US010361341B2

(12) United States Patent
Danesh et al.

(10) Patent No.: US 10,361,341 B2
(45) Date of Patent: Jul. 23, 2019

(54) INDIUM GALLIUM NITRIDE RED LIGHT EMITTING DIODE AND METHOD OF MAKING THEREOF

(71) Applicant: GLO AB, Lund (SE)

(72) Inventors: Fariba Danesh, Pleasanton, CA (US); Richard P. Schneider, Jr., Albuquerque, NM (US); Fan Ren, Sunnyvale, CA (US); Michael Jansen, Sunnyvale, CA (US); Nathan Gardner, Sunnyvale, CA (US)

(73) Assignee: GLO AB, Lund (SE)

( * ) Notice: Subject to any disclaimer, the term of this patent is extended or adjusted under 35 U.S.C. 154(b) by 18 days.

(21) Appl. No.: 15/786,766

(22) Filed: Oct. 18, 2017

(65) Prior Publication Data

US 2018/0114878 A1 Apr. 26, 2018

Related U.S. Application Data

(60) Provisional application No. 62/474,785, filed on Mar. 22, 2017, provisional application No. 62/412,065, filed on Oct. 24, 2016.

(51) Int. Cl.
*H01L 33/32* (2010.01)
*H01L 25/00* (2006.01)
(Continued)

(52) U.S. Cl.
CPC .......... *H01L 33/32* (2013.01); *H01L 25/0753* (2013.01); *H01L 25/50* (2013.01);
(Continued)

(58) Field of Classification Search
CPC ..... H01L 33/32; H01L 33/0095; H01L 33/06; H01L 33/24; H01L 33/42; H01L 33/60; H01L 33/62; H01L 25/0753; H01L 25/50
See application file for complete search history.

(56) References Cited

U.S. PATENT DOCUMENTS 8,761,218 B2 * 6/2014 Lin ................. B82Y 20/00
372/43.01
9,281,442 B2 3/2016 Romano et al.
(Continued)

FOREIGN PATENT DOCUMENTS

KR 1020120039324 A 4/2012
WO WO2016057588 A2 4/2016
(Continued)

OTHER PUBLICATIONS

Renjie Wang, Hieu P. T. Nguyen, Ashfiqua T. Connie, J. Lee, Ishiang Shih, and Zetian Mi, Color-tunable, phosphor-free InGaN nanowire light-emitting diode arrays monolithically integrated on silicon, Optics Express vol. 22, Issue S7, pp. A1768-A1775 (2014) (Year: 2014).*

(Continued)

*Primary Examiner* — Mark W Tornow

(74) *Attorney, Agent, or Firm* — The Marbury Law Group, PLLC

(57) ABSTRACT

A red-light emitting diode includes an n-doped portion, a p-doped portion, and a light emitting region located between the n-doped portion and a p-doped portion. The light emitting region includes a light-emitting indium gallium nitride layer emitting light at a peak wavelength between 600 and 750 nm under electrical bias thereacross, an aluminum gallium nitride layer located on the light-emitting indium gallium nitride layer and a GaN barrier layer located on the aluminum gallium nitride layer.

20 Claims, 106 Drawing Sheets

(51) Int. Cl.
| | |
|---|---|
| *H01L 25/075* | (2006.01) |
| *H01L 33/42* | (2010.01) |
| *H01L 33/62* | (2010.01) |
| *H01L 33/06* | (2010.01) |
| *H01L 33/24* | (2010.01) |
| *H01L 33/60* | (2010.01) |
| *H01L 33/00* | (2010.01) |

(52) U.S. Cl.
CPC .......... *H01L 33/0095* (2013.01); *H01L 33/06* (2013.01); *H01L 33/24* (2013.01); *H01L 33/42* (2013.01); *H01L 33/60* (2013.01); *H01L 33/62* (2013.01); *H01L 2224/16225* (2013.01); *H01L 2224/95* (2013.01)

(56) References Cited

U.S. PATENT DOCUMENTS

| | | |
|---|---|---|
| 9,882,086 B2 | 1/2018 | Romano et al. |
| 10,205,054 B2 | 2/2019 | Romano et al. |
| 2008/0305567 A1 | 12/2008 | Song |
| 2011/0073892 A1 | 3/2011 | Kyono |
| 2012/0037881 A1 | 2/2012 | Kim et al. |
| 2015/0207028 A1 | 7/2015 | Romano et al. |
| 2016/0118539 A1 | 4/2016 | Sugiyama et al. |
| 2017/0236975 A1 | 8/2017 | Romano et al. |
| 2017/0338277 A1* | 11/2017 | Banna .................. H01L 27/156 |
| 2018/0145218 A1 | 5/2018 | Romano et al. |

FOREIGN PATENT DOCUMENTS

| | | |
|---|---|---|
| WO | WO 2016/100657 A1 | 6/2016 |
| WO | WO 2016/100662 A1 | 6/2016 |

OTHER PUBLICATIONS

International Search Report and Written Opinion of the International Searching Authority for International Patent Application No. PCT/US2017/057099, dated Feb. 2, 2018, 15 pages.

Shiao, W. Y. et al., "X-Ray Diffraction Study on an InGaN/GaN quantum-Well Structure of Prestrained Growth," Journal of Applied Physics, vol. 101, 2 pages, (2007).

Shioda, T. et al., "Enhanced light output power of green LEDs employing AlGaN interlayer in InGaN/GaN MQW structure on sapphire (0001) substrate," Phys. Status Solidi A, vol. 209, No. 3, pp. 473-476, (2012).

Hwang, J. I. et al., "Development of InGaN-Based Red LED Grown on (0001) Polar Surface," Applied Physics Express, vol. 7, pp. 071003-1 to 071003-4, (2007).

Hashimoto, R. et al., "High-efficiency green-yellow light-emitting diodes grown on sapphire (0001) substrates," Phys. Status Solidi C, pp. 1-4, (2013).

Hashimoto, R. et al., "High-efficiency yellow light-emitting diodes grown on sapphire (0001) substrates," Phys. Status Solidi C 11, Nos. 3-4, pp. 628-631, (2014).

U.S. Appl. No. 15/533,866, filed Jun. 7, 2017, GLO AB.

U.S. Appl. No. 15/533,907, filed Jun. 7, 2017, GLO AB.

Notification Concerning Transmittal of International Preliminary Report on Patentability and Written Opinion of the International Searching Authority for International Patent Application No. PCT/US2017/057099, dated May 9, 2019, 12 pages.

* cited by examiner

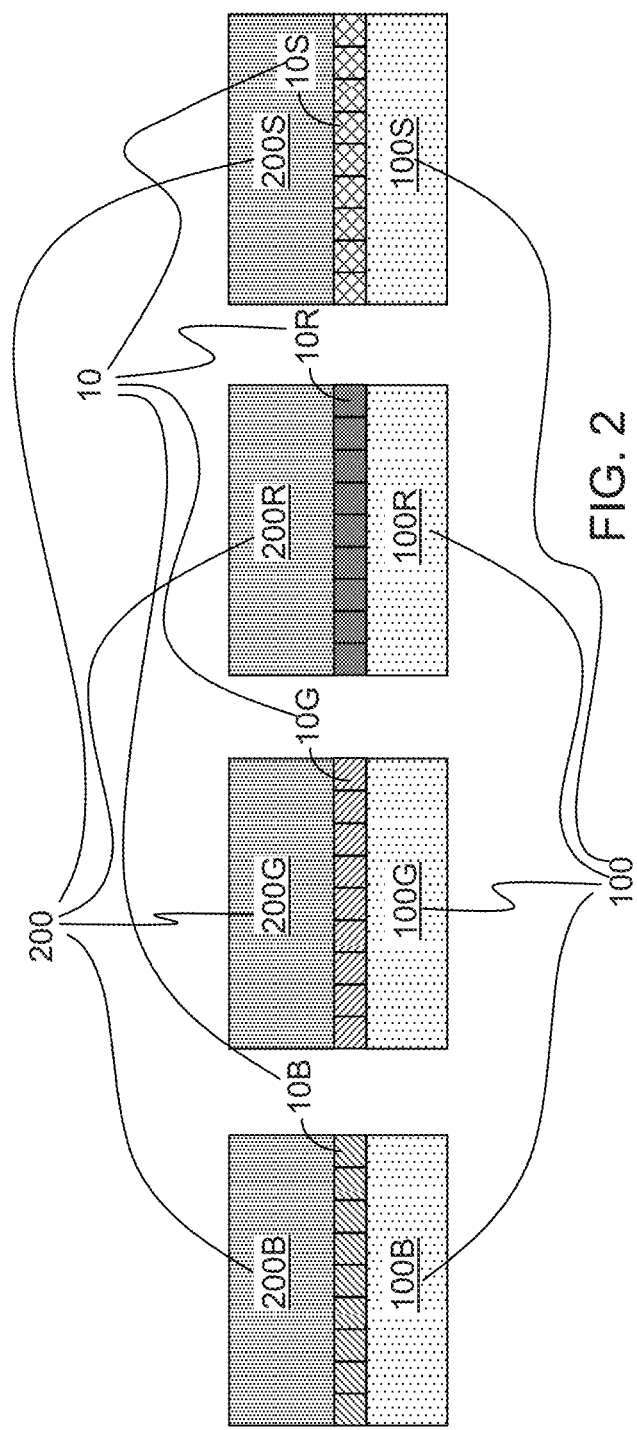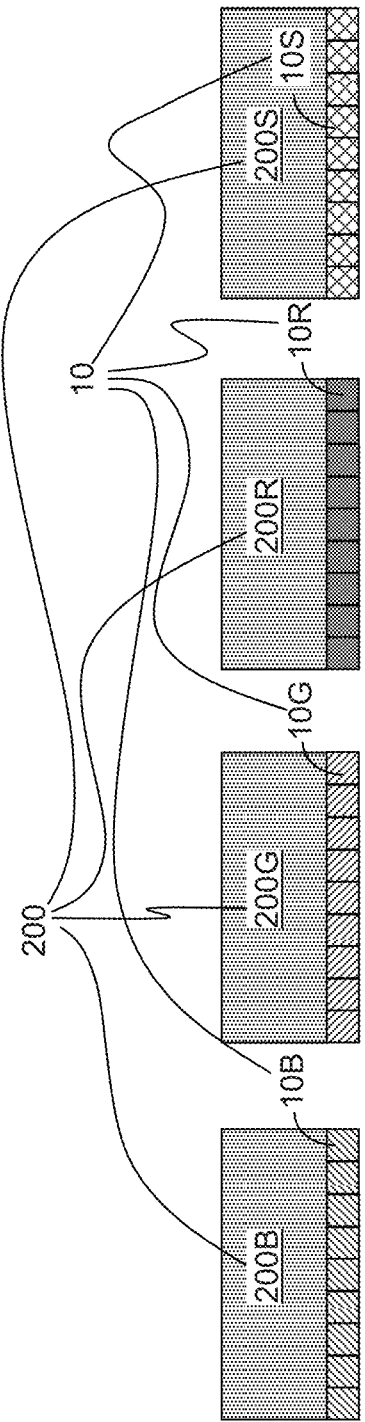

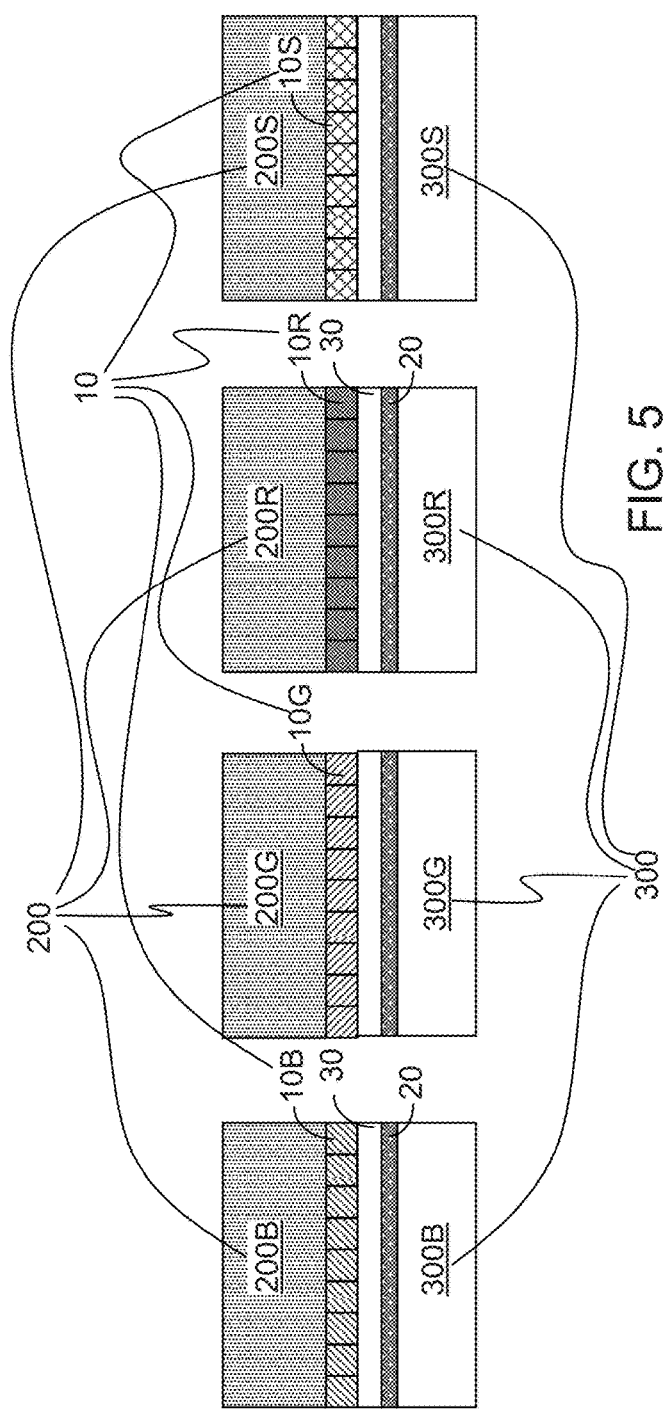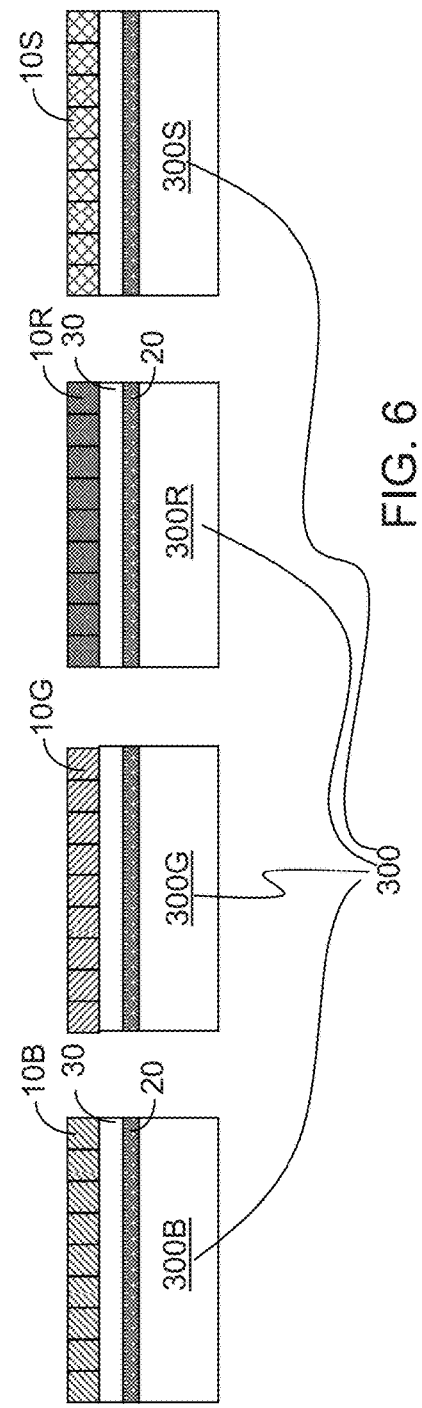

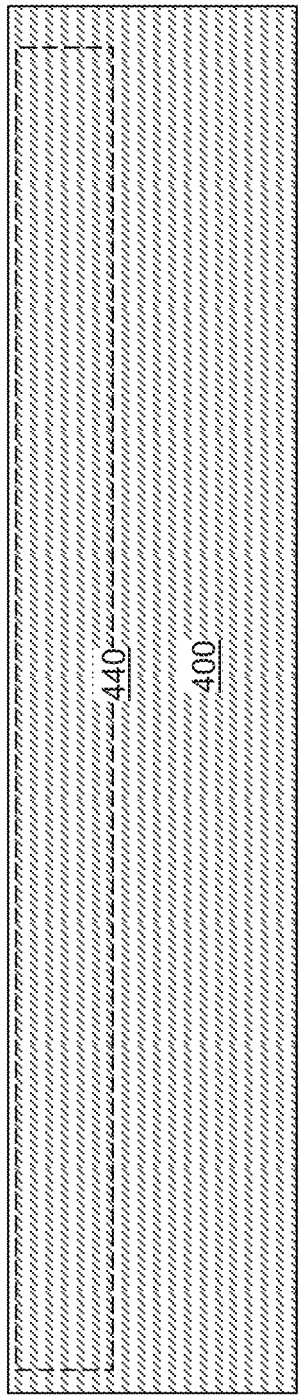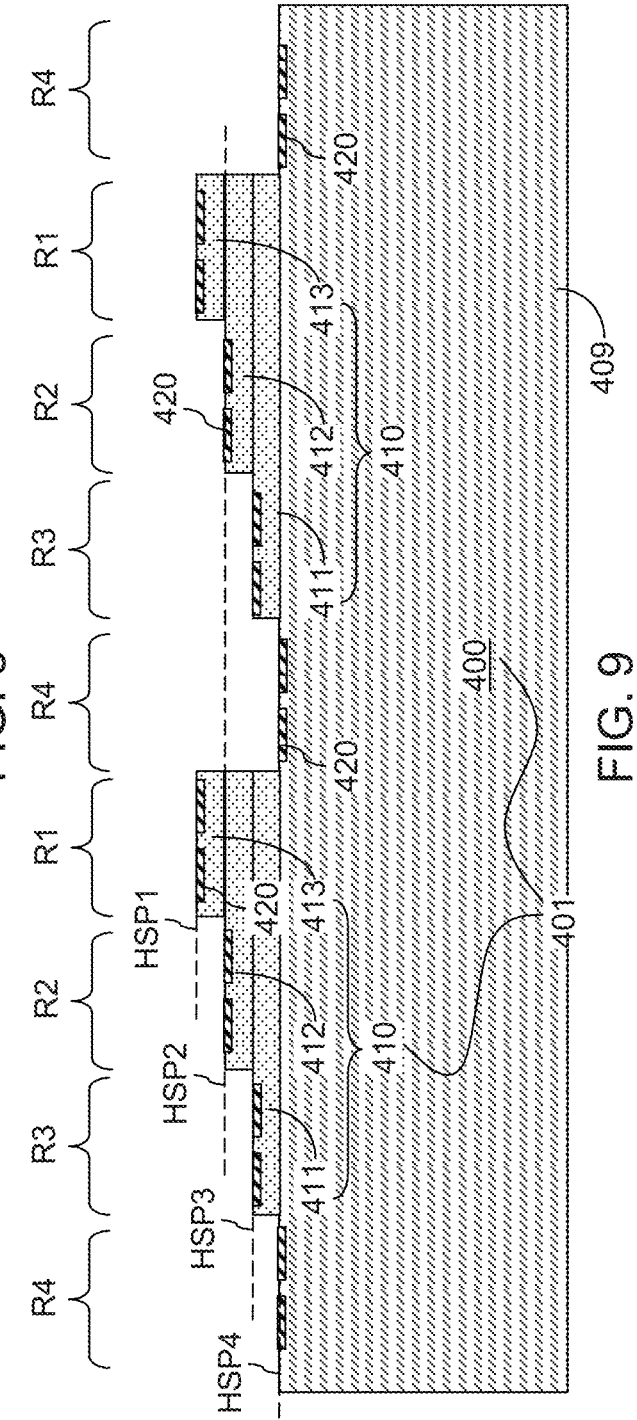
FIG. 8
FIG. 9

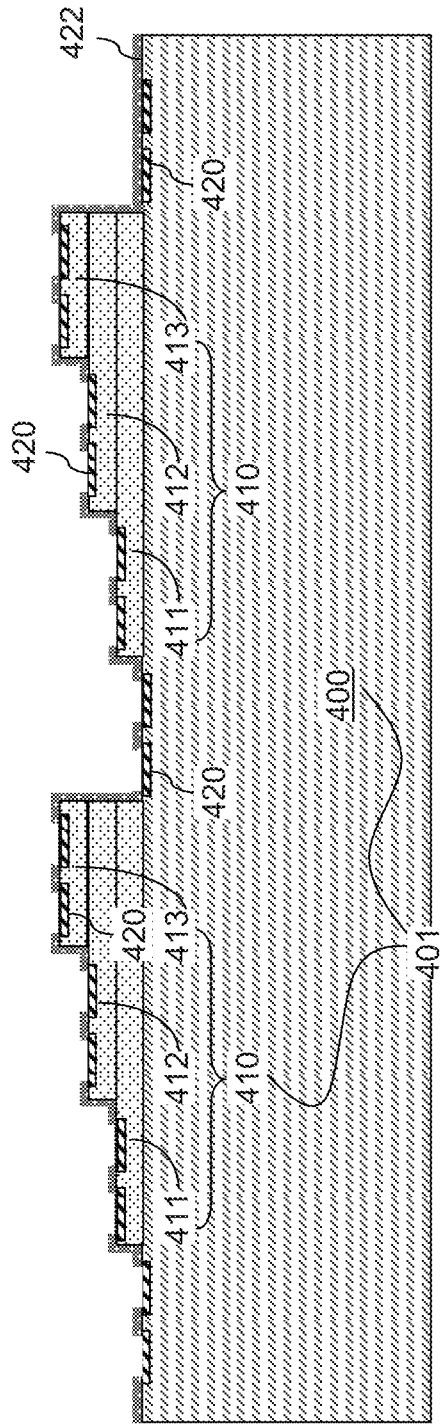
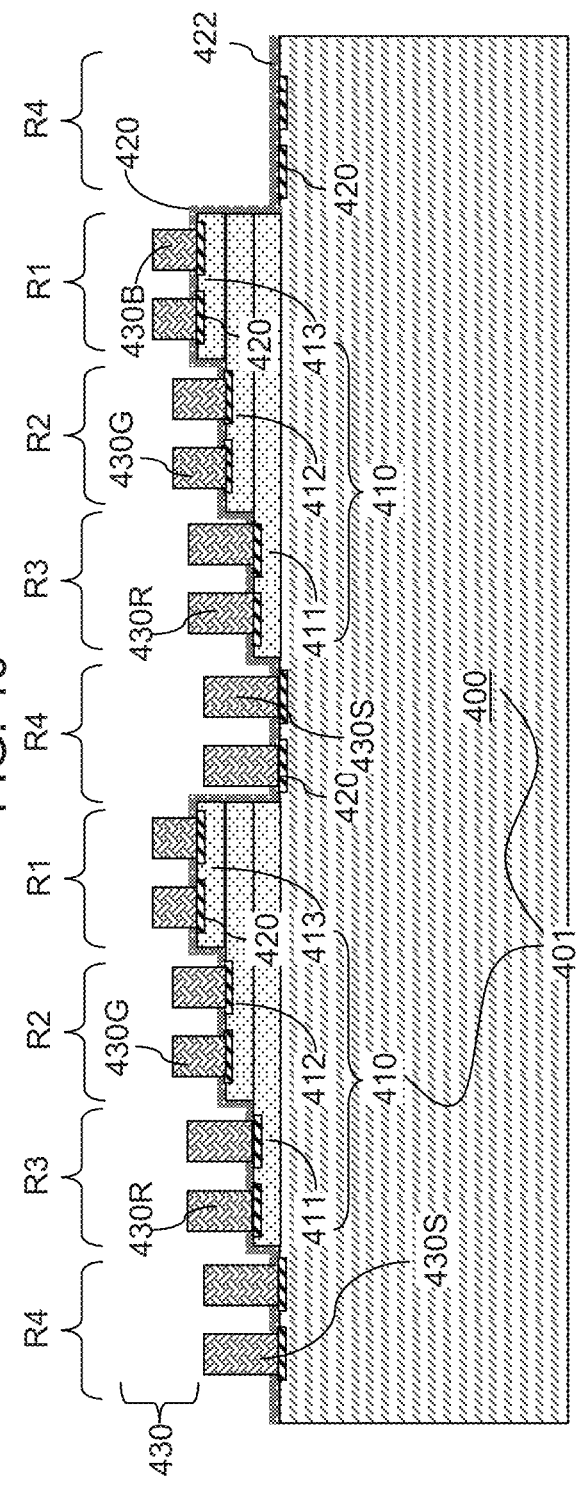

FIG. 30

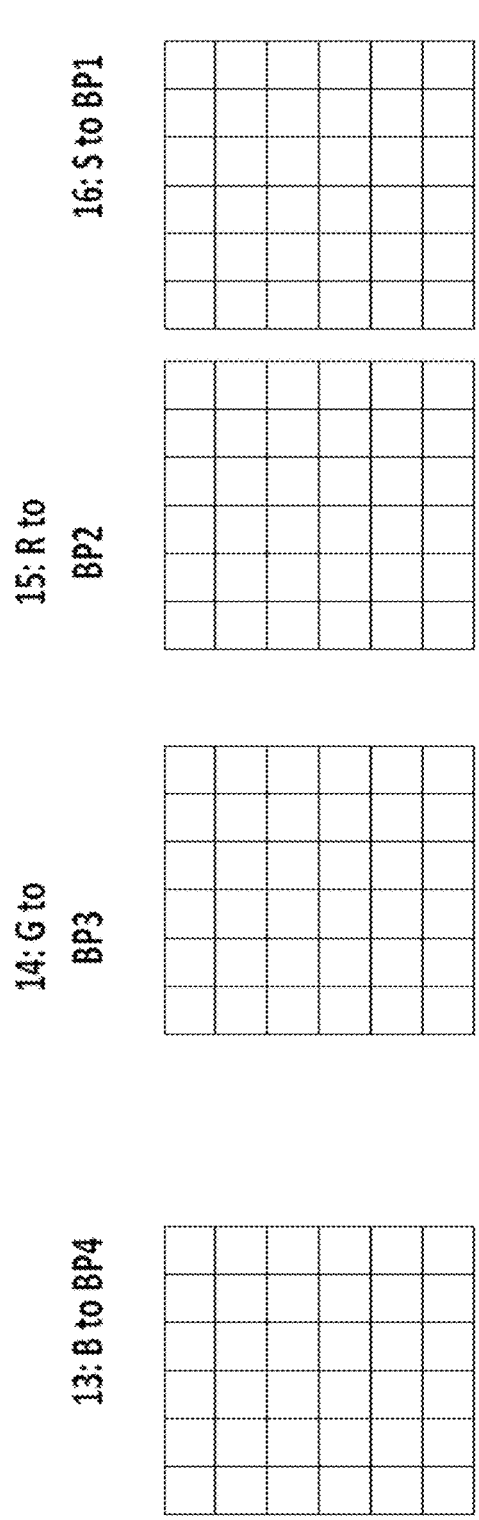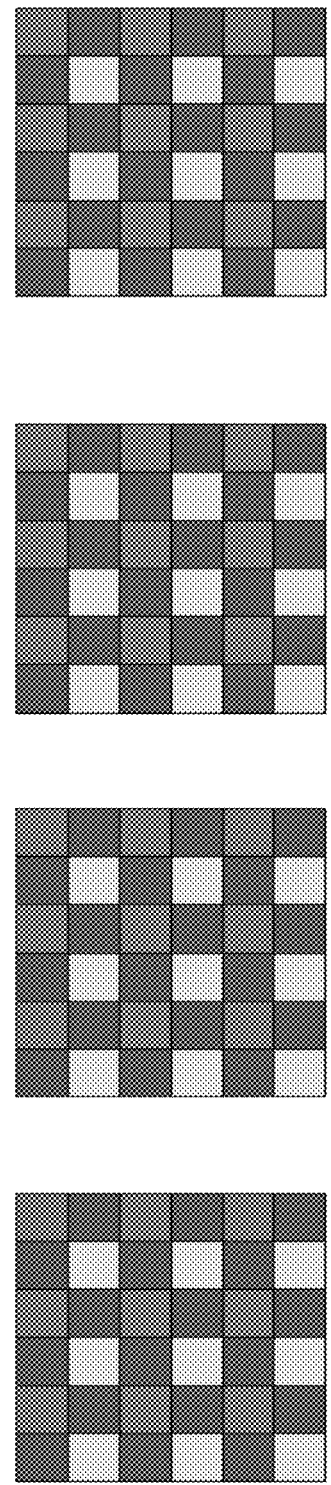
FIG. 31E

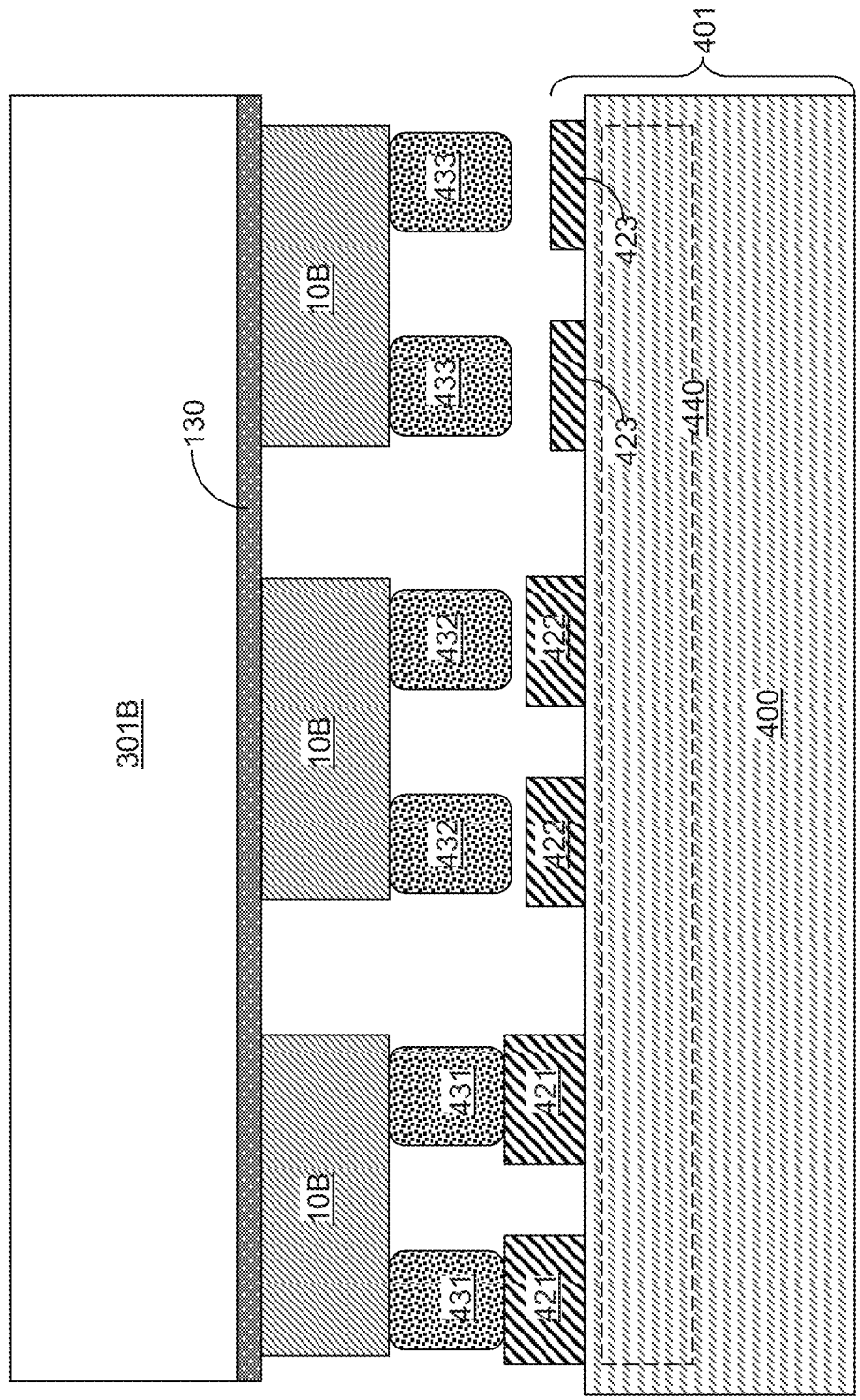

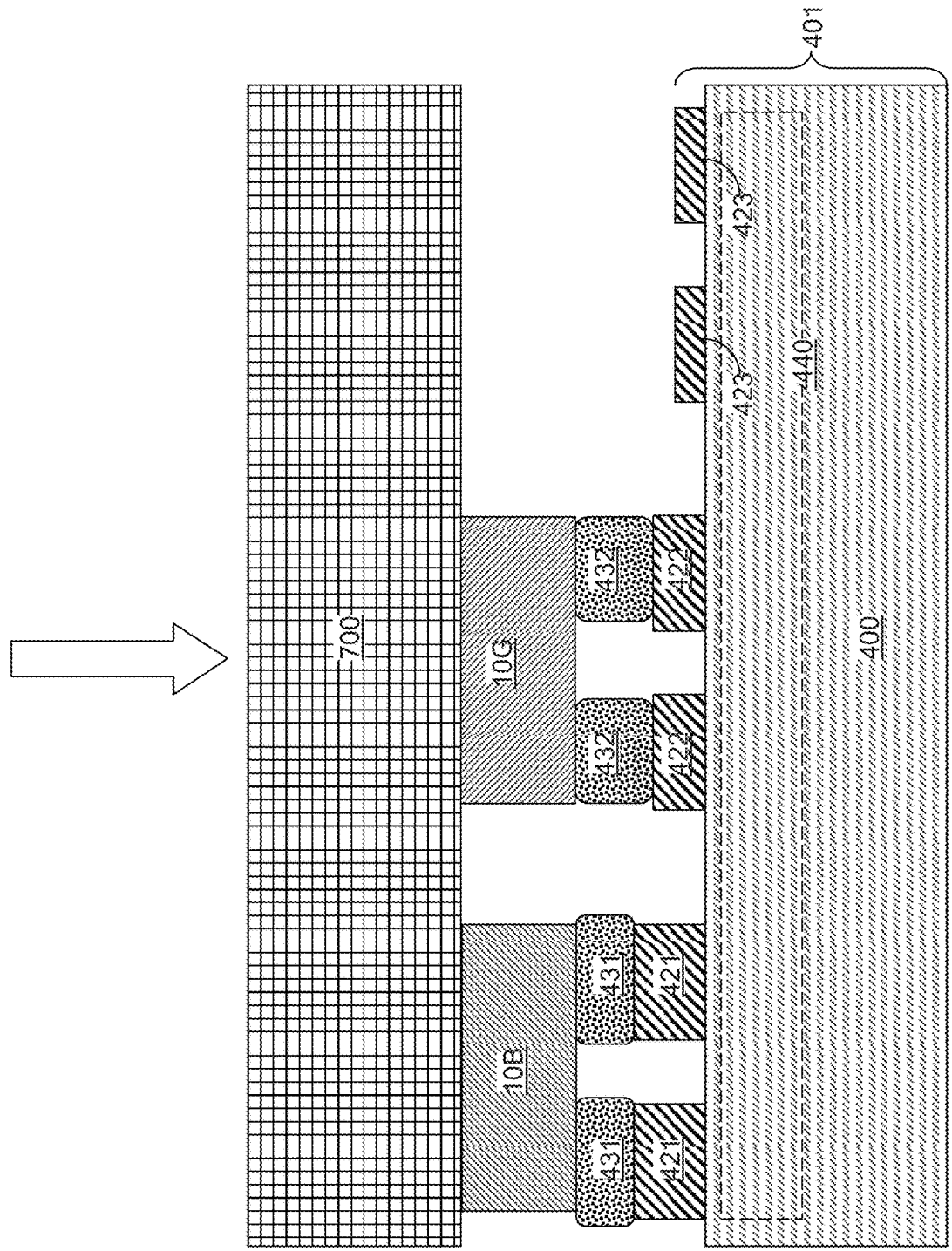

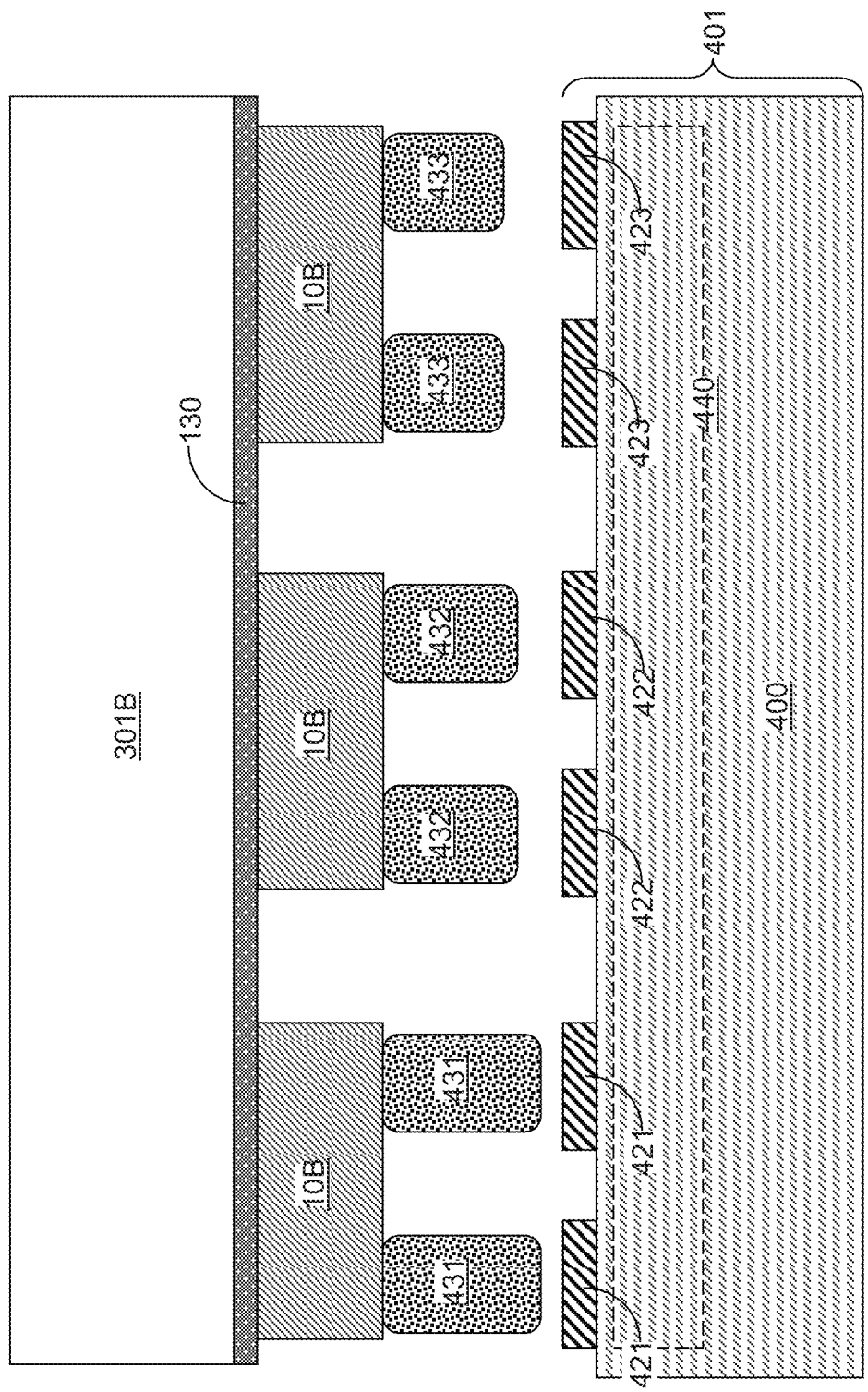

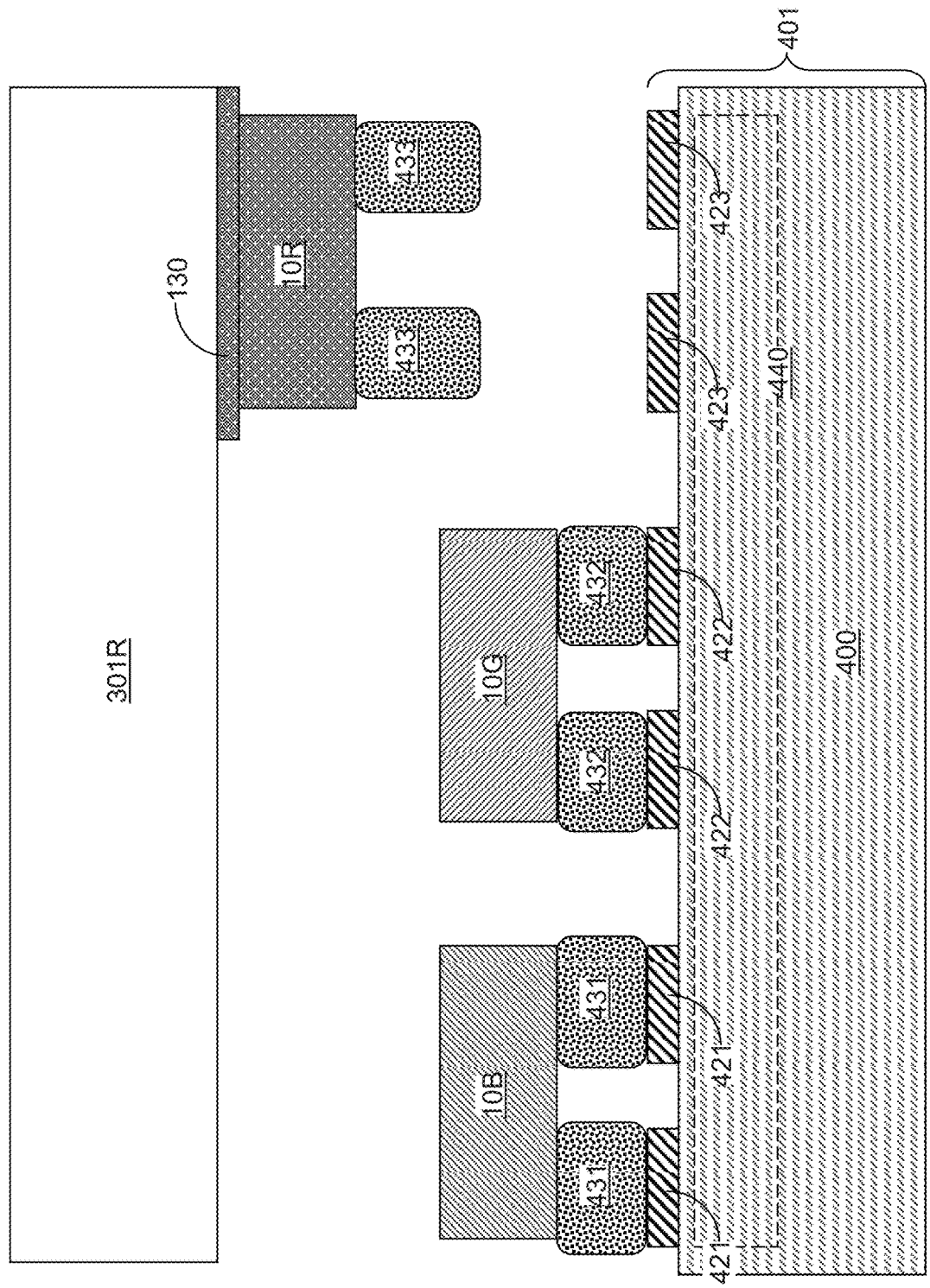

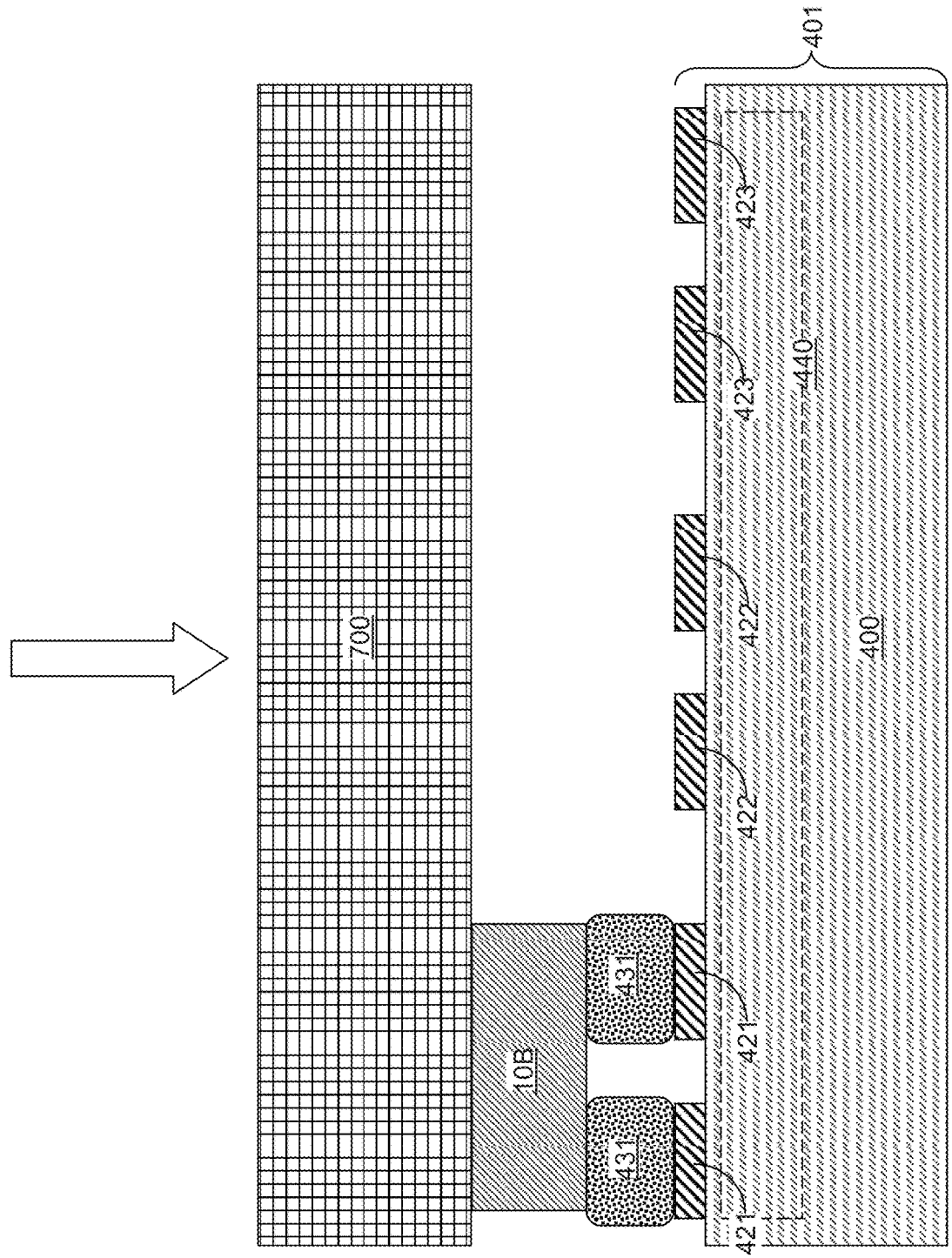

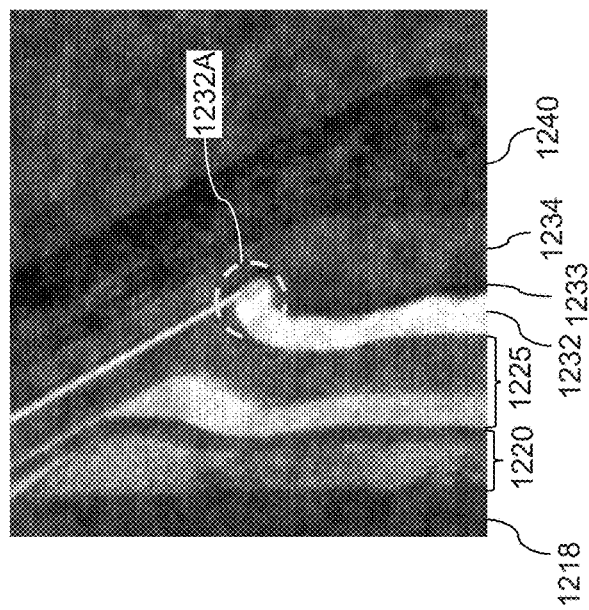
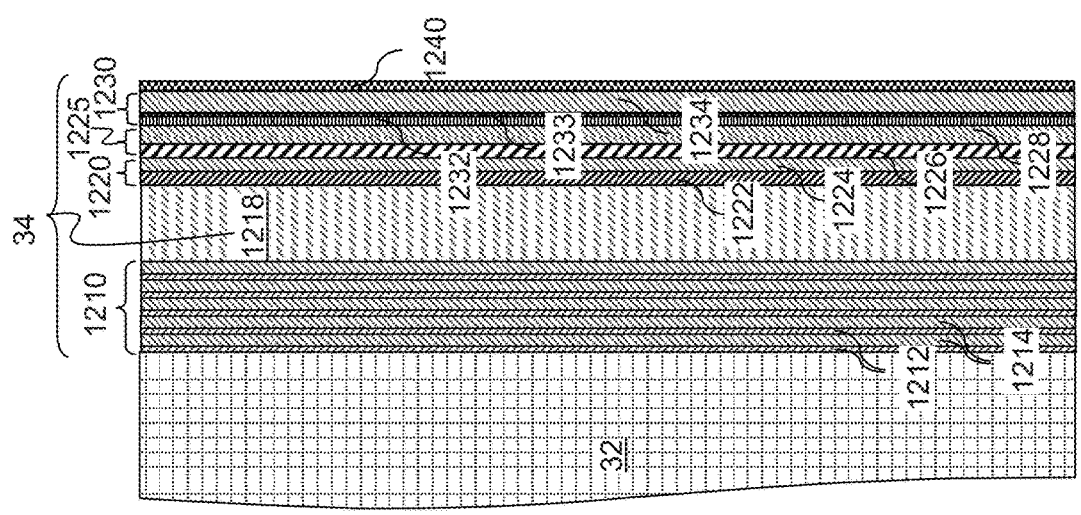
FIG. 46B
FIG. 46A

INDIUM GALLIUM NITRIDE RED LIGHT EMITTING DIODE AND METHOD OF MAKING THEREOF

FIELD

The embodiments of the invention are directed generally to semiconductor light emitting devices, and specifically to a red-light emitting diode including indium gallium nitride, and a method of manufacturing the same.

BACKGROUND

Light emitting devices such as light emitting devices are used in electronic displays, such as liquid crystal displays in laptops or LED televisions. Light emitting devices include light emitting diodes (LEDs) and various other types of electronic devices configured to emit light.

SUMMARY

According to an aspect of the present disclosure, a red-light emitting diode comprises an n-doped portion, a p-doped portion and a light emitting region located between the n-doped portion and a p-doped portion. The light emitting region comprises a light-emitting indium gallium nitride layer emitting light at a peak wavelength between 600 and 750 nm under electrical bias thereacross, a III-nitride layer located on the light-emitting indium gallium nitride layer; and a GaN barrier layer located on the III-nitride layer. The light emitting diode comprises at least one feature selected from: (a) the light emitting diode comprises a nanowire device; or (b) the light emitting region consists of one or two quantum wells; or (c) the III-nitride layer comprises an aluminum gallium nitride layer which has a composition $Al_yGa_{(1-y)}N$, where y is in a range from 0.3 to 1.0; or (d) UV emitting InGaN/GaN superlattice is located between the n-doped portion and the light emitting region.

According to another aspect of the present disclosure, a nanowire red-light emitting diode includes an n-doped nanowire core portion, a p-doped portion; and a light emitting shell located on the n-doped nanowire core under the p-doped portion. The light emitting shell comprises a light-emitting indium gallium nitride shell emitting light at a peak wavelength between 600 and 750 nm under electrical bias thereacross, a III-nitride shell located on the light-emitting indium gallium nitride shell, and a GaN barrier shell located on the III-nitride shell.

According to another aspect of the present disclosure, a method of manufacturing a direct view display device includes providing first light emitting diodes, wherein each of the first light emitting diodes comprises an epitaxial material layer stack configured to emit light at a first peak wavelength in a range from 600 nm to 750 nm, wherein the epitaxial material layer stack comprises, from one side to another, a single crystalline n-doped GaN portion, a plurality of strain-modulating layer stacks located on the single crystalline n-doped GaN layer and comprising a respective intervening indium gallium nitride layer and a respective intervening GaN layer, a light-emitting indium gallium nitride layer located on the plurality of strain-modulating layer stacks and emitting light at the first peak wavelength under electrical bias thereacross, a GaN barrier layer, and a p-doped aluminum gallium nitride layer. The method also includes providing second light emitting diodes configured to emit light at a second peak wavelength in a range from 400 nm to 600 nm, and bonding the first light emitting diodes and the second light emitting diodes to a backplane to form an array of pixels.

According to another aspect of the present disclosure, a direct view display device comprising an array of pixels located on a backplane is provided. Each of the pixels comprises a first light emitting diode configured to emit light at a first peak wavelength in a range from 600 nm to 750 nm, and a second light emitting diode configured to emit light at a second peak wavelength in a range from 400 nm to 600 nm. The first light emitting diode in each pixel includes an epitaxial material layer stack comprising, from one side to another: a single crystalline n-doped GaN portion; a plurality of strain-modulating layer stacks located on the single crystalline n-doped GaN layer and comprising a respective intervening indium gallium nitride layer and a respective intervening GaN layer; a light-emitting indium gallium nitride layer located on the plurality of strain-modulating layer stacks and emitting light at the first peak wavelength under electrical bias thereacross; a GaN barrier layer; and a p-doped aluminum gallium nitride layer.

According to another aspect of the present disclosure, a method of manufacturing a direct view display device is provided, which comprises the steps of: providing first light emitting diodes, wherein each of the first light emitting diodes comprises an epitaxial material layer stack configured to emit light at a first peak wavelength in a range from 600 nm to 750 nm, wherein the epitaxial material layer stack comprises, from one side to another: a single crystalline n-doped GaN portion, a plurality of strain-modulating layer stacks located on the single crystalline n-doped GaN layer and comprising a respective intervening indium gallium nitride layer and a respective intervening GaN layer, a light-emitting indium gallium nitride layer located on the plurality of strain-modulating layer stacks and emitting light at the first peak wavelength under electrical bias thereacross, a GaN barrier layer, and a p-doped aluminum gallium nitride layer; providing second light emitting diodes configured to emit light at a second peak wavelength in a range from 400 nm to 600 nm; and bonding the first light emitting diodes and the second light emitting diodes to a backplane to form an array of pixels.

According to an aspect of the present disclosure, a direct view display device comprising an array of pixels located on a backplane is provided. Each of the pixels comprises a red-light emitting diode configured to emit light at a peak wavelength in a range from 620 nm to 750 nm, a green-light emitting diode configured to emit light at a peak wavelength in a range from 495 nm to 570 nm, and a blue-light emitting diode configured to emit light at a peak wavelength in a range from 450 to 495 nm. The red-light emitting diode in each pixel comprises: a first single crystalline n-doped gallium nitride layer; a single crystalline n-doped indium gallium nitride layer in epitaxial alignment with the single crystalline n-doped gallium nitride layer; an active layer including at least one instance of an indium gallium nitride layer and at least one instance of a compound semiconductor material layer having a greater band gap than the at least one indium gallium nitride layer; and a first p-doped compound semiconductor material layer, wherein the active layer is configured to emit light at a peak wavelength in a range from 620 nm to 750 nm upon application of electrical bias between the single crystalline n-doped indium gallium nitride layer and the p-doped compound semiconductor material layer.

According to another aspect of the present disclosure, a method of manufacturing a direct view display device is provided. Red-light emitting diodes are provided, wherein each of the red-light emitting diode comprises: a first single crystalline n-doped gallium nitride layer; a single crystalline n-doped indium gallium nitride layer in epitaxial alignment with the single crystalline n-doped gallium nitride layer; an active layer including at least one instance of an indium gallium nitride layer and at least one instance of a compound semiconductor material layer having a greater band gap than the at least one indium gallium nitride layer; and a first p-doped compound semiconductor material layer, wherein the active layer is configured to emit light at a peak wavelength in a range from 620 nm to 750 nm upon application of electrical bias between the single crystalline n-doped indium gallium nitride layer and the p-doped compound semiconductor material layer. The methods includes the steps of: providing green-light emitting diodes configured to emit light at a peak wavelength in a range from 495 nm to 570 nm; providing blue-light emitting diodes configured to emit light at a peak wavelength in a range from 450 to 495 nm; and bonding the red-light emitting diodes, the green-light emitting diodes, and the blue-light emitting diodes to a backplane to form an array of pixels.

According to another aspect of the present disclosure, a method of forming a device assembly is provided. Multiple types of solder material portions are formed on a substrate. The multiple types of solder material portions comprises at least one first solder material portion including a first solder material and at least one second solder material portion including a second solder material. Multiple types of devices are provided. The multiple types of devices comprises a first type device including at least one first bonding pad and a second type device including at least one second bonding pad. The first and second bonding pads comprise a common bonding material. The first solder material and the common bonding material form a first eutectic system having a first eutectic temperature. The second solder material and the common bonding material form a second eutectic system having a second eutectic temperature that is greater than the first eutectic temperature. The first type device is bonded to the substrate by disposing each first bonding pad on a respective first solder material portion and heating each first bonding pad to a temperature above the first eutectic temperature and below the second eutectic temperature. The second type device is bonded to the substrate by disposing each second bonding pad on a respective second solder material portion and heating each second bonding pad to a temperature above the second eutectic temperature.

According to an aspect of the present disclosure, a method of forming at least one integrated light emitting device assembly is provided. A first assembly comprising a first source substrate and first light emitting devices that emit light of a first wavelength is disposed over a backplane. First conductive bonding structures are disposed between the backplane and the first assembly. A first subset of the first light emitting devices is bonded to the backplane through the first conductive bonding structures. The first subset of the first light emitting devices is detached from the first source substrate by laser ablation of material portions overlying the first subset of the first light emitting devices. An assembly comprising the first source substrate and a second subset of the first light emitting devices is separated from the backplane while the first subset of the first light emitting devices remains bonded to the backplane.

According to another aspect of the present disclosure, an integrated light emitting device assembly is provided, which comprises a backplane having stepped horizontal surfaces at a top side. The stepped horizontal surfaces comprise a first subset of the stepped horizontal surfaces located within a first horizontal surface plane, and a second subset of the stepped horizontal surfaces located within a second horizontal surface plane that is more proximal to a backside surface of the backplane than the first subset of stepped horizontal surfaces is to the backside surface of the backplane. The integrated light emitting device assembly comprises conductive bonding structures located on the stepped horizontal surfaces of the backplane. The conductive bonding structures comprise first conductive bonding structures overlying the first subset of the stepped horizontal surfaces and second conductive bonding structures overlying the second subset of the stepped horizontal surfaces. Further, the integrated light emitting device assembly comprises light emitting devices bonded to the conductive bonding structures. The light emitting devices comprise first light emitting devices that emit light of a first wavelength and overlie the first subset of the stepped horizontal surfaces and second light emitting devices that emit light of a second wavelength and overlie the second subset of stepped horizontal surfaces.

According to yet another aspect of the present disclosure, an integrated light emitting device assembly comprising first light emitting devices and second light emitting devices bonded to a backplane is provided. Each first light emitting device emits light at a first wavelength. Each second light emitting device emits light at a second wavelength that is different from the first wavelength. Each first light emitting device is bonded to the backplane through a first stack including a first bonding pad and a first conductive bonding structure. Each second light emitting device is bonded to the backplane through a second stack including a second bonding pad and a second conductive bonding structure. A first plane including first interfaces between the first bonding pads and the first conductive bonding structures is vertically offset from a second plane including second interfaces between the second bonding pads and the second conductive bonding structures.

According to still another aspect of the present disclosure, an integrated light emitting device assembly comprising first light emitting devices and second light emitting devices bonded to a backplane is provided. Each first light emitting device emits light at a first wavelength. Each second light emitting device emits light at a second wavelength that is different from the first wavelength. Each first light emitting device is bonded to the backplane through a first stack including a first bonding pad and a first conductive bonding structure. Each second light emitting device is bonded to the backplane through a second stack including a second bonding pad and a second conductive bonding structure. The first conductive bonding structures and the second conductive bonding structures have a same height. Each of the first conductive bonding structures has a first volume. Each of the second conductive bonding structures has a second volume that is less than the first volume.

BRIEF DESCRIPTION OF THE DRAWINGS

FIG. 2 is a schematic illustration of the step of bonding of the growth substrates to respective first carrier substrates through the respective devices according to an embodiment of the present disclosure.

FIG. 3 is a schematic illustration of the step of removing the growth substrates according to an embodiment of the present disclosure.

FIG. 5 is a schematic illustration of the step of bonding each pair of a first carrier substrate and a second carrier substrate according to an embodiment of the present disclosure.

FIG. 6 is a schematic illustration of the step in which each first carrier substrate is removed from a bonded structure according to an embodiment of the present disclosure.

FIG. 8 is a vertical cross-sectional view of a backplane substrate according to an embodiment of the present disclosure.

FIG. 9 is a vertical cross-sectional view of a backplane that is formed by forming various dielectric material layers on the backplane according to an embodiment of the present disclosure.

FIG. 10 is a vertical cross-sectional view of the backplane after formation and patterning of an optional protective layer including an optical protection material according to an embodiment of the present disclosure.

FIG. 11 is a vertical cross-sectional view of the backplane after formation of first conductive bonding structures on a first subset of horizontal stepped surfaces according to an embodiment of the present disclosure.

FIG. 30 illustrates an exemplary transfer pattern and an exemplary transfer sequence for transferring four different types of devices from four transfer substrates to four backplanes.

FIGS. 31A-31E are a schematic sequence for transfer of light emitting diodes according to the exemplary transfer pattern illustrated in FIG. 30.

FIG. 46A is a vertical cross-sectional view of a magnified region M of the exemplary structure of FIG. 45. FIG. 46B is a transmission electron microscope (TEM) micrograph of a magnified region R of the exemplary structure of FIG. 45.

DETAILED DESCRIPTION

Figure 1:
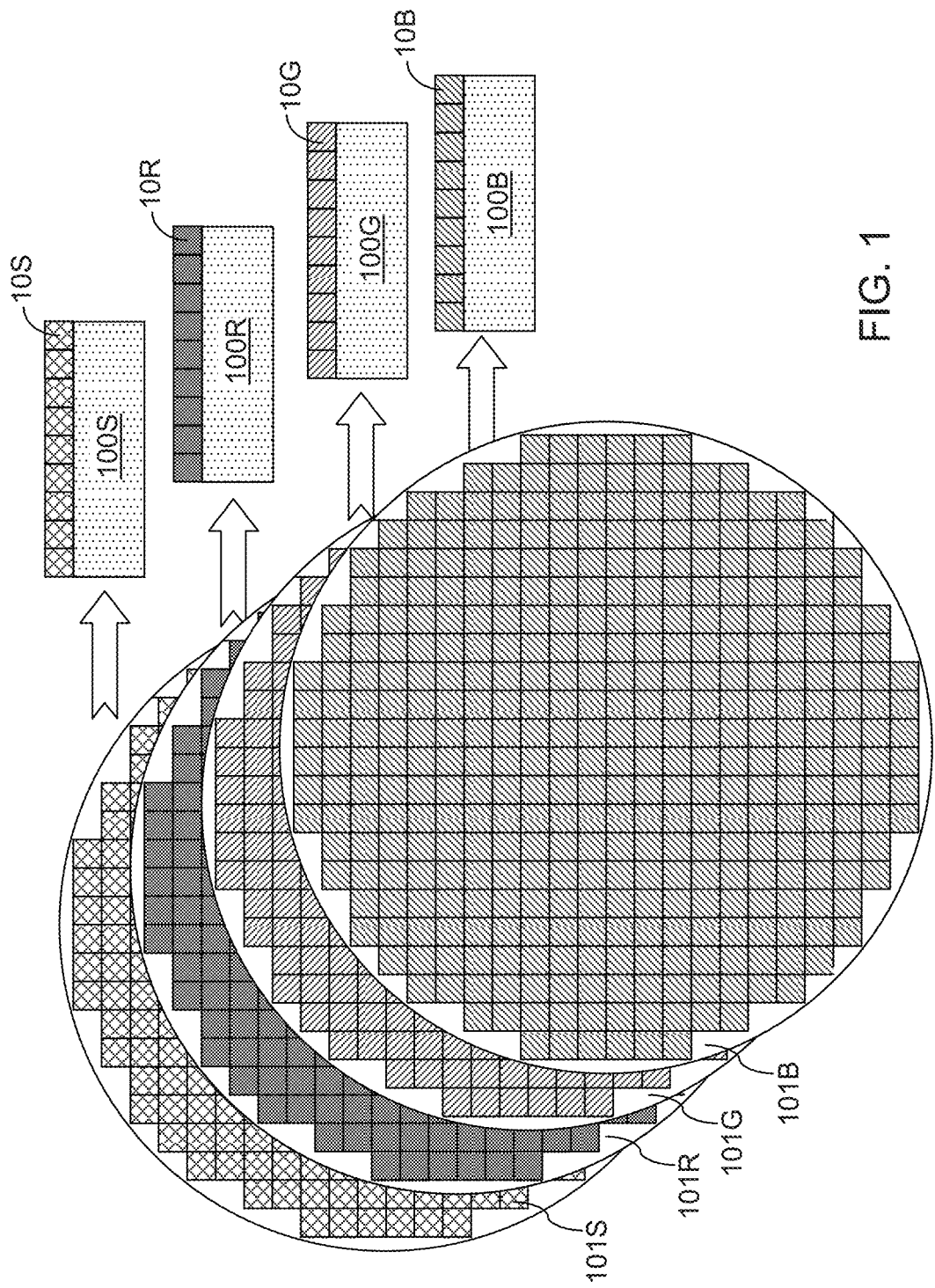
FIG. 1 is a schematic illustration of the step of generation of assemblies of growth substrates with respective devices thereupon from initial growth substrates according to an embodiment of the present disclosure.

As stated above, the present disclosure is directed to an emissive display panel including red-light emitting subpixels including indium gallium nitride, and a method of manufacturing the same, the various aspects of which are described below. Throughout the drawings, like elements are described by the same reference numeral. The drawings are not drawn to scale. Multiple instances of an element may be duplicated where a single instance of the element is illustrated, unless absence of duplication of elements is expressly described or clearly indicated otherwise. Elements with the same reference numerals are presumed to have the same composition and/or components unless expressly stated otherwise. Ordinals such as "first," "second," and "third" are employed merely to identify similar elements, and different ordinals may be employed across the specification and the claims of the instant disclosure.

As used herein, a "light emitting device" refers to any device that is configured to emit light and includes, but is not limited to, a light emitting diode (LED), a laser, such as a vertical-cavity surface-emitting laser (VCSEL), and any other electronic device that is configured to emit light upon application of a suitable electrical bias. A light emitting device may be a vertical structure (e.g., a vertical LED) in which the p-side and n-side contacts are located on opposite sides of the structure or a lateral structure in which the p-side and n-side contacts are located on the same side of the structure. As used herein, a "light emitting device assembly" refers to an assembly in which at least one light emitting device is structurally fixed with respect to a support structure, which can include, for example, a substrate, a matrix, or any other structure configured to provide stable mechanical support to the at least one light emitting device.

In the present disclosure, a method is provided for transferring an array of devices (such as an array of light emitting devices or an array of sensor devices) from a growth substrate to a target substrate. The target substrate can be any substrate on which formation of multiple types of devices in any configuration is desired. In an illustrative example, the target substrate can be a backplane substrate such as an active or passive matrix backplane substrate for driving light emitting devices. As used herein, a "backplane substrate" refers to any substrate configured to affix multiple devices thereupon. In one embodiment, the center-to-center spacing of neighboring light emitting devices on the backplane substrate can be is an integer multiple of the center-to-center spacing of neighboring light emitting devices on the growth substrate. The light emitting devices may include a plurality of light emitting devices, such as a group of two light emitting devices, one configured to emit blue light and one configured to emit green light. The light emitting devices may include a group of three light emitting devices, one configured to emit blue light, one configured to emit green light, and one configured to emit red light. As used herein, "neighboring light emitting devices" refer to a plurality of two or more light emitting devices located in closer proximity than at least another light emitting device. The method of the present disclosure can provide selective transfer of a subset of light emitting devices from a light emitting device array on a growth substrate to the backplane substrate.

Referring to FIG. 1, devices (10B, 10G, 10R, 10S) can be fabricated on respective initial growth substrates (101B, 101G, 101R, 101S) employing methods known in the art. As used herein, an "initial growth substrate" refers to a substrate that is processed to form devices thereupon or therein. The devices (10B, 10G, 10R, 10S) can include light emitting devices (10B, 10G, 10R) and/or sensor devices 10S (e.g., photodetectors) and/or any other electronic devices. The light emitting devices (10B, 10G, 10R) can be any type of light emitting devices, i.e., vertical light emitting devices, lateral light emitting devices, or any combination thereof. Devices of the same type can be formed on each initial growth substrate (101B, 101G, 101R, 101S). The devices (10B, 10G, 10R, 10S) can be formed as an array on the respective initial growth substrates (101B, 101G, 101R, 101S).

In one embodiment, the initial growth substrates (101B, 101G, 101R, 101S) can include an absorbing substrate such as a silicon substrate. As used herein, an "absorbing substrate" refers to a substrate that absorbs more than 50% of light energy within the spectrum range including ultraviolet range, visible range, and infrared range. As used herein, "ultraviolet range" refers to the wavelength range from 10 nm to 400 nm; "visible range" refers to the wavelength range from 400 nm to 800 nm, and "infrared range" refers to the wavelength range from 800 nm to 1 mm.

If the initial growth substrates (101B, 101G, 101R, 101S) are absorbing substrates, each array of devices (10B, 10G, 10R, 10S) can be transferred to a respective transparent carrier substrates, or a "transparent substrate," by full wafer transfer processes in which each array of devices (10B, 10G, 10R, 10S) is transferred to the respective transparent substrate in its entirety. As used herein, a "transparent substrate" refers to a substrate that transmits more than 50% of light energy at a wavelength within the spectrum range including ultraviolet range, visible range, and infrared range.

In one embodiment, devices (10B, 10G, 10R, 10S) can include light emitting devices (10B, 10G, 10R). In one embodiment, each light emitting device (10B, 10G, 10R) can be configured to emit light of a single peak wavelength. It is understood that light emitting devices typically emit light of a narrow wavelength band centered around the single wavelength at which the intensity of light is at a maximum, and the wavelength of a light emitting device refers to the peak wavelength. For example, an array of first light emitting devices 10B can be formed on a first-type growth substrate 100B, an array of second light emitting devices 10G can be formed on a second-type growth substrate 100G, and an array of third light emitting devices 10R can be formed on a third-type growth substrate 100R. In addition, an array of sensor devices 10S can be formed on a fourth-type growth substrate 100S. Alternatively, one or more types of light emitting devices (10B, 10G, 10R) can be integrated light emitting devices that are configured to emit light of at least two different wavelengths. In one embodiment, the light emitting devices (10B, 10G, 10R) may comprise arrays of nanowires or other nanostructures.

Contact structures (not explicitly shown) such as contact pads are provided on each light emitting device (10B, 10G, 10R). The contact structures for each light emitting device (10B, 10G, 10R) can include an anode contact structure and a cathode contact structure. In case one or more of the light emitting devices (10B, 10G, 10R) is an integrated light emitting device configured to emit light of at least two different wavelengths, a common contact structure (such as a common cathode contact structure) can be employed. For example, a triplet of blue, green, and red light emitting devices embodied as a single integrated light emitting device may have a single cathode contact.

The array of light emitting devices (10B, 10G, 10R) on each initial growth substrate (101B, 101G, 101R) is configured such that the center-to-center spacing of light emitting devices on a backplane substrate to which the light emitting devices are subsequently transferred is an integer multiple of the center-to-center spacing of light emitting devices (10B, 10G, 10R) on the initial growth substrate (101B, 101G, 101R).

Each initial growth substrate (101B, 101G, 101R, 101S) and devices (10B, 10G, 10R, 10S) thereupon can be diced into suitable sizes. Each diced portion of the initial growth substrate (101B, 101G, 101R, 101S) is herein referred to as a growth substrate (100B, 100G, 100R, 100S). Assemblies of growth substrates (100B, 100G, 100R, 100S) with respective devices (10B, 10G, 10R, 10S) thereupon are thus generated. In other words, the growth substrates (100B, 100G, 100R, 100S) are either the entirety or the diced portions of the initial growth substrates (101B, 101G, 101R, 101S), and an array of devices (10B, 10G, 10R, 10S) is present on each growth substrate (100B, 100G, 100R, 100S). The array of devices (10B, 10G, 10R, 10S) on each growth substrate (100B, 100G, 100R, 100S) can be an array of devices of the same type.

Prior to, or after, each initial growth substrate (101B, 101G, 101R, 101S) is singulated to corresponding growth substrates (100B, 100G, 100R, 100S), each device (10B, 10G, 10R, 10S), e.g., a light emitting device, a group of light emitting devices, or a sensor device, can be mechanically isolated from one another by forming trenches between each neighboring pair of the devices. In an illustrative example, if a light emitting device array or a sensor array is disposed on an initial growth substrate (101B, 101G, 101R, 101S), the trenches can extend from the final growth surface of the light emitting device array or the sensor array to the top surface of the initial growth substrate (101B, 101G, 101R, 101S).

Various schemes may be employed to transfer each array of devices (10B, 10G, 10R, 10S) to a respective transparent substrate, which is herein referred to as a transfer substrate. FIGS. 2-6 illustrate an exemplary scheme that can be employed to transfer each array of devices (10B, 10G, 10R, 10S) to a respective transparent substrate.

Referring to FIG. 2, first carrier substrates 200 can be optionally employed in case the contact structures on each device (10B, 10G, 10R, 10S) are formed on the top side of each device (10B, 10G, 10R, 10S) during fabrication of the devices (10B, 10G, 10R, 10S) on the growth substrates (101B, 101G, 101R, 101S). The first carrier substrates 200 can be any suitable substrate that can be bonded to the devices (10B, 10G, 10R, 10S) and can provide structural support to the (10B, 10G, 10R, 10S). Each as-grown array of devices (10B, 10G, 10R, 10S) and a respective growth substrate 100 is bonded to a first carrier substrate 200. Thus, each growth substrate 100 can be bonded to a respective first carrier substrate 200 through the respective devices 10. In other words, the devices 10 are present between a growth substrate 100 and a first carrier substrate within each bonded structure (100, 10, 200). In an illustrative example, a first-type growth substrate 100B can be bonded to a first-type first carrier substrate 200B through first light emitting devices 10B, a second-type growth substrate 100G can be bonded to a second-type first carrier substrate 200G through second light emitting devices 10G, a third-type growth substrate 100R can be bonded to a third-type first carrier substrate 200R through third light emitting devices 10R, and a fourth-type growth substrate 100S can be bonded to a fourth-type first carrier substrate 200S through the sensor devices 10S.

Referring to FIG. 3, each growth substrate 100 can be removed from the transient bonded structure including the stack of the growth substrate 100, an array of devices 10, and the first carrier substrate 200. For example, if the growth substrate 100 is a silicon substrate, the growth substrate 100 can be removed by a wet chemical etch process, grinding, polishing, splitting (for example, at a hydrogen implanted layer), or a combination thereof. For example, splitting of a substrate can be performed by implanting atoms that form a weak region (such as hydrogen atoms implanted into a semiconductor material) and by applying a suitable processing conditions (for example, an anneal at an elevated temperature and/or mechanical force) to cause the substrate to split into two parts.

Figure 4:
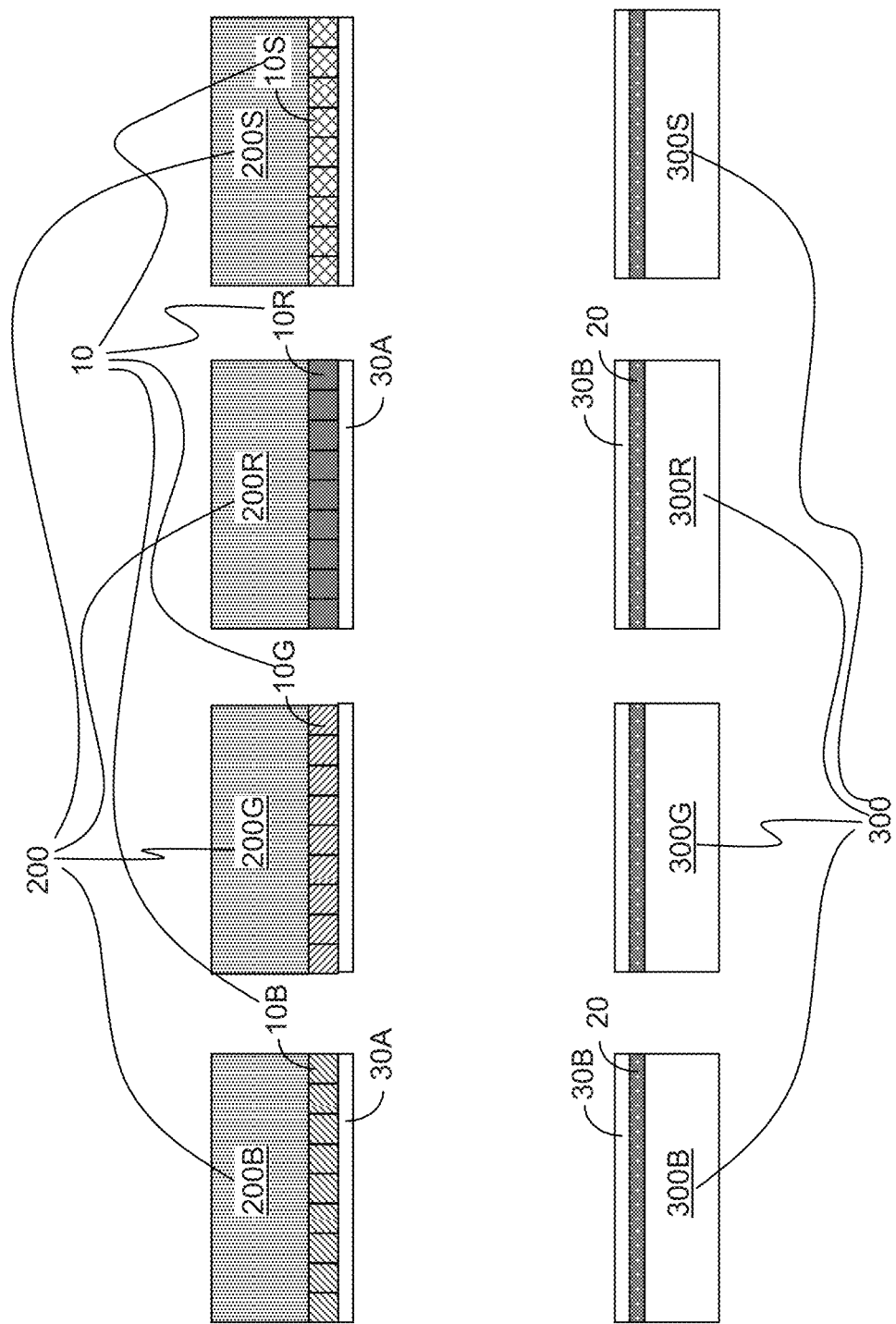
FIG. 4 is a schematic illustration of the step of forming a first bonding material layer on the first carrier substrates, providing second carrier substrate, and forming a release layer and a second bonding material layer according to an embodiment of the present disclosure.

Referring to FIG. 4, a first bonding material layer 30A can be formed on each first carrier substrate 200. The first bonding material layer 30A includes any bonding material that can be bonded to another bonding material upon suitable treatment (such as application of heat and/or pressure). In one embodiment, the first bonding material layer 30A can comprise a dielectric material such as silicon oxide, borophosphosilicate glass (BPSG), a spin-on glass (SOG) material, and/or an adhesive bonding material such as SU-8 or benzocyclobutene (BCB). The thickness of the first bonding material layer 30A can be in a range from 50 nm to 5 micron, although lesser and greater thicknesses can also be employed. In one embodiment, the first bonding material layer 30A can be a silicon oxide layer having a thickness of about 1 micron. The first bonding material layer 30A can be formed by a suitable deposition method such as chemical vapor deposition or spin coating.

Transfer substrates 300 are provided. As used herein, a "transfer substrate" refers to a substrate from which at least one device is transferred to a target substrate, which can comprise a backplane substrate. In one embodiment, each transfer substrate 300 can be a second carrier substrate, which can be employed to receive an array of devices from a respective first carrier substrate 200 and to carry the array of devices until a subset of the devices are transferred to the target substrate in a subsequent process.

In some embodiments, the transfer substrates 300 can be optically transparent at a laser wavelength. The laser wavelength is the wavelength of the laser beam to be subsequently employed to transfer devices individually and selectively from a respective transfer substrate 300 to the target substrate, and can be an ultraviolet wavelength, a visible wavelength, or an infrared wavelength. In one embodiment, the transparent substrates 300 can include sapphire, glass (silicon oxide), or other optically transparent material known in the art. In an alternative embodiment, the transfer substrates 300 can be transparent growth substrates or diced portions thereof. In some other embodiments in which initial growth substrates are cleaved (for example, at a layer implanted with hydrogen or noble gas) to provide a thin substrate from which light emitting diodes are transferred to a backplane without use of transfer substrates, the initial growth substrates may absorb laser at the laser wavelength.

A release layer 20 and a second bonding material layer 30B can be sequentially deposited on each transfer substrate 300. The release layer 20 includes a material that can provide sufficient adhesion to the transfer substrate 300 and is absorptive at the laser wavelength of the laser beam to be subsequently employed during a subsequent selective transfer process. For example, the release layer 20 can include silicon-rich silicon nitride or a semiconductor layer, such as a GaN layer that can be heated by laser irradiation. The thickness of the release layer 20 can be in a range from 100 nm to 1 micron, although lesser and greater thicknesses can also be employed.

The second bonding material layer 30B can comprise a dielectric material such as silicon oxide. The thickness of the second bonding material layer 30B can be in a range from 50 nm to 5 micron, although lesser and greater thicknesses can also be employed. In one embodiment, the second bonding material layer 30B can be a silicon oxide layer having a thickness of about 1 micron. The second bonding material layer 30B can be formed by a suitable deposition method such as chemical vapor deposition or spin coating.

A transfer substrate 300 can be provided for each first carrier substrate 200. For example, a first transfer substrate 300B can be provided for the first-type first carrier substrate 200B; a second transfer substrate 300G can be provided for the second-type first carrier substrate 200G; a third transfer substrate 300R can be provided for the third-type first carrier substrate 300R; and an additional transfer substrate 300S can be provided for the additional type first carrier substrate 300S. Multiple stacked structures can be formed, which include a first stacked structure (300B, 20, 30B) including a stack of the first transfer substrate 300B, a release layer 20, and a second bonding material layer 30B; a second stacked structure (300G, 20, 30B) including a stack of the second transfer substrate 300G, a release layer 20, and a second bonding material layer 30B; a third stacked structure (300R, 20, 30B) including a stack of the third transfer substrate 300R, a release layer 20, and a second bonding material layer 30B; and an additional stacked structure (300S, 20, 30B) including a stack of the additional transfer substrate 300S, a release layer 20, and a second bonding material layer 30B.

The combination of the array of first light emitting devices 10B and the first transfer substrate 300B is herein referred to as a first transfer assembly (300B, 10B), the combination of the second light emitting devices 10G and the second transfer substrate 300G is herein referred to as a second transfer assembly (300G, 10G), and the combination of the third light emitting devices 10R and the third transfer substrate 300R is herein referred to as a third transfer assembly (300R, 10R). In addition, the combination of the sensor devices 10S and the fourth transfer substrate 300S is herein referred to as fourth transfer assembly (300S, 10S).

Referring to FIG. 5, each pair of a first carrier substrate 200 and a transfer substrate 300 (which can be a second carrier substrate) can be bonded. For example, the second bonding material layer 30B can be bonded with the respective first bonding material layer 30A on the corresponding first carrier substrate 200 to form a bonding material layer 30. Each bonded assembly comprises a first transfer substrate 300, a release layer 20, a bonding material layer 30, and an array of devices 10.

Referring to FIG. 6, a first carrier substrate 200 is removed from each bonded assembly (300, 20, 30, 200), for example, by polishing, grinding, cleaving, and/or chemical etching. Each array of devices 20 can be disposed on a transfer substrate 300, which is a transparent carrier substrate with a release layer 20 thereupon, i.e., between the transparent carrier substrate and the array of devices 20.

Figure 7:
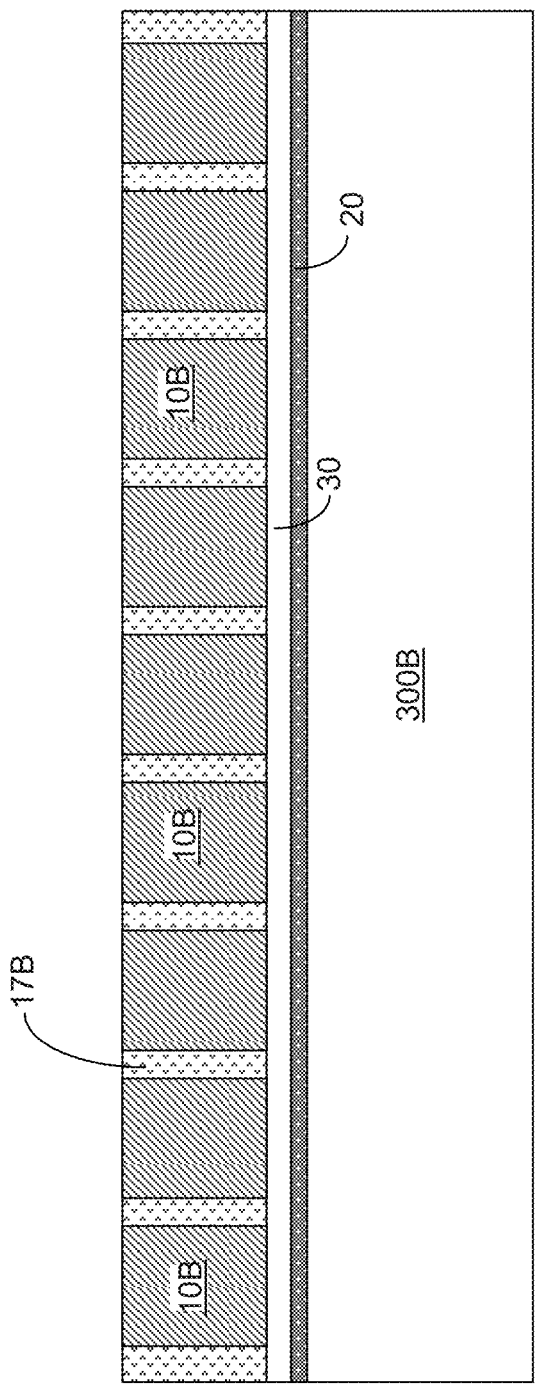
FIG. 7 is a vertical cross-sectional view of a second carrier substrate, an array of first light emitting devices thereupon, and an optional optical protection material layer that fills gaps among the first light emitting devices according to an embodiment of the present disclosure.

Referring to FIG. 7, each array of devices 10 on a respective transfer substrate 300 can be arranged such that each device 10 is laterally spaced from neighboring devices 10 by trenches. For example, the array of first light emitting devices 10B on the first transfer substrate 300B can be laterally spaced from one another by trenches. Optionally, a first optical protection material layer 17B can be applied to fill the gaps among the first light emitting devices 10B. Similarly, an optical protection material layer can be applied to fill the gaps among each array of devices 10 on other transfer substrates (300G, 300R, 300S). Each optical protection material layer comprises a material that absorbs or scatters light at the laser wavelength of the laser beam to be subsequently employed. Each optical protection material layer can include, for example, silicon-rich silicon nitride, an organic or inorganic antireflective coating (ARC) material, or a photoresist material. Each optical protection material layer can be formed such that the outside surfaces of the devices 10 are not covered by the optical protection material layer. The optical protection material layers can be formed, for example, by spin coating or by a combination of deposition and a recess etch.

Each assembly (300, 20, 30, 10) comprising a transfer substrate 300 and an array of devices 10 can further comprise a release layer 20 contacting the respective transfer substrate 300 and comprising a material that absorbs light at a wavelength selected from ultraviolet range, visible range, and infrared range, and a bonding material layer 30 contacting the release layer 20 and the respective array of devices 10.

Referring to FIG. 8, a backplane substrate 400 is provided. The backplane substrate 400 is a substrate onto which various devices can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid and active device circuits are not present. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprises one or more transistors.

Referring to FIG. 9, a backplane 401 including stepped horizontal surfaces is formed. As used herein, "stepped horizontal surfaces" refer to a set of horizontal surfaces that are vertically spaced apart and connected by steps. In one embodiment, the stepped horizontal surfaces can be formed by adding various dielectric material layers 410 and additional metal interconnect structures embedded in the additional dielectric material layers 410 to the backplane substrate 400. In one embodiment, the various dielectric material layers 410 can comprise a plurality of portions of an upper dielectric material layer 413 overlying the dielectric material matrix, a plurality of portions of an intermediate dielectric material layer 412 interposed between the upper dielectric material layer 413 and the dielectric material matrix, and a plurality of portions of a lower dielectric material layer 411 interposed between the intermediate dielectric material layer 412 and the dielectric matrix. Alternatively, surface portions of the backplane substrate 401 as provided at the processing step of FIG. 8 can be recessed to different depths to form the backplane 401 including stepped horizontal surfaces. The stepped horizontal surfaces can be provided at a top side of the backplane 401.

A first subset of the stepped horizontal surfaces can be located within a first horizontal surface plane HSP1, which is the horizontal plane containing the topmost horizontal surfaces of the backplane 401. A second subset of the stepped horizontal surfaces can be located within a second horizontal surface plane HSP2, which may be more proximal to a backside surface 409 of the backplane 401 than the first subset of stepped horizontal surfaces is to the backside surface 409 of the backplane 401. A third subset of the stepped horizontal surfaces can be located within a third horizontal surface plane HSP3, which may be more proximal to the backside surface 409 of the backplane 401 than the second subset of stepped horizontal surfaces is to the backside surface 409 of the backplane 401. An additional subset of the stepped horizontal surfaces can be located within an additional horizontal surface plane HSP4, which may be more proximal to the backside surface 409 of the backplane 401 than the third subset of stepped horizontal surfaces is to the backside surface 409 of the backplane 401. The first subset of the stepped horizontal surfaces can be formed in a first region R1, the second subset of the stepped horizontal surfaces can be formed in a second region R2, the third subset of the stepped horizontal surfaces can be formed in a third region R3, and the additional subset of the stepped horizontal surfaces can be formed in a fourth region R4. The first region R1 includes locations at which first type devices, such as first light emitting devices 10B, are to be subsequently attached. The second region R2 includes locations at which second type devices, such as second light emitting devices 10G, are to be subsequently attached. The third region R3 includes locations at which third type devices, such as third light emitting devices 10R, are to be subsequently attached. The fourth region R4 includes locations at which fourth type devices, such as sensor devices 10S, are to be subsequently attached.

In one embodiment, horizontal top surfaces of the upper dielectric material layer 413 can constitute the first subset of the stepped horizontal surfaces, horizontal top surfaces of the intermediate dielectric material layer 412 can constitute the second subset of the stepped horizontal surfaces, horizontal top surfaces of the lower dielectric material layer 411 can constitute the third subset of the stepped horizontal surfaces, and physically exposed surfaces of the backplane substrate 400 can constitute the fourth subset of the stepped horizontal surfaces.

A bond pad 420 can be provided d at each location at which a device is to be subsequently bonded. For example, the bond pads 420 can be formed at each intersection of the criss-cross lines of the metal interconnect structures 440 in the backplane 401. The bond pads 420 cam comprise metallic pads including a metallic material such as Sn, AuSn, SAC, or other solderable metal. Additionally or alternatively, the bond pads 420 can comprise Cu or Au or other metal that can, through a thermocompression process, form a contact with another metal. The bond pads 420 can be embedded within the backplane 401 as components of the metal interconnect structures 440, or can be formed on top of dielectric surfaces of the backplane 401.

In one embodiment, the center-to-center spacing of bond pads 420 on the backplane 401 can be an integer multiple of the center-to-center spacing of the devices 10 on a respective growth substrate 100, on a respective first carrier substrate 200, or on a respective transfer substrate 300.

In one embodiment, the backplane 401 can comprise metal interconnect structures 440 embedded within a dielectric material matrix. The bond pads 420 are electrically connected to a respective metal interconnect structure 440 within the backplane 440. As used herein, a first element is "electrically connected to" a second element if the first element is electrically shorted to the second element.

In one embodiment, the bond pads 420 on the backplane 401 can be configured to align with contact pads on the devices 10 (such as light emitting devices). One or more bond pads 401 may be provided in a group. For example, if a device 10 to be transferred to the backplane 401 comprises a plurality of red, green, and blue light emitting diodes (LEDs), there may be a group of four bond pads 420 arranged in alignment with contact pads on the LED. For example, the group of bond pads 410 can include an anode contact for the red LED, an anode contact for the blue LED, an anode contact for the green LED, and a cathode contact. For example, if a device 10 to be transferred to the backplane 401 comprises a single LED, there may be a group of two bond pads 420 arranged in alignment with contact pads on the LED.

Referring to FIG. 10, a protective layer 422 including an optical protection material can be optionally formed on the side of the backplane 401. The protective layer 422 includes a material that absorbs or scatters light at the laser wavelength of the laser beam to be subsequently employed. In one embodiment, the protective layer 422 can include a dielectric material such as silicon-rich silicon nitride or an antireflective coating material. The thickness of the protective layer 422 can be in a range from 200 nm to 2 microns, although lesser and greater thicknesses can also be employed. The protective layer 422 can be formed such that conductive bonding structures (i.e., contact structures) to be subsequently formed can contact the bond pads 420. Suitable openings can be formed in the protective layer 422. In one embodiment, all openings in the protective layer 422 can be formed in the same patterning step. In another embodiment, the opening in the protective layer 422 can be sequentially formed, for example, immediately before formation of each set of conductive bonding structures.

Referring to FIG. 11, conductive bonding structures (430B, 430G, 430R, 430S) can be formed on the horizontal stepped surfaces located on the top side of the backplane 401. The conductive bonding structures 430 can include first conductive bonding structures 430B that are formed on the first subset of horizontal stepped surfaces in the first region R1, second conductive bonding structures 430G that are formed on the second subset of horizontal stepped surfaces in the second region R2, third conductive bonding structures 430R that are formed on the third subset of horizontal stepped surfaces in the third region R3, and additional conductive bonding structures 430S that are formed on the fourth subset of horizontal stepped surfaces in the fourth region R1.

The first conductive bonding structures 430B are formed at locations at which transfer of first light emitting devices 10B is desired. The second conductive bonding structures 430G are formed at locations at which transfer of second light emitting devices 10G is desired. The third conductive bonding structures 430R are present at locations at which transfer of third light emitting devices 10R is desired. The additional conductive bonding structures 430S are present at locations at which transfer of sensor devices 10S is desired.

In one embodiment, each of the conductive bonding structures 430 can comprise a metal stack that can bond with the bond pads 420 provided on the backplane 401. In one embodiment, the conductive bonding structures 430 can comprise copper and/or gold, and the bonding pads can be formed of Sn. In one embodiment, the conductive bonding structures 430 can comprise a layer of Au, and the bond pads 420 can be formed of AuSn or an Sn—Ag—Cu alloy. In another embodiment, the conductive bonding structures 430 can be formed of copper, and the bond pads can be formed of copper. The conductive bonding structures 430 are electrically connected to a respective the metal interconnect structure 440 within the backplane 401. In general, various conductive bonding structures that can be employed for the purposes of the present disclosure can include (1) a lower conductive material (such as copper or aluminum that is electrically attached to the circuitry of the backplane), (2) one or more thin layers for adhesion, which covers the lower conductive material and provides a diffusion barrier (such as a TiPt layer), and (3) a solderable material (such as pure tin or indium, or alloys such as AuSn or SAC).

In one embodiment, the conductive bonding structures 430 can be employed to electrically and mechanically join various devices to be transferred to the backplane 401. The various devices can include light emitting diode (LED) subpixels, sensor pixels, and other electronic elements. Additional contacts can be formed on other horizontal surfaces of the set of stepped horizontal surfaces at this step, or can be formed at subsequent processing steps.

The various conductive bonding structures (which include the conductive bonding structures 430) may be formed on multiple horizontal planes that are vertically offset. For example, for a three-color RGB display panel comprising sensors, the various conductive bonding structures can be arranged in four different horizontal planes. In an illustrative example, the conductive bonding structures of the blue subpixels in the display panel can be located on a first plane such as the first horizontal surface plane HSP1 containing the first subset of the stepped horizontal surfaces. The various conductive bonding structures for all of the green subpixels can be located on a second plane such as the second horizontal surface plane HSP2 containing the second subset of the stepped horizontal surfaces. The second plane can be a certain distance, for example, 2 micron, lower than the first plane. The various conductive bonding structures for all of the red subpixels can be located on a third plane such as the third horizontal surface plane HSP3 containing the third subset of the stepped horizontal surfaces. The third plane can be, for example, 4 micron lower than the first contact plane. The conductive bonding structures for all of the sensor subpixels can be formed on a fourth plane such as the additional horizontal surface plane HSP1 containing the additional subset of the stepped horizontal surfaces. The fourth plane can be, for example, 6 microns lower than the first contact plane. A display panel with a greater number of colors than three colors, such as a four-color display panel or a five-color display panel, can be formed in the same manner. One of the advantage a display panel with more than three colors is that such a display panel can be less sensitive to non-uniform or dead pixels.

Each of the second conductive bonding structures 430G can have the same material stack (or the same material composition) as any embodiment of the first conductive bonding structures 430B. The second conductive bonding structures 430G are electrically connected to a respective the metal interconnect structure 440 within the backplane 401. In one embodiment, the second conductive bonding structures 430G can be employed to electrically and mechanically join various devices to be transferred to the backplane 401. In one embodiment, the second conductive bonding structures 430G can have a greater height than the first conductive bonding structures 430B. In other words, the first conductive bonding structures 430B can have a lesser height than the second conductive bonding structures 430G.

Each of the third conductive bonding structures 430R can have the same material stack (or the same material composition) as any embodiment of the first conductive bonding structures 430B or the second conductive bonding structures 430G. The third conductive bonding structures 430R are electrically connected to a respective the metal interconnect structure 440 within the backplane 401. In one embodiment, the third conductive bonding structures 430R can be employed to electrically and mechanically join various devices to be transferred to the backplane 401. In one embodiment, the third conductive bonding structures 430R can have a greater height than the second conductive bonding structures 430G. In other words, the second conductive bonding structures 430G can have a lesser height than the third conductive bonding structures 430R.

Each of the additional conductive bonding structures 430S can have the same material stack (or the same material composition) as any embodiment of the first conductive bonding structures 430B or the second conductive bonding structures 430G or the third conductive bonding structures 430R. The additional conductive bonding structures 430S are electrically connected to a respective the metal interconnect structure 440 within the backplane 401. In one embodiment, the additional conductive bonding structures 430S can be employed to electrically and mechanically join various devices to be transferred to the backplane 401. In one embodiment, the additional conductive bonding structures 430S can have a greater height than the third conductive bonding structures 430R. In other words, the third conductive bonding structures 430R can have a lesser height than the additional conductive bonding structures 430S.

Figure 12:
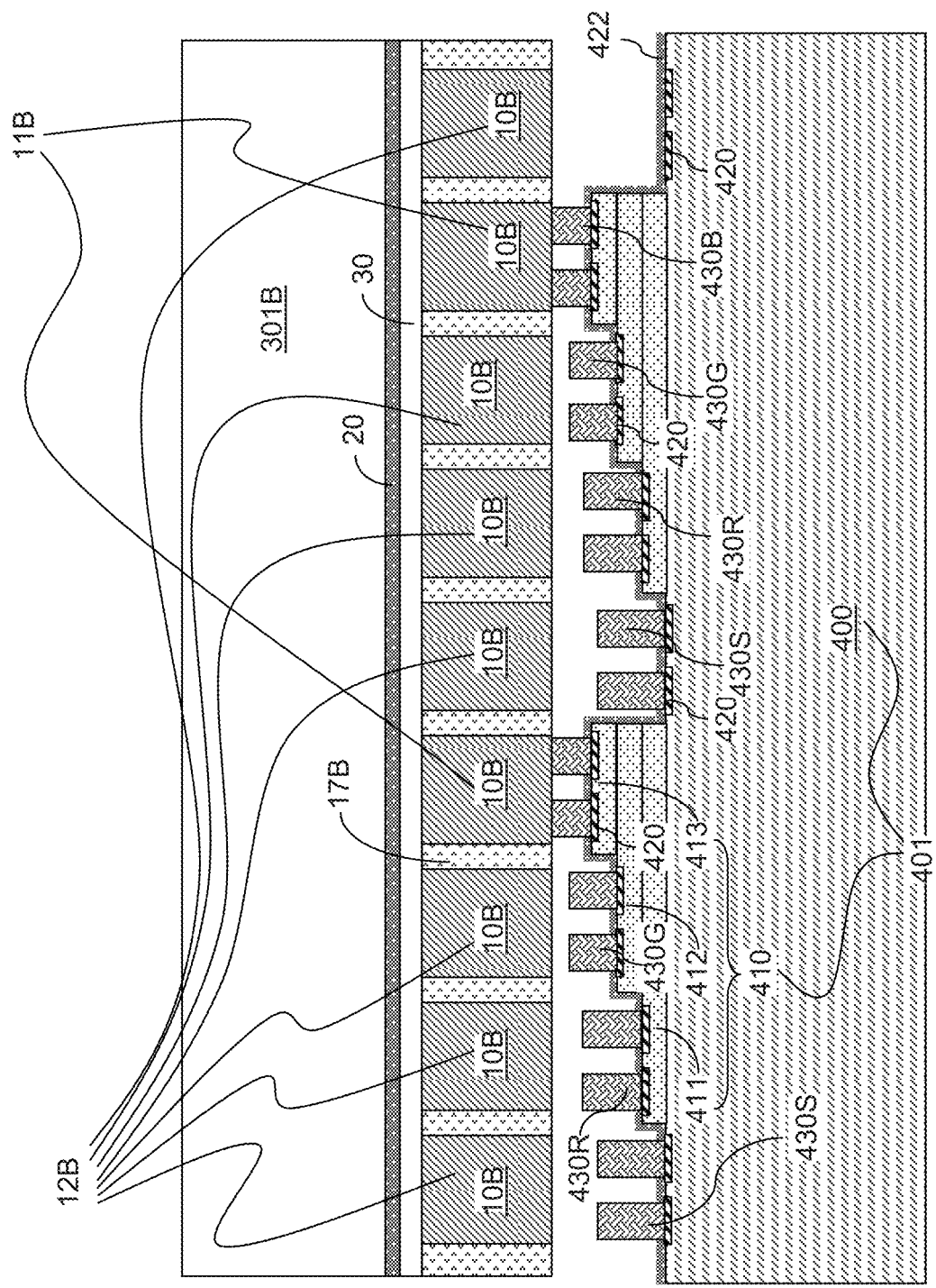
FIG. 12 is a vertical cross-sectional view of the backplane while bonding a first subset of the first light emitting devices on a first transfer substrate to the first conductive bonding structures on a first subset of horizontal stepped surfaces of the backplane according to an embodiment of the present disclosure.

Referring to FIG. 12, an assembly comprising a first transfer substrate 301B and first light emitting devices 10B that emits light of a first wavelength is disposed on the backplane 401 so that a first subset 11B of the first light emitting devices 10B contacts the first conductive bonding structures 430B and a second subset 12B of the first light emitting devices 10B does not contact any conductive bonding structure. The assembly comprising the first transfer substrate 301B and the first light emitting devices 10B is aligned to the backplane 401 so that the contact pads (not shown) of the first subset 11B of the first light emitting devices 10B contact respective first conductive bonding structures 430B. Specifically, the array of the first light emitting devices 10B can be aligned over the backplane 401 such that each bond pad 420 and a corresponding contact pad of an overlying first light emitting device 10B contact the first conductive bonding structure 430B located therebetween.

The first subset 11B of the first light emitting devices 10B on the first transfer substrate 301B is bonded to the first conductive bonding structures 430B, which are located on the first subset of horizontal stepped surfaces of the backplane 401. In one embodiment, the bond pads 420 can be solderable bond pad, and a heat cycle can be applied to the backplane 401 and the first transfer substrate 301B such that a solder material reflows and the bond pads 420 are attached to the first conductive bonding structures 430B. In one embodiment, the bond pads 420 can be cold bonding bond pad, and the first conductive bonding structures 430B can be metal stud bumps such as Cu stud bumps. In this case, a mechanical force is applied such that each bond pad 420 and a corresponding first conductive bonding structure 430B mate with each other. Optionally, the first transfer substrate 301B can be thinned to a thickness less than 100 microns prior to alignment with the backplane 401.

Figure 13:
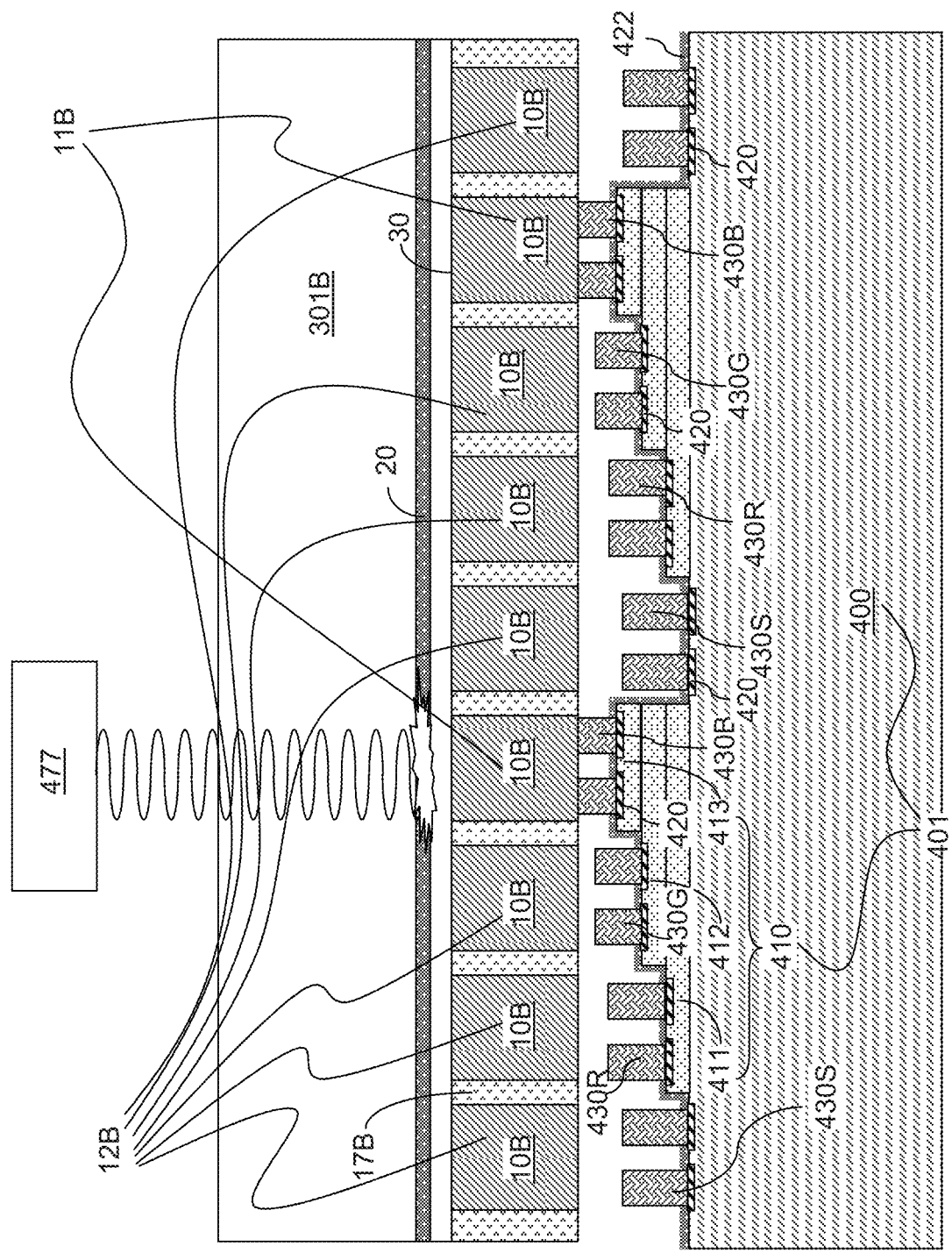
FIG. 13 is a vertical cross-sectional view of the backplane and the first transfer substrate while detaching a light emitting device among the first subset of the first light emitting devices employing laser irradiation and ablation of a portion of the release layer in the first transfer substrate according to an embodiment of the present disclosure.

Referring to FIG. 13, each first light emitting device 10B that is bonded to the first conductive bonding structures 430B can be dissociated from the first transfer substrate 301B individually, while first light emitting devices 10B that are not bonded to the first conductive bonding structures 430B remain intact, i.e., are not detached. The set of the first light emitting devices 10B that are bonded to the first conductive bonding structures 430B is the first subset 11B of the first light emitting devices 10B, and the set of first light emitting devices 10B that are not bonded to the first conductive bonding structures 430B is the second subset 12B of the first light emitting devices 10B. Each first light emitting device 10B among the first subset 11B of the first light emitting devices 10B can be detached employing targeted laser irradiation emitted by a laser 477. The material of the release layer 20 is selected such that the laser beam is absorbed by the release layer 20. The size of the laser beam, or the size of the raster area of the laser beam if the laser beam is rastered, can be selected to substantially match the area of a single first light emitting device 10B. The first optical protection material layer 17B, if present, can absorb or reflect the portion of the laser beam that collaterally impinges thereupon. In one embodiment, the irradiated portion of the release layer 20 can be ablated. Further, a portion of the bonding material layer 30 that underlies the ablated portion of the release layer 20 can be collaterally ablated or structurally damaged during the laser irradiation.

Each portion of the release layer 20 that overlies the first subset 11B of the first light emitting devices 10B is irradiated by the laser beam sequentially, i.e., one at a time. The portions of the release layer 20 that are irradiated by the laser beam are collectively referred to as first portions of the release layer 20, while the portions of the release layer 20 that are not irradiated by the laser beam are collectively referred to as second portions of the release layer 20. The first portions of the release layer 20 that overlies the first subset 11B of the first light emitting devices 10B are selectively and sequentially removed, while the second portions of the release layer 20 that overlie the second subset 12B of the first light emitting devices 10B are not removed. The first transfer substrate 301B comprises a material that is optically transparent at the laser wavelength.

In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20. The process of selectively removing the first portions of the release layer 20 while not removing the second portions of the release layer 20 is herein referred to as an area-selective laser lift-off process or a die-selective laser lift-off process. The size of the area of laser irradiation (i.e., the shot size) of the laser beam can be selected such that the area of the laser irradiation is slightly greater than the area of each first light emitting device 10B (or a plurality of first light emitting devices in case multiple first light emitting devices 10B are transferred at the same time). Only the first subset 11B of first light emitting devices 10B, i.e., the subset of the first light emitting devices 10B (or groups of first light emitting devices 10B) which have their respective conductive contact structures 430B bonded to the underlying bond pads 420, is processed by the selective laser lift-off process. The laser beam is steered away from the second subset 12B of the first light emitting devices 10B that are not bonded to the backplane 401.

Figure 14:
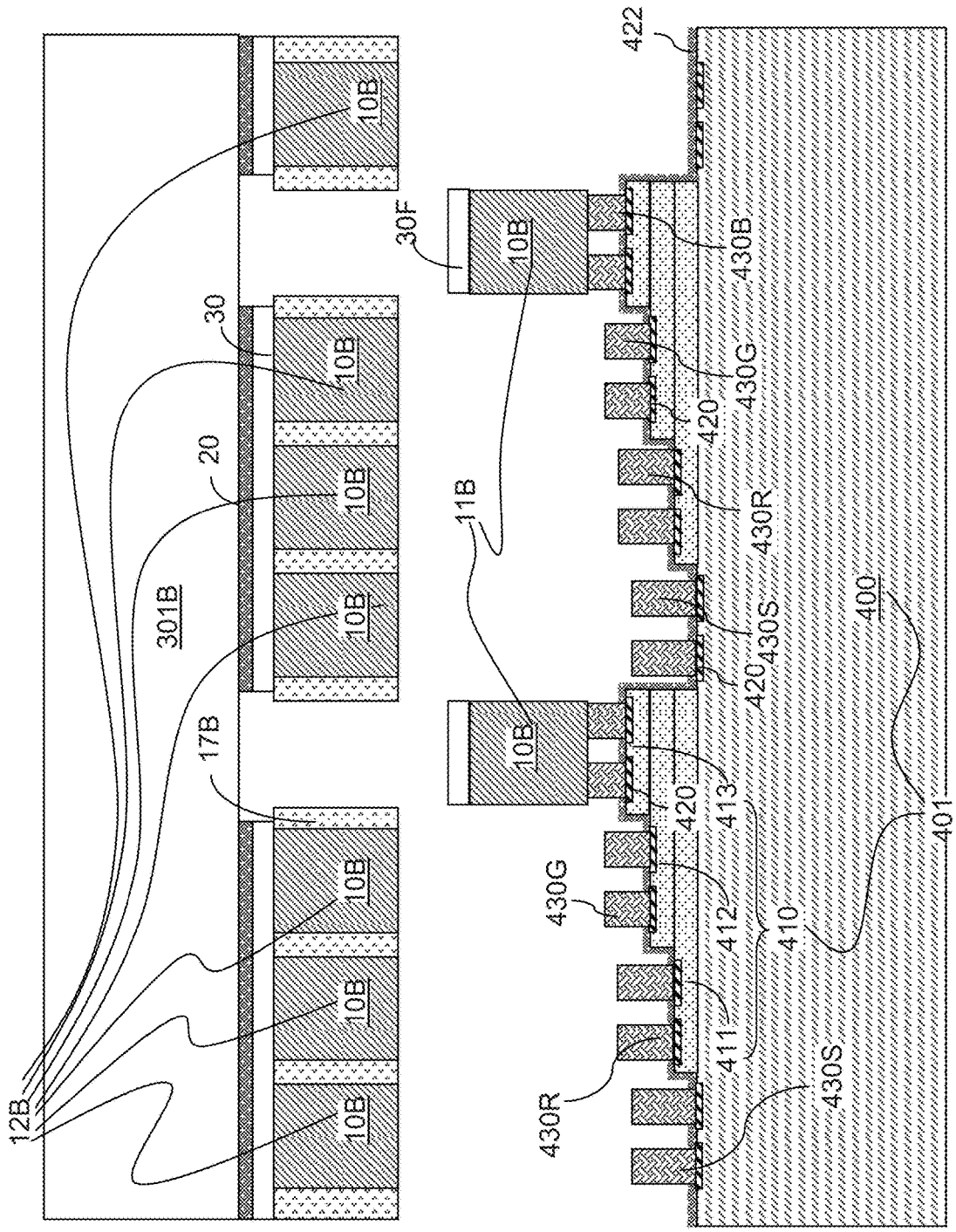
FIG. 14 is a vertical cross-sectional view of the backplane after separating the first transfer substrate according to an embodiment of the present disclosure.

Referring to FIG. 14, after all first portions of the release layer 20 overlying the first subset 11B of first light emitting devices 10B are removed, the first transfer substrate 301B can be separated from the backplane 401 by pulling the first transfer substrate 301B and/or the backplane 401 from each other. In one embodiment, a remnant portion 30F of the bonding material layer 30 can be formed on at least one of the first subset 11B of the first light emitting devices 10B after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying first light emitting device 10B. If any portion of the bonding material layer 30 remains underneath the irradiated portions of the release layer 20, the periphery of such a portion can be fractured while the assembly comprising the first transfer substrate 301B and the second subset 12B of the first light emitting devices 10B is separated from the backplane 401. The separation of the assembly comprising the first transfer substrate 301B and the second subset 12B of the first light emitting devices 10B from the backplane 401 can be performed while the first subset 11B of the first light emitting devices 10B remains bonded to the first conductive bonding structures 430B.

The second subset 12B of the first light emitting devices 10B can be employed to subsequently transfer another subset of the first light emitting devices 10B to another backplane (not shown). The second light emitting devices 10G on the second transfer substrate 300G (See FIG. 6) can be similarly employed to transfer a subset of the second light emitting devices 10G to yet another backplane (not shown). The third light emitting devices 10R on the third transfer substrate 300R (See FIG. 6) can be similarly employed to transfer a subset of the third light emitting devices 10R to still another backplane (not shown). The sensor devices 10S on the additional transfer substrate 300S (See FIG. 6) can be similarly employed to transfer a subset of the sensor devices 10S to even another backplane (not shown).

Optionally, a wet chemical clean process can be performed to remove residual material from the backplane 401 and the first subset 11B of first light emitting devices 10B thereupon. For example, dilute hydrofluoric acid can be employed to remove residual material from the surfaces of the backplane 401 and the first subset 11B of first light emitting devices 10B.

Figure 15:
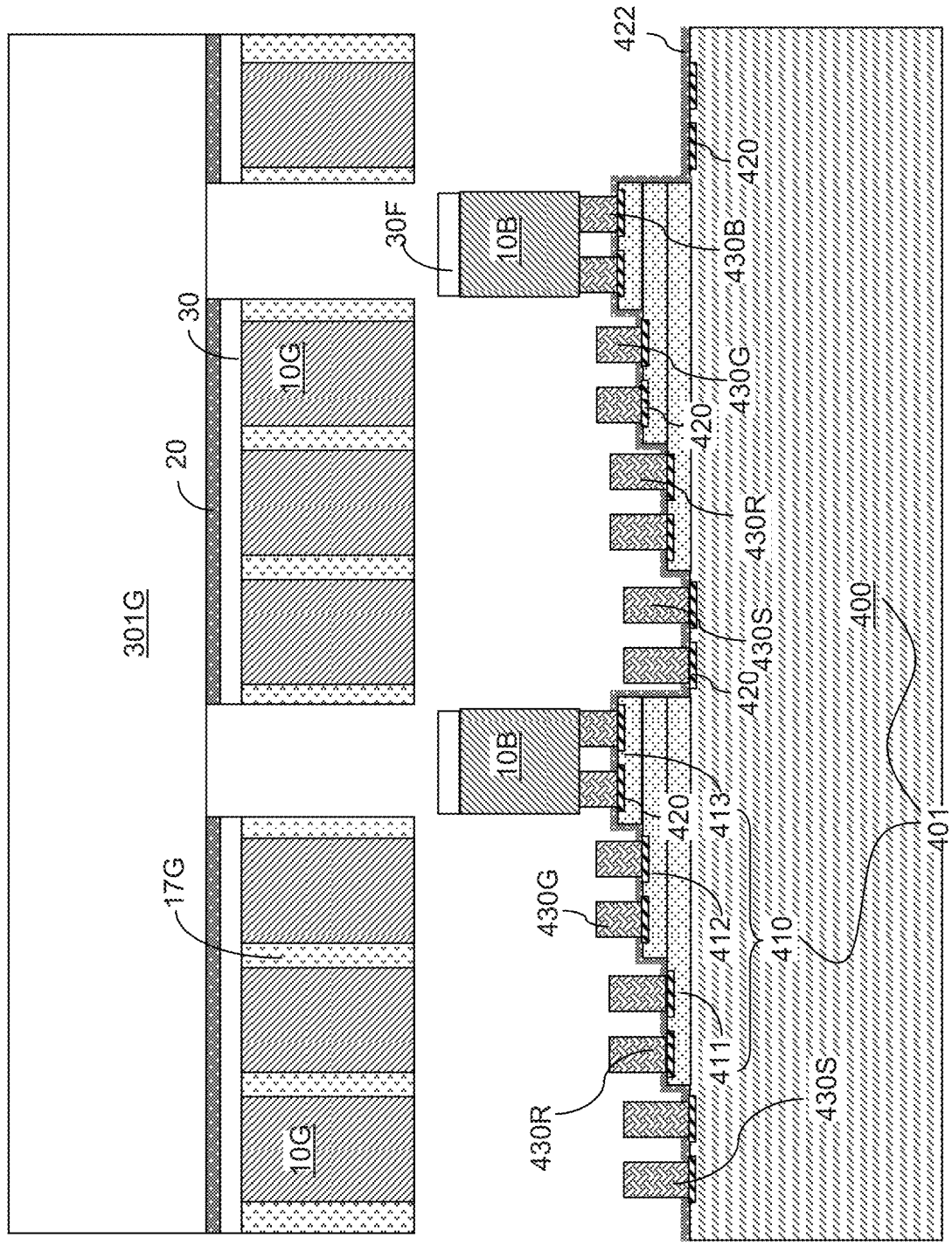
FIG. 15 is a vertical cross-sectional view of the backplane after aligning a second transfer substrate with second light emitting devices thereupon according to an embodiment of the present disclosure.
Figure 16:
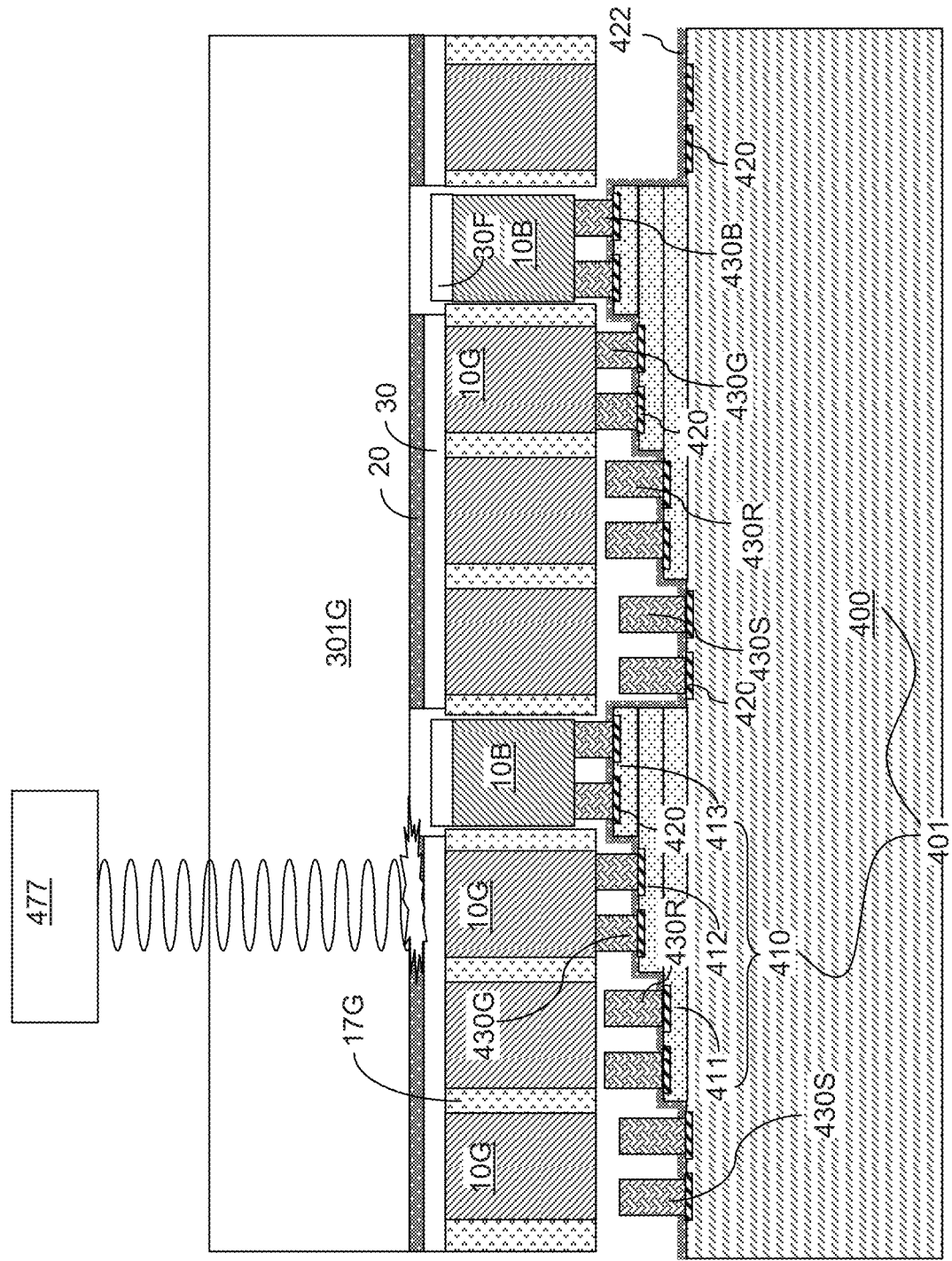
FIG. 16 is a vertical cross-sectional view of the backplane and the second transfer substrate while detaching a light emitting device among a first subset of the second light emitting devices employing laser irradiation and ablation of a portion of the release layer in the second transfer substrate according to an embodiment of the present disclosure.

Referring to FIG. 15, an assembly comprising a second transfer substrate 301G and second light emitting devices 10G that emits light of a second wavelength is provided. The second wavelength is different from the first wavelength. For example, the first wavelength can be a wavelength of blue light, and the second wavelength can be a wavelength of green light. The second light emitting devices 10G are not present in positions that correspond to positions over the backplane 401 at which the first subset of the first light emitting devices 10B is present in a configuration in which the second light emitting devices 10G face the top side of the backplane 401. In other words, the second light emitting devices 10G are not present in areas that overlap with the areas of the first subset of the first light emitting devices 10B in a configuration in which the second light emitting devices 10G face downward and the first subset of the first light emitting devices 10B on the backplane 401 face upward. In one embodiment, any second light emitting device 10G located in positions that would overlap with preexisting first devices 10B on the backplane 401 can be removed from the second transfer substrate 301G before the second transfer substrate 301G is aligned with the backplane 401 for transfer of a subset of the second light emitting devices 10G.

Optionally, a second optical protection material layer 17G can be applied to fill the gaps among the second light emitting devices 10G prior to removal of a subset of the second light emitting devices 10G from overlapping locations. The second optical protection material layer 17G can have the same composition as the first optical protection material layer 17B. By ensuring that the second light emitting devices 10G are not present in positions that correspond to positions over the backplane 401 at which the first subset of the first light emitting devices 10B is present, potential collision between second light emitting devices 10G and the first subset of the first light emitting devices 10B can be avoided when the second transfer substrate 301G is subsequently disposed on the backplane 401 to bond a subset of the second light emitting devices 10G.

After aligning the assembly of the second transfer substrate 301G and the second light emitting devices 10G to the backplane 401, the assembly of the second transfer substrate 301G and the second light emitting devices 10G is disposed on the backplane 401 so that a first subset of the second light emitting devices 10G contacts the second conductive bonding structures 430G and a second subset of the second light emitting devices 10G does not contact any conductive bonding structure. The contact pads (not shown) of the first subset of the second light emitting devices 10G contact respective second conductive bonding structures 430G. Specifically, the array of the second light emitting devices 10G can be aligned over the backplane 401 such that each bond pad 420 and a corresponding contact pad of an overlying second light emitting device 10G contact the second conductive bonding structure 430G located therebetween.

The second conductive bonding structures 430G are present at locations at which transfer of second light emitting devices 10G is desired. The first subset of the second light emitting devices 10G on the second transfer substrate 301G is bonded to the second conductive bonding structures 430G, which are located on the second subset of horizontal stepped surfaces of the backplane 401. Each pair of a bond pad 420 and an overlying contact pads on the first subset of the second light emitting devices 10G can be bonded through a respective second conductive bonding structures 430G employing any of the bonding methods described above, i.e., the bonding methods that can be employed to bond pairs of a bond pad 420 and an overlying contact pads on the first subset of the first light emitting devices 10B through a respective first conductive bonding structures 430B.

Subsequently, each second light emitting device 10G that is bonded to the second conductive bonding structures 430G can be dissociated from the second transfer substrate 301G individually, while second light emitting devices 10G that are not bonded to the second conductive bonding structures 430G remain intact, i.e., are not detached. The set of the second light emitting devices 10G that are bonded to the second conductive bonding structures 430G is the first subset of the second light emitting devices 10G, and the set of second light emitting devices 10G that are not bonded to the second conductive bonding structures 430G is the second subset of the second light emitting devices 10G. Each second light emitting device 10G among the first subset of the second light emitting devices 10G can be detached employing targeted laser irradiation emitted by a laser 477 in the same manner employed to detach the first subset of the first light emitting devices 10B in a prior processing step. Thus, the first portions of the release layer 20 that overlies the first subset of the second light emitting devices 10G are selectively and sequentially removed, while the second portions of the release layer 20 that overlie the second subset of the second light emitting devices 10G are not removed. The second transfer substrate 301G comprises a material that is optically transparent at the laser wavelength. In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20.

Figure 17:
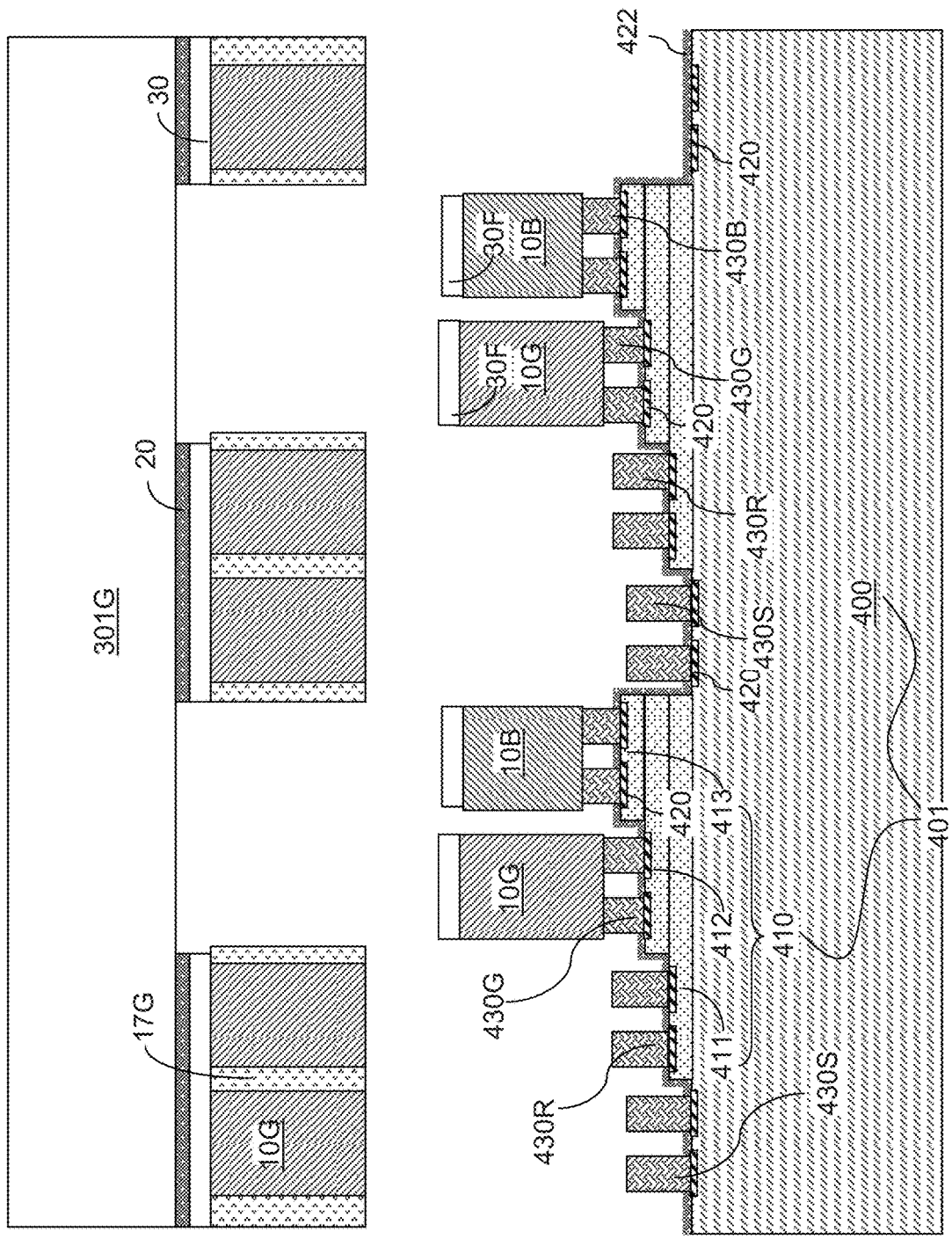
FIG. 17 is a vertical cross-sectional view of the backplane after separating the second transfer substrate according to an embodiment of the present disclosure.

Referring to FIG. 17, after all first portions of the release layer 20 overlying the first subset of the second light emitting devices 10G are removed, the second transfer substrate 301G can be separated from the backplane 401 by pulling the second transfer substrate 301G and/or the backplane 401 from each other. In one embodiment, a remnant portion 30F of the bonding material layer 30 can be formed on at least one of the first subset of the second light emitting devices 10G after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying second light emitting device 10G. If any portion of the bonding material layer 30 remains underneath the irradiated portions of the release layer 20, the periphery of such a portion can be fractured while the assembly comprising the second transfer substrate 301G and the second subset of the second light emitting devices 10G is separated from the backplane 401. The separation of the assembly comprising the second transfer substrate 301G and the second subset of the second light emitting devices 10G from the backplane 401 can be performed while the first subset of the second light emitting devices 10G remains bonded to the second conductive bonding structures 430G.

The second subset of the second light emitting devices 10G can be employed to subsequently transfer another subset of the second light emitting devices 10G to another backplane (not shown). Optionally, a wet chemical clean process can be performed to remove residual material from the backplane 401 and the first subset of the first light emitting devices 10B and the first subset of the second light emitting devices 10G. For example, dilute hydrofluoric acid can be employed to remove residual material from the surfaces of the backplane 401, the first subset of the first light emitting devices 10B, and the first subset of the second light emitting devices 10G.

Figure 18:
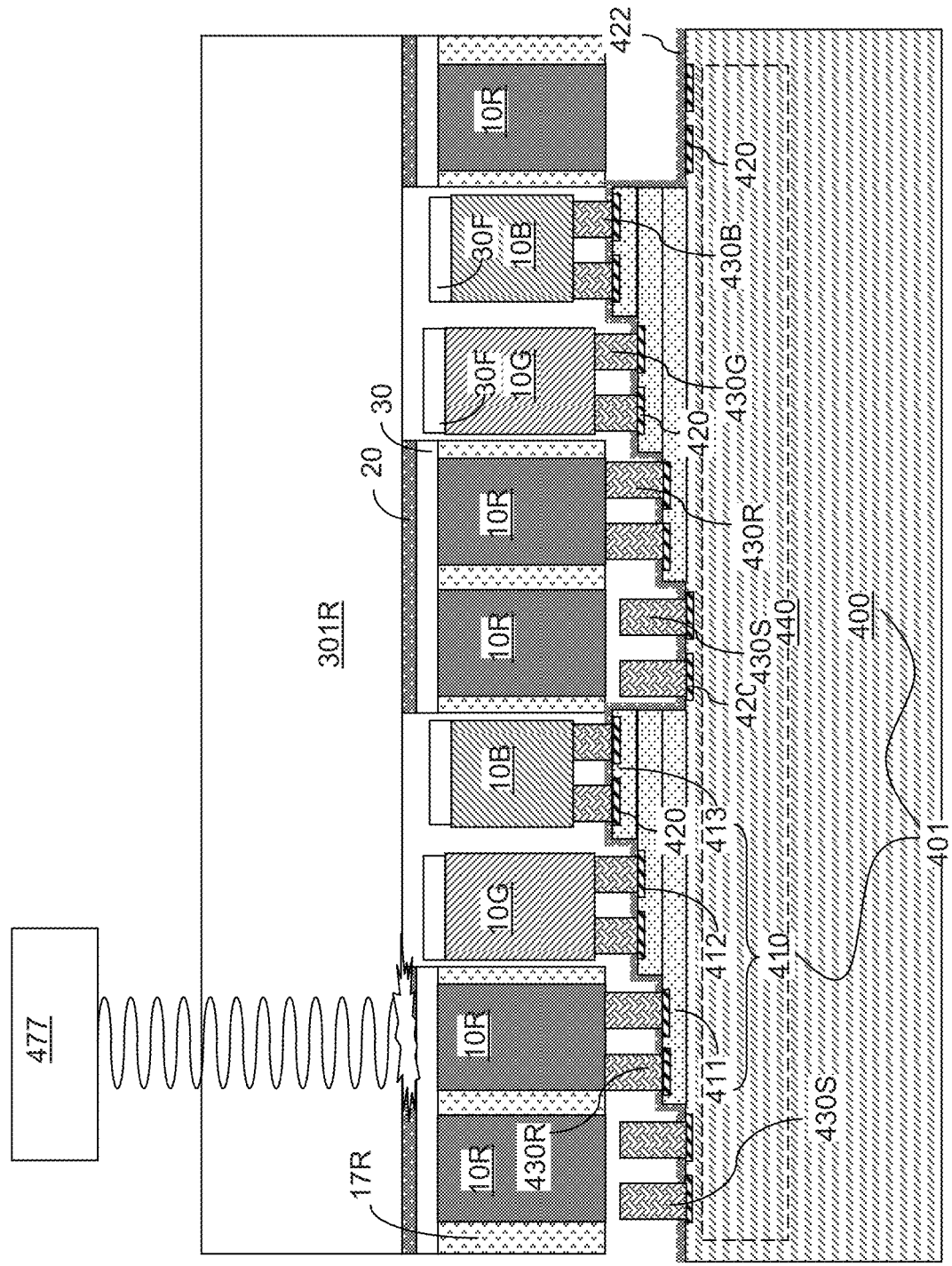
FIG. 18 is a vertical cross-sectional view of the backplane and a third transfer substrate while detaching a light emitting device among a first subset of third light emitting devices employing laser irradiation and ablation of a portion of the release layer in the third transfer substrate according to an embodiment of the present disclosure.

Referring to FIG. 18, an assembly comprising a third transfer substrate 301R and third light emitting devices 10R that emits light of a third wavelength is provided. The third wavelength is different from the first wavelength and the second wavelength. For example, the first wavelength can be a wavelength of blue light, the second wavelength can be a wavelength of green light, and the third wavelength can be a wavelength of red light. The third light emitting devices 10R are not present in positions that correspond to positions over the backplane 401 at which the first subset of the first light emitting devices 10B or the first subset of the second light emitting devices 10G is present in a configuration in which the third light emitting devices 10R face the top side of the backplane 401. In other words, the third light emitting devices 10R are not present in areas that overlap with the areas of the first subset of the first light emitting devices 10B or the first subset of the second light emitting devices 10G in a configuration in which the third light emitting devices 10R face downward and the first subset of the first light emitting devices 10B and the first subset of the second light emitting devices 10G on the backplane 401 face upward.

In one embodiment, any third light emitting device 10R located in positions that would overlap with preexisting devices (10B, 10G) on the backplane 401 can be removed from the third transfer substrate 301R before the third transfer substrate 301R is aligned with the backplane 401 for transfer of a subset of the third light emitting devices 10R. Optionally, a third optical protection material layer 17R can be applied to fill the gaps among the third light emitting devices 10R prior to removal of a subset of the third light emitting devices 10R from overlapping locations. The third optical protection material layer 17R can have the same composition as the first optical protection material layer 17B. By ensuring that the third light emitting devices 10R are not present in positions that correspond to positions over the backplane 401 at which the first subset of the first light emitting devices 10B and the first subset of the second light emitting devices 10G are present, potential collision between the third light emitting devices 10R and the first subset of the first light emitting devices 10B or between the third light emitting devices 10R and the first subset of the second light emitting devices 10G can be avoided when the third transfer substrate 301R is subsequently disposed on the backplane 401 to bond a subset of the third light emitting devices 10R.

After aligning the assembly of the third transfer substrate 301R and the third light emitting devices 10R to the backplane 401, the assembly of the third transfer substrate 301R and the third light emitting devices 10R is disposed on the backplane 401 so that a first subset of the third light emitting devices 10R contacts the third conductive bonding structures 430R and a second subset of the third light emitting devices 10R does not contact any conductive bonding structure. The contact pads (not shown) of the first subset of the third light emitting devices 10R contact respective third conductive bonding structures 430R. Specifically, the array of the third light emitting devices 10R can be aligned over the backplane 401 such that each bond pad 420 and a corresponding contact pad of an overlying third light emitting device 10R contact the third conductive bonding structure 430R located therebetween.

The third conductive bonding structures 430R are present only at locations at which transfer of third light emitting devices 10R is desired. The first subset of the third light emitting devices 10R on the third transfer substrate 301R is bonded to the third conductive bonding structures 430R, which are located on the third subset of horizontal stepped surfaces of the backplane 401. Each pair of a bond pad 420 and an overlying contact pads on the first subset of the third light emitting devices 10R can be bonded through a respective third conductive bonding structures 430R employing any of the bonding methods described above, i.e., the bonding methods that can be employed to bond pairs of a bond pad 420 and an overlying contact pads on the first subset of the first light emitting devices 10B through a respective first conductive bonding structures 430B.

Subsequently, each third light emitting device 10R that is bonded to the third conductive bonding structures 430R can be dissociated from the third transfer substrate 301R individually, while third light emitting devices 10R that are not bonded to the third conductive bonding structures 430R remain intact, i.e., are not detached. The set of the third light emitting devices 10R that are bonded to the third conductive bonding structures 430R is the first subset of the third light emitting devices 10R, and the set of third light emitting devices 10R that are not bonded to the second conductive bonding structures 430R is the second subset of the third light emitting devices 10R. Each third light emitting device 10R among the first subset of the third light emitting devices 10R can be detached employing targeted laser irradiation emitted by a laser 477 in the same manner employed to detach the first subset of the first light emitting devices 10B in a prior processing step. Thus, the first portions of the release layer 20 that overlies the first subset of the third light emitting devices 10R are selectively and sequentially removed, while the second portions of the release layer 20 that overlie the second subset of the third light emitting devices 10R are not removed. The third transfer substrate 301R comprises a material that is optically transparent at the laser wavelength. In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20.

Figure 19:
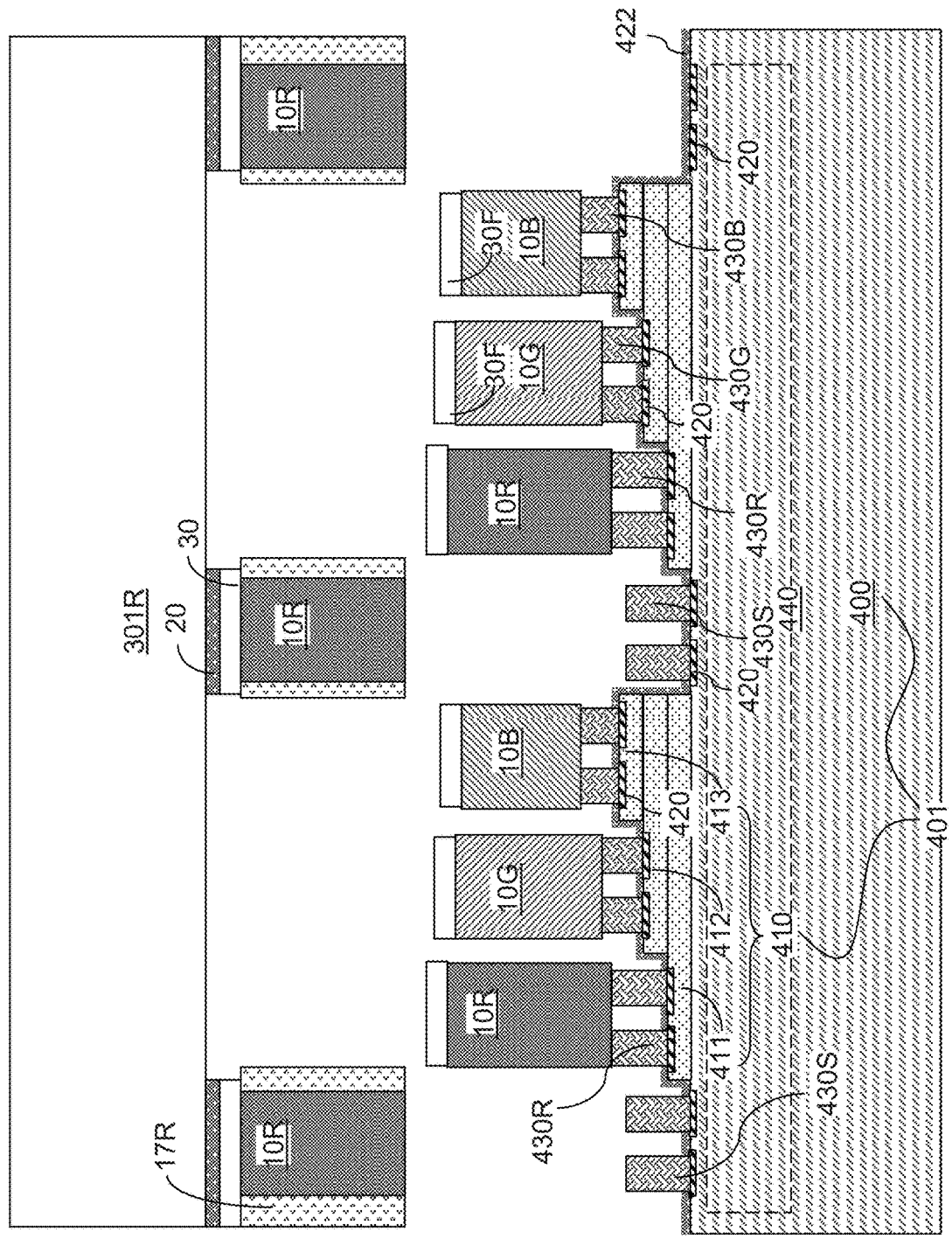
FIG. 19 is a vertical cross-sectional view of the backplane after separating the third transfer substrate according to an embodiment of the present disclosure.

Referring to FIG. 19, after all first portions of the release layer 20 overlying the first subset of the third light emitting devices 10R are removed, the third transfer substrate 301R can be separated from the backplane 401 by pulling the third transfer substrate 301R and/or the backplane 401 from each other. In one embodiment, a remnant portion 30F of the bonding material layer 30 can be formed on at least one of the first subset of the third light emitting devices 10R after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying third light emitting device 10R. If any portion of the bonding material layer 30 remains underneath the irradiated portions of the release layer 20, the periphery of such a portion can be fractured while the assembly comprising the third transfer substrate 301R and the second subset of the third light emitting devices 10R is separated from the backplane 401. The separation of the assembly comprising the third transfer substrate 301R and the second subset of the third light emitting devices 10R from the backplane 401 can be performed while the first subset of the third light emitting devices 10R remains bonded to the third conductive bonding structures 430R.

The second subset of the third light emitting devices 10R can be employed to subsequently transfer another subset of the third light emitting devices 10R to another backplane (not shown). Optionally, a wet chemical clean process can be performed to remove residual material from the backplane 401, the first subset of the first light emitting devices 10B, the first subset of the second light emitting devices 10G, and the first subset of the third light emitting devices 10R. For example, dilute hydrofluoric acid can be employed to remove residual material from the surfaces of the backplane 401, the first subset of the first light emitting devices 10B, the first subset of the second light emitting devices 10G, and the first subset of the third light emitting devices 10R.

It is understood that the order of bonding various devices can be permutated to enable bonding of multiple types of devices having different heights and the same horizontal pitch, i.e., the same periodicity along the two horizontal directions. In general, the sequence of bonding different devices 10 and the height of the respective conductive bonding structures can be selected to avoid collision between pre-existing bonded devices on the backplane 401 and the new devices to be bonded. The horizontal plane including the interface between the devices and the bonding material layer of the transfer substrate that is disposed over the backplane 410 is located above the topmost surfaces of the preexisting devices on the backplane 401.

Figure 20:
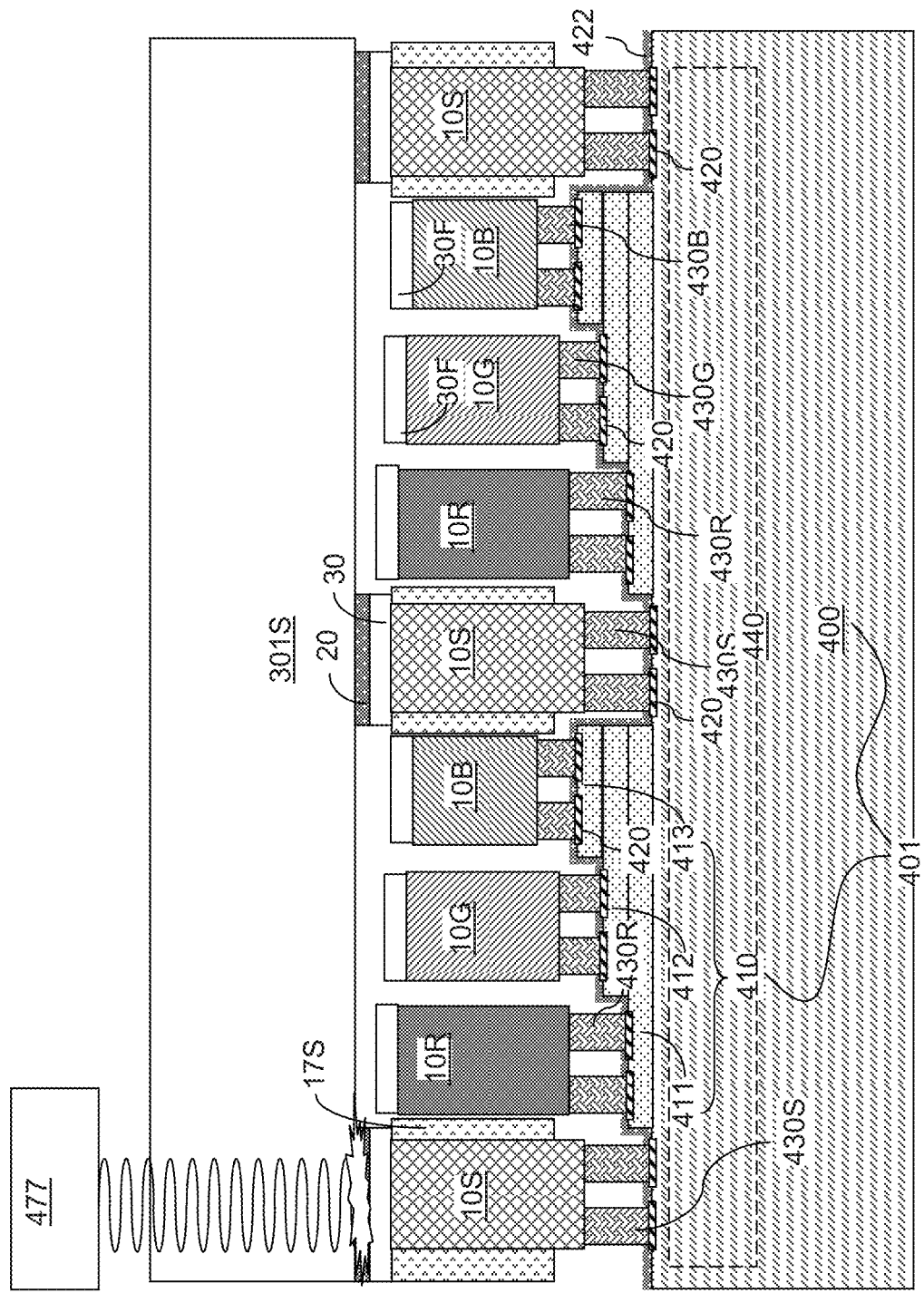
FIG. 20 is a vertical cross-sectional view of the backplane and a fourth transfer substrate while detaching a sensor device among a first subset of sensor devices employing laser irradiation and ablation of a portion of the release layer in the fourth transfer substrate according to an embodiment of the present disclosure.

Referring to FIG. 20, an assembly comprising the additional transfer substrate 301S and the sensor devices that sense at least one parameter is provided. The at least one parameter can be luminosity, pressure, temperature, and/or another physical parameter. The sensor devices 10S are not present in positions that correspond to positions over the backplane 401 at which the first subset of the first light emitting devices 10B, the first subset of the second light emitting devices 10G, or the first subset of the third light emitting devices 10R is present in a configuration in which the sensor devices 10S face the top side of the backplane 401. In other words, the sensor devices 10S are not present in areas that overlap with the areas of the first subset of the first light emitting devices 10B, the first subset of the second light emitting devices 10G, or the first subset of the third light emitting devices 10R in a configuration in which the sensor devices 10S face downward and the first subset of the first light emitting devices 10B, the first subset of the second light emitting devices 10G, and the first subset of the third light emitting devices 10R on the backplane 401 face upward. In one embodiment, any sensor device 10S located in positions that would overlap with preexisting devices (10B, 10G, 10R) on the backplane 401 can be removed from the additional transfer 301S substrate before the additional transfer substrate 301S is aligned with the backplane 401 for transfer of a subset of the sensor devices 10S. Optionally, a fourth optical protection material layer 17S can be applied to fill the gaps among the sensor devices 10S prior to removal of a subset of the sensor devices 10S from overlapping locations. The fourth optical protection material layer 17S can have the same composition as the first optical protection material layer 17B. By ensuring that the sensor devices 10S are not present in positions that correspond to positions over the backplane 401 at which the first subset of the first light emitting devices 10B, the first subset of the second light emitting devices 10G, and the first subset of the third light emitting devices 10R are present, potential collision between the sensor devices 10S and the light emitting devices (10B, 10G, 10R) can be avoided when the additional transfer substrate 301S is subsequently disposed on the backplane 401 to bond a subset of the sensor devices 10S.

After aligning the assembly of the additional transfer substrate 301R and the sensor devices 10S to the backplane 401, the assembly of the additional transfer substrate 301S and the sensor devices 10S is disposed on the backplane 401 so that a first subset of the sensor devices 10S contacts the additional conductive bonding structures 430S and a second subset of the sensor devices 10S does not contact any conductive bonding structure. The contact pads (not shown) of the first subset of the sensor devices 10S contact respective additional conductive bonding structures 430S. Specifically, the array of the sensor devices 10S can be aligned over the backplane 401 such that each bond pad 420 and a corresponding contact pad of an overlying sensor device 10S contact the additional conductive bonding structure 430S located therebetween.

The additional conductive bonding structures 430S are present only at locations at which transfer of sensor devices 10S is desired. The first subset of the sensor devices 10S on the additional transfer substrate 301S is bonded to the additional conductive bonding structures 430S, which are located on the fourth subset of horizontal stepped surfaces of the backplane 401. Each pair of a bond pad 420 and an overlying contact pads on the first subset of the sensor devices 10S can be bonded through a respective additional conductive bonding structures 430S employing any of the bonding methods described above, i.e., the bonding methods that can be employed to bond pairs of a bond pad 420 and an overlying contact pads on the first subset of the first light emitting devices 10B through a respective first conductive bonding structures 430B.

Subsequently, each sensor device 10S that is bonded to the additional conductive bonding structures 430S can be dissociated from the additional transfer substrate 301G individually, while sensor devices 10S that are not bonded to the additional conductive bonding structures 430S remain intact, i.e., are not detached. The set of the sensor devices 10S that are bonded to the additional conductive bonding structures 430G is the first subset of the sensor devices 10S, and the set of sensor devices 10S that are not bonded to the second conductive bonding structures 430G is the second subset of the sensor devices 10S. Each sensor device 10S among the first subset of the sensor devices 10S can be detached employing targeted laser irradiation emitted by a laser 477 in the same manner employed to detach the first subset of the first light emitting devices 10B in a prior processing step. Thus, the first portions of the release layer 20 that overlie the first subset of the sensor devices 10S are selectively and sequentially removed, while the second portions of the release layer 20 that overlie the second subset of the sensor devices 10S are not removed. The additional transfer substrate 301S comprises a material that is optically transparent at the laser wavelength. In one embodiment, the release layer 20 can comprise silicon nitride, the laser wavelength can be an ultraviolet wavelength (such as 248 nm or 193 nm), and irradiating the first portions of the release layer 20 with the laser beam ablates the first portions of the release layer 20.

Figure 21:
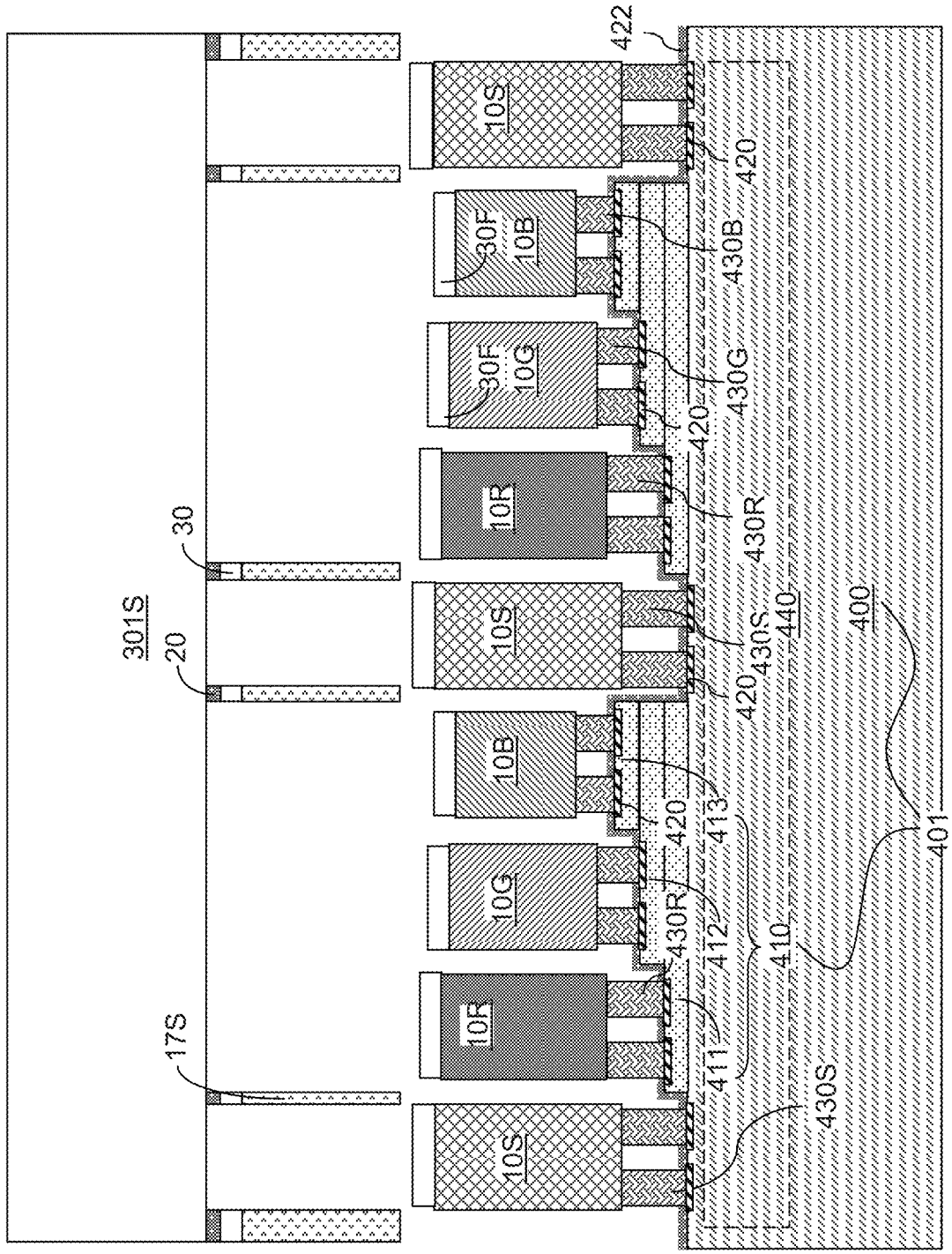
FIG. 21 is a vertical cross-sectional view of the backplane after separating the fourth transfer substrate according to an embodiment of the present disclosure.

Referring to FIG. 21, after all first portions of the release layer 20 overlying the first subset of the sensor devices 10S are removed, the additional transfer substrate 301S can be separated from the backplane 401 by pulling the additional transfer substrate 301S and/or the backplane 401 from each other. In one embodiment, a remnant portion 30F of the bonding material layer 30 can be formed on at least one of the first subset of the sensor devices 10S after the first portions of the release layer 20 are irradiated with the laser beam. In another embodiment, the portions of the bonding material layer 30 underneath the irradiated portions of the release layer 20 can be ablated or liquefied and flow out, for example, along sidewalls of an underlying sensor device 10S. If any portion of the bonding material layer 30 remains underneath the irradiated portions of the release layer 20, the periphery of such a portion can be fractured while the assembly comprising the additional transfer substrate 301S and the second subset of the sensor devices 10S is separated from the backplane 401. The separation of the assembly comprising the additional transfer substrate 301S and the second subset of the sensor devices 10S from the backplane 401 can be performed while the first subset of the sensor devices 10S remains bonded to the additional conductive bonding structures 430S.

The second subset of the sensor devices 10S can be employed to subsequently transfer another subset of the sensor devices 10S to another backplane (not shown). Optionally, a wet chemical clean process can be performed to remove residual material from the backplane 401, the first subset of the first light emitting devices 10B, the first subset of the second light emitting devices 10G, the first subset of the third light emitting devices 10R, and the first subset of the sensor devices 10S. For example, dilute hydrofluoric acid can be employed to remove residual material from the surfaces of the backplane 401, the first subset of the first light emitting devices 10B, the first subset of the second light emitting devices 10G, the first subset of the third light emitting devices 10R, and the first subset of the sensor devices 10S.

Figure 22:
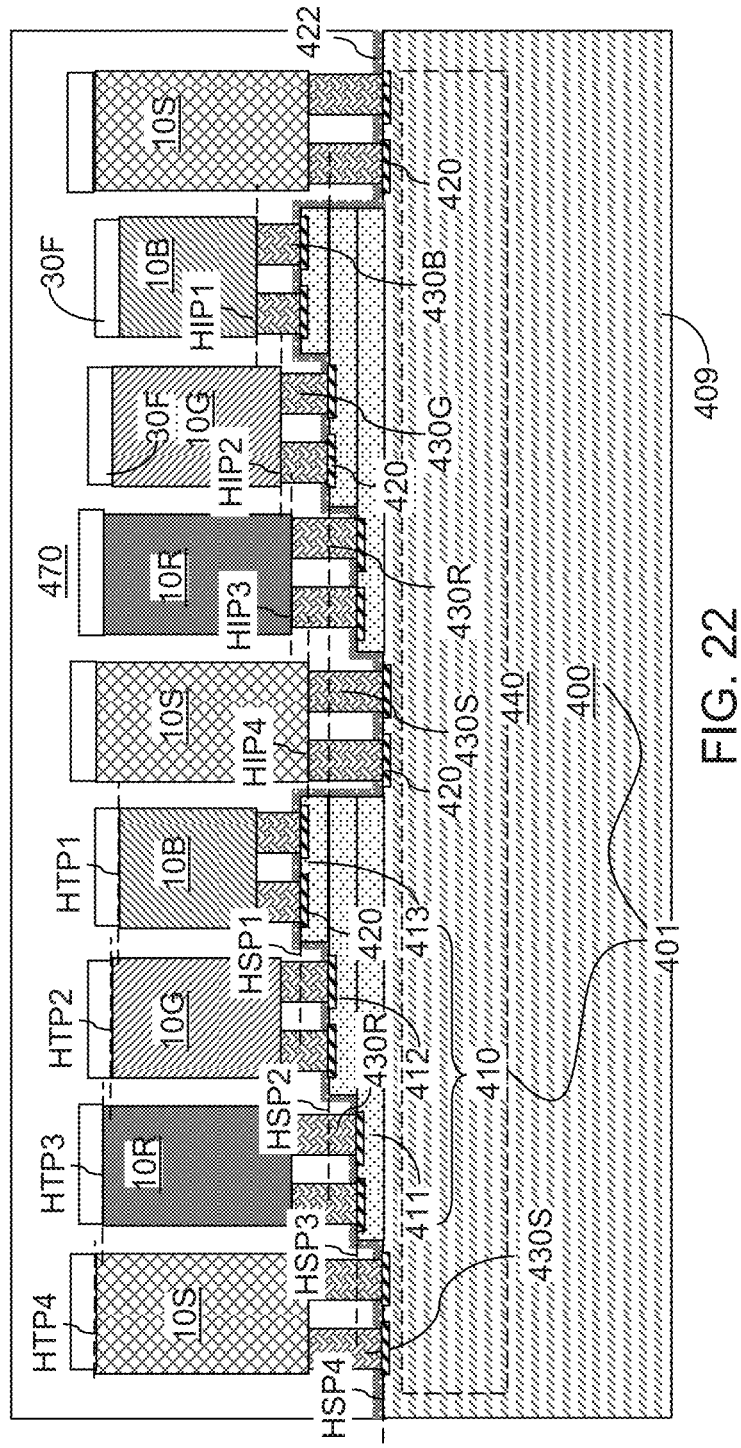
FIG. 22 is a vertical cross-sectional view of a first exemplary light emitting device assembly after formation of a transparent encapsulation dielectric layer according to an embodiment of the present disclosure.

Referring to FIG. 22, the electronic components (light emitting device subpixels, sensors, or other components) may be encapsulated by a transparent encapsulation material. The transparent encapsulation material increases the extraction of light from the light emitting device subpixels, increasing the amount of light emitted by the display panel. The transparent encapsulation material may provide a top surface of the display panel that has less peak-to-valley height variations. A transparent material can be deposited over the backplane 401 to form a transparent encapsulation dielectric layer 470. The encapsulant may be any of a range of materials such as dielectric resins (such as benzocyclobutene, polymethylmethacrylate, polybenzoxazole, or polyimide), silicones, dielectrics (such as $TiO_2$ or $SiO_2$), or low-melting temperature glasses or spin-on glasses.

The thicknesses of the conductive bonding structures and/or the thicknesses of the electronic component (light emitting device, sensor, or other electronic element) may be different for each of the groupings of components. In an illustrative example of a three-color RGB display panel comprising sensors, the first light emitting devices 10B can be blue light emitting devices, the second light emitting devices can be green light emitting devices, and the third light emitting devices can be red light emitting devices. The blue light emitting device may have a thickness of 6 microns and the first conductive bonding structure 430B between the backplane substrate and the blue light emitting device may be about 2 microns thick. The green light emitting device may have a thickness of 7 microns and the second conductive bonding structure 430G between the backplane substrate and the green light emitting device may be 4 microns thick. The red light emitting device may have a thickness of 8 microns and the third conductive bonding structure 430R between the backplane substrate and the red light emitting device may be 5 microns thick. The sensor device 10S may have a thickness of 8 microns and the additional conductive bonding structure 430S between the backplane substrate and the sensor may be 7 microns thick. In this example, the height of the distal face of the electronic component (face of the light emitting device or sensor farthest from the backplane 430) above the face of the backplane substrate may be 8 microns, 11 microns, 13 microns, and 15 microns, for the blue light emitting device, green light emitting device, red light emitting device, and sensor, respectively.

In a display panel, the thicknesses of the conductive bonding structures for the electronic components (light emitting devices, sensors, etc) may be different, or the thicknesses of the electronic components (light emitting devices, sensors, etc) may be different, or a combination thereof, as described in the example above.

The conductive bonding structures (430B, 430G, 430R, 430S) may be configured to make one or more electrical contacts to each element affixed to the backplane 401. In one embodiment, a green light emitting device subpixel may be affixed to the backplane substrate by two conductive bonding structures. A first conductive bonding structure connects the cathode of the green light emitting device to the electronic circuitry in the backplane 430, and a second conductive bonding structures connects the anode of the light emitting device to the electronic circuitry in the backplane 401. In one embodiment, the first and second conductive bonding structures may be located on different horizontal planes. For example, the anode contact plane may be 0.5 micron higher than the cathode contact plane. In one embodiment, the first and second conductive bonding structures may be different thicknesses. For example, the anode bonding structure thickness may be 0.5 um thicker than the cathode bonding structure.

In another embodiment, a blue light emitting device subpixel may be affixed to the backplane 430 by one conductive bonding structure, which may be either an anode bonding structure or a cathode bonding structure. In another embodiment, a silicon photodetector device may be affixed to the backplane 401 by two conductive bonding structures. In another embodiment, an array of three silicon photodetectors may be affixed to the backplane 401 by six conductive bonding structures. In another embodiment, a silicon photodetector device may be affixed to the backplane 430 by one conductive bonding structure, which may be either an anode or cathode bonding structure or a cathode bonding structure.

In one embodiment, a light emitting device configured to emit blue light may be formed adjacent to a light emitting device configured to emit green light and adjacent to a light emitting device configured to emit red light. In one embodiment, all contacts to the electronic devices affixed to the backplane 401 can be provided between the backplane 401 and the electronic components, and the transparent encapsulation dielectric layer 470 can have a single top surface (i.e., be planarized). In another embodiment, the transparent encapsulation dielectric layer 470 can be formed into a microlens array, for example with a domed surface over each electronic component.

The conductive bonding structures between electrical components (light emitting device subpixels, sensors, or other components) and the backplane 401 may comprise Ag, Al, Au, In, Sn, Cu, Ni, Bi, Sb. The conductive bonding structures may comprise multiple layers comprising multiple metals or metal alloys. The conductive bonding structures for different groupings of devices may comprise different metals or metal alloys. For example, the conductive bonding structures affixing the blue light emitting devices to the backplane 401 may comprise AuSn, the conductive bonding structures affixing the green light emitting devices to the backplane 401 may comprise NiSn, and the conductive bonding structures affixing the red light emitting devices to the backplane substrate may comprise InSn.

The exemplary structure of FIG. 22 is a first exemplary light emitting device assembly that comprises a backplane 401 having stepped horizontal surfaces at a top side. The stepped horizontal surfaces comprise a first subset of the stepped horizontal surfaces located within a first horizontal surface plane HSP1, a second subset of the stepped horizontal surfaces located within a second horizontal surface plane HSP2 that is more proximal to a backside surface 409 of the backplane 401 than the first subset of stepped horizontal surfaces is to the backside surface 409 of the backplane 401, a third subset of the stepped horizontal surfaces located within a third horizontal surface plane HSP3 that is more proximal to the backside surface 409 of the backplane 401 than the second subset of stepped horizontal surfaces is to the backside surface 409 of the backplane 401, and a fourth subset of the stepped horizontal surfaces located within a fourth horizontal surface plane HSP4 that is more proximal to the backside surface 409 of the backplane 401 than the third subset of stepped horizontal surfaces is to the backside surface 409 of the backplane 401. The height of each step between each consecutive plane can be in a range from 0 micron to 3 microns (for example, in a range from 0.2 micron to 2 microns). The presence or absence of finite step heights is dependent on methods employed for selectively attaching light emitting devices (or sensor devices), which depend on embodiments employed to implement the methods of the present disclosure. In other words, the steps may not be present in some embodiments, and all of the horizontal surface planes (HSP1, HSP2, HSP3, HSP4) can be located within the same horizontal plane in such cases. The presence of the steps facilitate formation of the topmost surfaces of the various electronic components (such as the light emitting devices (10B, 10G, 10R) and the sensor devices 10S) to be formed with less height differential than would be otherwise possible.

The integrated light emitting device assembly further comprises conductive bonding structures (430B, 430G, 430R, 430S) located on the stepped horizontal surfaces of the backplane 401. The conductive bonding structures (430B, 430G, 430R, 430S) can comprise first conductive bonding structures 430B contacting the first subset of the stepped horizontal surfaces, second conductive bonding structures 430G contacting the second subset of the stepped horizontal surfaces, third conductive bonding structures 430R contacting the third subset of the stepped horizontal surfaces, and additional conductive bonding structures 430S contacting the fourth subset of the stepped horizontal surfaces.

The integrated light emitting device assembly can further comprise light emitting devices (10B, 10G, 10R) bonded to the respective conductive bonding structures (430B, 430G, 430R, 430S). The light emitting devices (10B, 10G, 10R) comprise first light emitting devices 10B that emit light of a first wavelength and overlie the first subset of the stepped horizontal surfaces, second light emitting devices 10G that emit light of a second wavelength and overlie the second subset of stepped horizontal surfaces, and third light emitting devices 10R that emit light of a third wavelength and overlie the third subset of stepped horizontal surfaces.

The integrated light emitting device assembly can further comprise sensor devices 10S bonded to the backplane 410 through fourth conductive bonding structures 430S. The sensor devices 10S can overlie the fourth subset of stepped horizontal surfaces.

The locations of the various bonded components (10B, 10G, 10R, 10S), the heights of the various conductive bonding structures (430B, 430G, 430R, 430S), and the heights of the various stepped horizontal surfaces can be combined so that the height differential among the topmost surface of the bonded components (10B, 10G, 10R, 10S) as bonded to the backplane 401 can be less than the height differential among the various bonded components (10B, 10G, 10R, 10S). In one embodiment, a first horizontal interfacial plane HIP1 including interfaces between the first light emitting devices 10B and the first conductive bonding structures 403B can be more distal from the second horizontal surface plane HSP2 (or from any other horizontal reference plane such as the fourth horizontal surface plane HSP4 or the backside surface 409) than a second horizontal interface plane HIP2 between the second light emitting devices 10G and the second conductive bonding structures 430G is to the second horizontal surface plane HSP2 (or from any other horizontal reference plane such as the fourth horizontal surface plane HSP4 or the backside surface 409).

In one embodiment, the various conductive bonding structures (430B, 430G, 430R, 430S) can have different heights to reduce the height differential among the topmost surface of the bonded components (10B, 10G, 10R, 10S). In one embodiment, the second conductive bonding structures 430G can have a greater height than the first conductive bonding structures 430B. The third conductive bonding structures 430R can have a greater height than the second conductive bonding structures 430G. The additional conductive bonding structures 430S can have a greater height than the third conductive bonding structures 430R. The height differential among the various conductive bonding structures (430B, 430G, 430R, 430S) can be optional provided that the inherent height differential among the various bonded components (10B, 10G, 10R, 10S), the step height differential among the stepped horizontal surfaces of the backplane 401, and the locations of the various bonded components (10B, 10G, 10R, 10S) can be combined to prevent collision among sequential bonding of various transfer substrates (300B, 300G, 300R, 300S).

In one embodiment, a first horizontal top plane HTP1 including top surfaces of the first light emitting devices 10B can be more proximal to the second horizontal surface plane HSP2 (or from any other horizontal reference plane such as the fourth horizontal surface plane HSP4 or the backside surface 409) than a second horizontal top plane HTP2 including top surfaces of the second light emitting devices 10G is to the second horizontal surfaces plane HSP2 (or from any other horizontal reference plane such as the fourth horizontal surface plane HSP4 or the backside surface 409). The second horizontal top plane HTP2 including top surfaces of the second light emitting devices 10G can be more proximal to the second horizontal surface plane HSP2 (or from any other horizontal reference plane such as the fourth horizontal surface plane HSP4 or the backside surface 409) than a third horizontal top plane HTP3 including top surfaces of the third light emitting devices 10R is to the second horizontal surfaces plane HSP2 (or from any other horizontal reference plane such as the fourth horizontal surface plane HSP4 or the backside surface 409). The third horizontal top plane HTP3 including top surfaces of the third light emitting devices 10R can be more proximal to the second horizontal surface plane HSP2 (or from any other horizontal reference plane such as the fourth horizontal surface plane HSP4 or the backside surface 409) than a fourth horizontal top plane HTP4 including top surfaces of the sensor devices 10S is to the second horizontal surfaces plane HSP2 (or from any other horizontal reference plane such as the fourth horizontal surface plane HSP4 or the backside surface 409).

In one embodiment, the second light emitting devices 10G can have a greater height than the first light emitting devices 10B, the third light emitting devices 10R can have a greater height than the second light emitting devices 10G, and the sensor devices 10S can have a greater height than the third light emitting devices 10R.

In one embodiment, the backplane 401 comprises metal interconnect structures 440 embedded within a dielectric material matrix. The conductive bonding structures (430B, 430G, 430R, 430S) are electrically connected to a respective metal interconnect structure 440 within the backplane 401. The metal interconnect structures 440 can comprise bond pads 420 that are located on, or embedded within, the backplane 410. The bond pads 420 contact a respective bottom surface of the conductive bonding structures (430B, 430G, 430R, 430S). In one embodiment, the conductive bonding structures (430B, 430G, 430R, 430S) can comprise solder balls bonded to a respective bond pad 420 and to a respective light emitting device (10B, 10G, 10R) or to a respective sensor device 10S.

In one embodiment, a remnant portion 30F of the bonding material layer can be present over one or more of the bonded components (10B, 10G, 10R, 10S). For example, silicon oxide material portions can contact a respective top surface of the light emitting devices (10B, 10G, 10S), and can be laterally spaced from one another. In one embodiment, the transparent encapsulation dielectric layer 470 can overlie the backplane 401 and can embed the light emitting devices (10B, 10G, 10R) and the sensor devices 10S.

Optionally, a protective material layer 422 may be located on the stepped horizontal surfaces and sidewalls of the backplane 401. The protective material layer 422 can comprise a material that absorbs light within a wavelength range that includes ultraviolet light, visible light, and infrared light. In one embodiment, the light emitting devices (10B, 10G, 10R) and/or the sensor devices 10S can be arranged in a periodic array in which center-to-center distances of neighboring light emitting devices (10B, 10G, 10R) along a horizontal direction are integer multiples of a unit distance. In one embodiment, the periodic array can be a rectangular array in which the light emitting devices (10B, 10G, 10R) and/or the sensor devices 10S are arranged at lattice sites of a rectangular lattice.

Figure 23:
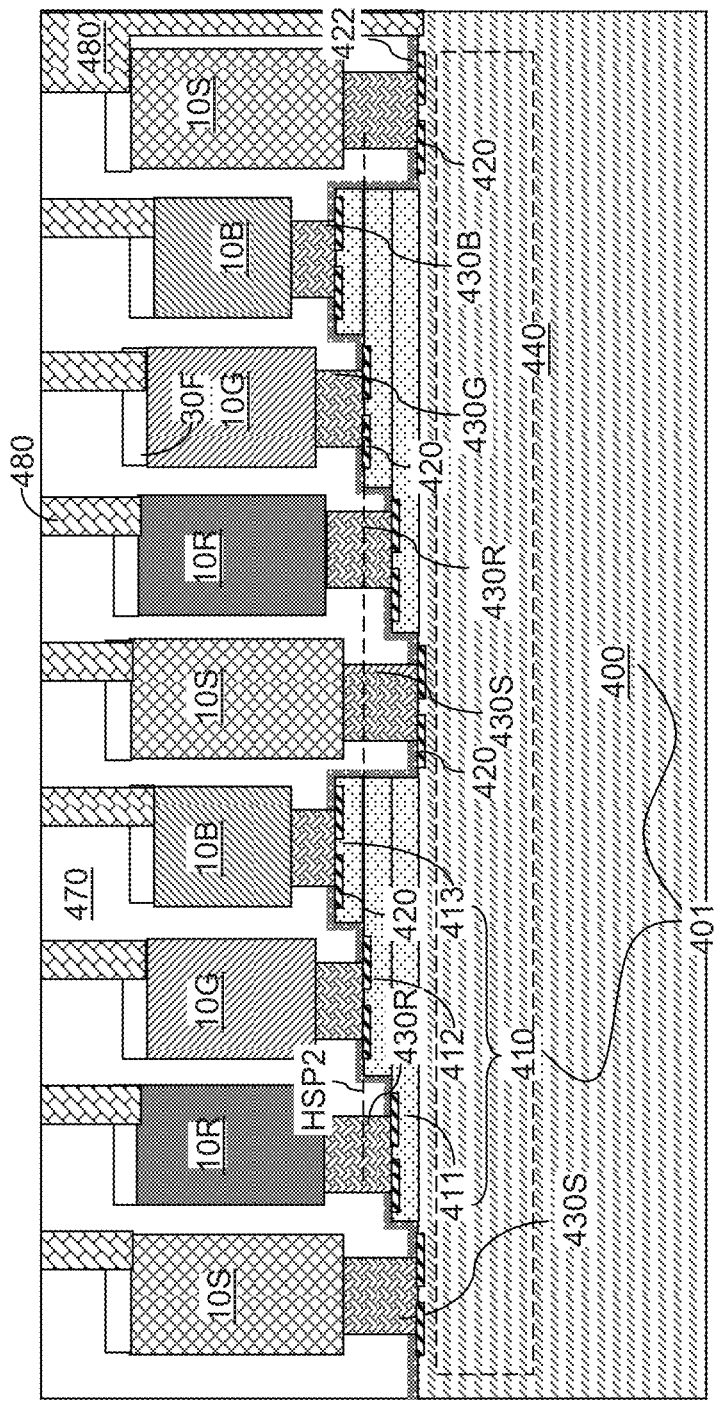
FIG. 23 is a vertical cross-sectional view of an alternate embodiment of the first exemplary light emitting device assembly after formation of conductive interconnect structures according to an embodiment of the present disclosure.

Referring to FIG. 23, an alternative embodiment of the integrated light emitting device assembly is shown. Conductive interconnect structures 480 can be formed within the transparent encapsulation dielectric layer 470, for example, by formation of line cavities and via cavities by a combination of lithographic patterning and at least one etch process, and by filling the line cavities and the via cavities with at least one conductive material. Alternatively or additionally, conductive interconnect structures 480 can be formed over the transparent encapsulation dielectric layer 470, for example, by deposition of a conductive material layer and patterning of the conductive material layer by a combination of lithographic patterning and at least one etch process. The conductive interconnect structures 480 can electrically contact one or more of the bonded components (10B, 10G, 10R, 10S). For example, the conductive interconnect structures 480 can be embedded within the transparent encapsulation dielectric layer 470 and can electrically contact a respective light emitting device (10B, 10G, 10R) and/or a respective sensor device 10S. In one embodiment, at least one of the conductive interconnect structures 480 can be electrically connected to a metal interconnect structure 440 embedded within the backplane 401.

In one embodiment, only a first part of the electrical contacts to the electronic components (10B, 10G, 10R, 10S) can be provided by the conductive bonding structures (430B, 430G, 430R, 430S) formed between the components (10B, 10G, 10R, 10S) and the backplane 401. A second part of the electrical contacts to the electrical components (10B, 10G, 10R, 10S) can be provided by a top contact layer as embodied by the conductive interconnect structures 480. The conductive interconnect structures 480 are formed over the electronic components (10B, 10G, 10R, 10S), and can be embedded within the transparent encapsulation dielectric layer 470, and/or can be formed over the transparent encapsulation dielectric layer 470.

In one embodiment, the transparent encapsulation dielectric layer 470 may partially planarize the top surface of a display panel that incorporates the integrated light emitting device assembly of the present disclosure. Via cavities can be provided in the transparent encapsulation dielectric layer 470 directly over the top surface of each electronic component (10B, 10G, 10S), and a transparent conductive oxide such as ITO or AZO, silver nanowire mesh, silver mesh electrode, or other transparent or semitransparent contact structures can be provided over the encapsulant and electronic components, forming op contact structures as embodied as the conductive interconnect structures 480. The top contact structures may be electrically joined to the backplane 401 at some specific site on the backplane 401, for example, by wirebonding or by contact via structures that extend through transparent encapsulation dielectric layer 470. The top contact structures may be a full sheet contact which covers every electronic component (10B, 10G, 10R, 10S) on the backplane 401, or may be patterned to provide multiple top contact structures to specific components or groups of components, in which case the top contact structures may be electrically joined to the backplane 401 at several specific sites, e.g. by wirebonding or by contact with a metal electrode formed on the backplane 401.

Figure 24:
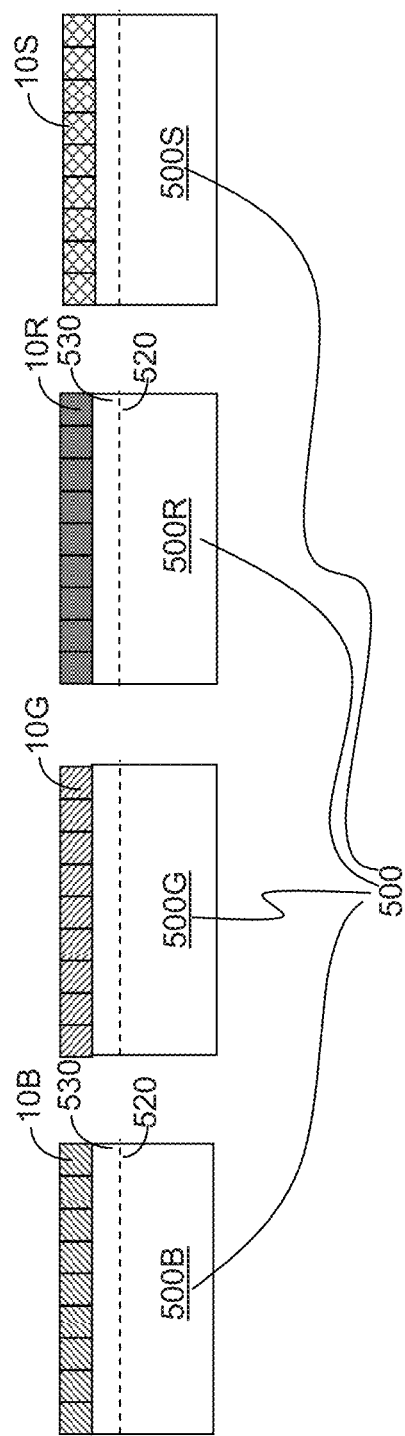
FIG. 24 is an alternative embodiment of the devices on initial growth substrates according to an embodiment of the present disclosure.

Referring to FIG. 24, an alternative embodiment of the devices (10B, 10G, 10R, 10S) on growth substrates 500 is illustrated. In this case, the devices (10B, 10G, 10R, 10S) can be grown or fabricated from the growth substrates 500 employing device fabrication techniques known in the art. For example, the growth substrates 500 can be a semiconductor substrate including a semiconductor material, which can be a III-V compound semiconductor substrate (e.g., a GaAs or a GaN substrate), or an insulating substrate, such as sapphire. Each growth substrate 500 can be provided with an internal release layer 520, which can be, for example, an implanted material layer such as an implanted hydrogen layer, an implanted oxygen layer, an implanted nitrogen layer, or a layer formed by implantation of any other atomic species that facilitates cleaving upon irradiation by laser or local heating by other methods. The internal release layer 520 performs the function of the release layer 20 discussed above.

Each growth substrate 500 can be provided with a source substrate 530, which can be a thin layer of the material of the growth substrate 500, and is thin enough to be fractured, ablated, or otherwise removed upon laser irradiation of an adjoining portion of the internal release layer 520. The thickness of the source substrate 530 can be in a range from 50 nm to 3 microns, although lesser and greater thicknesses can also be employed. In one embodiment, first light emitting devices 10B can be manufactured over a first growth substrate 500B, second light emitting devices 10G can be manufactured over a second growth substrate 500G, third light emitting devices 10R can be manufactured over a third growth substrate 500R, and sensor devices 10S can be manufactured over a fourth growth substrate 500S.

Figure 25:
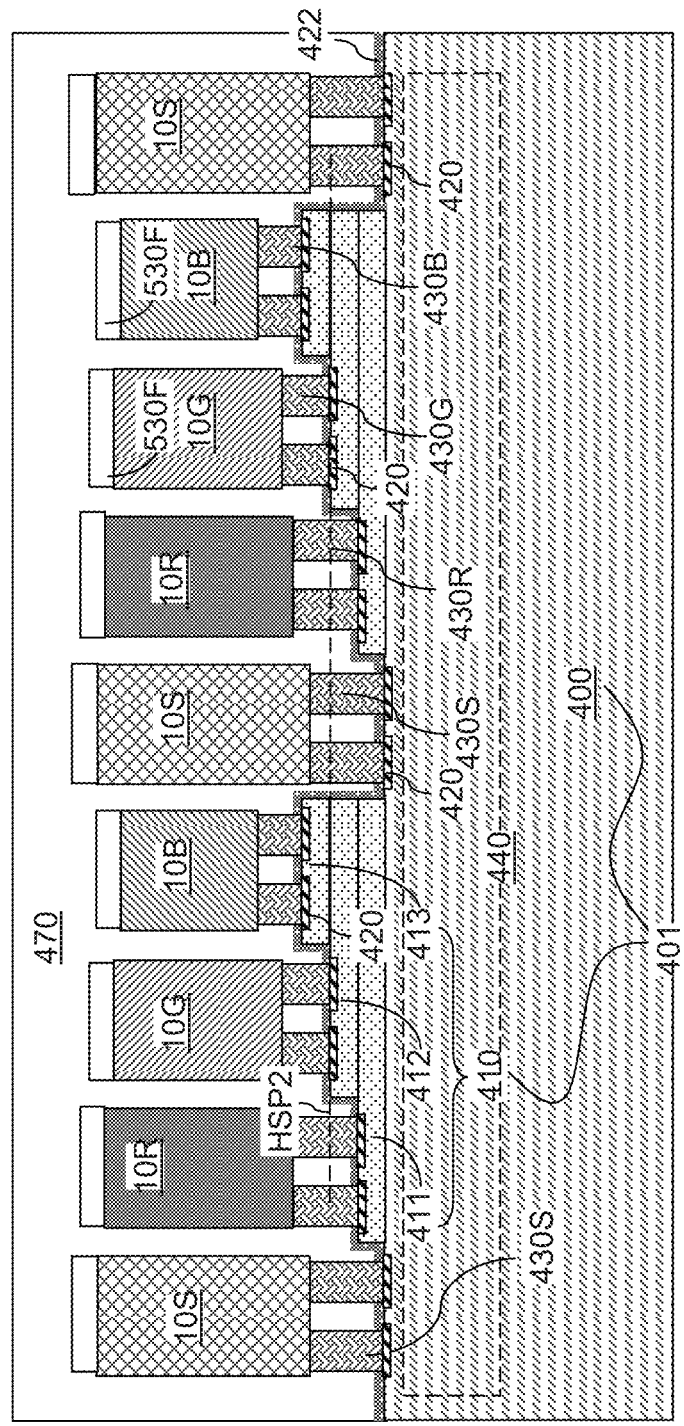
FIG. 25 is a vertical cross-sectional view of another alternate embodiment of the first exemplary light emitting device assembly according to an embodiment of the present disclosure.

Referring to FIG. 25, the same processing sequences described above can be employed to form an integrated light emitting device assembly. A portion of the source substrate 530 is ablated during each laser irradiation process. Because a source substrate 530 is present on each growth substrate 500, a remnant portion 530F of the source substrate 530 can be present over the bonded components (10B, 10G, 10R, 10S) and within the transparent encapsulation dielectric layer 470.

The methods of the present disclosure can be employed to form an emissive display panel. An emissive display panel is a direct view display where the viewer directly views an image made by different color light emission from different color light emitting subpixels. The subpixels can be inorganic light emitting devices, such as light emitting diodes. Thus, the direct view display differs from a backlight of a liquid crystal display (LCD), where different color light from the backlight is combined to form which light which is used to illuminate the liquid crystal material and color filters of the LCD, and the viewer views different color light transmitted through the color filters and the liquid crystal material. Elements on the backplane 401 and the light emitting devices can facilitate the assembly of the display panel. The emissive display panel may include sensors or other electronic elements assembled onto the display panel in a similar method. Elements of the sensors and/or electronic elements facilitate assembly of the display panel.

In order to fabricate an emissive display panel with inorganic light emitting diodes (LEDs) as the emissive element, millions of LEDs must be affixed to a backplane substrate. The backplane 401 contains the electronics which drive current through the individual LED subpixels such that light is emitted and an image is formed on the display.

In one embodiment, the display is a three color display panel, wherein within each pixel of the display there are three subpixels which emit red, green, and blue light. Each subpixel can be an inorganic LED. The blue and green subpixels may be made of InGaN LEDs. The red subpixels may be made of InGaN or AlInGaP or AlGaAs LEDs. The display panel may have more colors. For example, a four-color display can include four subpixels per pixel. The subpixels may emit blue light at about 470 nm wavelength, emerald green light at about 505 nm wavelength, yellowish-green light at about 570 nm wavelength, and red light at about 610 nm wavelength. In one embodiment, the subpixels may all be formed of InGaN.

The light emitting devices forming the subpixels may comprise an array of nanowires such that each nanowire is a light emitting device. Nanowire light emitting diodes (LEDs) are advantageous for forming the subpixels for several reasons. First, the nanowire LEDs may be as small as 1 micron in lateral dimension. This minimizes the amount of LED material that must be used to form each subpixel. This also allows the subpixels to be placed at small pitches, forming a high resolution display. Second, the nanowire LEDs have excellent efficacy (lumens per watt of electrical input power) when driven with small powers.

Figure 26:
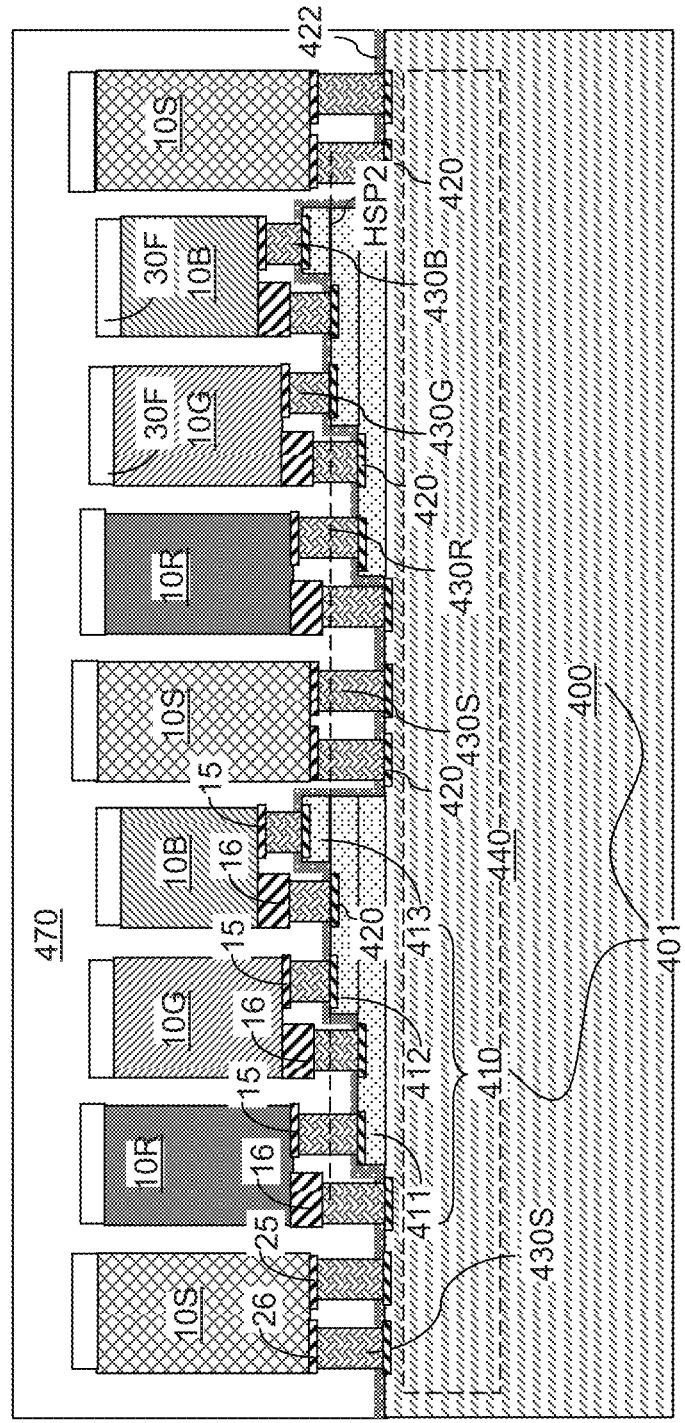
FIG. 26 is a vertical cross-sectional view of yet another alternate embodiment of the first exemplary light emitting device assembly according to an embodiment of the present disclosure.

Referring to FIG. 26, another alternate embodiment of the structure of the present disclosure is shown. In addition to have a stepped backplane 401 having stepped horizontal surfaces, stepped light emitting device surfaces can be employed to form a light emitting device assembly. In one embodiment, stepped light emitting device surfaces can be provided through use of different thicknesses of, or partial absence of, solderable metallization structures on the side of each light emitting device (10B, 10G, 10R) or each sensor structure 10S that is bonded to the backplane 401. In one embodiment, the solderable metallization structures can be a set of differential thickness contact pads (15, 16), which includes at least a first contact pad 15 having a first thickness and a second contact pad 16 having a second thickness that is different from the first thickness. Each combination of the first thickness and the second thickness can be selected to enable use of conductive bonding structures (430B, 430G, 430R, 430S) of the same thickness for each type of bonded components (10B, 10G, 10R, 10S). The solderable metallization structures such as the set of differential thickness contact pads (15, 16) can be formed, for example, by electroplating prior to dicing the initial growth substrates (100B, 100G, 100R, 100S). One or more than one type of bonded components (10B, 10G, 10R, 10S) can have differential thickness contact pads (15, 16). Alternately, one or more than one type of bonded components (10B, 10G, 10R, 10S) can have uniform thickness contact pads (15, 16) that have the same thickness.

Various types of devices can be bonded to the backplane 401. For example, in addition to, or in lieu of, bonding a set of sensor devices 10S, a probe or other electronic processor integrated chips (ICs) may be bonded to the backplane 401. A non-limiting illustrative example of a probe is a high-power infrared light emitting diode (IR LED) or a vertical-cavity surface-emitting laser (VCSEL) that is used in combination with a detector to provide the functionality of gesture recognition. A non-limiting illustrative example of an electronic IC is a low-density high cost processor chip for which direct fabrication on an active backplane is not economical, and transfer from a growth substrate to a backplane is more economical.

Multiple sensors, probes, and/or electronic ICs can be integrated onto the backplane 401 employing multiple bonding steps. In one embodiment, a plurality of vertical-cavity surface-emitting lasers (VCSELs) can be employed to form a projection display.

Tests and rework processes can be performed as needed at any stage of the assembly process of the present disclosure prior to formation of the transparent encapsulation dielectric layer 470. A rework process can comprise high-speed pick and place operations, in which a known defective electronic component (10G, 10G, 10R, 10S) that is bonded to the backplane 401 can be selectively picked (for example, employing local heating of the respective conductive bonding structures) and a functional replacement electronic component (10G, 10G, 10R, 10S) is placed in its stead. A suitable clean and placement of a new set of conductive bonding structures can be performed prior to bonding the functional replacement electronic component. If the rework process is performed at a later stage, the replacement electronic components can have a greater height than existing electronic components on the backplane 401 (for example, by adding a thicker bonding material layer or manufacturing the electronic component with a greater height), or a placement method that does not interfere with neighboring electronic components can be employed.

Figure 27:
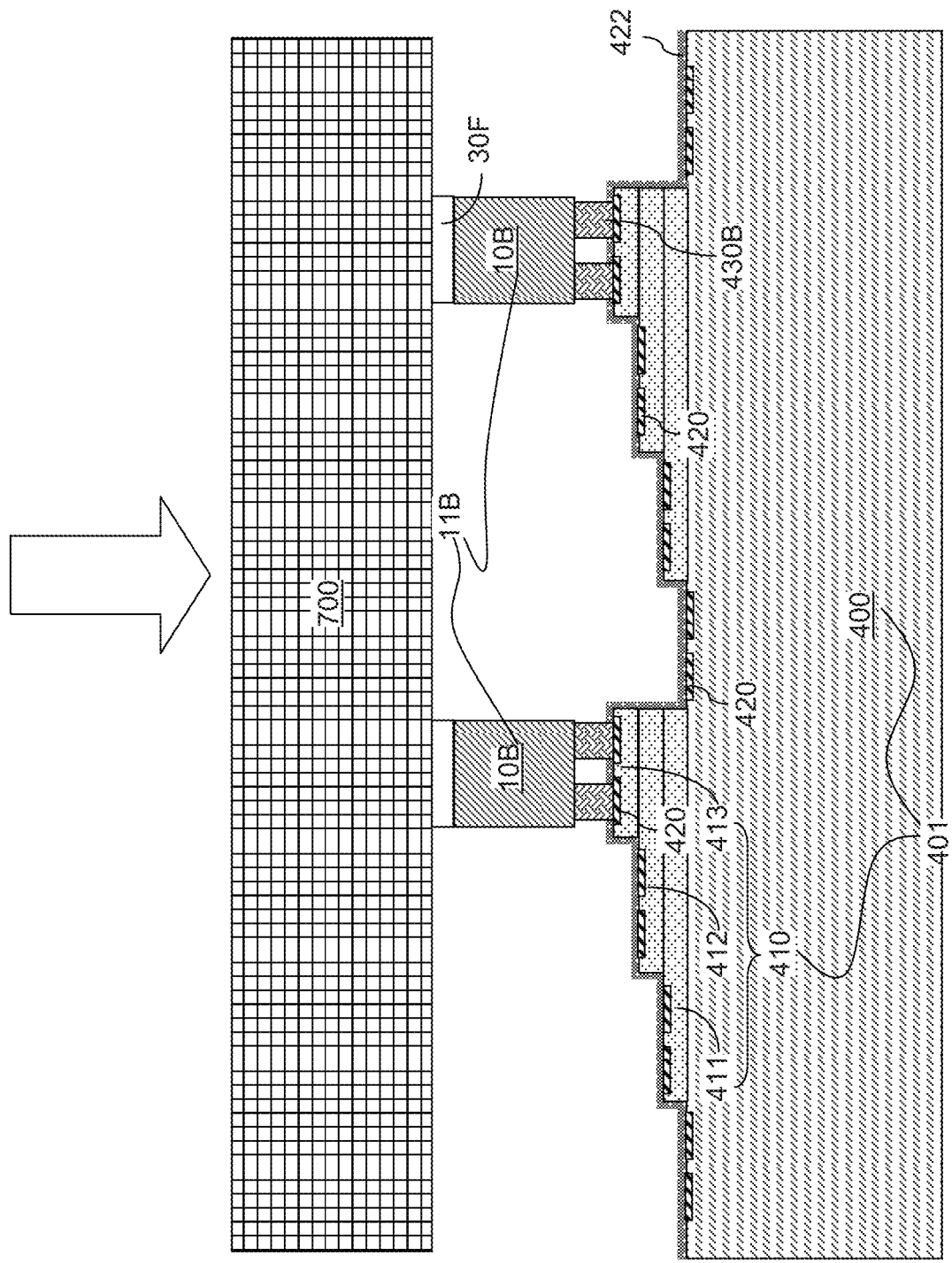
FIG. 27 illustrates a processing step in an alternate embodiment of the present disclosure in which a dummy substrate is disposed above top surfaces of bonded light emitting devices.

In one embodiment, the conductive bonding structures (430B, 430G, 430R, 430S) of the present disclosure can be solder material portions, i.e., solder "balls." It is understood that a solder "ball" may, or may not, have a spherical shape, and other shapes, such as a cylindrical shape, can also be employed as a solder "ball." Referring to FIG. 27, the processing sequences of the present disclosure may be modified to enhance to coplanarity of the top surfaces of bonded devices from a backplane 401. After each round of bonding devices (10B, 10G, 10R, or 10S) to a backplane 401 and removing a remainder of a transfer assembly, for example, after the processing steps of FIG. 14, after the processing steps of FIG. 17, after the processing steps of FIG. 19, and/or after the processing steps of FIG. 21, a dummy substrate 700 having a planar bottom surface can be disposed on the top surfaces of the newly bonded devices (10B, 10G, 10R, or 10S) and over the backplane 401.

FIG. 27 illustrates an exemplary structure after a dummy substrate 701 having a planar bottom surface is disposed on top surfaces of the first light emitting devices 10B after separating the assembly comprising the first transfer substrate 301B and the second subset of the first light emitting devices 10B from the backplane 401. The same method may be applied after separating any of the transfer substrates (301B, 301G, 301R, 301S). The dummy substrate 701 may be repeatedly used, or may be replaced with a new one for each usage. The dummy substrate 701 can comprise an insulator material, a conductive material, a semiconductor material, or a combination thereof provided that the bottom surface of the dummy substrate 701 includes a flat rigid surface, i.e., a surface that substantially coincides with a horizontal Euclidean two-dimensional plane.

Figure 28:
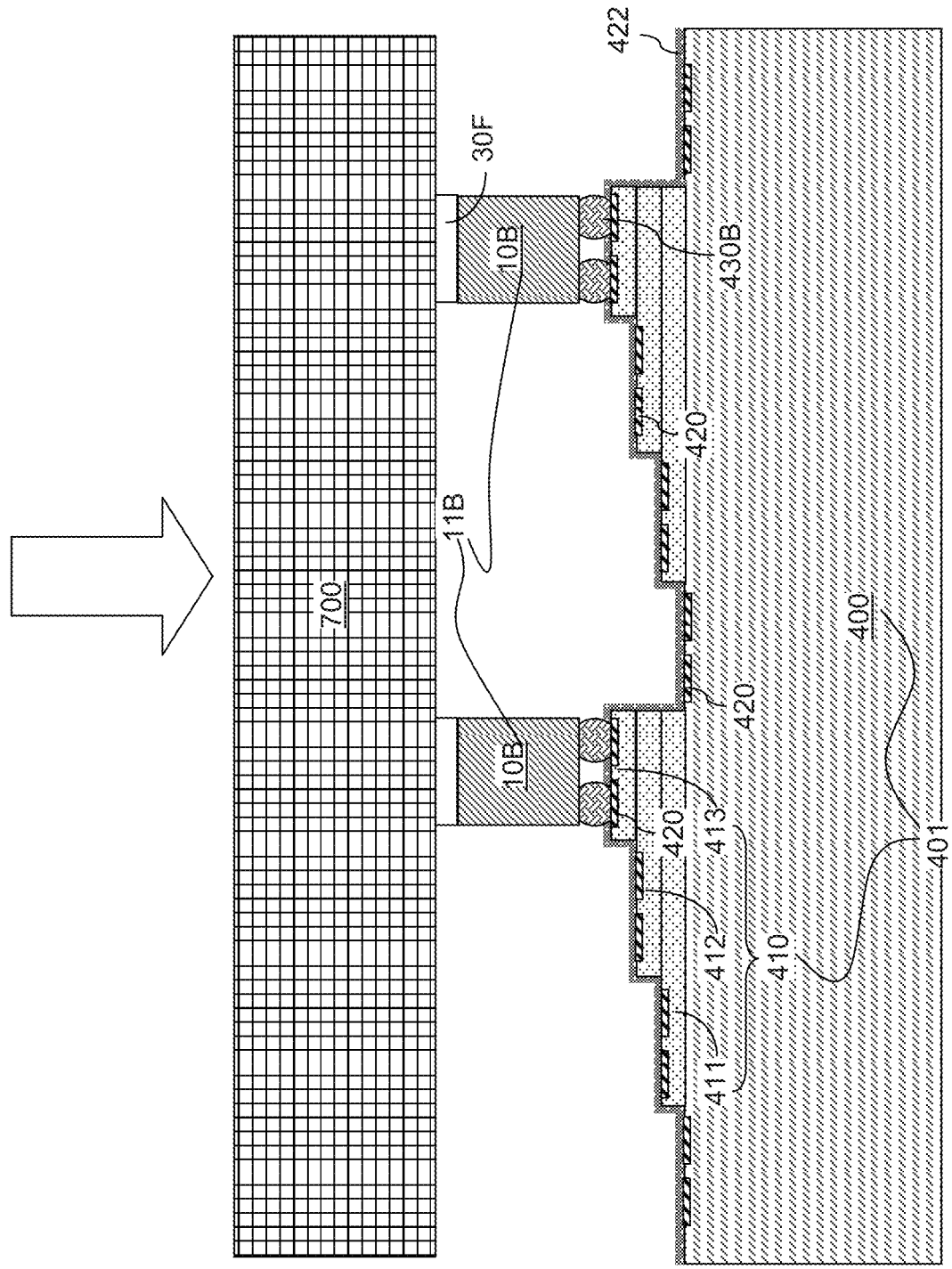
FIG. 28 illustrates a processing step in an alternate embodiment of the present disclosure in which the dummy substrate presses against bonded light emitting diodes while solder balls are heated to a reflow temperature.

Referring to FIG. 28, a downward pressure can be applied to the dummy substrate 700 while the conductive bonding structures (430B, 430G, 430R, 430S), i.e., the solder balls, are heated to a reflow temperature. During this processing step, the dummy substrate 700 presses the newly bonded devices (10B, 10G, 10R, or 10S) toward the backplane 401. In some embodiment, the dummy substrate 700 can be used during a last reflow step to press down on the top surfaces of the transferred devices (10B, 10G, 10R, and 10S) to ensure that the top surfaces of all the transferred dies are positioned in the same horizontal plane. In some other embodiments, previously bonded devices may not affect subsequent transfers by careful selection of the heights of top surfaces of the previously bonded devices (e.g., by selecting the heights of the stepped surfaces of the bond pads 420 and the heights of the conductive bonding structures 430 for multiple backplanes 401 such that top surfaces of later bonded devices are farther away from each backplane 401 than previously bonded devices). FIG. 28 illustrates the step of reflowing the first conductive bonding structures 430B while the dummy substrate 700 presses the transferred first light emitting devices 10B toward the backplane 410.

Figure 29:
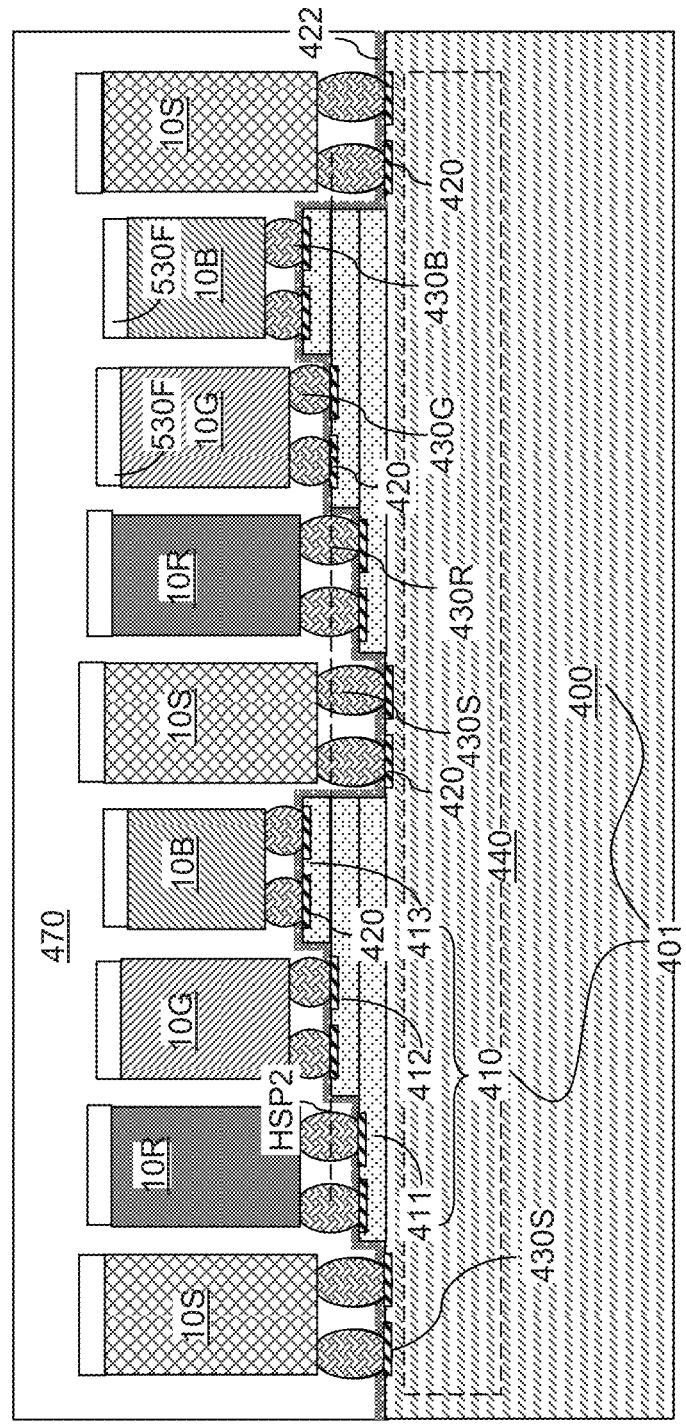
FIG. 29 illustrates still another alternate embodiment of the first exemplary light emitting device assembly according to an embodiment of the present disclosure.

Referring to FIG. 29, subsequent processing steps can be performed to encapsulate the bonded devices (10B, 10G, 10R, 10S) employing any of the embodiments described above. The conductive bonding structures (430B, 430G, 430R, 430S) can include features that are characteristic of reflowed solder material portions such as convex reflowed surfaces.

Multiple transfer assemblies and multiple backplanes can be employed to transfer devices of different types to each backplane, and to form a periodic array of a device set on each backplane. The devices in each transfer assembly can have the same two-dimensional periodicity prior to a series of device transfers. The periodic array of a device set can be the same across the backplanes, and can have a two-dimensional periodicity that is multiples of the two-dimensional periodicity of the devices on the transfer assemblies.

Figure 30:
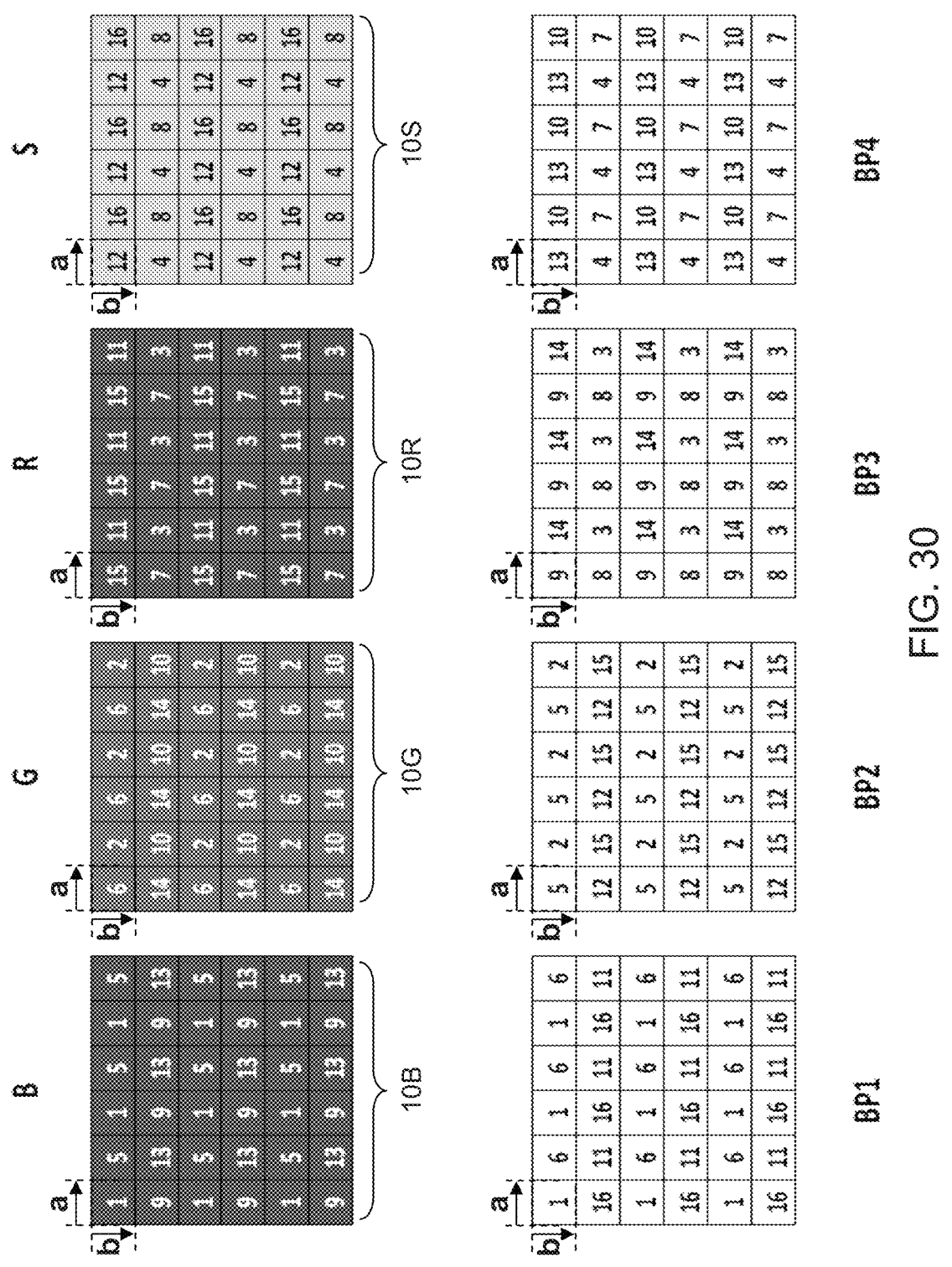

Referring to FIG. 30, an exemplary transfer pattern and an exemplary transfer sequence are illustrated for transferring four different types of devices (10B, 10G, 10R, 10S) (e.g., blue, green and red emitting LEDs and sensors, respectively) to four backplanes (BP1, BP2, BP3, BP4). The four different types of devices (10B, 10G, 10R, 10S) can be provided on four source substrates (B, G, R, S), which can comprise four transfer substrates (301B, 301G, 301R, 301S), or four growth substrates (100/500A, 100/500B, 100/500C, 100/500D), or combinations thereof. The first light emitting diodes 10B can be provided on the first source substrate B, the second light emitting diodes 10G can be provided on the second source substrate G, the third light emitting diodes 10R can be provided on the third source substrate R, and the sensor devices 10S can be provided on the fourth source substrate S.

A subset of first devices 10B labeled "1" can be transferred from the first source substrate B to locations on the first backplane BP1 that are marked with "1." Subsequently, a subset of second devices 10G labeled "2" can be transferred from the second source substrate G to a second substrate BP2 to locations on the second backplane BP2 that are marked with "2." The sequential transfer continues with each set of devices labeled with gradually increasing numerical indices up to the set of devices labeled with the numerical index "16."

Figure 31A:
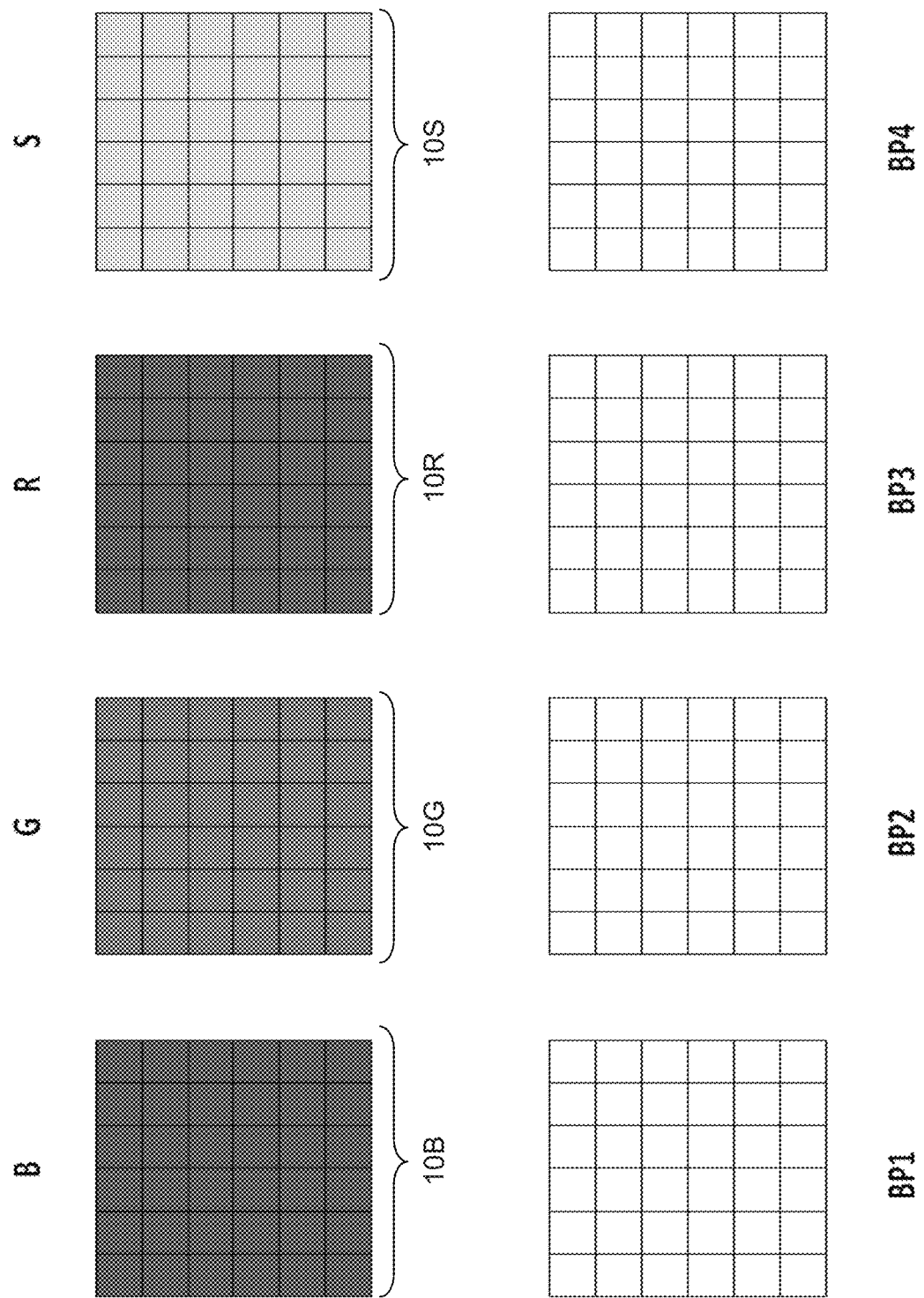
Figure 31B:
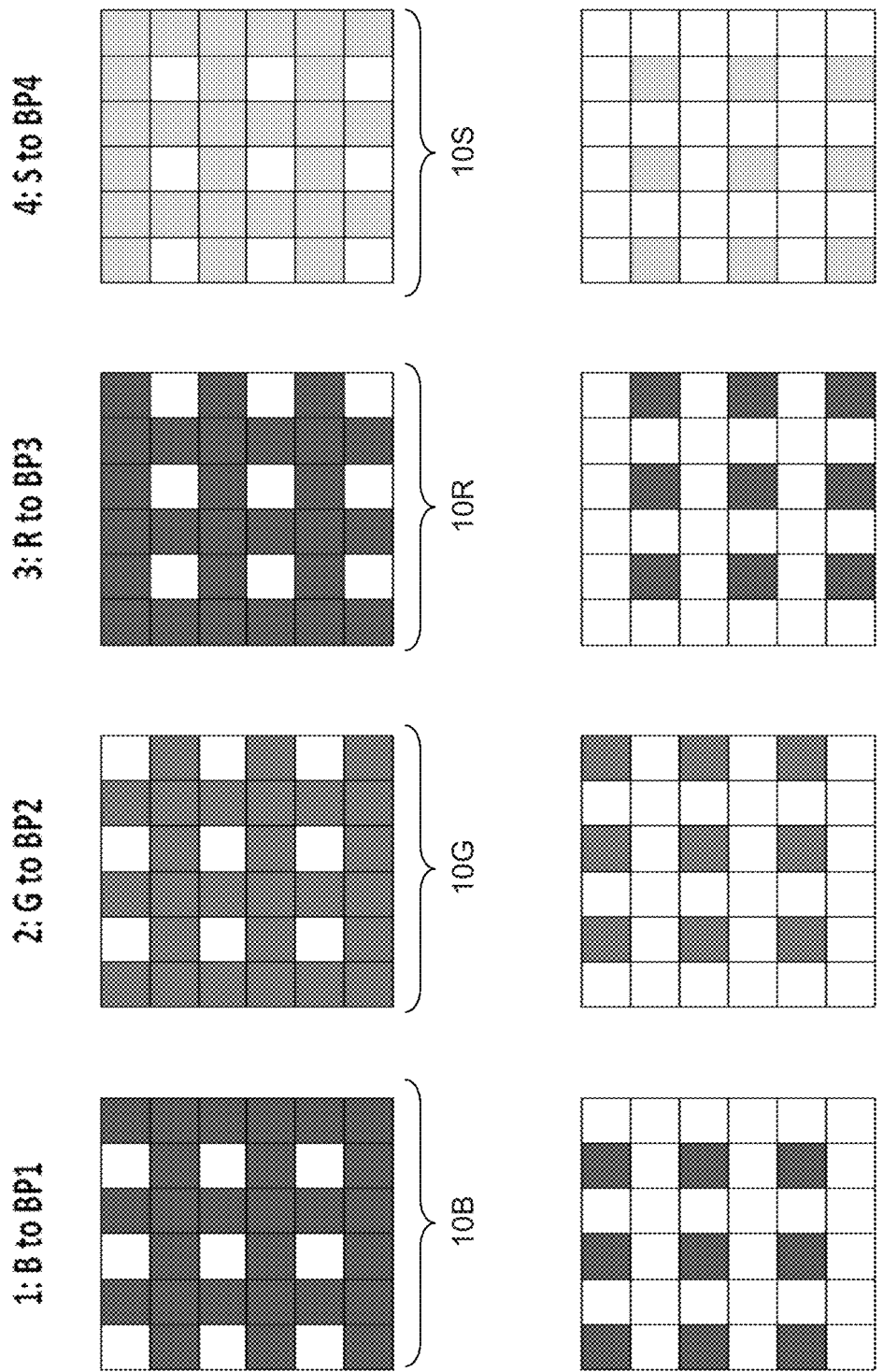
Figure 31C:
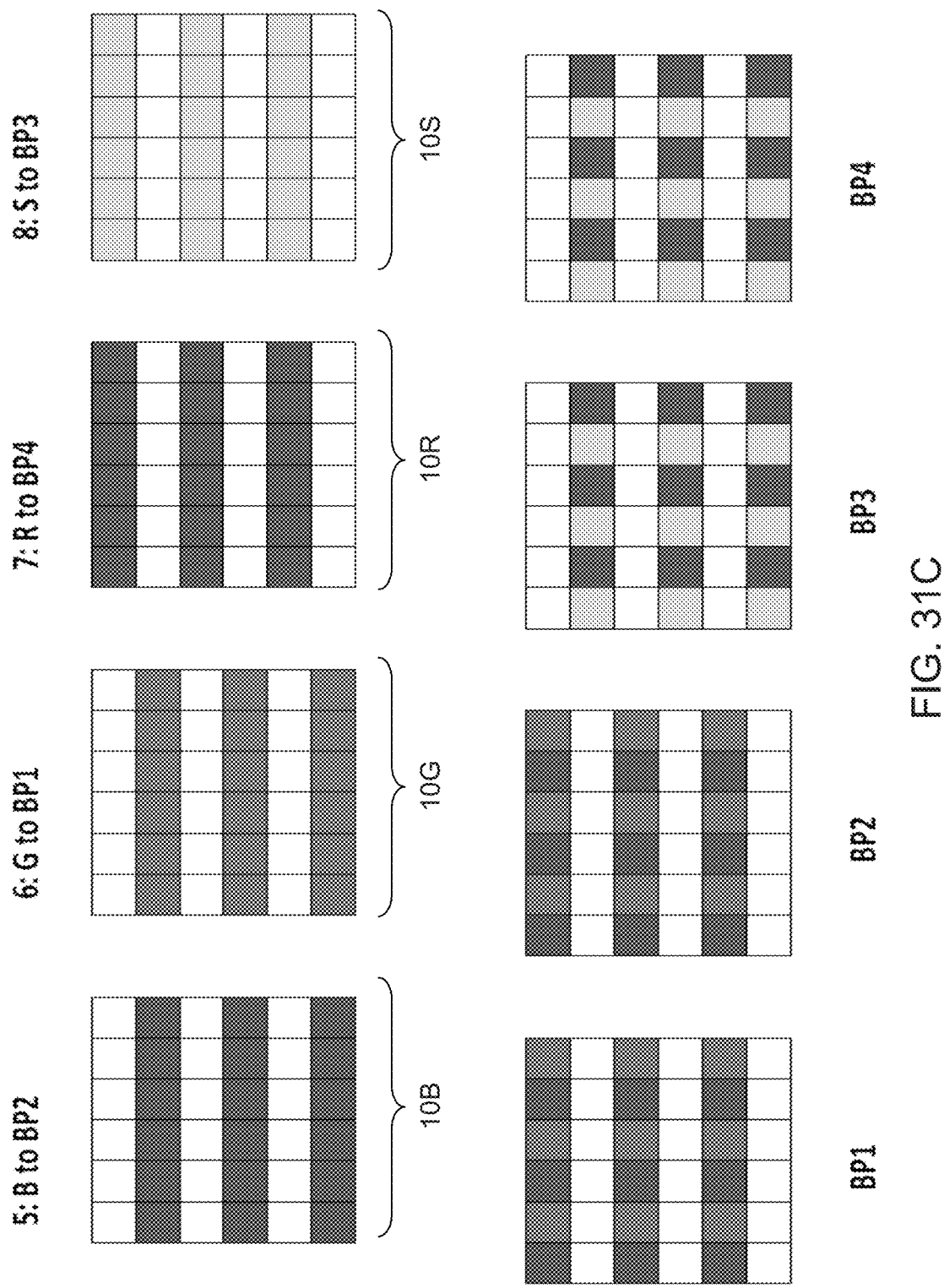
Figure 31D:
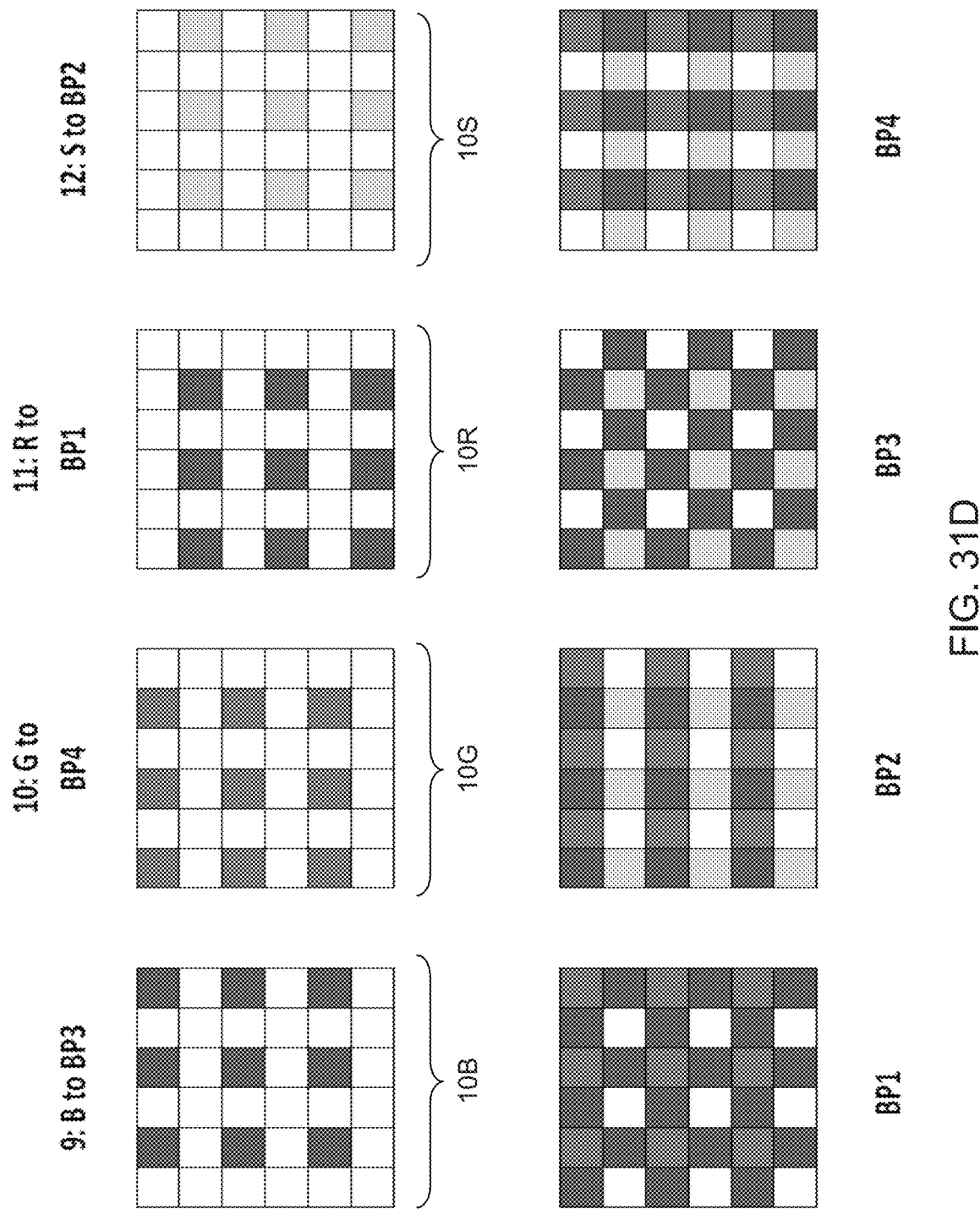

Changes in the presence or absence of the various devices (10B, 10G, 10R, 10S) on the source substrates (B, G, R, S) and the backplanes (BP1, BP2, BP3, BP4) at each step of the transfer sequence are illustrated in FIGS. 31A-31E. FIG. 31A corresponds to a configuration prior to any transfer of the devices (10B, 10G, 10R, 10S), FIG. 31B corresponds to the configuration after performing transfer steps 1-4, FIG. 31C corresponds to the configuration after performing steps 5-8, FIG. 31D corresponds to the configuration after performing steps 9-12, and FIG. 31E corresponds to the configuration after performing steps 13-16. It should be noted that steps 1-4 as illustrated in FIG. 31B may be shuffled in any order because steps 1-4 are independent of one another, steps 5-8 as illustrated in FIG. 31C may be shuffled in any order because steps 5-8 are independent of one another, steps 9-12 as illustrated in FIG. 31D may be shuffled in any order because steps 9-12 are independent of one another, and steps 13-16 as illustrated in FIG. 31E may be shuffled in any order because steps 13-16 are independent of one another.

While the exemplary transfer pattern and the exemplary transfer sequence is illustrated for cases in which four source substrates (B, G, R, S) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. The n backplanes bond with devices from the m transfer assemblies to form n integrated light emitting device assemblies. In one embodiment, n can be the same as, or greater than, m.

A plurality of transfer assemblies, e.g., m transfer assemblies, is provided. Each of the m transfer assemblies comprises a respective source substrate (B, G, R, S) and respective devices (10B, 10G, 10R, 10S) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit conductive bonding structures pattern configured to mount m types of devices.

Each of the m types of devices can be one of the devices within a respective transfer assembly among the m transfer assemblies. The pitches of each unit conductive bonding structures pattern along two independent directions within each of the n backplanes can be multiples of a respective pitch of the two-dimensional periodicity of the devices within each of the m transfer assemblies. In an illustrative example, each of the devices (10B, 10G, 10R, 10S) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of 2a (which is an integer multiple of a) along a first direction, and with the second periodicity of 2b (which is an integer multiple of b) along a second direction (which may be perpendicular to the first direction).

Subsets of devices (10B, 10G, 10R, 10S) from each of them transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R, 10S), if any, that are previously bonded to the respective backplane (BP1, BP2, BP3, BP4).

Figure 32A:
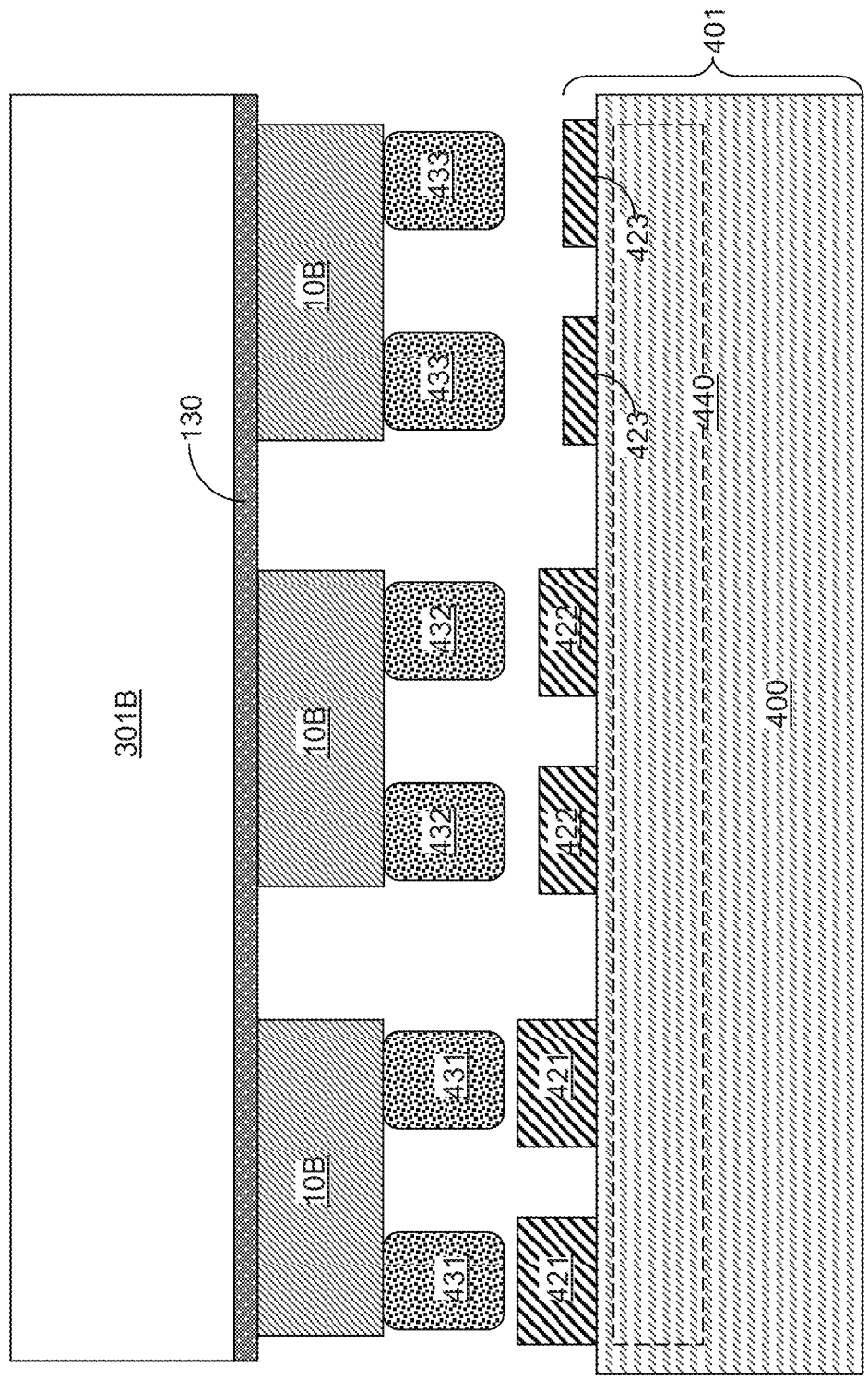
FIGS. 32A-32N are sequential vertical cross-sectional views illustrating a process for formation of a second exemplary light emitting device assembly according to an embodiment of the present disclosure.

Referring to FIG. 32A, an in-process structure is illustrated, which can be employed to form a second exemplary light emitting device assembly according to an embodiment of the present disclosure in which different height bond pads are used. As used herein, a "prototype" structure or an "in-process" structure refers to a transient structure that is subsequently modified in the shape or composition of at least one component therein. The in-process structure for the second exemplary light emitting device assembly can include a backplane substrate 400 including metal interconnect structures 440 therein. The first light emitting diodes 10B can be attached to the source substrate 301B via an ablation material layer 130, which can be a release layer 20 described above or a portion of a source substrate 530 described above. In this embodiment, the backplane substrate 400 may have a substantially planar (i.e., not stepped) upper surface or a stepped upper surface as illustrated in FIG. 9.

Bond pads (421, 422, 423) can be formed at locations at which various devices are to be subsequently bonded. The various devices can include first light emitting devices 10B, second light emitting devices 10G, third light emitting devices 10R, and/or sensor devices 10S described above. The various devices (10B, 10G, 10R, 10S) can be provided on source substrates (B, G, R, S; Refer to FIG. 30), which can be transfer substrates (301B, 301G, 301R, 301S), growth substrates (100/500B, 100/500G, 100/500R, 100/500S), or combinations thereof. The backplane 401 includes the backplane substrate 400 and the bond pads (421, 422, 423).

The bond pads (421, 422, 423) can have the same composition as the bond pads 420 described above. The bond pads (421, 422, 423) can include multiple types having different thicknesses. For example, the bond pads (421, 422, 423) can include first bond pads 421 having a first thickness, second bond pads 422 having a second thickness, and third bond pads 423 having a third thickness. Additional bond pads (not shown) having different thicknesses can also be employed. In one embodiment, the first thickness can be greater than the second thickness, and the second thickness can be greater than the third thickness. The difference between the first thickness and the second thickness can be in a range from 0.3 micron to 10 microns (for example, from 1 micron to 5 microns), and the difference between the second thickness and the third thickness can be in a range from 0.3 micron to 10 microns (for example, from 1 micron to 5 microns). The thickness of the thinnest bond pads can be in a range from 1 micron to 20 microns (for example, from 2 microns to 10 microns), although lesser and greater thicknesses can also be employed.

In one embodiment, conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate 301B, which can be a first transfer substrate 300B or a first-type growth substrate 100B or 500B. The conductive bonding structures (431, 432, 433) can be any of the conductive bonding structures 430 discussed above. The conductive bonding structures (431, 432, 432) can include first conductive bonding structures 431 formed on a first subset of the first light emitting diodes 10B to be subsequently transferred to the backplane substrate 400, second conductive bonding structures 432 formed on a second subset of the first light emitting diodes 10B to be subsequently transferred to another backplane substrate (not shown), third conductive bonding structures 433 formed on a third subset of the first light emitting diodes 10B to be subsequently transferred to yet another backplane substrate, and optional additional conductive bonding structures formed on another subset of the first light emitting diodes 10B to be subsequently transferred to still another backplane substrate. The conductive bonding structures (431, 432, 433) can be formed simultaneously on the first light emitting diodes 10B.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

In one embodiment, each of the conductive bonding structures (431, 432, 432) can have the same height (or total height if formed in two portions). In one embodiment, each of the conductive bonding structures (431, 432, 432) can have the same height and the same volume (or total volume if formed in two portions). In one embodiment, each of the conductive bonding structures (431, 432, 432) can have the same height, the same volume, and the same shape (or same sets of two shapes if formed in two portions). The height of the conductive bonding structures (431, 432, 432) can be in a range from 15 microns to 100 microns (such as from 20 microns to 60 microns), although lesser and greater heights can also be employed. In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Referring to FIG. 32B, the backplane 401 and the assembly including the first light emitting diodes 10B are positioned such that each first conductive bonding structure 431 is attached to one of a first light emitting device 10B and a first bonding pad 421, and contacts the other of the first light emitting device 10B and the first bonding pad 421. Due to the difference in the thickness of the various types of bonding pads (421, 422, 423), the second conductive bonding structures 432 and the third conductive bonding structures 433 do not contact any underlying bonding pads (422, 423) (in case the second conductive bonding structures 432 and the third conductive bonding structures 433 are attached to the first light emitting devices 10B) or do not contact overlying first light emitting devices 10B (in case the second conductive bonding structures 432 and the third conductive bonding structures 433 are attached to the second bonding pads 422 or the third bonding pads 423).

A reflow process is subsequently performed. The ambient temperature can be raised to a reflow temperature of the material of the conductive bonding structures (431, 432, 432). Only the first conductive bonding structures 431 form additional bonding with the underlying first bonding pads 421 (if the first conductive bonding structures 431 are already bonded to the first light emitting devices 10B) or with the overlying first light emitting devices 10B (if the first conductive bonding structures 431 are already bonded to the first bonding pads 421). Thus, each first conductive bonding structure 431 becomes bonded to the overlying first light emitting device 10B and to the underlying first bonding pad 421, while additional bonding is not formed for the second and third conductive bonding structures (432, 433) during the reflow process. While the present disclosure is described employing an embodiment in which the backplane 401 and the assembly including the first light emitting diodes 10B are brought into contact with each other prior to the reflow process, embodiments are expressly contemplated herein in which the mechanical movement of the backplane 401 and the assembly including the first light emitting diodes 10B is performed simultaneously with the reflow process, e.g., during temperature ramping steps of the reflow process. While the first bonding pads 421 are described above as "underlying" while the first light emitting devices are described as "overlying" for convenience of illustration, it should be understood that the components can be arranged upside down (i.e., where first bonding pads 421 are "underlying" and the first light emitting devices are "underlying") or in any other position during the process.

Figure 32C:
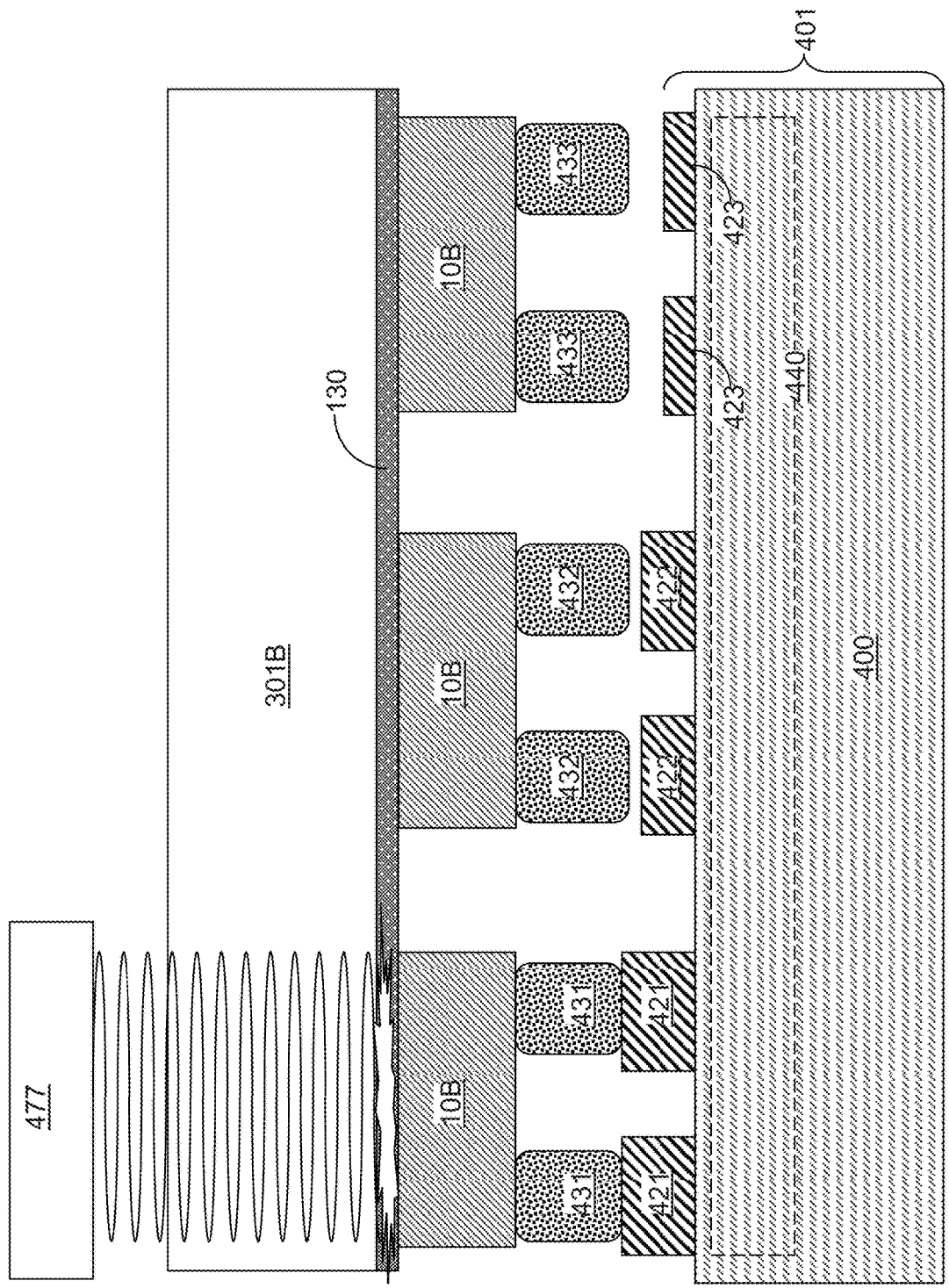

Referring to FIG. 32C, a laser irradiation process is performed to separate each bonded first light emitting device 10B from the first source substrate. The same laser irradiation process can be employed as described above. Portions of the ablation material layer 130 overlying the first subset of the first light emitting diodes 10B (which are bonded to the backplane 401) are irradiated by a laser beam, and are ablated. The laser ablation can be performed sequentially for each first light emitting diode 10B within the first subset.

Figure 32D:
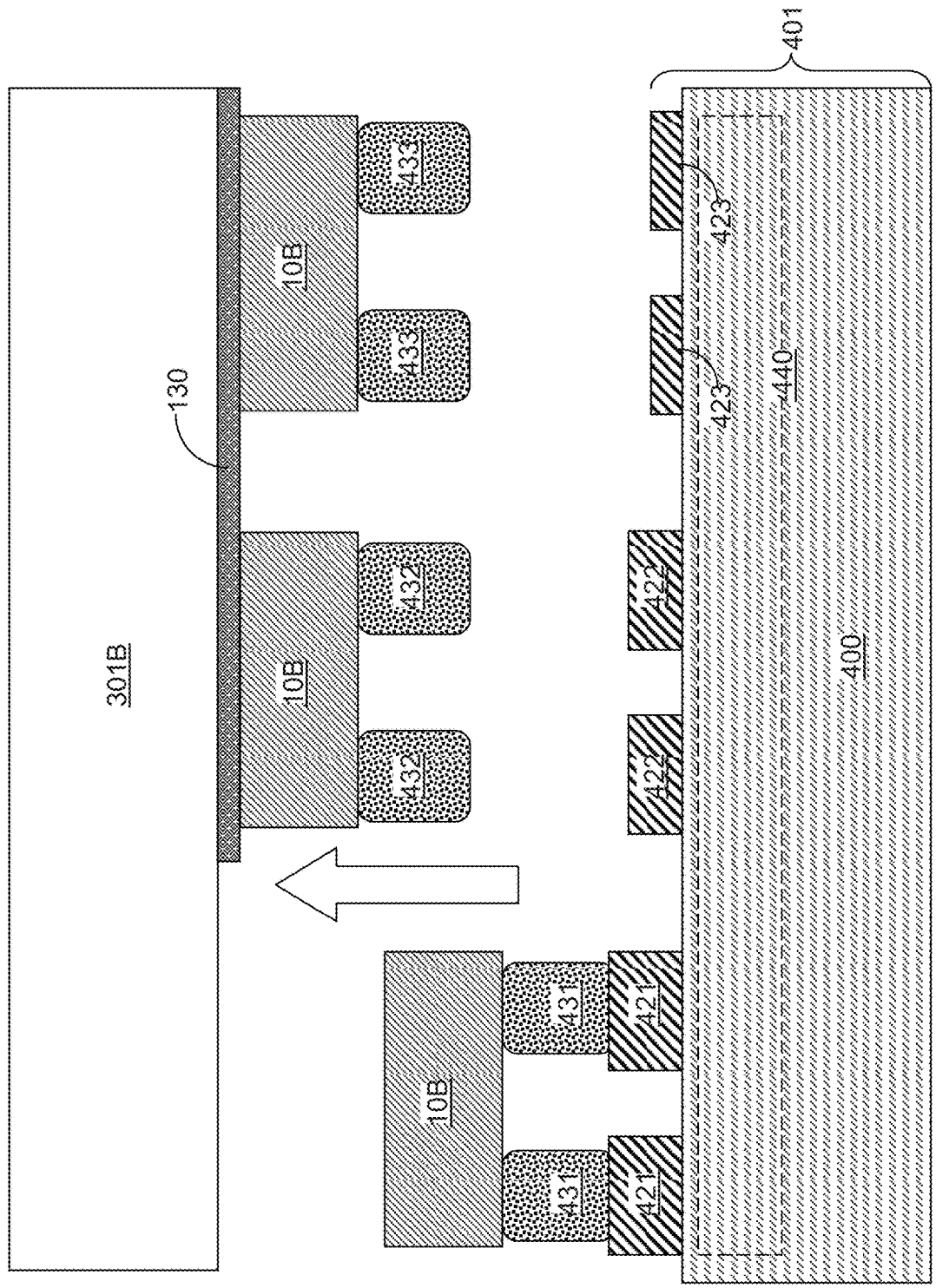

Referring to FIG. 32D, the assembly of the first source substrate 301B and attached first light emitting diodes 10B (i.e., the complement of the first subset of the first light emitting diodes 10B) is separated from the backplane 401 and the first subset of the first light emitting diodes 10B. The first subset of the first light emitting diodes 10B is attached to the backplane 401 through the first conductive bonding structures 431 to form the in-process second exemplary light emitting device assembly.

Figure 32E:
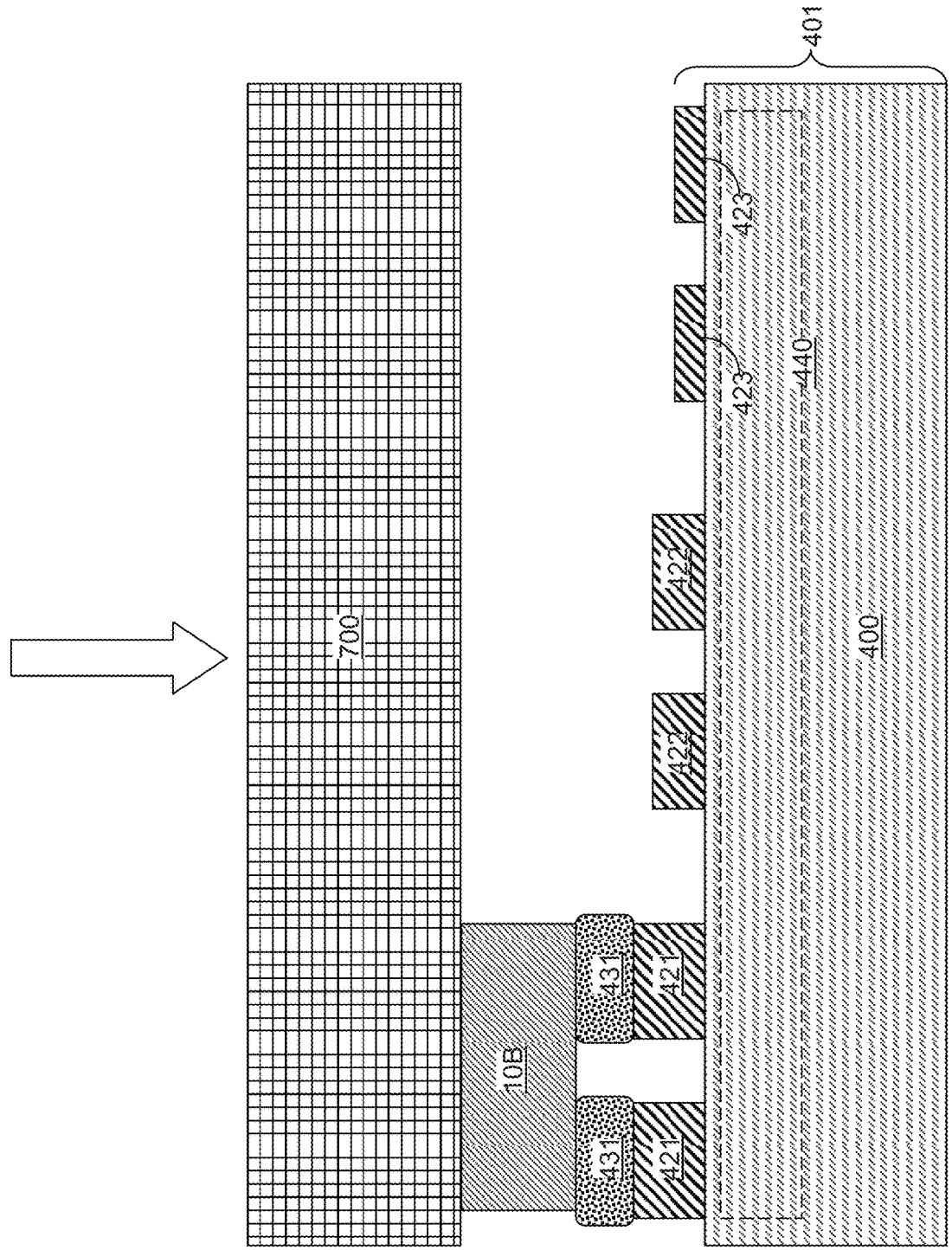

Referring to FIG. 32E, any suitable pressure plate, such as a dummy substrate 700 is employed to push the first light emitting diodes 10B on the first conductive bonding structures 431 toward the backplane 401. The temperature of the in-process second light emitting device assembly is raised to the reflow temperature of the first conductive bonding structures 431 to induce reflow of the first conductive bonding structures 431 as the dummy substrate 700 pushes the first light emitting diodes 10B toward the backplane 401. The push distance is selected such that the vertical distance between the bottom surfaces of the first bonding pads 421 and the top surfaces of the first light emitting diodes 10B is less than the sum of the thicknesses of the thinnest bonding pads (e.g., the third bonding pads 421), the height of the conductive bonding structures (431, 432, 433) (which is the same among the conductive bonding structures), and the least height of the devices (10G, 10R) to be subsequently attached (if the heights are different) or the common height of the devices (10G, 10R) to be subsequently attached (if the heights are the same).

The processing steps of FIGS. 32A-32E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 32F:
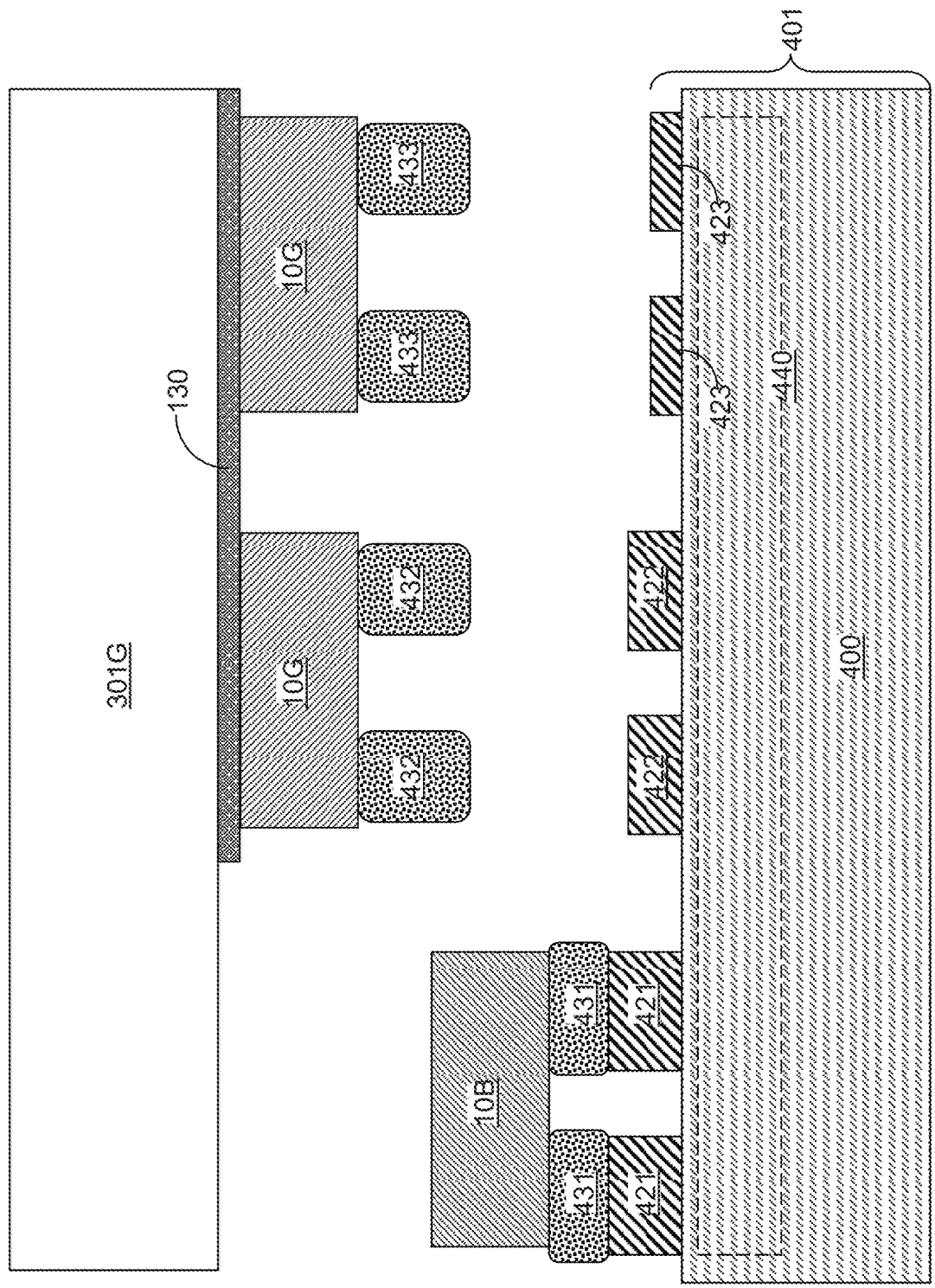

Referring to FIG. 32F, a second source substrate (such as a second transfer substrate 301G) from which a first subset of second light emitting devices 10G are removed is positioned over the in-process second exemplary light emitting device assembly, and is aligned such that a second subset of the second light emitting diodes 10G overlies the second bonding pads 422.

Figure 32G:
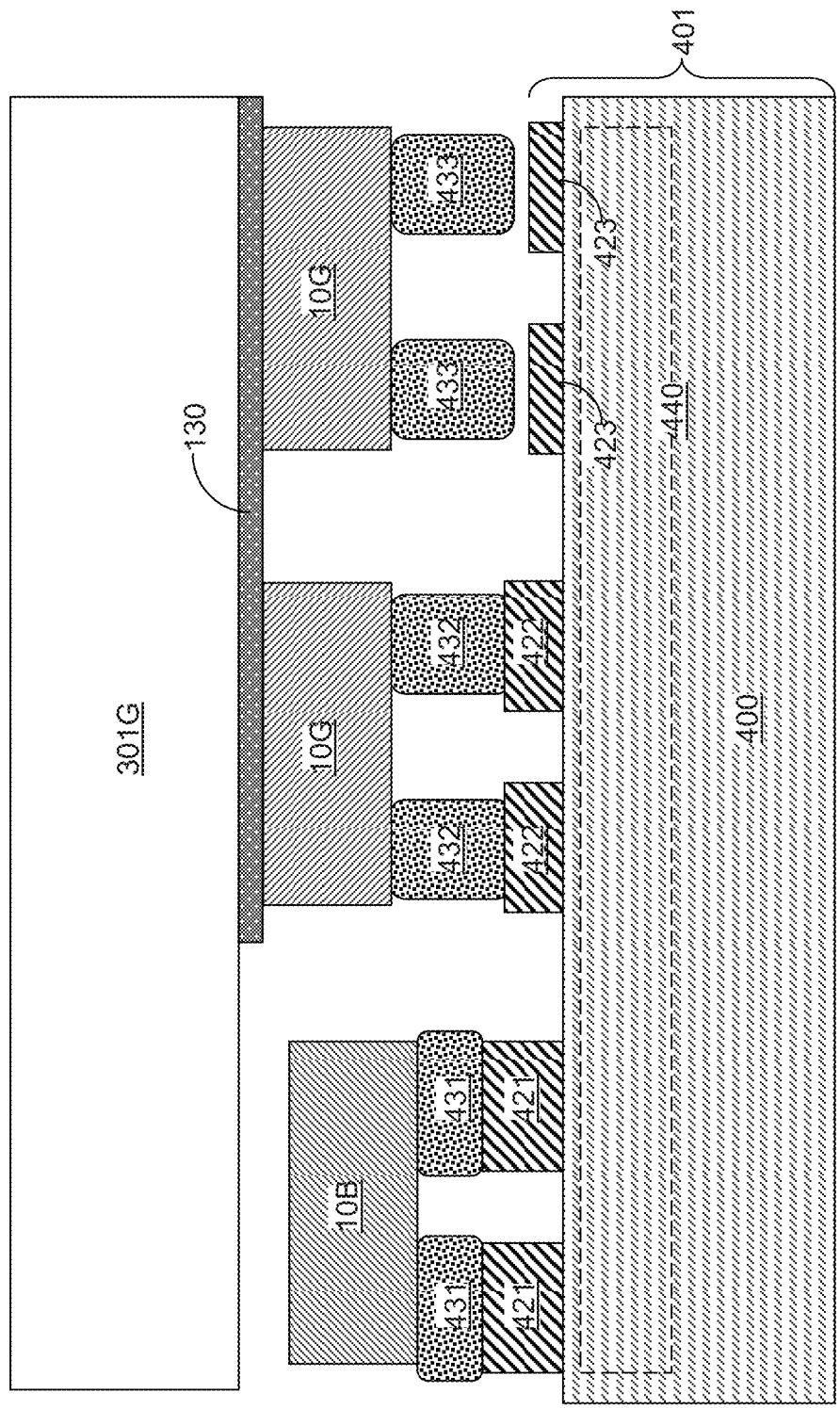

Referring to FIG. 32G, the backplane 401 and the assembly including the second light emitting diodes 10G are positioned such that each second conductive bonding structure 432 is attached to one of a second light emitting device 10G and a second bonding pad 422, and contacts the other of the second light emitting device 10G and the second bonding pad 422. Due to the difference in the thickness of the second and third bonding pads (422, 423), the third conductive bonding structures 433 do not contact any underlying bonding pads 423 (in case the second conductive bonding structures 432 and the third conductive bonding structures 433 are attached to the second light emitting devices 10G) or do not contact overlying second light emitting devices 10G (in case the second conductive bonding structures 432 and the third conductive bonding structures 433 are attached to the second bonding pads 422 or the third bonding pads 423).

A reflow process is subsequently performed. The ambient temperature can be raised to a reflow temperature of the material of the conductive bonding structures (431, 432, 432). The second conductive bonding structures 432 form additional bonding with the underlying second bonding pads 422 (if the second conductive bonding structures 432 are already bonded to the second light emitting devices 10G) or with the overlying second light emitting devices 10G (if the second conductive bonding structures 432 are already bonded to the second bonding pads 422). Thus, each second conductive bonding structure 432 becomes bonded to the overlying second light emitting device 10G, and to the underlying second bonding pad 422, while additional bonding is not formed for the third conductive bonding structures 433 during the reflow process.

Figure 32H:
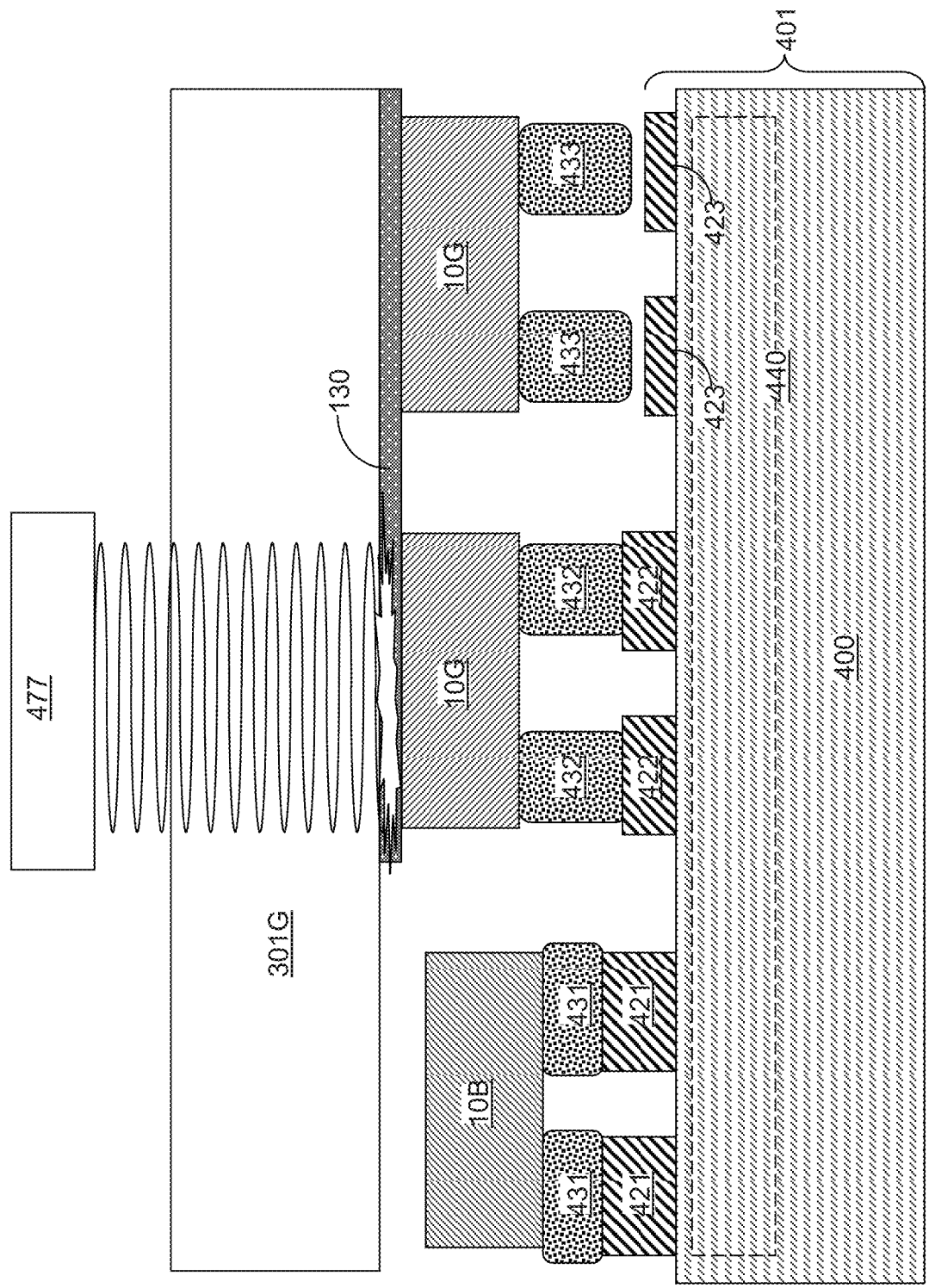

Referring to FIG. 32H, a laser irradiation process is performed to separate each bonded second light emitting device 10G from the second source substrate. Portions of the ablation material layer 130 overlying the bonded subset (i.e., the second subset) of the second light emitting diodes 10G (which are bonded to the backplane 401) are irradiated by a laser beam, and are ablated. The laser ablation can be performed sequentially for each second light emitting diode 10G within the subset of the second light emitting diodes 10G that are bonded to the backplane 401.

Figure 32I:
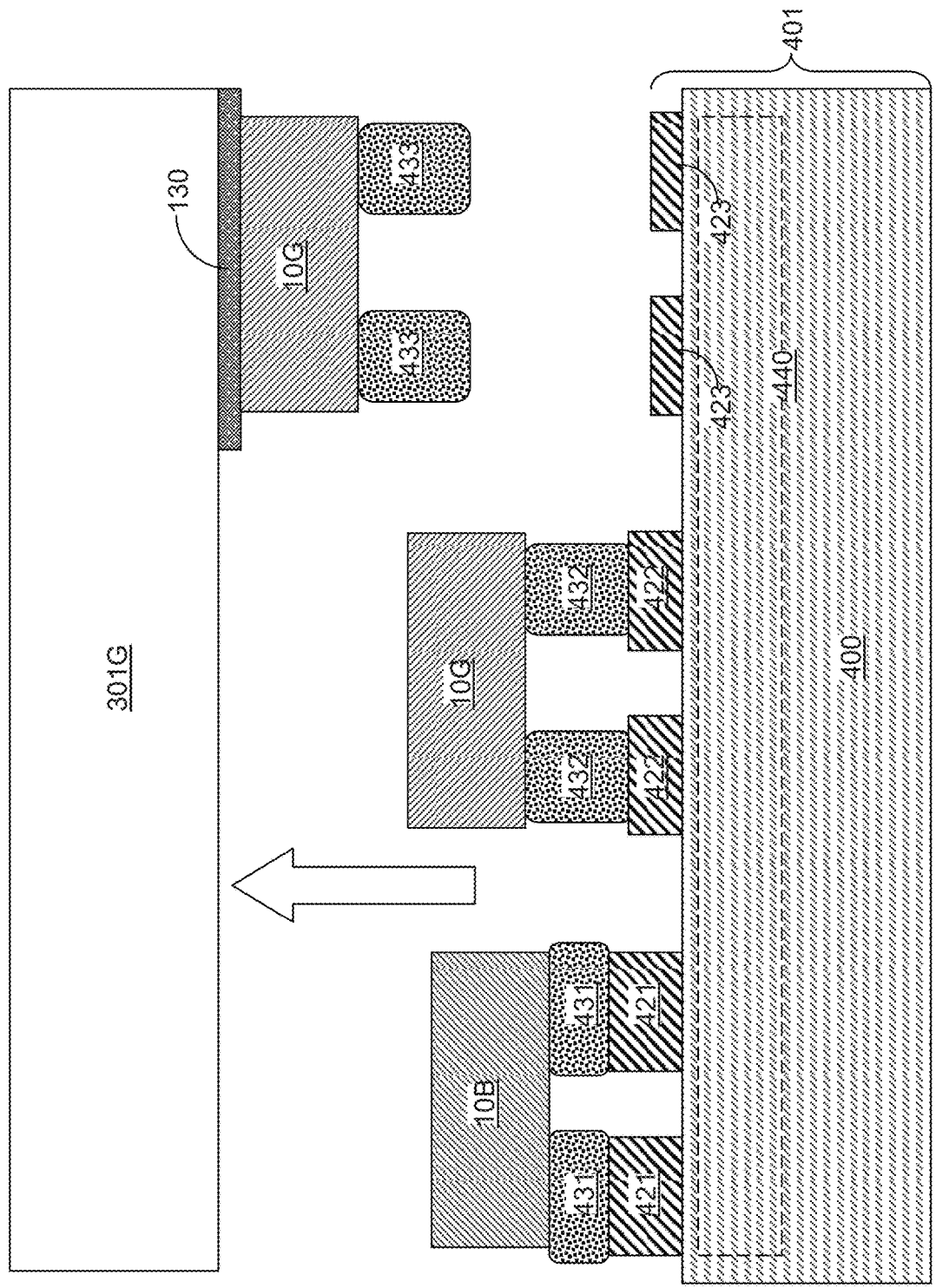

Referring to FIG. 32I, the assembly of the second source substrate 301G and attached second light emitting diodes 10G (a third subset of the second light emitting diodes 10G that remain on the second source substrate) is separated from the backplane 401 and the second subset of the second light emitting diodes 10G that are now attached to the backplane 401. The second subset of the second light emitting diodes 10G is attached to the backplane 401 through the second conductive bonding structures 432 to form the in-process second exemplary light emitting device assembly.

Referring to FIG. 32J, a dummy substrate 700 is employed to push the second light emitting diodes 10G on the second conductive bonding structures 432 toward the backplane 401. The temperature of the in-process second light emitting device assembly is raised to the reflow temperature of the second conductive bonding structures 432 to induce reflow of the second conductive bonding structures 432 as the dummy substrate 700 pushes the second light emitting diodes 10G toward the backplane 401. The push distance is selected such that the vertical distance between the bottom surfaces of the second bonding pads 422 and the top surfaces of the second light emitting diodes 10G is less than the sum of the thicknesses of the thinnest bonding pads (e.g., the third bonding pads 423), the height of the conductive bonding structures (431, 432, 433) as originally provided (which is the same among the conductive bonding structures), and the least height of the devices (10R and optionally 10S) to be subsequently attached (if the heights are different) or the common height of the devices (10R and optionally 10S) to be subsequently attached (if the heights are the same).

The processing steps of FIGS. 32F-32J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Figure 32K:
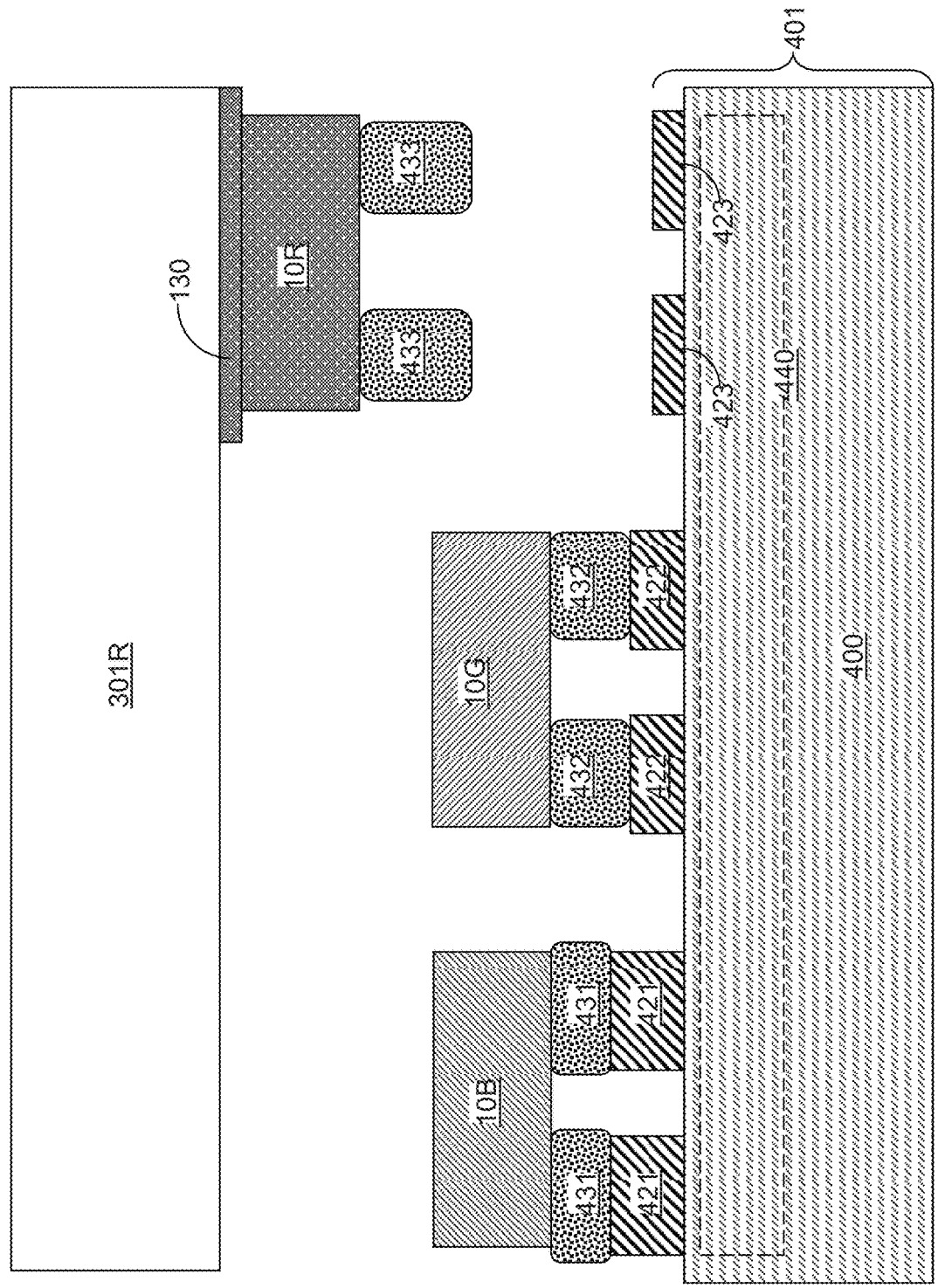

Referring to FIG. 32K, a third source substrate (such as a third transfer substrate 301R), from which a first subset and a second subset of third light emitting devices 10R have been removed in prior processing steps, is positioned over the in-process second exemplary light emitting device assembly, and is aligned such that a third subset of the third light emitting diodes 10R overlies the third bonding pads 423.

Figure 32L:
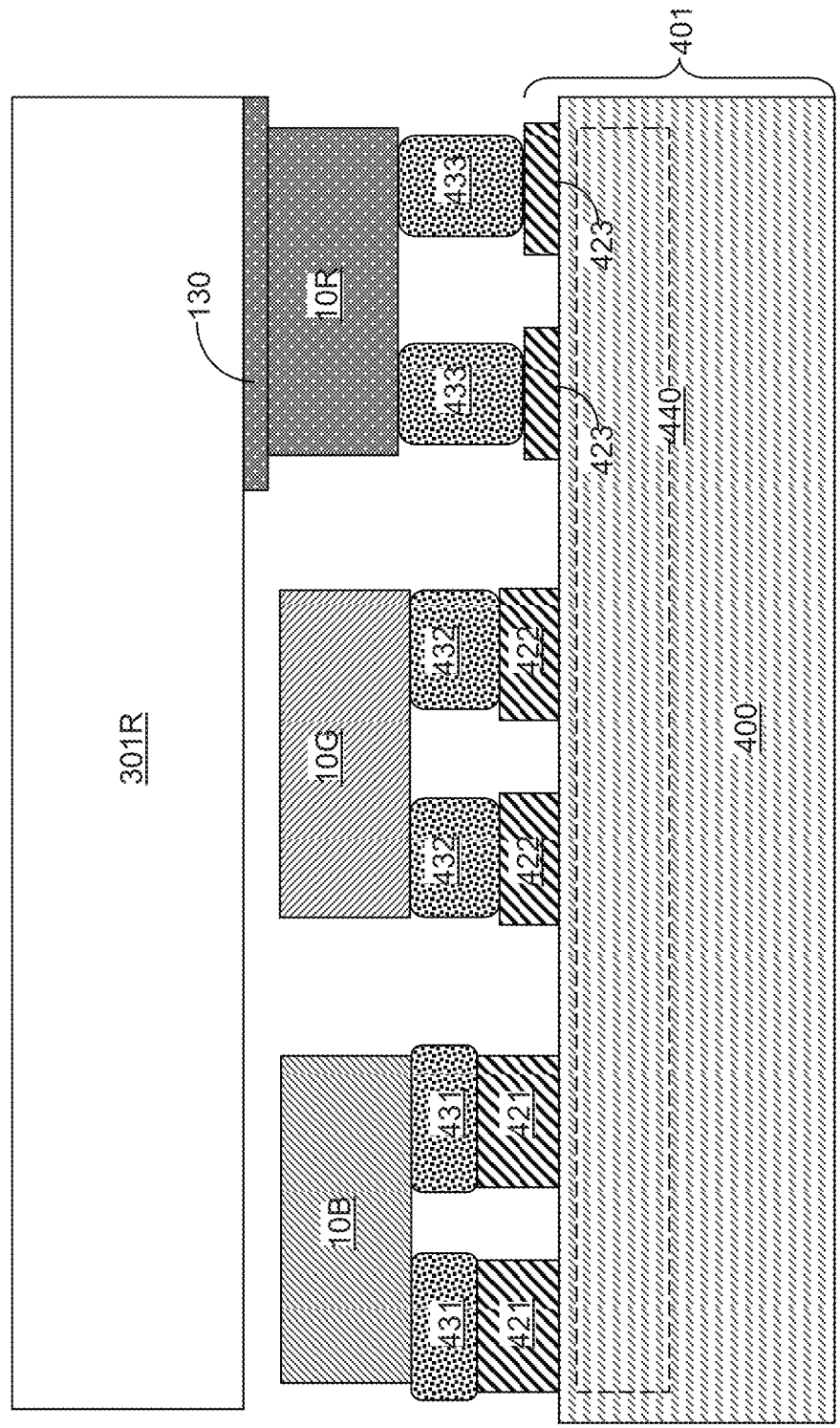

Referring to FIG. 32L, the backplane 401 and the assembly including the third light emitting diodes 10R are positioned such that each third conductive bonding structure 433 is attached to one of a third light emitting device 10R and a third bonding pad 423, and contacts the other of the third light emitting device 10R and the third bonding pad 423. If any addition bonding pads (not shown) having a lesser thickness are present, additional conductive bonding structures (not shown) overlying such additional bonding pads do not contact any underlying additional bonding pads (in case the additional conductive bonding structures are attached to the third source substrate) or do not contact overlying third light emitting devices 10R (in case the additional conductive bonding structures are attached to the additional bonding pads).

A reflow process is subsequently performed. The ambient temperature can be raised to a reflow temperature of the material of the conductive bonding structures (431, 432, 432). The third conductive bonding structures 433 form additional bonding with the underlying third bonding pads 423 (if the third conductive bonding structures 433 are already bonded to the third light emitting devices 10R) or with the overlying third light emitting devices 10R (if the third conductive bonding structures 433 are already bonded to the third bonding pads 423). Thus, each third conductive bonding structure 433 becomes bonded to the overlying third light emitting device 10R, and to the underlying third bonding pad 423, while additional bonding is not formed for the additional conductive bonding structures (if present) during the reflow process.

Figure 32M:
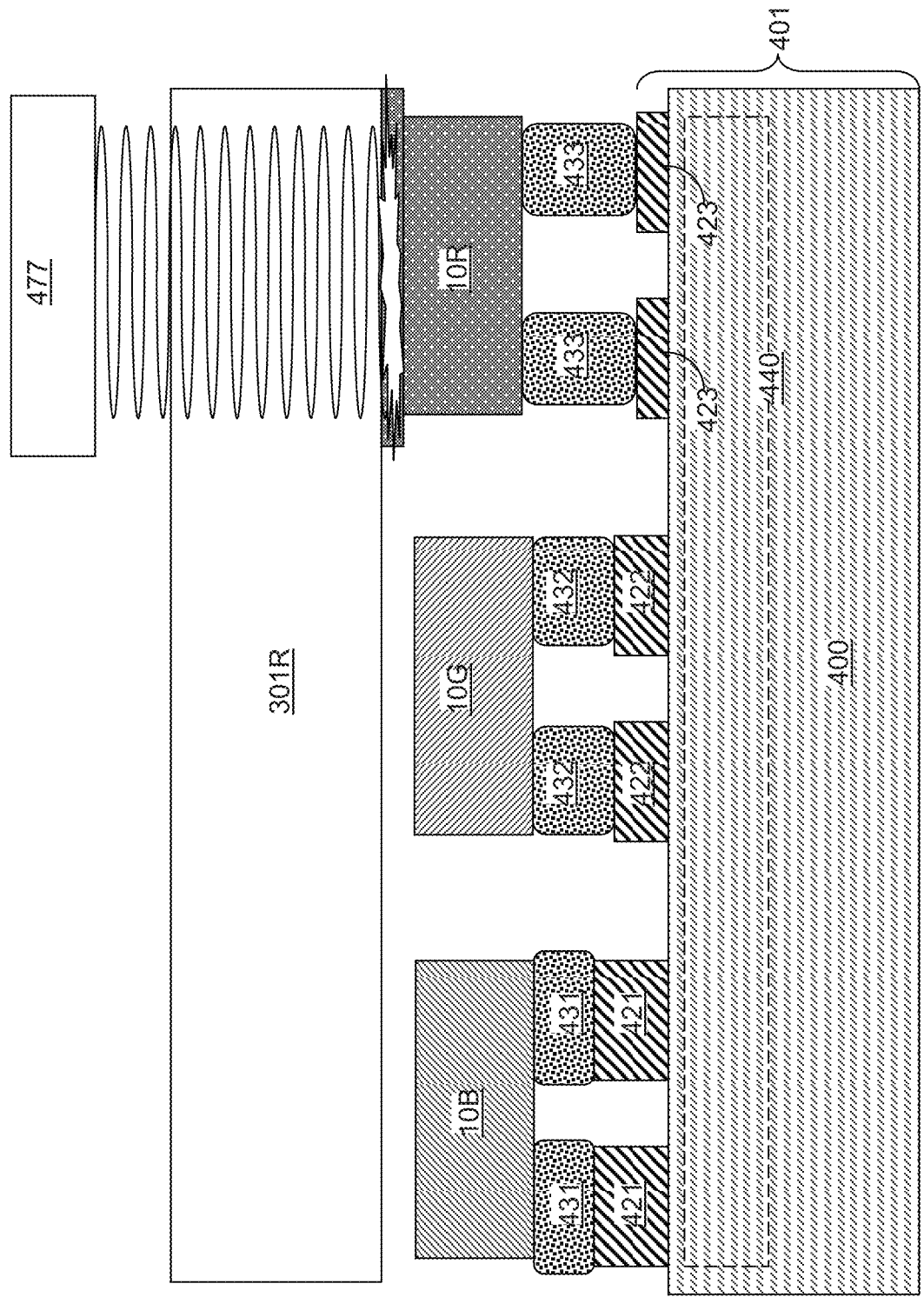

Referring to FIG. 32M, a laser irradiation process is performed to separate each bonded third light emitting device 10R from the third source substrate. Portions of the ablation material layer 130 overlying the bonded subset (i.e., the third subset) of the third light emitting diodes 10R (which are bonded to the backplane 401) are irradiated by a laser beam, and are ablated. The laser ablation can be performed sequentially for each third light emitting diode 10R within the subset of the third light emitting diodes 10R that are bonded to the backplane 401.

Figure 32N:
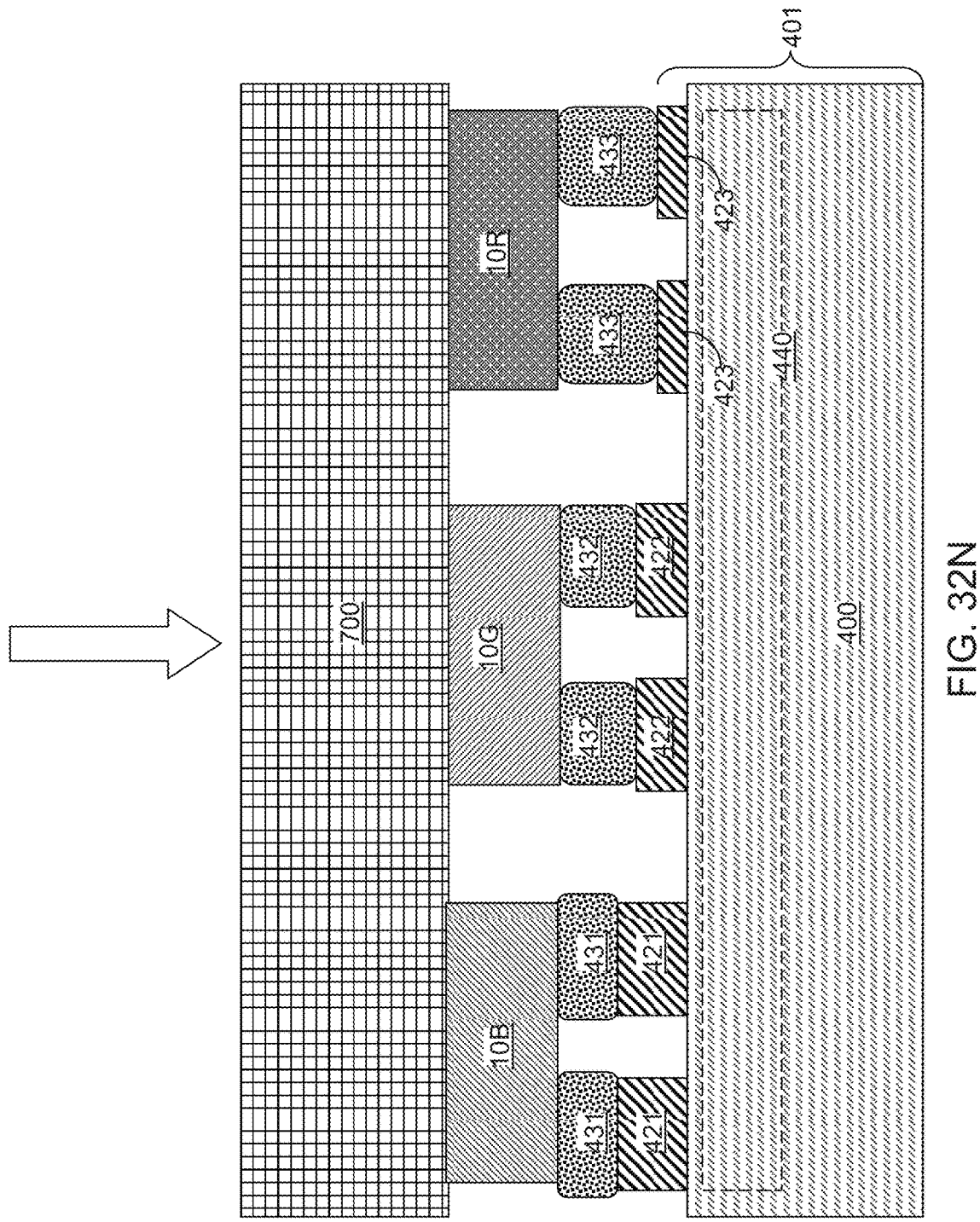

Referring to FIG. 32N, the assembly of the third source substrate 301R and any remaining third light emitting diodes 10R, if any, is separated from the backplane 401 and the third subset of the third light emitting diodes 10R that are now attached to the backplane 401. The third subset of the third light emitting diodes 10R is attached to the backplane 401 through the third conductive bonding structures 433 to form the second exemplary light emitting device assembly.

Optionally, a dummy substrate 700 may be employed to push the third light emitting diodes 10R on the third conductive bonding structures 433 toward the backplane 401. The temperature of the second light emitting device assembly is raised to the reflow temperature of the third conductive bonding structures 433 to induce reflow of the third conductive bonding structures 433 as the dummy substrate 700 pushes the third light emitting diodes 10R toward the backplane 401. If any additional devices (such as sensor devices 10S) are to be subsequently attached to the backplane 401, the push distance can be selected such that the vertical distance between the bottom surfaces of the third bonding pads 423 and the top surfaces of the third light emitting diodes 10R is less than the sum of the thicknesses of the additional bonding pads, the height of the additional conductive bonding structures (which can be the same as the height of the other conductive bonding pads (431, 432, 433) as originally provided), and the least height of the devices (such as sensor devices 10S) to be subsequently.

Referring to FIG. 33A, an in-process structure is illustrated, which can be employed to form a third exemplary light emitting device assembly according to an embodiment of the present disclosure. The in-process third exemplary light emitting device assembly can be derived from the in-process second exemplary light emitting device assembly of FIG. 32A by employing the same thickness for the bonding pads (421, 422, 423) and different heights for the conductive bonding structures (431, 432, 433). The bond pads (421, 422, 423) can have the same composition as the bond pads 420 described above. In this embodiment, the backplane substrate 400 may have a substantially planar (i.e., not stepped) upper surface or a stepped upper surface as illustrated in FIG. 9, and the bond pads (421, 422, 423) can have the same height or different heights as shown in FIG. 32A.

The conductive bonding structures (431, 432, 433) can include multiple types having different heights. For example, the conductive bonding structures (431, 432, 433) can include first conductive bonding structures 431 having a first height, second conductive bonding structures 432 having a second height, and third conductive bonding structures 433 having a third height. Additional conductive bonding structures (not shown) having different heights can also be employed. In one embodiment, the first height can be greater than the second height, and the second height can be greater than the third height. The difference between the first height and the second height can be in a range from 0.3 micron to 10 microns (for example, from 1 micron to 5 microns), and the difference between the second height and the third height can be in a range from 0.3 micron to 10 microns (for example, from 1 micron to 5 microns). The height of the shortest conductive bonding structures (e.g., 433) can be in a range from 10 micron to 80 microns (for example, from 15 microns to 50 microns), although lesser and greater heights can also be employed.

In one embodiment, the conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate B, which can be a first transfer substrate 30B or a first-type growth substrate 100B. The conductive bonding structures (431, 432, 433) can be any of the conductive bonding structures 430 discussed above. The conductive bonding structures 431 are formed on a first subset of the first light emitting diodes 10B to be subsequently transferred to the backplane substrate 400. The second conductive bonding structures 432 are formed on a second subset of the first light emitting diodes 10B to be subsequently transferred to another backplane substrate (not shown). The third conductive bonding structures 433 are formed on a third subset of the first light emitting diodes 10B to be subsequently transferred to yet another backplane substrate. Optionally, additional conductive bonding structures can be formed on another subset of the first light emitting diodes 10B to be subsequently transferred to still another backplane substrate.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

Different types of conductive bonding structures (431, 432, 433) can be formed sequentially on the first light emitting diodes 10B. The first conductive bonding structures 431 can have a greater volume than the second conductive bonding structures 432, and the second conductive bonding structures 432 can have a greater volume than the third conductive bonding structures 433. In one embodiment, the conductive bonding structures (431, 432, 433) of different types can have substantially the same maximum lateral dimensions (e.g., the diameter of a spherical shape or a cylindrical shape).

In one embodiment, the conductive bonding structures (431, 432, 432) can be substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 33B:
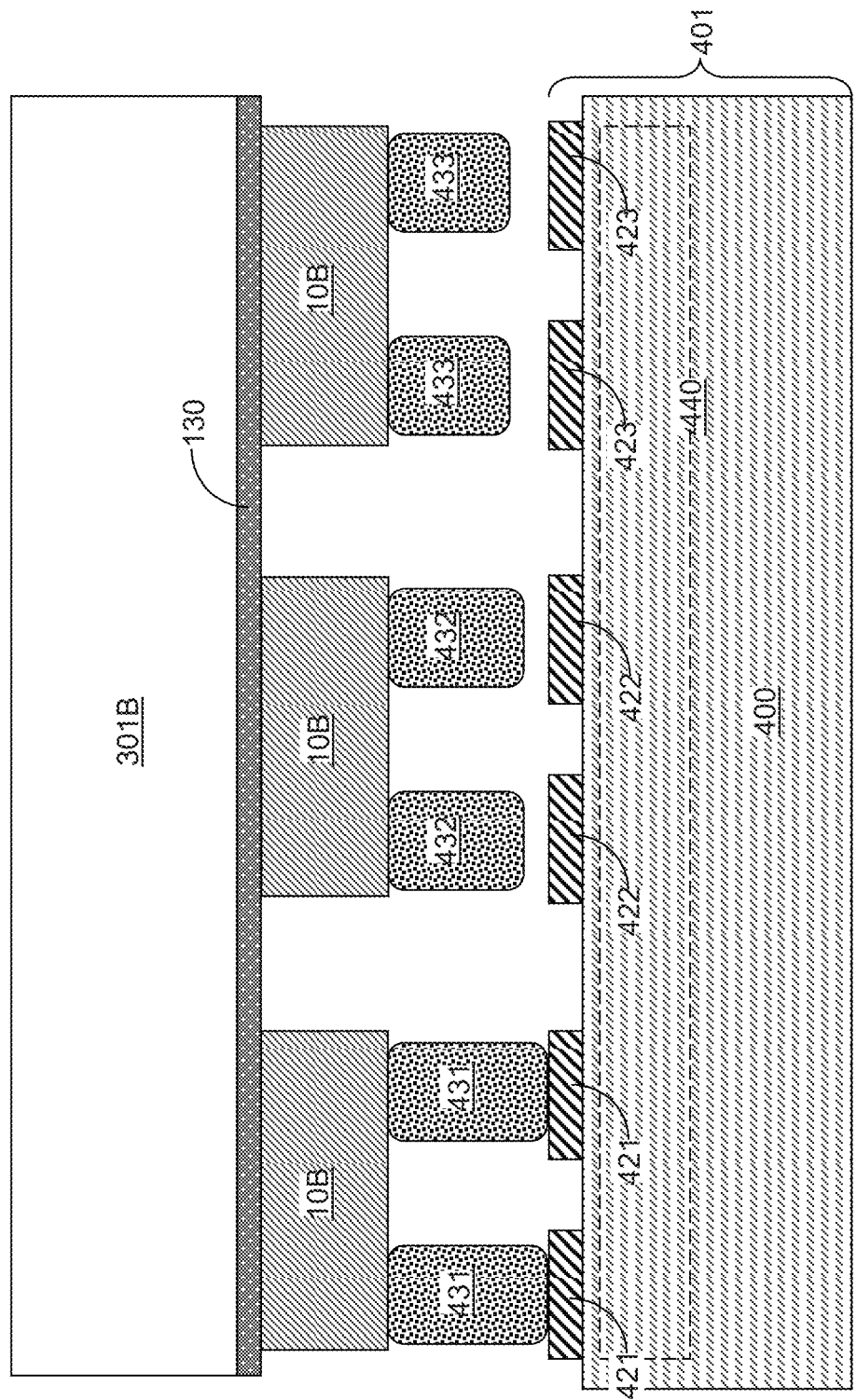
FIGS. 33A-33N are sequential vertical cross-sectional views illustrating a process for formation of a third exemplary light emitting device assembly according to an embodiment of the present disclosure.

Referring to FIG. 33B, the backplane 401 and the assembly including the first light emitting diodes 10B are positioned such that each first conductive bonding structure 431 is attached to one of a first light emitting device 10B and a first bonding pad 421, and contacts the other of the first light emitting device 10B and the first bonding pad 421. Due to the difference in the heights of the various types of conductive bonding structures (431, 432, 432), the second conductive bonding structures 432 and the third conductive bonding structures 433 do not contact any underlying bonding pads (422, 423) (in case the second conductive bonding structures 432 and the third conductive bonding structures 433 are attached to the first light emitting devices 10B) or do not contact overlying first light emitting devices 10B (in case the second conductive bonding structures 432 and the third conductive bonding structures 433 are attached to the second bonding pads 422 or the third bonding pads 423).

A reflow process is subsequently performed in the same manner as the processing steps of FIG. 32B.

Figure 33C:
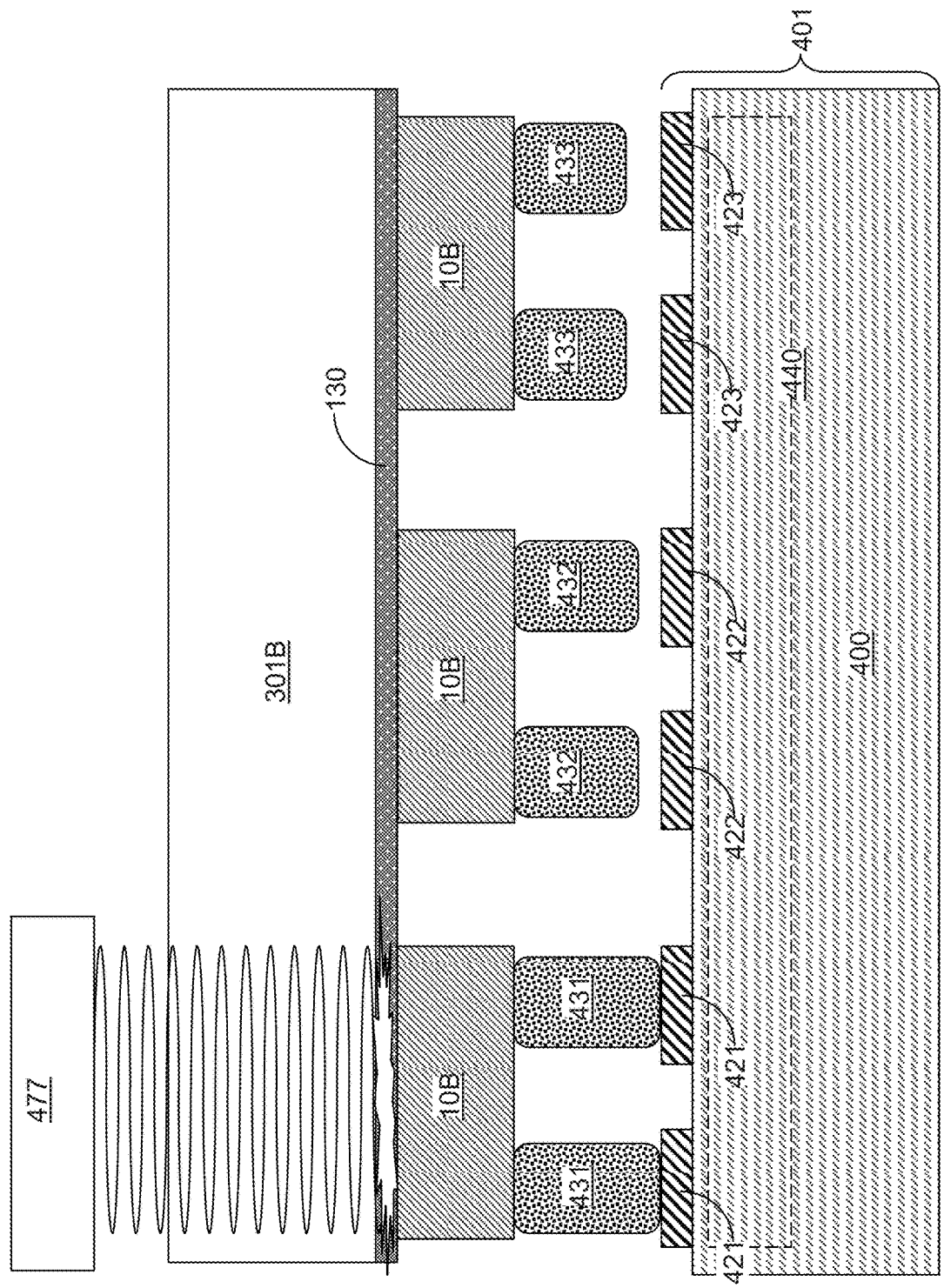

Referring to FIG. 33C, a laser irradiation process is performed to separate each bonded first light emitting device 10B from the first source substrate in the same manner as the processing steps of FIG. 32C.

Figure 33D:
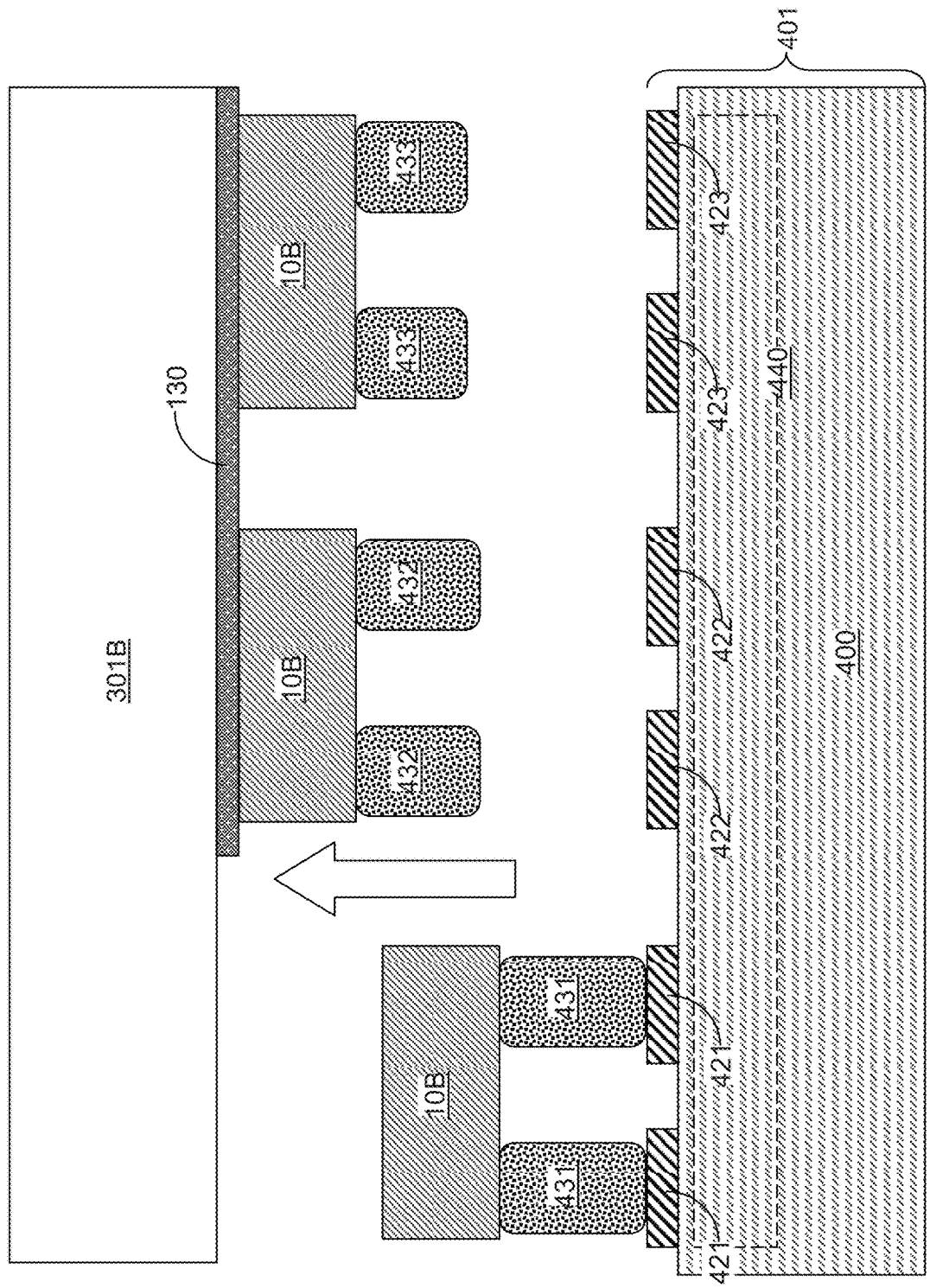

Referring to FIG. 33D, the assembly of the first source substrate 301B and attached first light emitting diodes 10B (i.e., the complement of the first subset of the first light emitting diodes 10B) is separated from the backplane 401 and the first subset of the first light emitting diodes 10B.

Figure 33E:
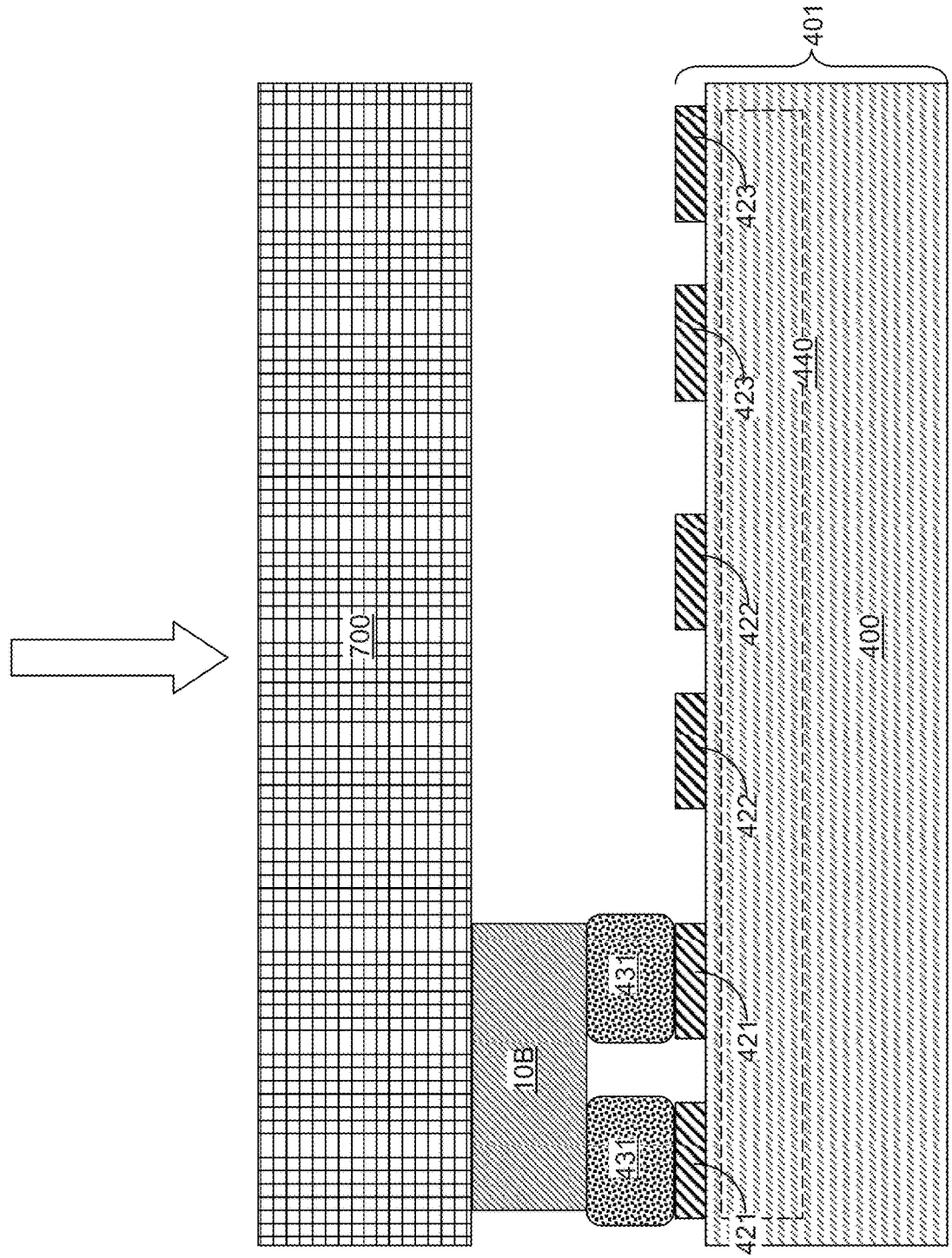

Referring to FIG. 33E, a dummy substrate 700 is employed to push the first light emitting diodes 10B on the first conductive bonding structures 431 toward the backplane 401 while reflowing the first conductive bonding structures 431 in the same manner as the processing steps of FIG. 32E.

The processing steps of FIGS. 33A-33E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 33F:
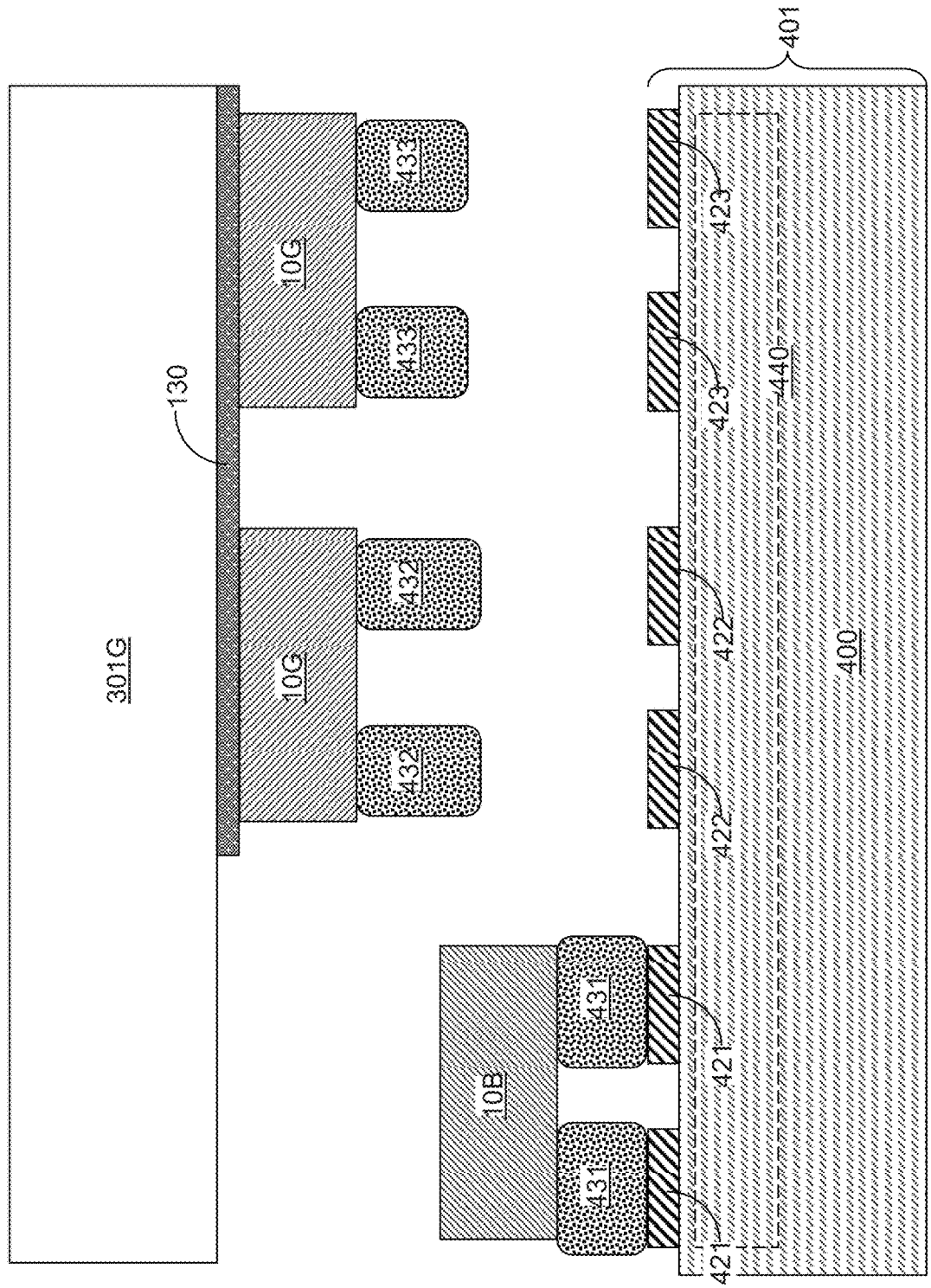

Referring to FIG. 33F, a second source substrate (such as a second transfer substrate 301G) from which a first subset of second light emitting devices 10G are removed is positioned over the in-process fourth exemplary light emitting device assembly, and is aligned such that a second subset of the second light emitting diodes 10G overlies the second bonding pads 422.

Figure 33G:
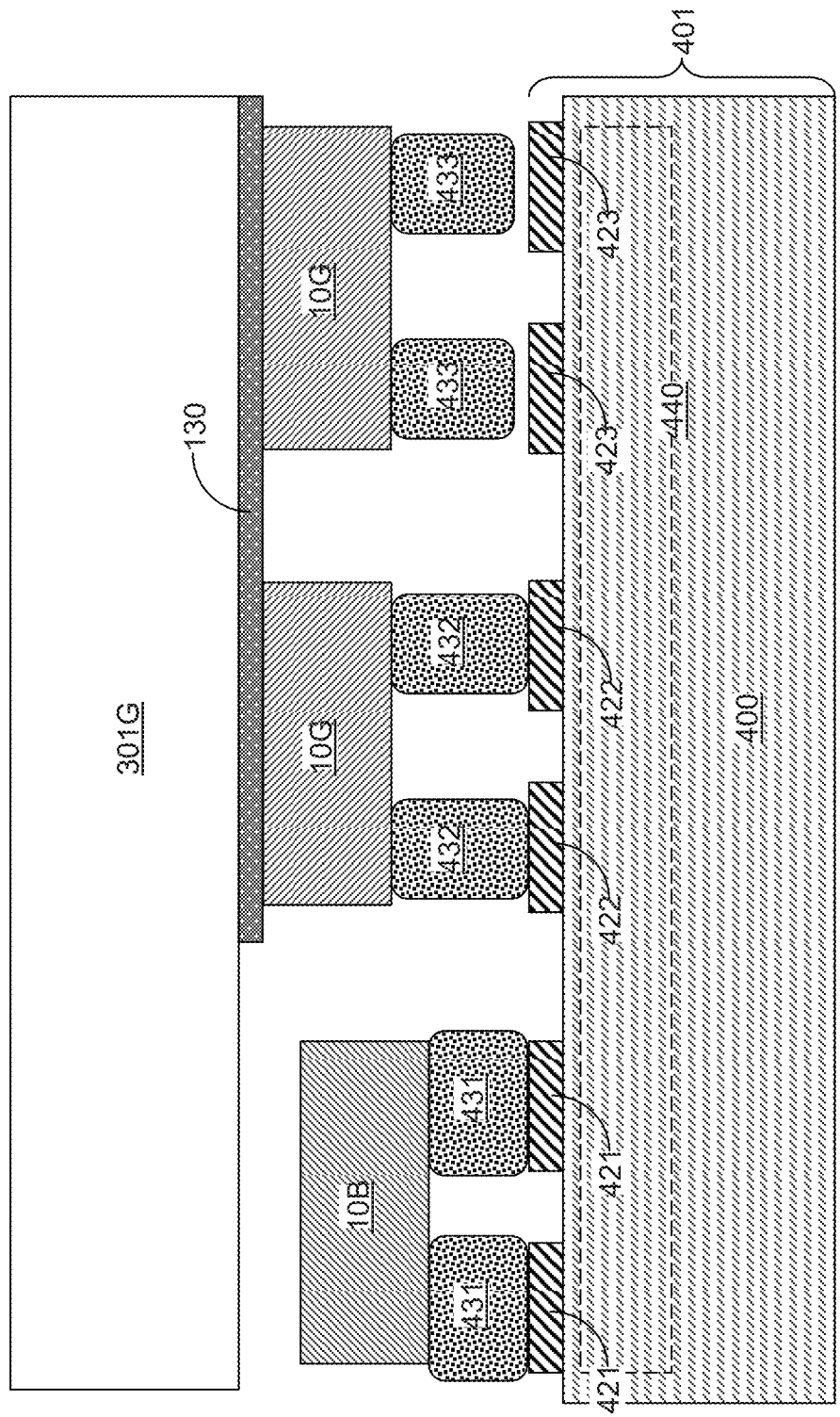

Referring to FIG. 33G, the backplane 401 and the assembly including the second light emitting diodes 10G are positioned such that each second conductive bonding structure 432 is attached to one of a second light emitting device 10G and a second bonding pad 422, and contacts the other of the second light emitting device 10G and the second bonding pad 422. Due to the difference in the heights of the second and third conductive bonding structures (432, 433), the third conductive bonding structures 433 do not contact any underlying bonding pads 423 (in case the second conductive bonding structures 432 and the third conductive bonding structures 433 are attached to the second light emitting devices 10G) or do not contact overlying second light emitting devices 10G (in case the second conductive bonding structures 432 and the third conductive bonding structures 433 are attached to the second bonding pads 422 or the third bonding pads 423).

A reflow process is subsequently performed in the same manner as the processing steps of FIG. 32G. Each second conductive bonding structure 432 becomes bonded to the overlying second light emitting device 10G, and to the underlying second bonding pad 422, while additional bonding is not formed for the third conductive bonding structures 433 during the reflow process.

Figure 33H:
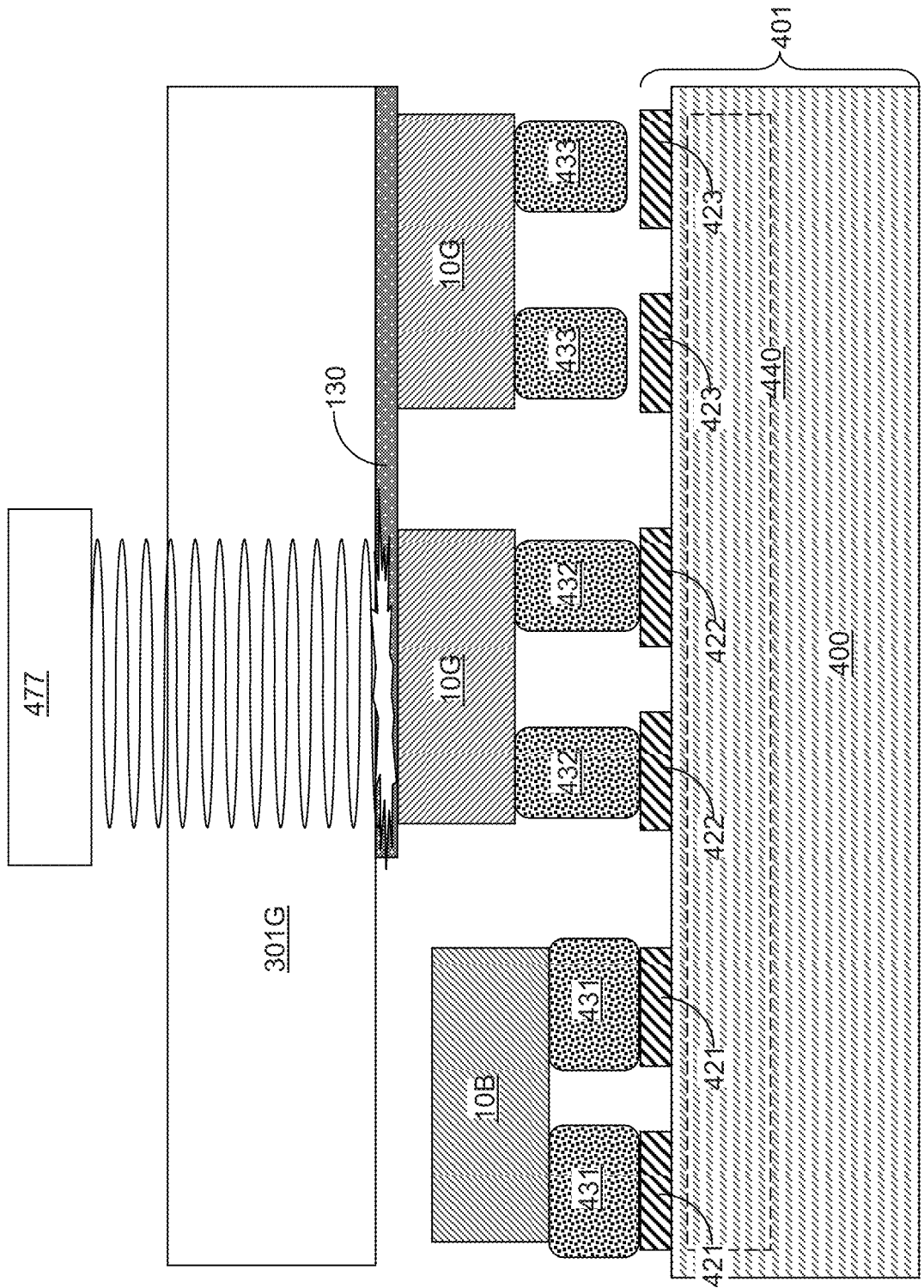

Referring to FIG. 33H, a laser irradiation process is performed to separate each bonded second light emitting device 10G from the second source substrate. The same laser irradiation process can be performed as in the processing steps of FIG. 32H.

Figure 33I:
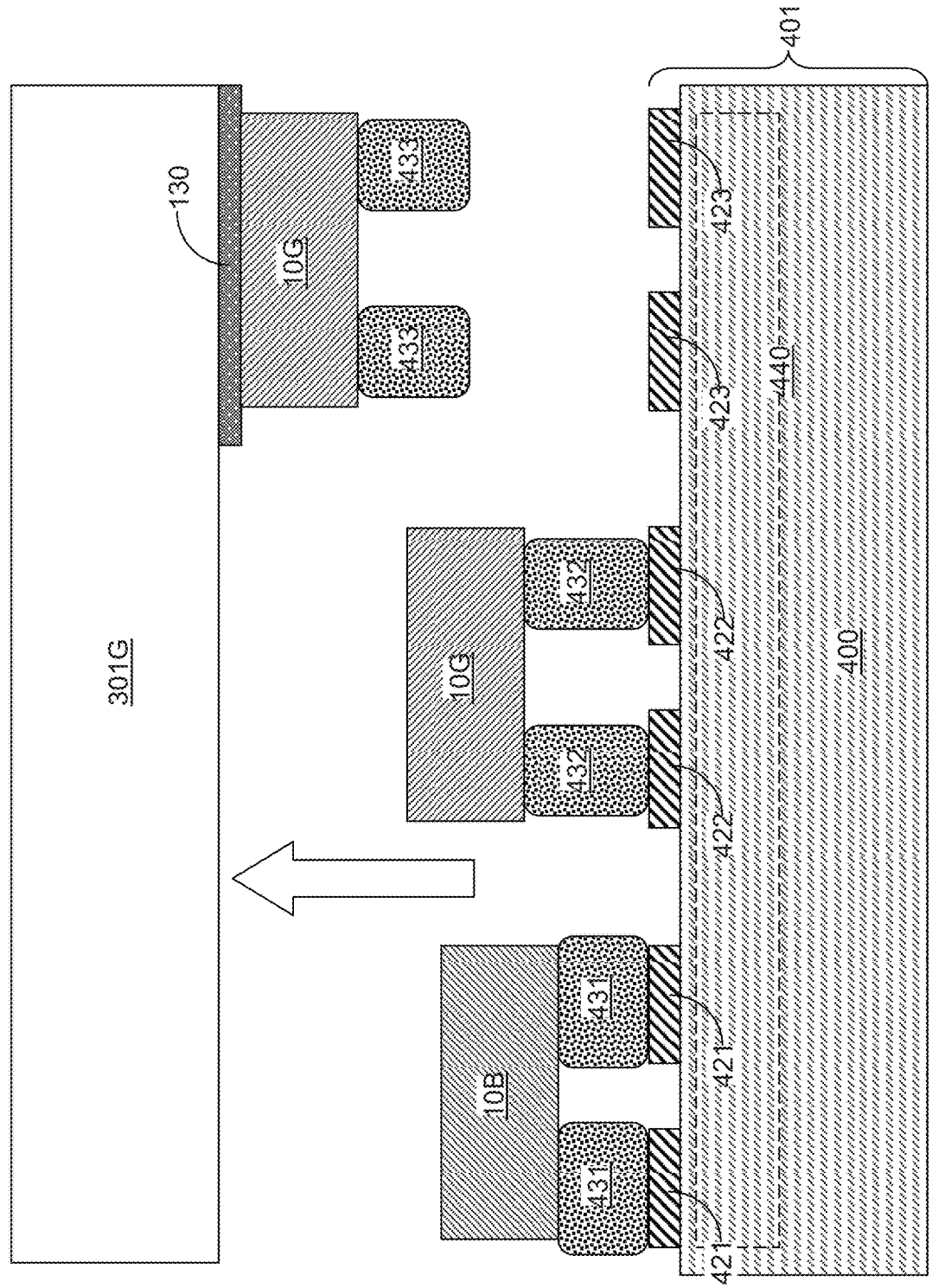

Referring to FIG. 33I, the assembly of the second source substrate 301G and attached second light emitting diodes 10G (a third subset of the second light emitting diodes 10G that remain on the second source substrate) is separated from the backplane 401 and the second subset of the second light emitting diodes 10G that are now attached to the backplane 401.

Figure 33J:
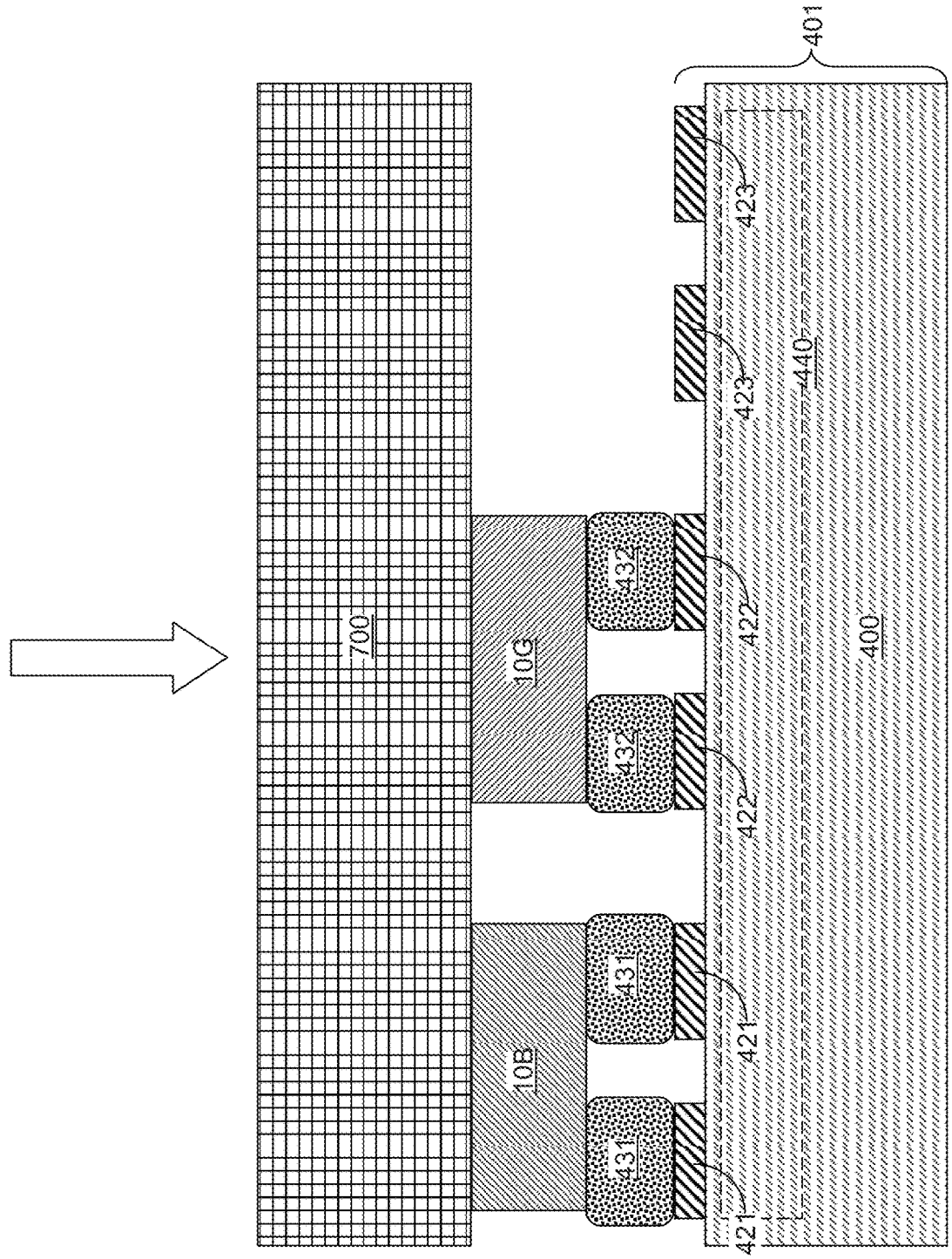

Referring to FIG. 33J, a dummy substrate 700 is employed to push the second light emitting diodes 10G on the second conductive bonding structures 432 toward the backplane 401 in the same manner as in the processing steps of FIG. 32J.

The processing steps of FIGS. 33F-33J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Figure 33K:
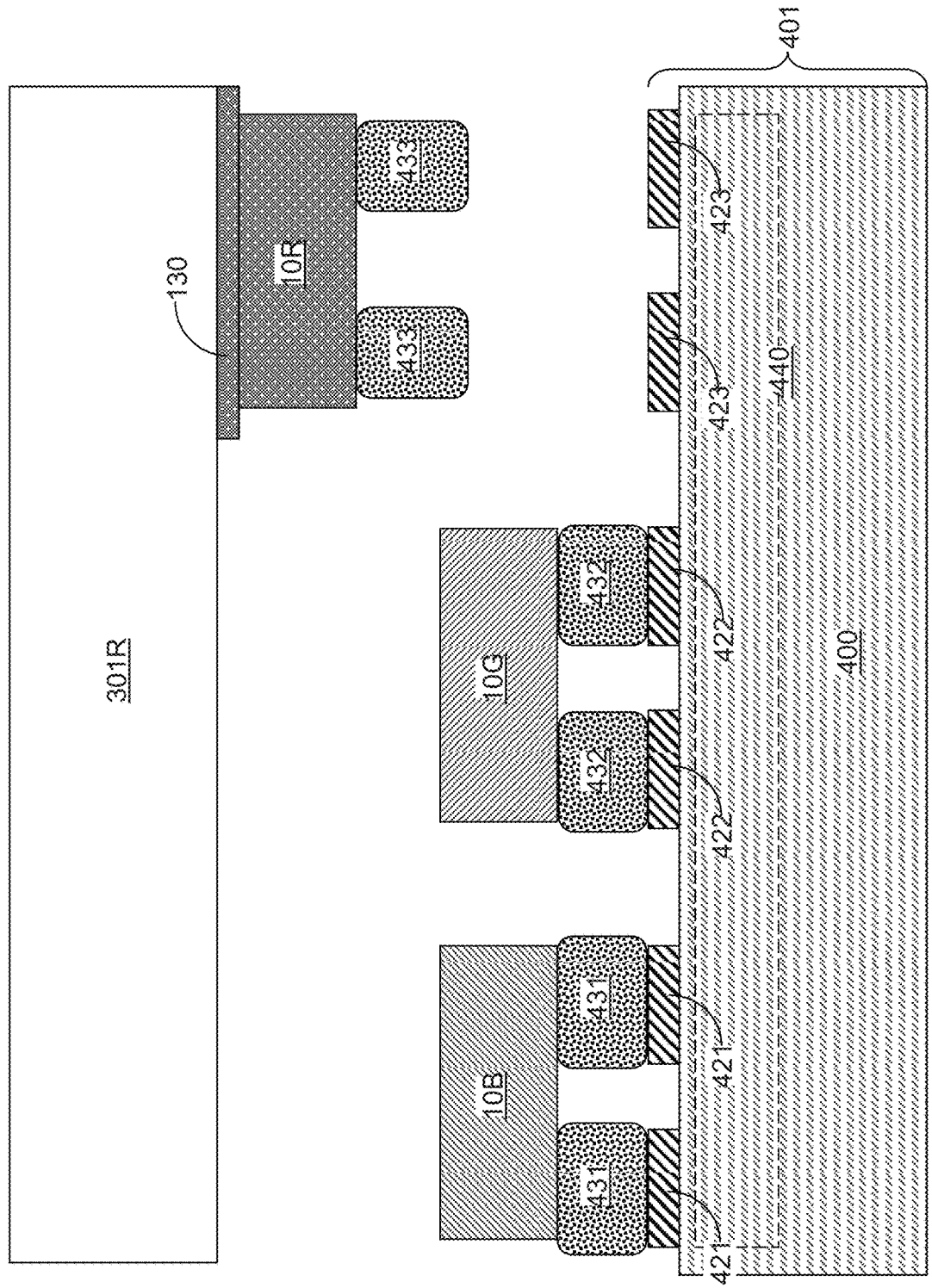

Referring to FIG. 33K, a third source substrate (such as a third transfer substrate 301R), from which a first subset and a second subset of third light emitting devices 10R have been removed in prior processing steps, is positioned over the in-process second exemplary light emitting device assembly, and is aligned such that a third subset of the third light emitting diodes 10R overlies the third bonding pads 423.

Figure 33L:
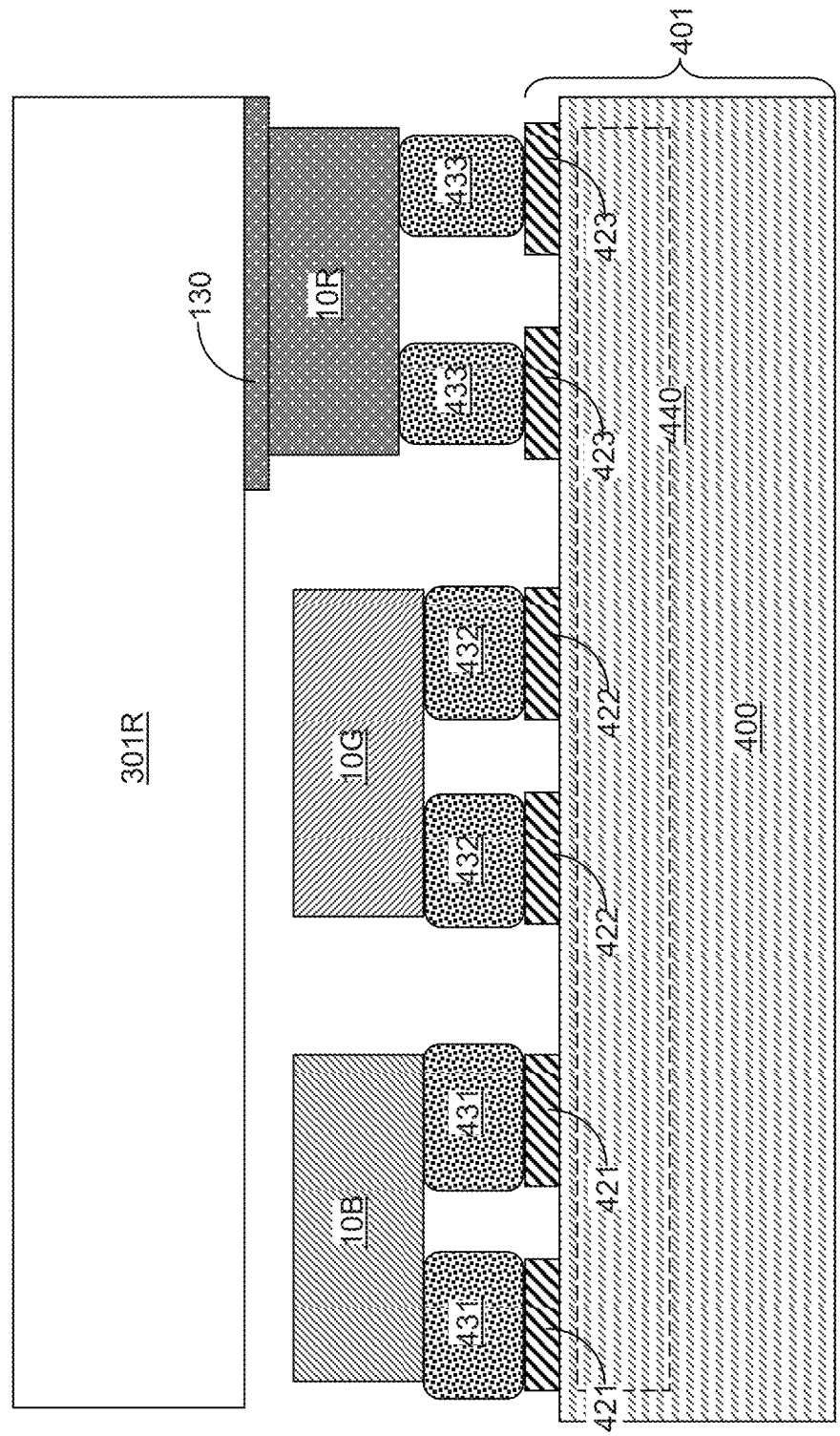

Referring to FIG. 33L, the backplane 401 and the assembly including the third light emitting diodes 10R are positioned such that each third conductive bonding structure 433 is attached to one of a third light emitting device 10R and a third bonding pad 423, and contacts the other of the third light emitting device 10R and the third bonding pad 423. If any addition conductive bonding structures (not shown) having a lesser height are present, additional conductive bonding structures (not shown) overlying such additional bonding pads do not contact any underlying additional bonding pads (in case the additional conductive bonding structures are attached to the third source substrate) or do not contact overlying third light emitting devices 10R (in case the additional conductive bonding structures are attached to the additional bonding pads).

A reflow process is subsequently performed in the same manner as in the processing steps of FIG. 32L.

Figure 33M:
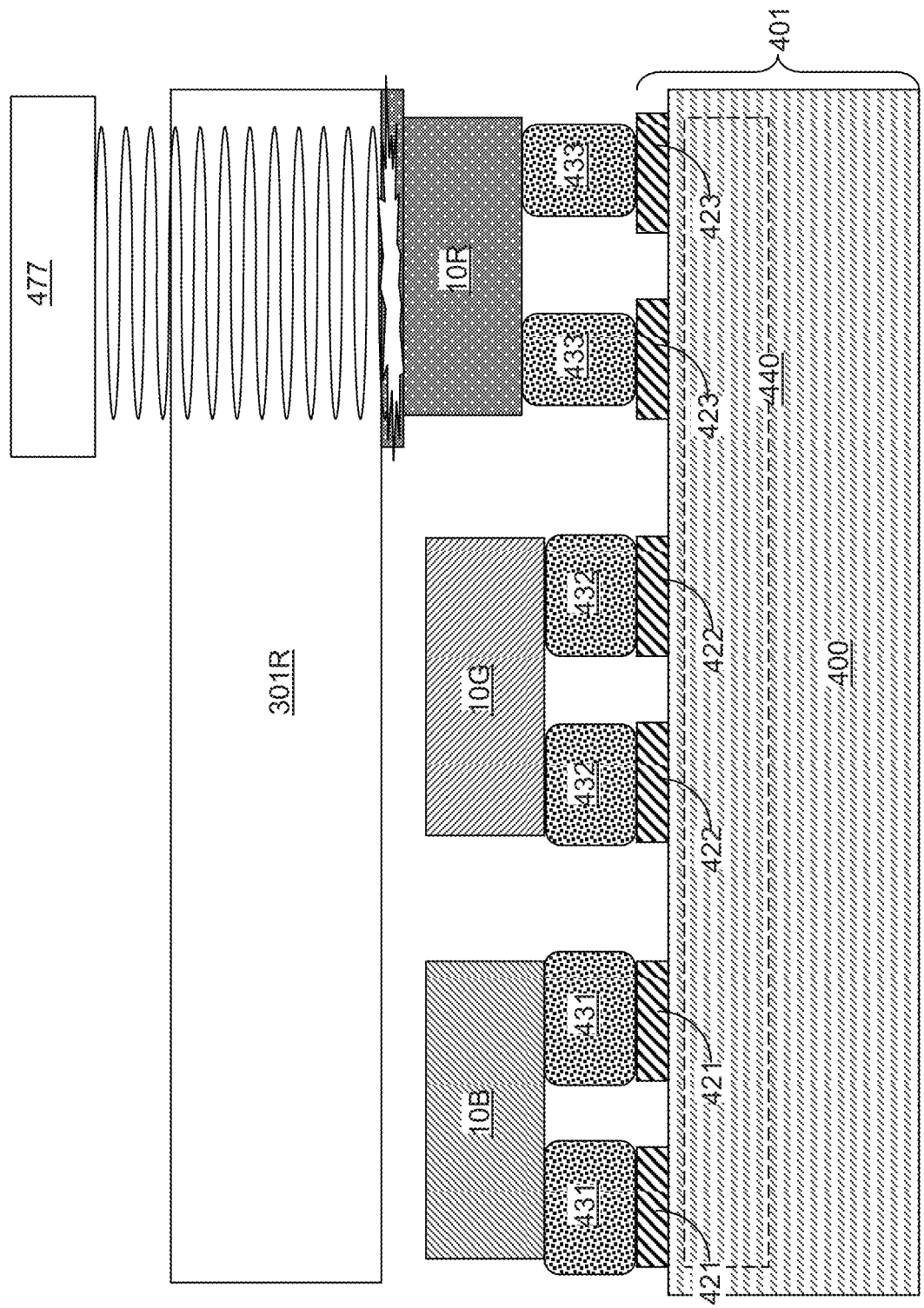

Referring to FIG. 33M, a laser irradiation process is performed to separate each bonded third light emitting device 10R from the third source substrate in the same manner as in the processing steps of FIG. 32M.

Figure 33N:
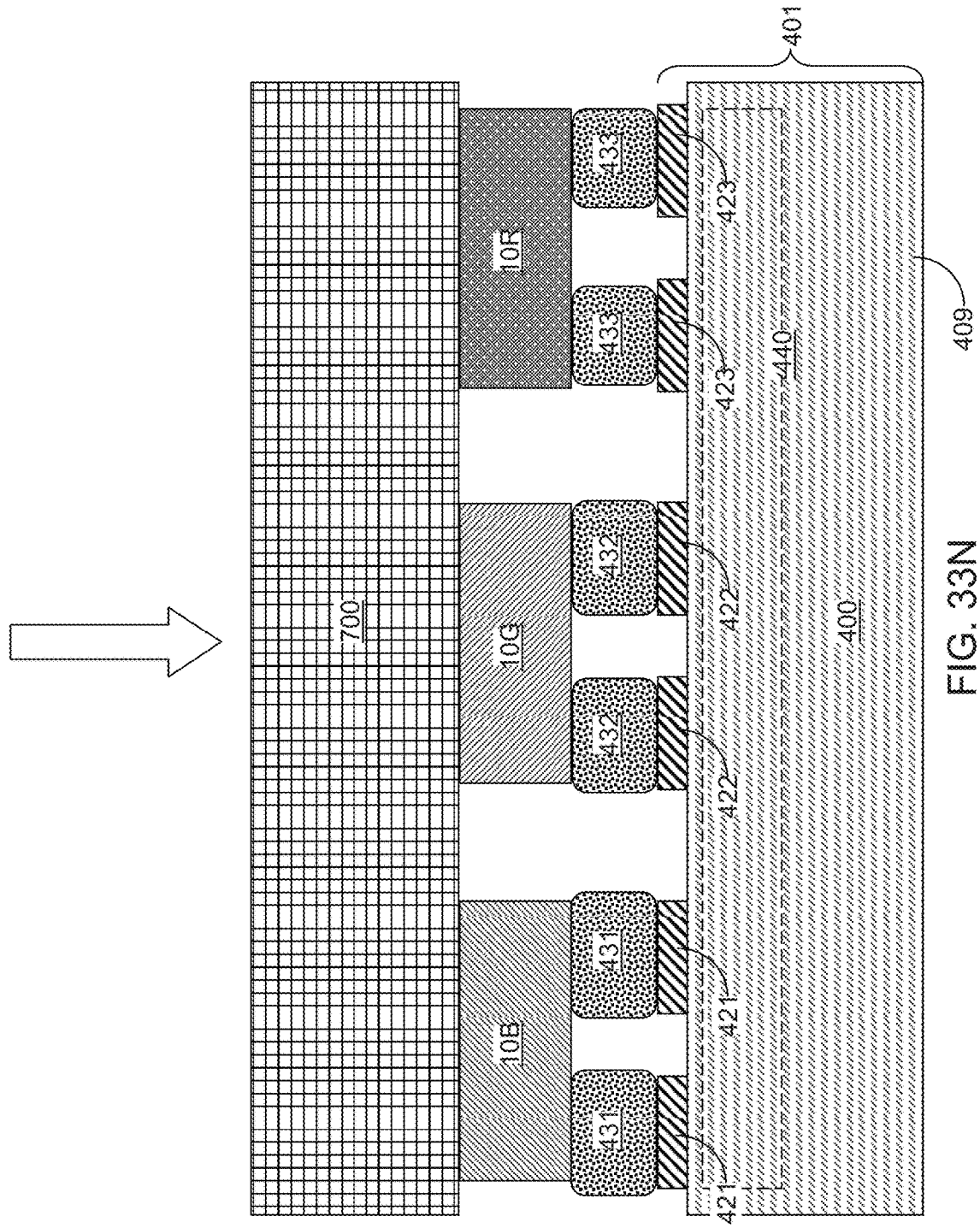

Referring to FIG. 33N, the assembly of the third source substrate 301R and any remaining third light emitting diodes 10R, if any, is separated from the backplane 401 and the third subset of the third light emitting diodes 10R that are now attached to the backplane 401 in the same manner as in the processing steps of FIG. 32N.

Optionally, a dummy substrate 700 may be employed to push the third light emitting diodes 10R on the third conductive bonding structures 433 toward the backplane 401 in the same manner as in the processing steps of FIG. 32N.

Figure 34A:
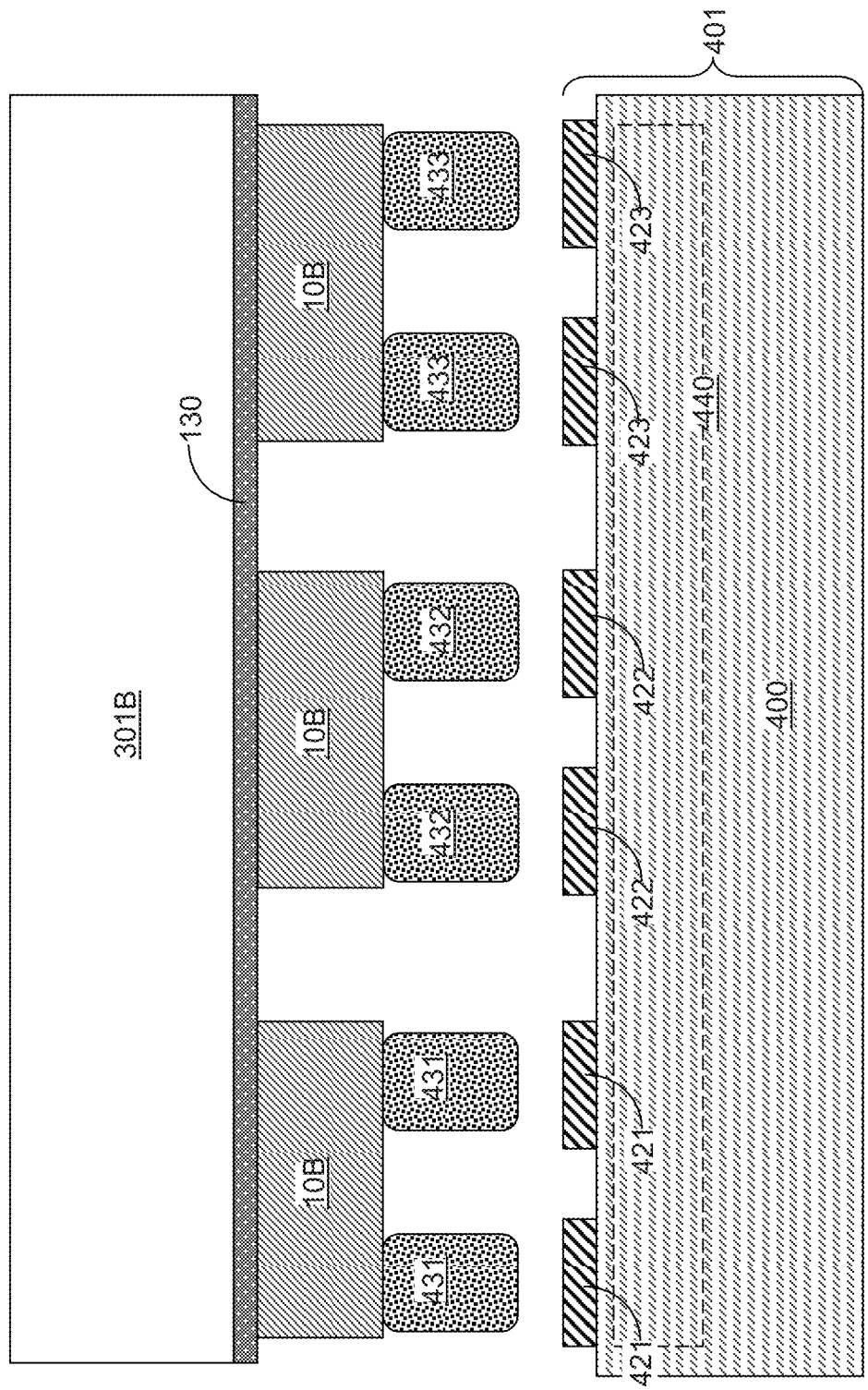
FIGS. 34A-34N are sequential vertical cross-sectional views illustrating a process for formation of a fourth exemplary light emitting device assembly according to an embodiment of the present disclosure.

Referring to FIG. 34A, an in-process structure is illustrated, which can be employed to form a fourth exemplary light emitting device assembly according to an embodiment of the present disclosure in which selective laser soldering is used to bond devices to the backplane. The in-process fourth exemplary light emitting device assembly can be derived from the in-process second exemplary light emitting device assembly of FIG. 32A or the in-process third exemplary light emitting device assembly of FIG. 33A by employing the same thickness for the bonding pads (421, 422, 423) and the same height for the conductive bonding structures (431, 432, 433). The bond pads (421, 422, 423) can have the same composition as the bond pads 420 described above. The conductive bonding structures (431, 432, 433) can have the same composition as the conductive bonding structures 430 described above. In this embodiment, the backplane substrate 400 may have a substantially planar (i.e., not stepped) upper surface or a stepped upper surface as illustrated in FIG. 9. The bond pads (421, 422, 423) can have the same height or different heights as shown in FIG. 32A. The conductive bonding structures (431, 432, 433) can have the same height or different heights as shown in FIG. 33A.

In one embodiment, the conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate 301B, which can be a first transfer substrate 300B or a first-type growth substrate 100/500B. The conductive bonding structures (431, 432, 433) can be any of the conductive bonding structures 430 discussed above. The conductive bonding structures 431 are formed on a first subset of the first light emitting diodes 10B to be subsequently transferred to the backplane substrate 400. The second conductive bonding structures 432 are formed on a second subset of the first light emitting diodes 10B to be subsequently transferred to another backplane substrate (not shown). The third conductive bonding structures 433 are formed on a third subset of the first light emitting diodes 10B to be subsequently transferred to yet another backplane substrate. Optionally, additional conductive bonding structures can be formed on another subset of the first light emitting diodes 10B to be subsequently transferred to still another backplane substrate.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 34B:
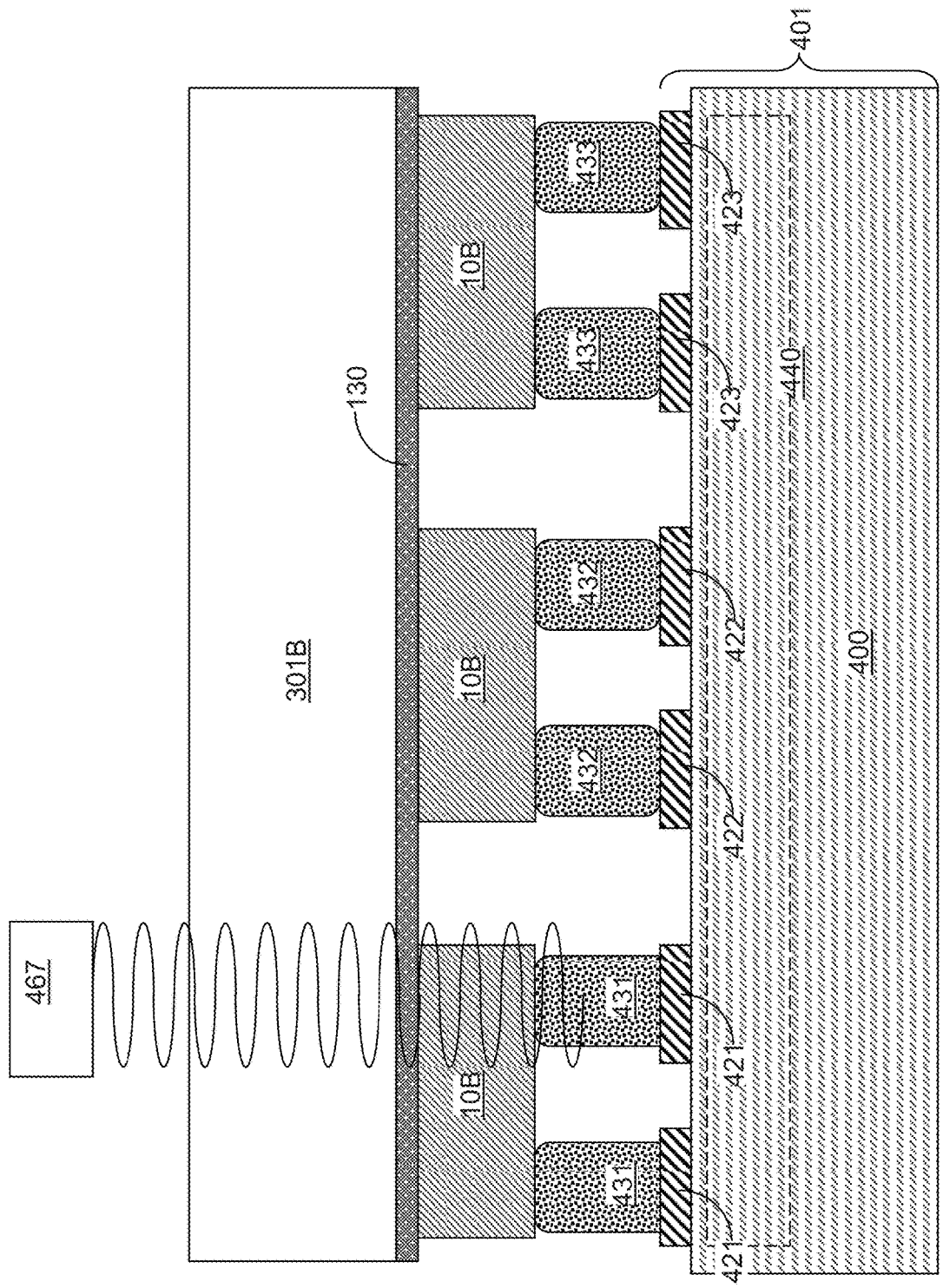

Referring to FIG. 34B, the backplane 401 and the assembly including the first light emitting diodes 10B are positioned such that each conductive bonding structure (431, 432, 433) is attached to one of a first light emitting device 10B and a bonding pad (421, 422, or 423), and contacts the other of the first light emitting device 10B and the bonding pad (421, 422, or 423). In one embodiment, each first conductive bonding structure 431 can be attached to one of an overlying first light emitting device 10B and a first bonding pad 421, and contacts the other of the overlying first light emitting device 10B and the first bonding pad 421; each second conductive bonding structure 432 can be attached to one of an overlying first light emitting device 10B and a second bonding pad 422, and contacts the other of the overlying first light emitting device 10B and the second bonding pad 422; and each third conductive bonding structure 433 can be attached to one of an overlying first light emitting device 10B and a third bonding pad 423, and contacts the other of the overlying first light emitting device 10B and the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the source substrate 301B or within the materials of the devices to be transferred (e.g., the first light emitting devices 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the source substrate 301B and the devices to be transferred. The first conductive bonding structures 431 can be selectively heated by sequential irradiation of a laser beam from the heating layer 467 to reflow each first conductive bonding structure 431, and to bond each first conductive bonding structure 431 to an overlying first light emitting device 10B and to an underlying first bonding pad 421. Preferably, the laser beam is provided through the source substrate 301B. The laser beam may be transmitted through the source substrate 301B and through the devices to the conductive bonding structures 431 for selective heating. Alternatively, the laser beam may be absorbed by the source substrate or the device adjacent to the conductive bonding structures 431 to selectively heat and reflow the conductive bonding structures 431 without reflowing the remaining conductive bonding structures (432, 433).

Figure 34C:
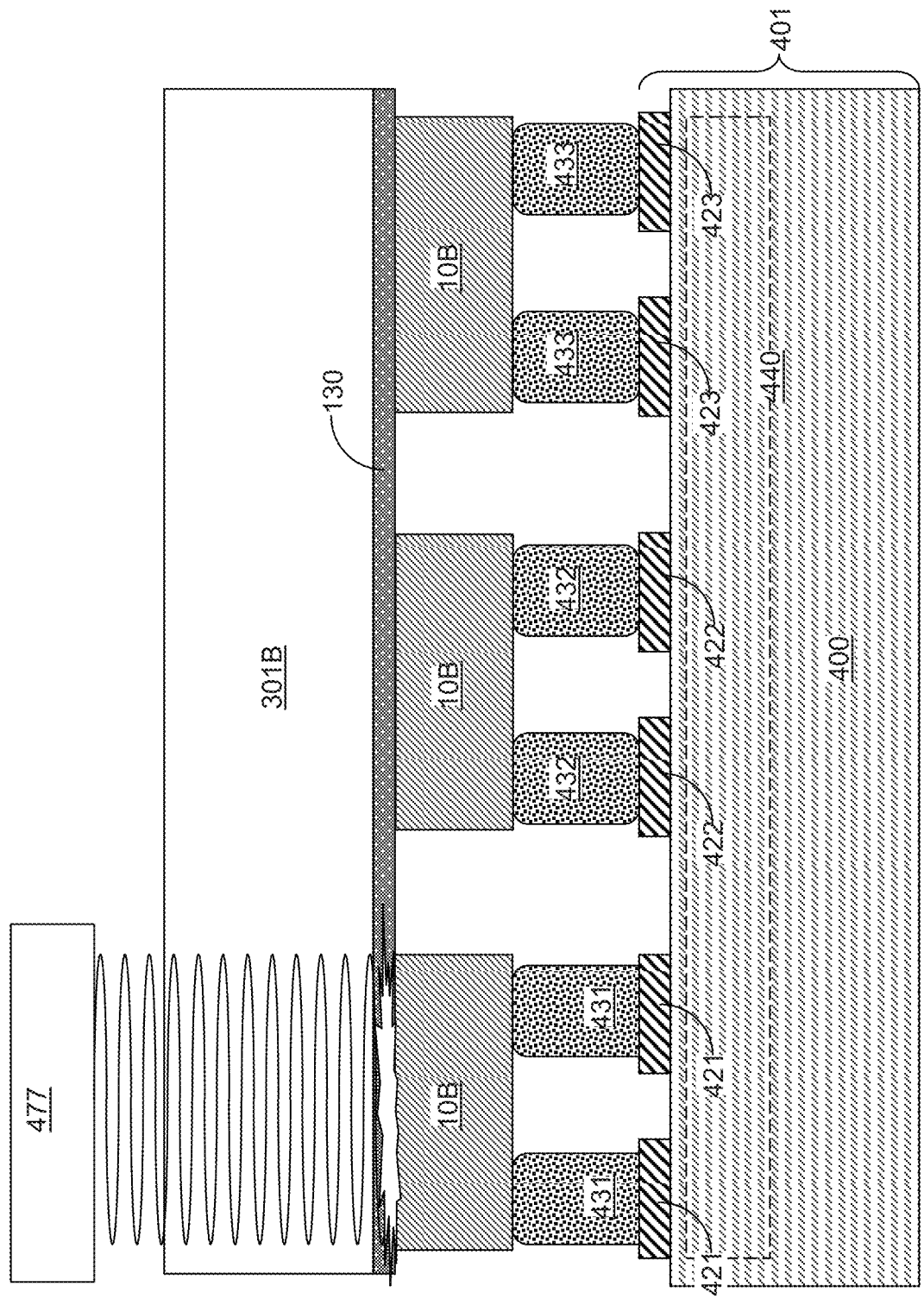

Referring to FIG. 34C, a laser irradiation process is performed to separate each bonded first light emitting device 10B from the first source substrate in the same manner as the processing steps of FIG. 32C. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the source substrate 301B and the transferred devices (e.g., the first light emitting diodes 10B). Each portion of the ablation material layer 130 overlying the first conductive bonding structures 431 can be sequentially irradiated by a laser beam from the laser 477 to dissociate each underlying first light emitting device 10B.

Figure 34D:
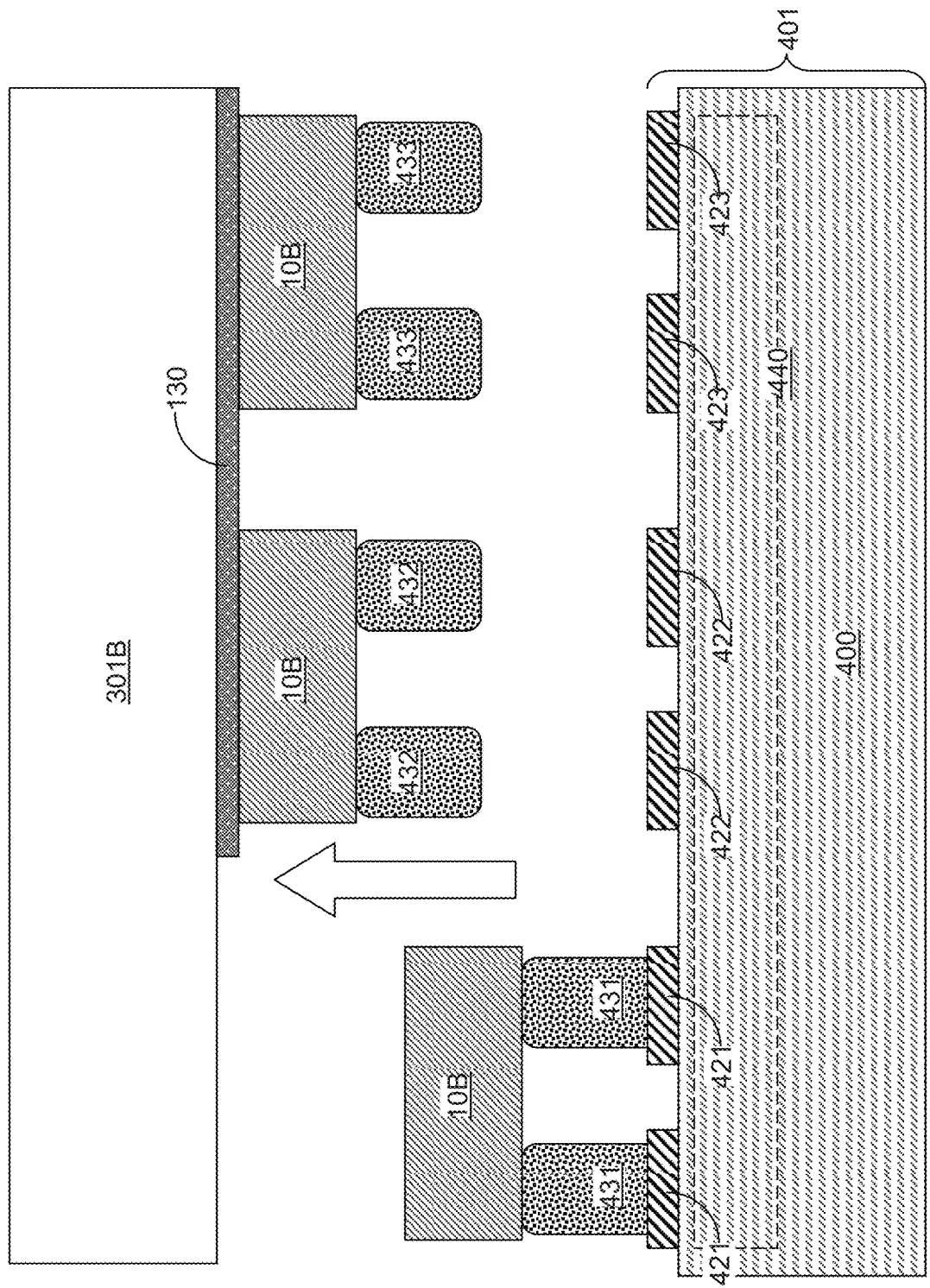

Referring to FIG. 34D, the assembly of the first source substrate 301B and attached first light emitting diodes 10B (i.e., the complement of the first subset of the first light emitting diodes 10B) is separated from the backplane 401 and the first subset of the first light emitting diodes 10B.

Figure 34E:
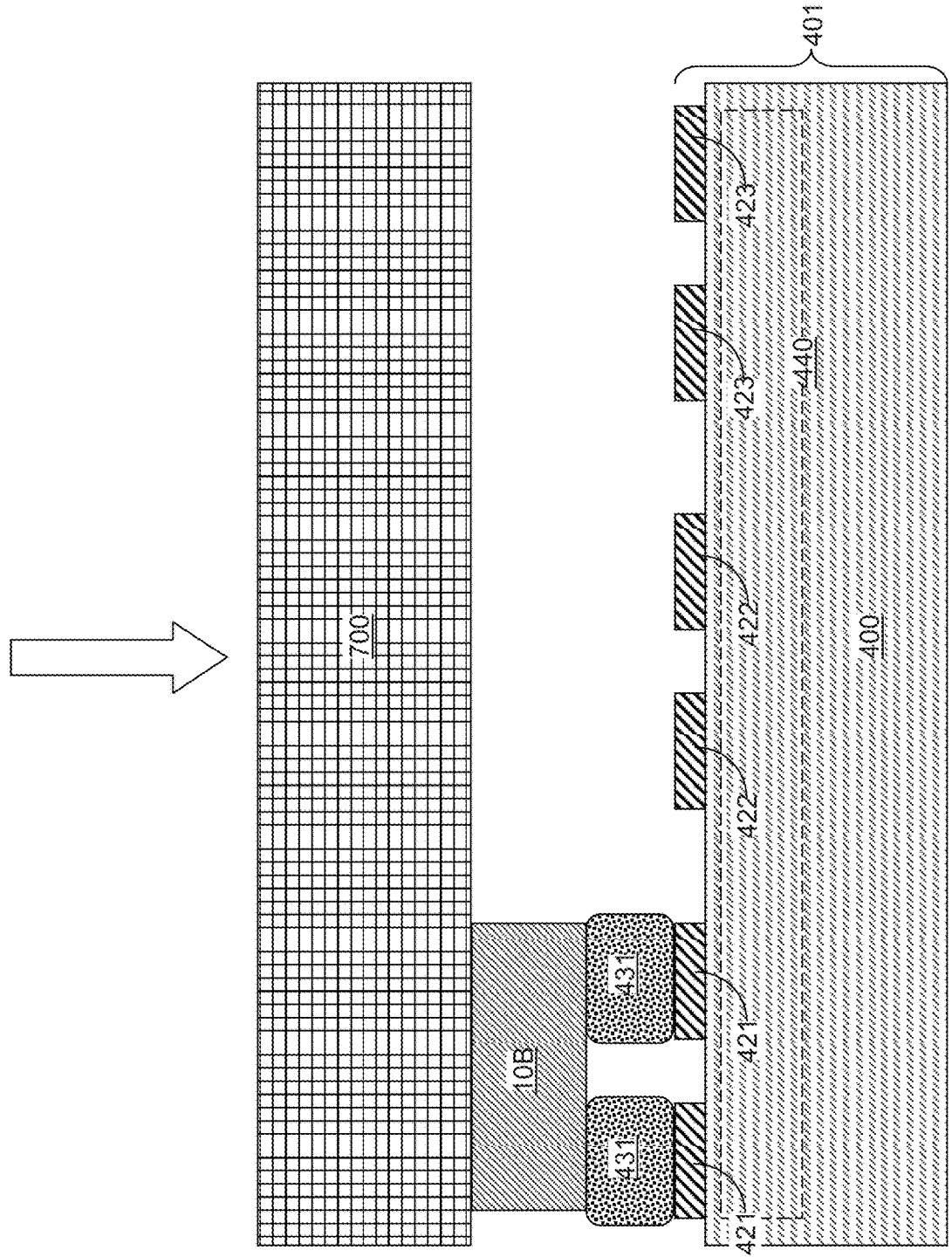

Referring to FIG. 34E, a dummy substrate 700 is employed to push the first light emitting diodes 10B on the first conductive bonding structures 431 toward the backplane 401 while reflowing the first conductive bonding structures 431 in the same manner as the processing steps of FIG. 32E.

The processing steps of FIGS. 34A-34E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 34F:
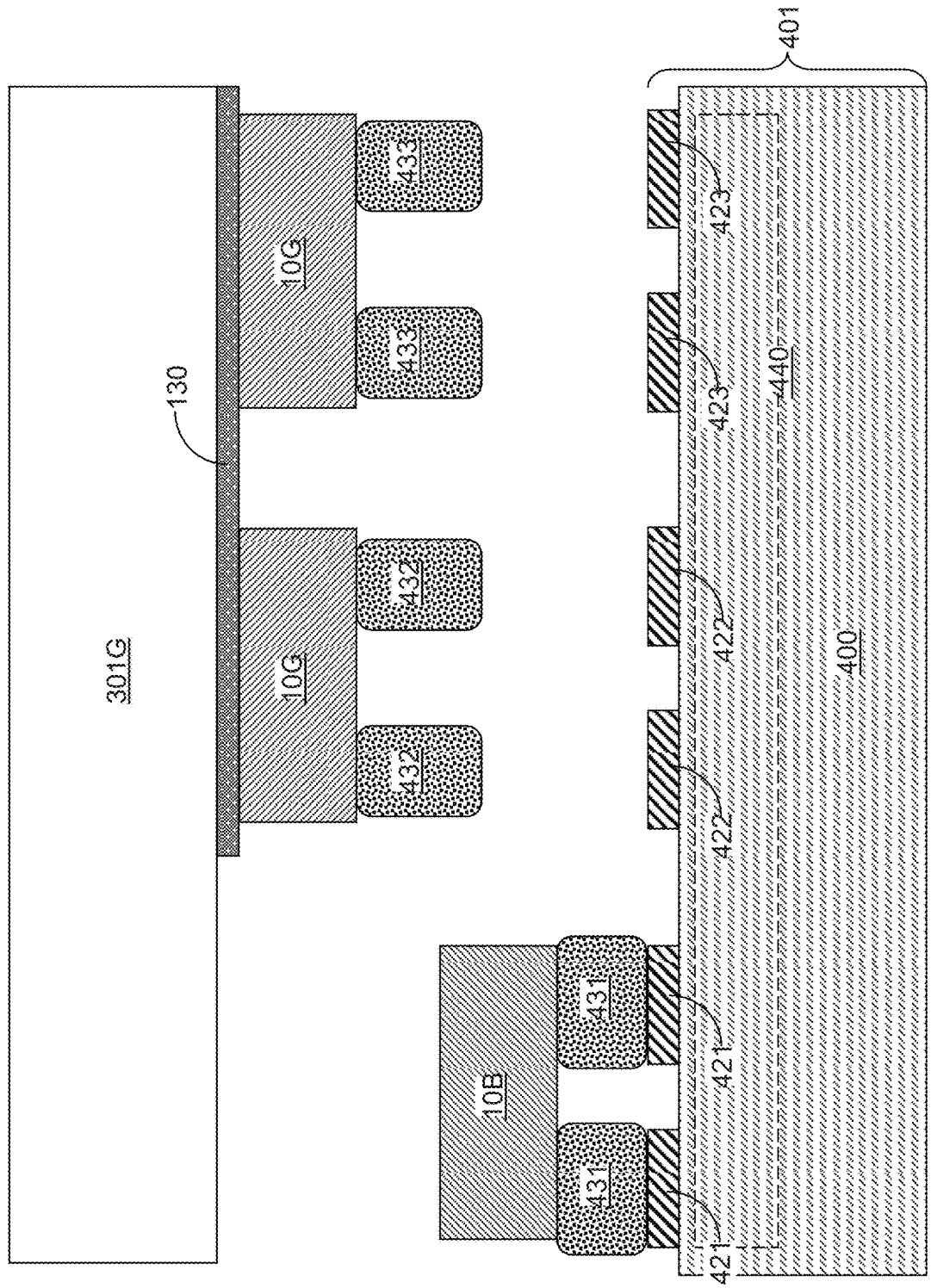

Referring to FIG. 34F, a second source substrate (such as a second transfer substrate 301G) from which a first subset of second light emitting devices 10G are removed is positioned over the in-process fourth exemplary light emitting device assembly, and is aligned such that a second subset of the second light emitting diodes 10G overlies the second bonding pads 422.

Figure 34G:
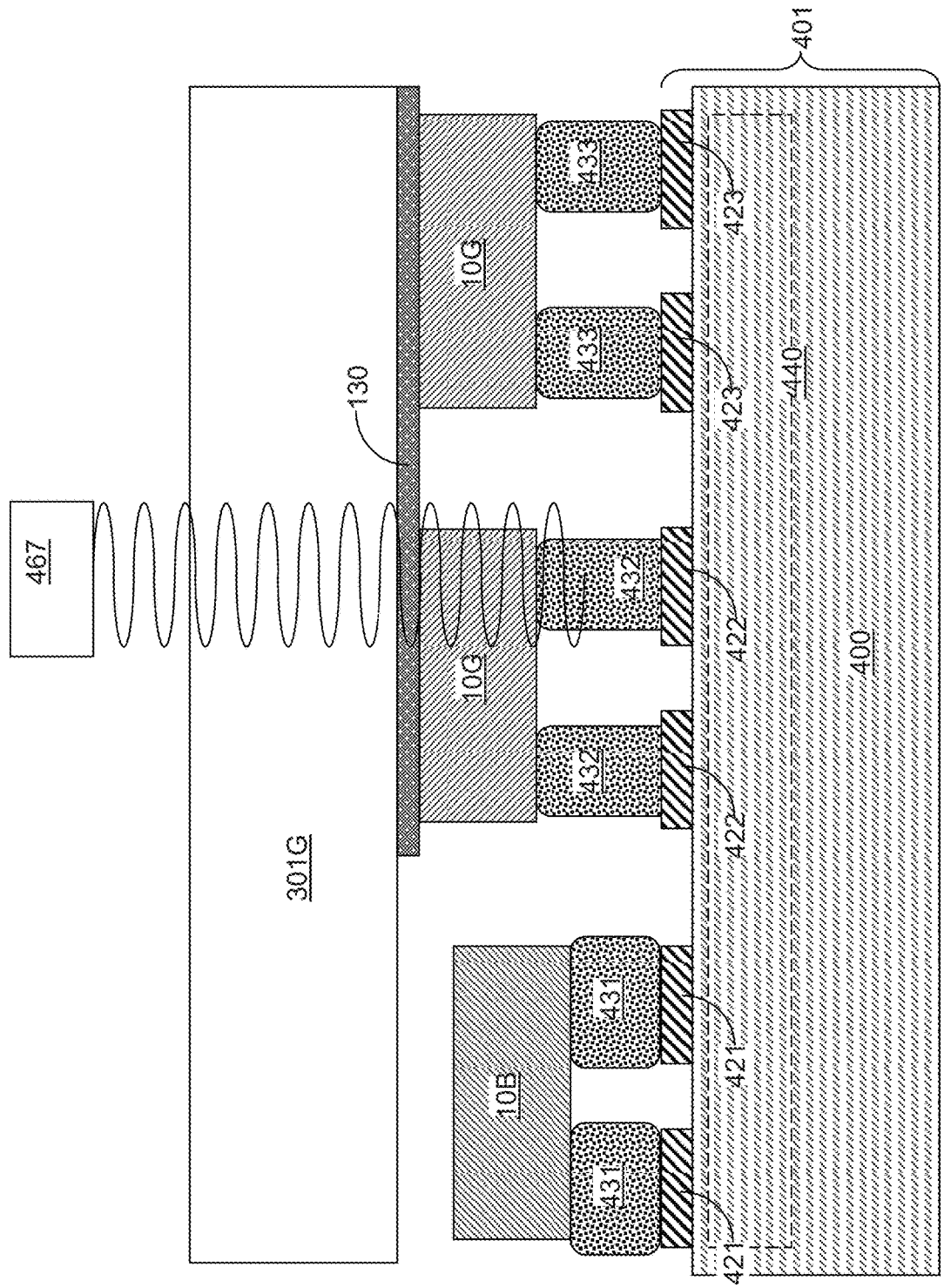

Referring to FIG. 34G, the backplane 401 and the assembly including the second light emitting diodes 10G are positioned such that each second conductive bonding structure 432 is attached to one of a second light emitting device 10G and a second bonding pad 422, and contacts the other of the second light emitting device 10G and the second bonding pad 422.

In one embodiment, each second conductive bonding structure 432 can be attached to one of an overlying second light emitting device 10G and a second bonding pad 422, and contacts the other of the overlying second light emitting device 10G and the second bonding pad 422; and each third conductive bonding structure 433 can be attached to one of an overlying second light emitting device 10G and a third bonding pad 423, and contacts the other of the overlying second light emitting device 10G and the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the source substrate 301G or within the materials of the devices to be transferred (e.g., the second light emitting devices 10G). The same heating laser can be employed as in the processing steps of FIG. 34B. The second conductive bonding structures 432 can be sequentially irradiated by a laser beam from the heating layer 467 to reflow each second conductive bonding structure 432, and to bond each second conductive bonding structure 432 to an overlying second light emitting device 10G and to an underlying second bonding pad 422.

Figure 34H:
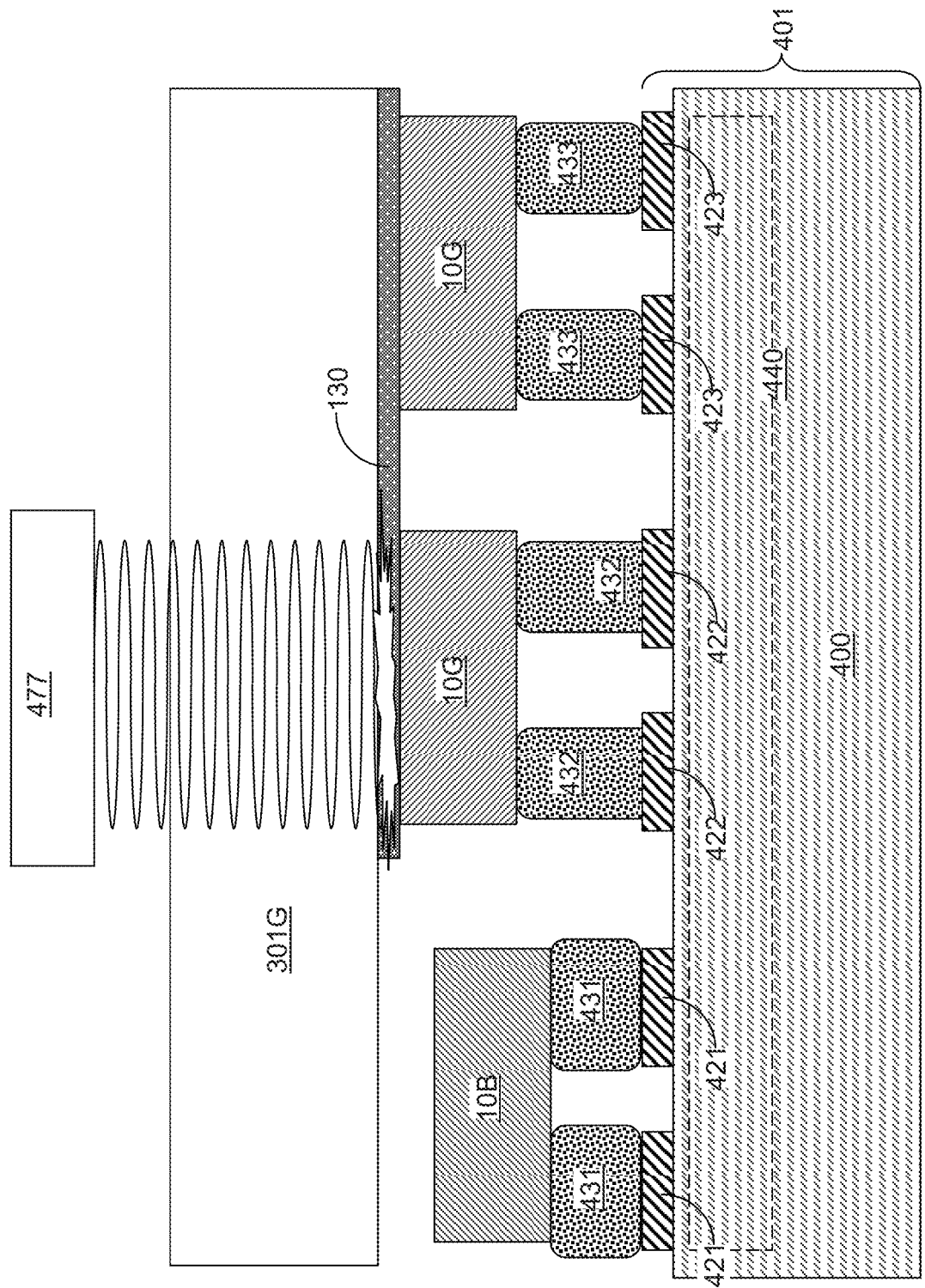

Referring to FIG. 34H, a laser irradiation process is performed to separate each bonded second light emitting device 10G from the second source substrate in the same manner as the processing steps of FIG. 32H. The wavelength of the laser 477 can be different from the wavelength of the heating laser 467, and provides more heating to the material of the ablation material layer 130 than to the materials of the source substrate 301G and the transferred devices (e.g., the second light emitting diodes 10G). Each portion of the ablation material layer 130 overlying the second conductive bonding structures 432 can be sequentially irradiated by a laser beam from the layer 477 to dissociate each underlying second light emitting device 10G.

Figure 34I:
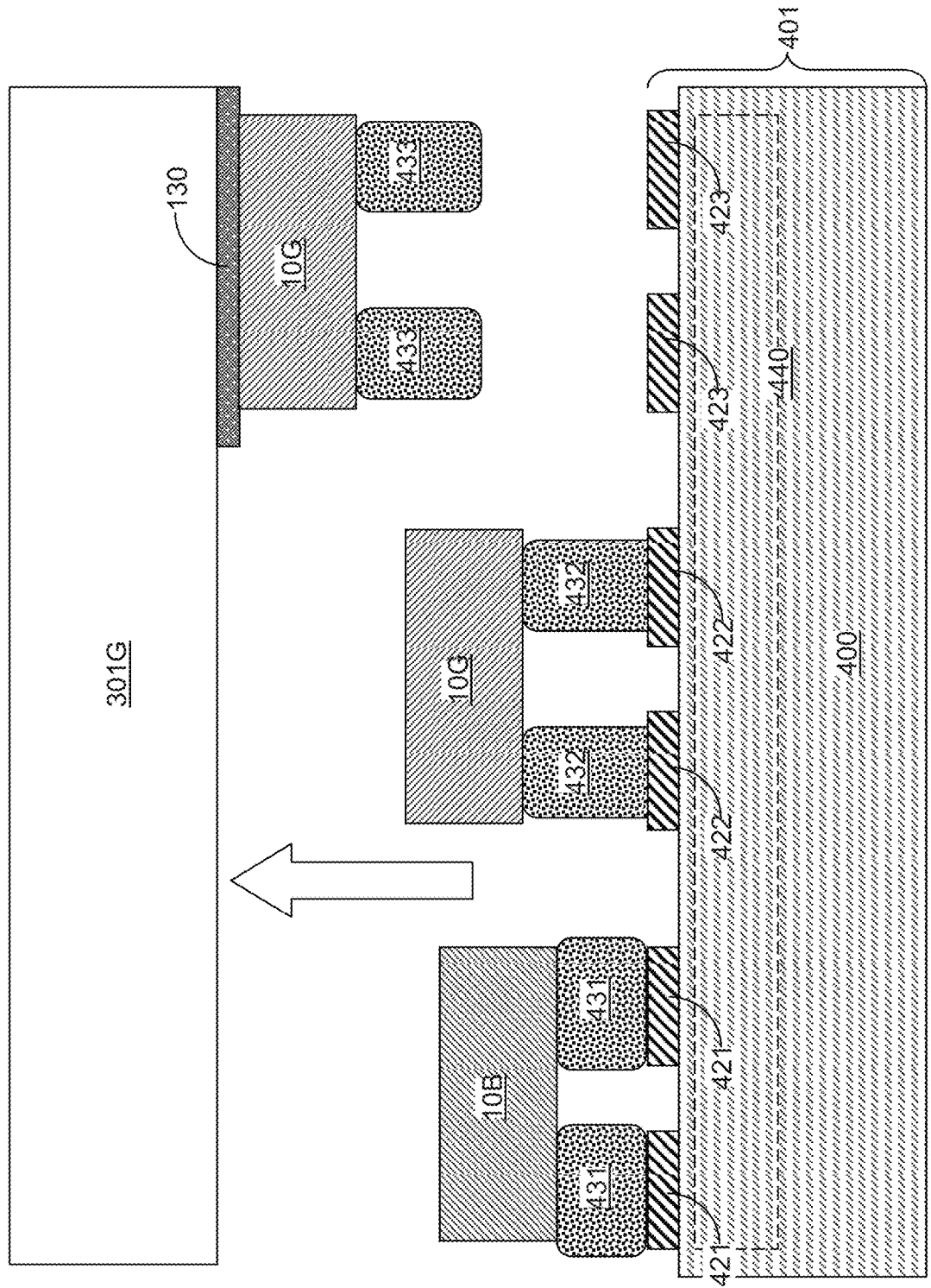

Referring to FIG. 34I, the assembly of the second source substrate 301G and attached second light emitting diodes 10G (a third subset of the second light emitting diodes 10G that remain on the second source substrate) is separated from the backplane 401 and the second subset of the second light emitting diodes 10G that are now attached to the backplane 401.

Figure 34J:
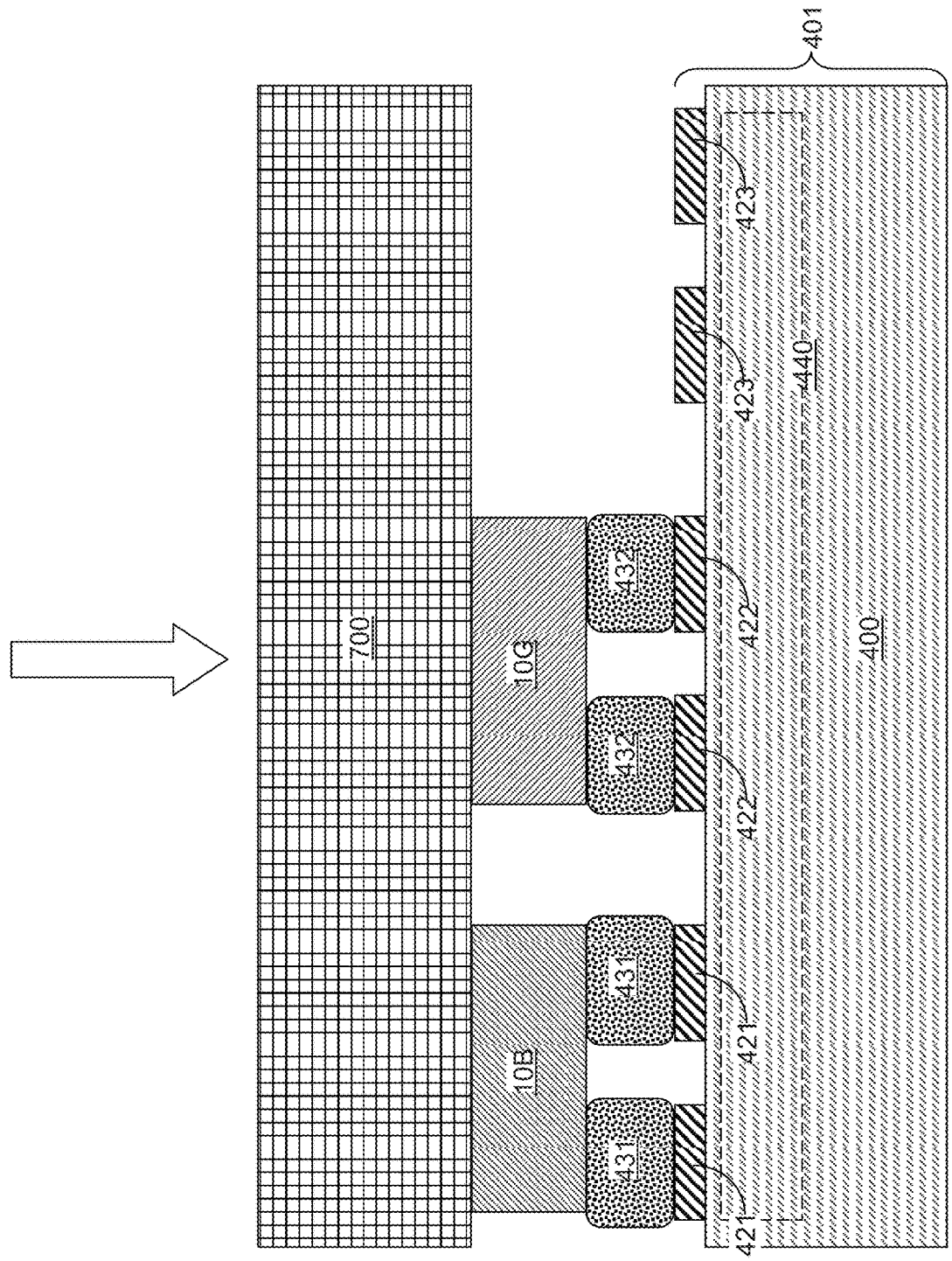

Referring to FIG. 34J, a dummy substrate 700 is employed to push the second light emitting diodes 10G on the second conductive bonding structures 432 toward the backplane 401 in the same manner as in the processing steps of FIG. 32J.

The processing steps of FIGS. 34F-34J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Referring to FIG. 34K, a third source substrate (such as a third transfer substrate 301R), from which a first subset and a second subset of third light emitting devices 10R have been removed in prior processing steps, is positioned over the in-process fourth exemplary light emitting device assembly, and is aligned such that a third subset of the third light emitting diodes 10R overlies the third bonding pads 423.

Figure 34L:
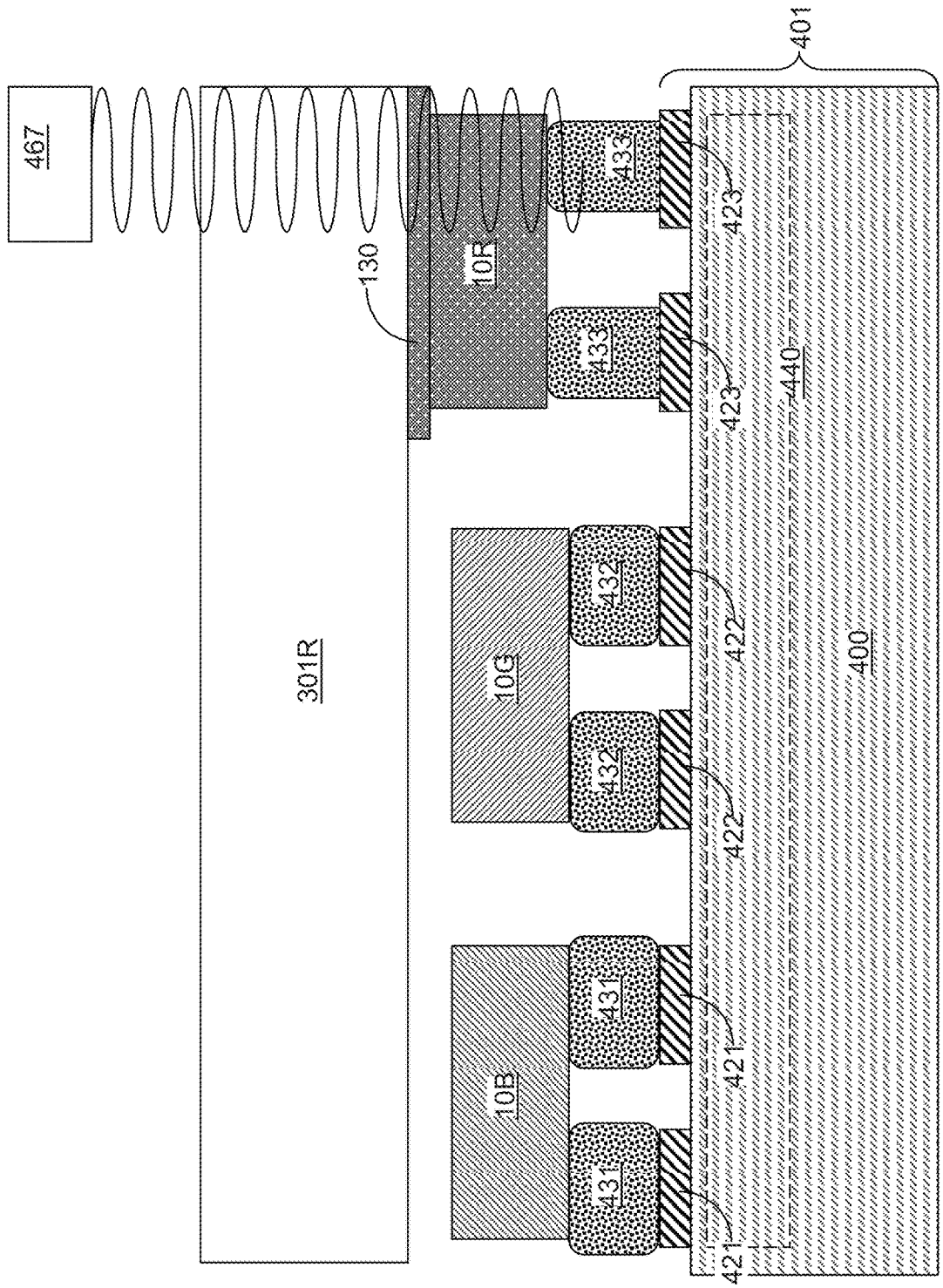

Referring to FIG. 34L, the backplane 401 and the assembly including the third light emitting diodes 10R are positioned such that each third conductive bonding structure 433 is attached to one of a third light emitting device 10R and a third bonding pad 423, and contacts the other of the third light emitting device 10R and the third bonding pad 423. If any addition conductive bonding structures (not shown) are present, additional conductive bonding structures (not shown) overlying such additional bonding pads can contact underlying additional bonding pads and overlying third light emitting devices 10R, and can be attached to the underlying additional bonding pads or to the overlying third light emitting devices 10R.

A heating laser 467 is employed to reflow the third conductive bonding structures 433. The heating laser 467 can have a wavelength that induces greater absorption of energy within the material of the third conductive bonding structures 433 than within the materials of the source substrate 301R or within the materials of the devices to be transferred (e.g., the third light emitting devices 10R). The same heating laser can be employed as in the processing steps of FIG. 34B or FIG. 34G. The third conductive bonding structures 433 can be sequentially irradiated by a laser beam from the heating layer 467 to reflow each third conductive bonding structure 433, and to bond each third conductive bonding structure 433 to an overlying third light emitting device 10R and to an underlying third bonding pad 423.

Figure 34M:
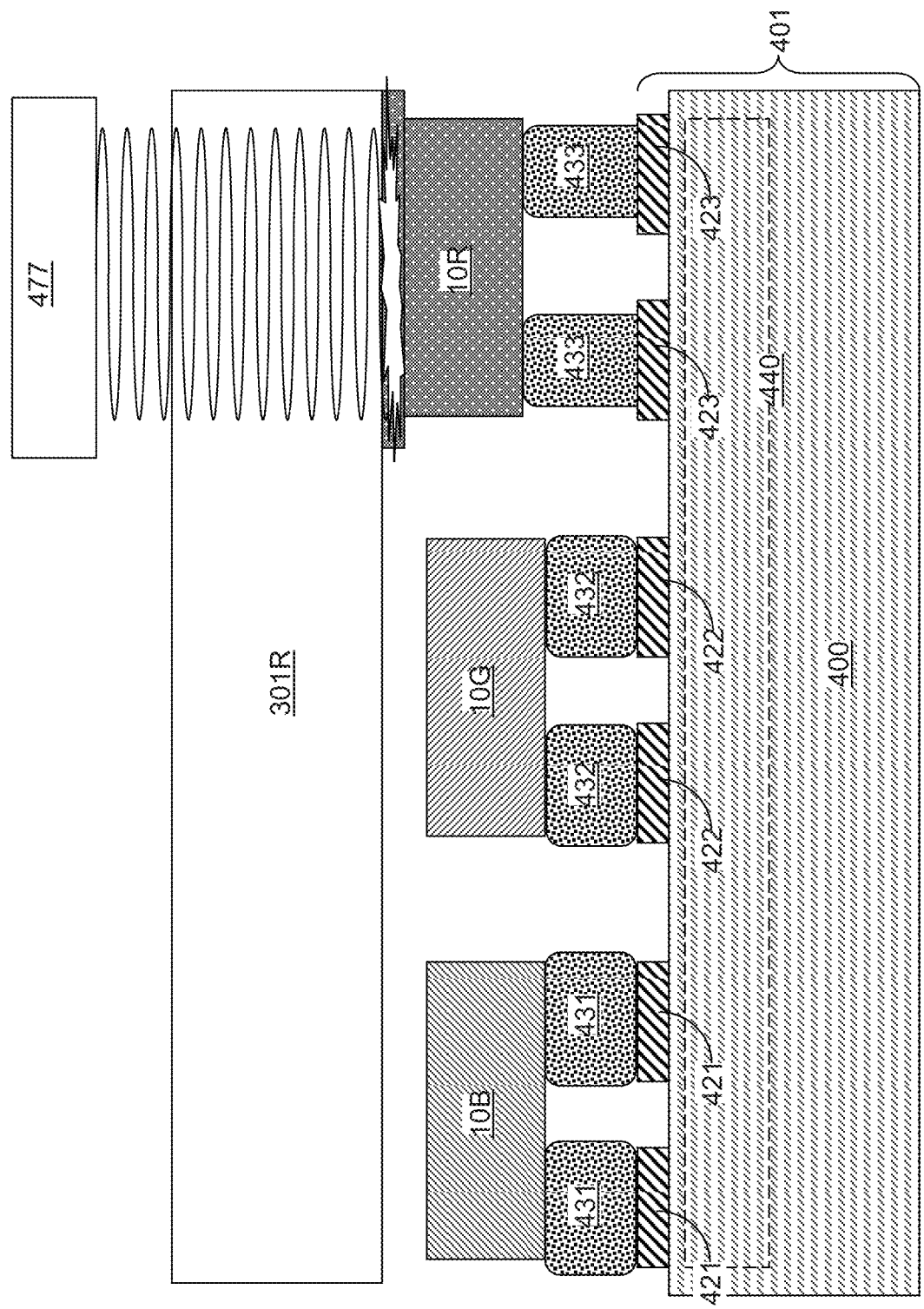

Referring to FIG. 34M, a laser irradiation process is performed to separate each bonded third light emitting device 10R from the third source substrate in the same manner as in the processing steps of FIG. 32M.

Figure 34N:
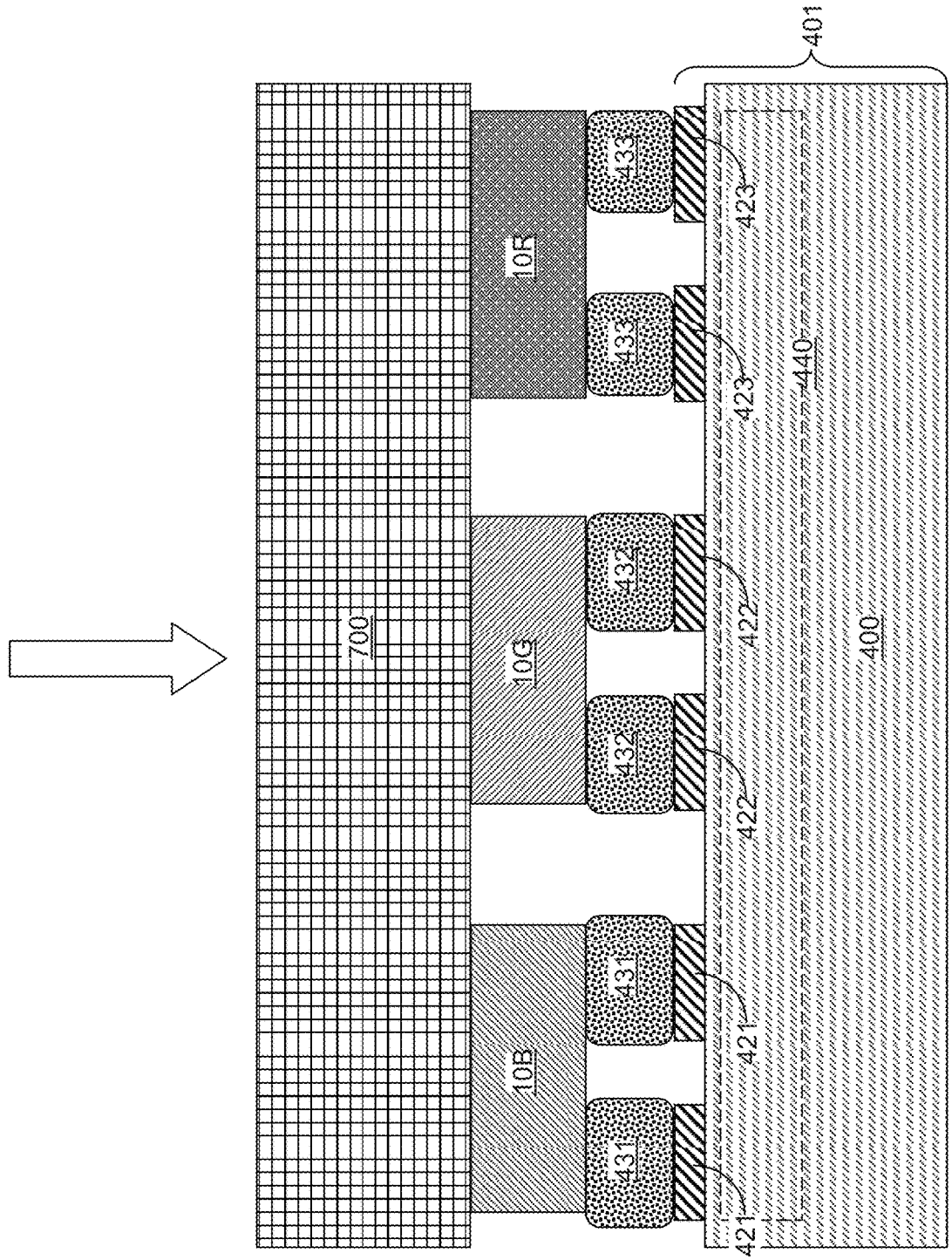

Referring to FIG. 34N, the assembly of the third source substrate 301R and any remaining third light emitting diodes 10R, if any, is separated from the backplane 401 and the third subset of the third light emitting diodes 10R that are now attached to the backplane 401 in the same manner as in the processing steps of FIG. 32N.

Optionally, a dummy substrate 700 may be employed to push the third light emitting diodes 10R on the third conductive bonding structures 433 toward the backplane 401 in the same manner as in the processing steps of FIG. 32N.

Figure 35A:
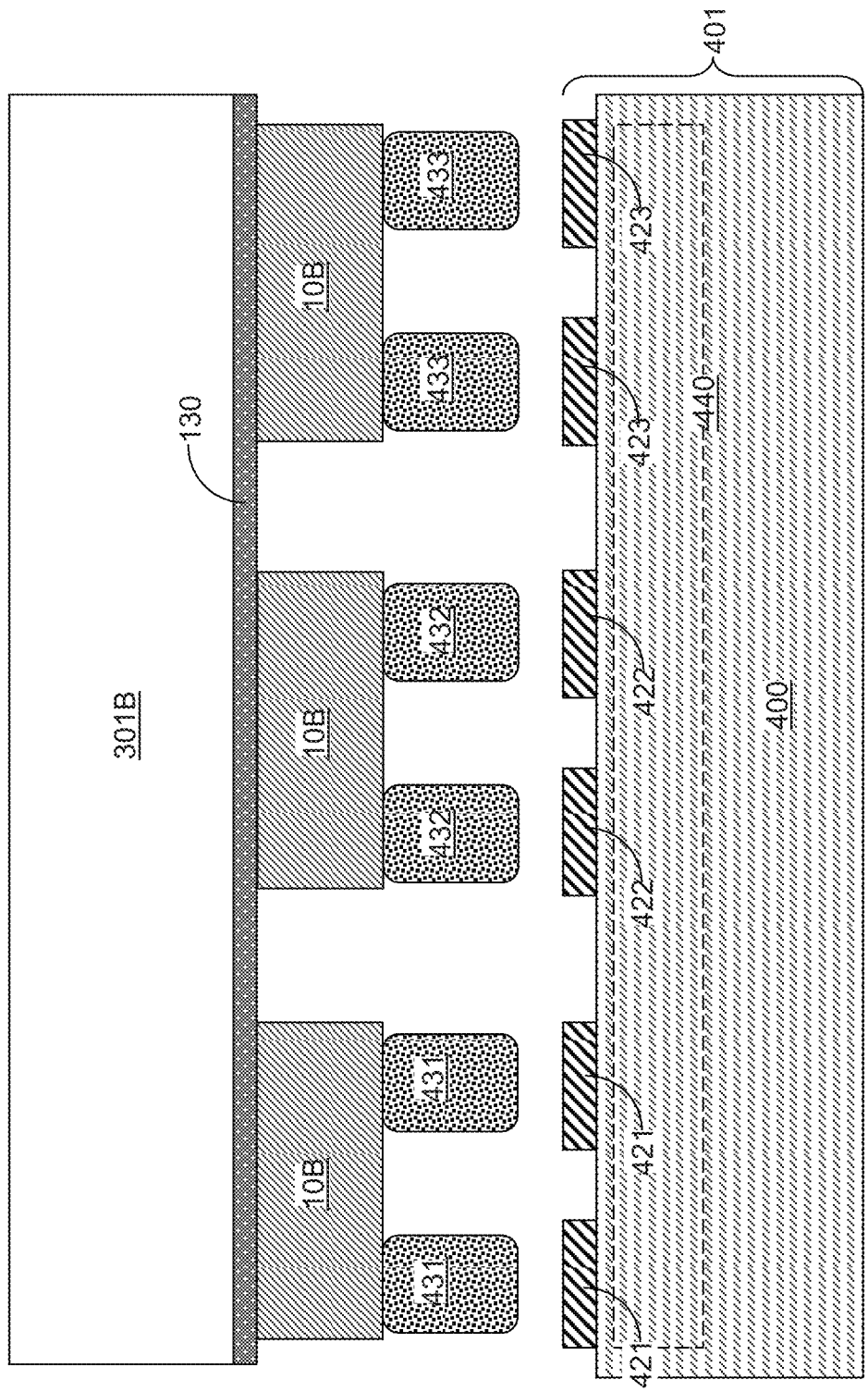
FIGS. 35A-35N are sequential vertical cross-sectional views illustrating a process for formation of a fifth exemplary light emitting device assembly according to an embodiment of the present disclosure.

Referring to FIG. 35A, an in-process structure is illustrated, which can be employed to form a fifth exemplary light emitting device assembly according to an embodiment of the present disclosure in which components are bonded at the same time by non-selective heating rather than by selective laser heating. The in-process fifth exemplary light emitting device assembly can be the same as the in-process fourth exemplary light emitting device assembly of FIG. 34A. In this embodiment, the backplane substrate 400 may have a substantially planar (i.e., not stepped) upper surface or a stepped upper surface as illustrated in FIG. 9. The bond pads (421, 422, 423) can have the same height or different heights as shown in FIG. 32A. The conductive bonding structures (431, 432, 433) can have the same height or different heights as shown in FIG. 33A.

In one embodiment, the conductive bonding structures (431, 432, 433) can be formed on the devices to be transferred to the backplane 401. For example, first light emitting diodes 10B can be the first devices to be transferred to the backplane substrate 400. The first light emitting diodes 10B can be located on first source substrate B, which can be a first transfer substrate 300B or a first-type growth substrate 100/500B. The conductive bonding structures (431, 432, 433) can be any of the conductive bonding structures 430 discussed above.

Alternatively, conductive bonding structures (431, 432, 433) can be formed on the bond pads (421, 422, 423) of the backplane 401. In this case, the conductive bonding structures (431, 432, 433) can be formed simultaneously on all the bond pads (421, 422, 423).

Yet alternatively, each conductive bonding structure (431, 432, 433) can be formed as two physically disjoined portions such that one portion of each conductive bonding structure (431, 432, or 433) is formed on a first light emitting diode 10B and another portion of the corresponding conductive bonding structure (431, 432, or 433) is formed on a surface of a matching bond pad (421, 422, or 423). In one embodiment, each conductive bonding structure (431, 432, 433) can be formed as two disjoined portions that are divided approximately evenly between an upper portion formed on a first light emitting diode 10B and a lower portion formed on a bond pad (421, 422, or 423).

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 15 microns to 100 microns (such as from 20 microns to 60 microns), although lesser and greater maximum horizontal dimensions can also be employed.

Figure 35B:
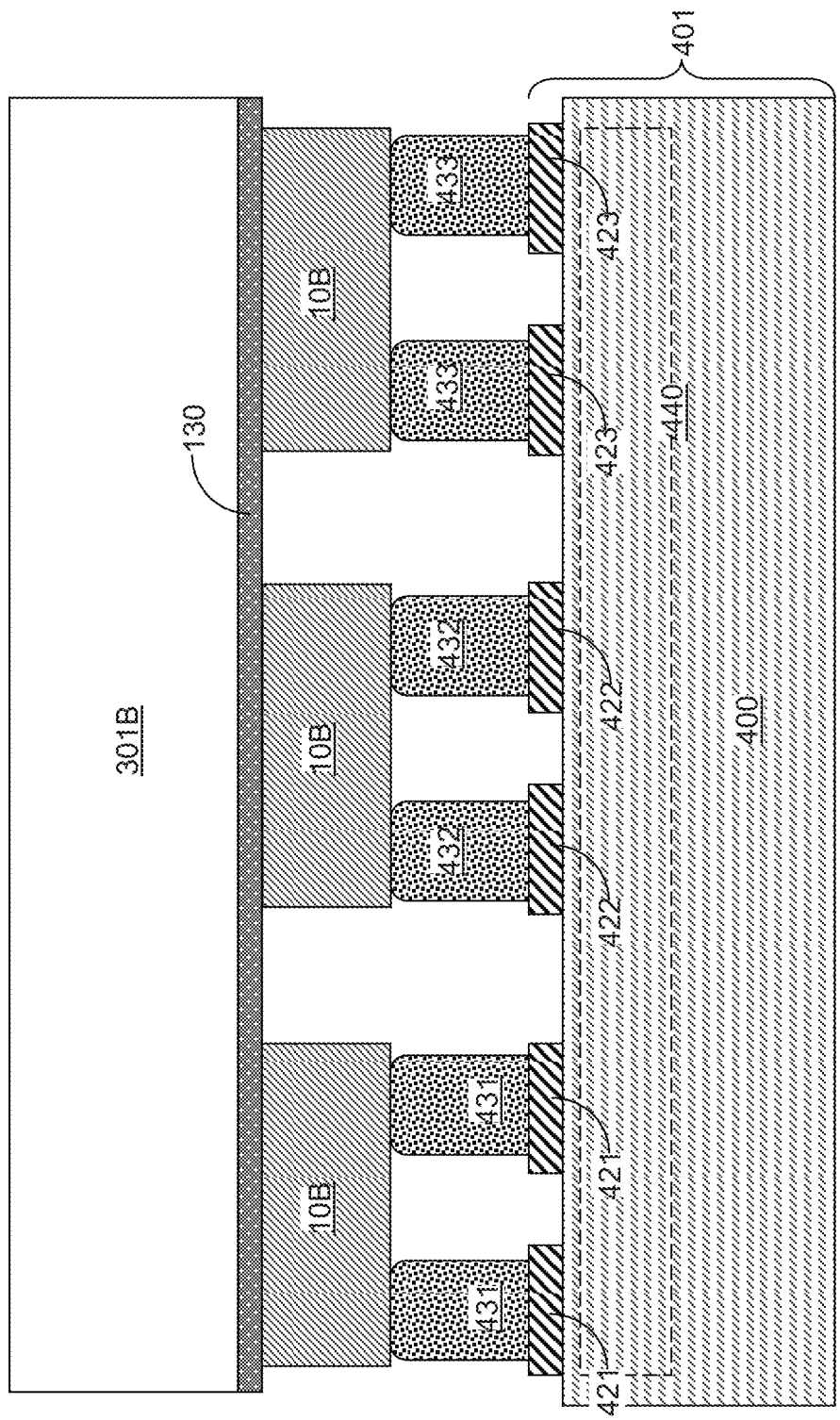

Referring to FIG. 35B, the backplane 401 and the assembly including the first light emitting diodes 10B are positioned such that each conductive bonding structure (431, 432, 433) is attached to one of a first light emitting device 10B and a bonding pad (421, 422, or 423), and contacts the other of the first light emitting device 10B and the bonding pad (421, 422, or 423). In one embodiment, each first conductive bonding structure 431 can be attached to one of an overlying first light emitting device 10B and a first bonding pad 421, and contacts the other of the overlying first light emitting device 10B and the first bonding pad 421; each second conductive bonding structure 432 can be attached to one of an overlying first light emitting device 10B and a second bonding pad 422, and contacts the other of the overlying first light emitting device 10B and the second bonding pad 422; and each third conductive bonding structure 433 can be attached to one of an overlying first light emitting device 10B and a third bonding pad 423, and contacts the other of the overlying first light emitting device 10B and the third bonding pad 423.

A reflow process is performed to reflow the conductive bonding structures (431, 432, 433). The reflow process can be performed by providing uniform heating to the conductive bonding structures (431, 432, 433), for example, by placing the assembly of the backplane 401 and the first source substrate 301B with attached structures thereupon into a furnace or any other temperature controlled environment. Each conductive bonding structure (431, 432, 433) can be bonded to an overlying first light emitting device 10B and an underlying bonding pad (421, 422, 423). The bonding of the conductive bonding structure (431, 432, 433) can occur simultaneously.

Figure 35C:
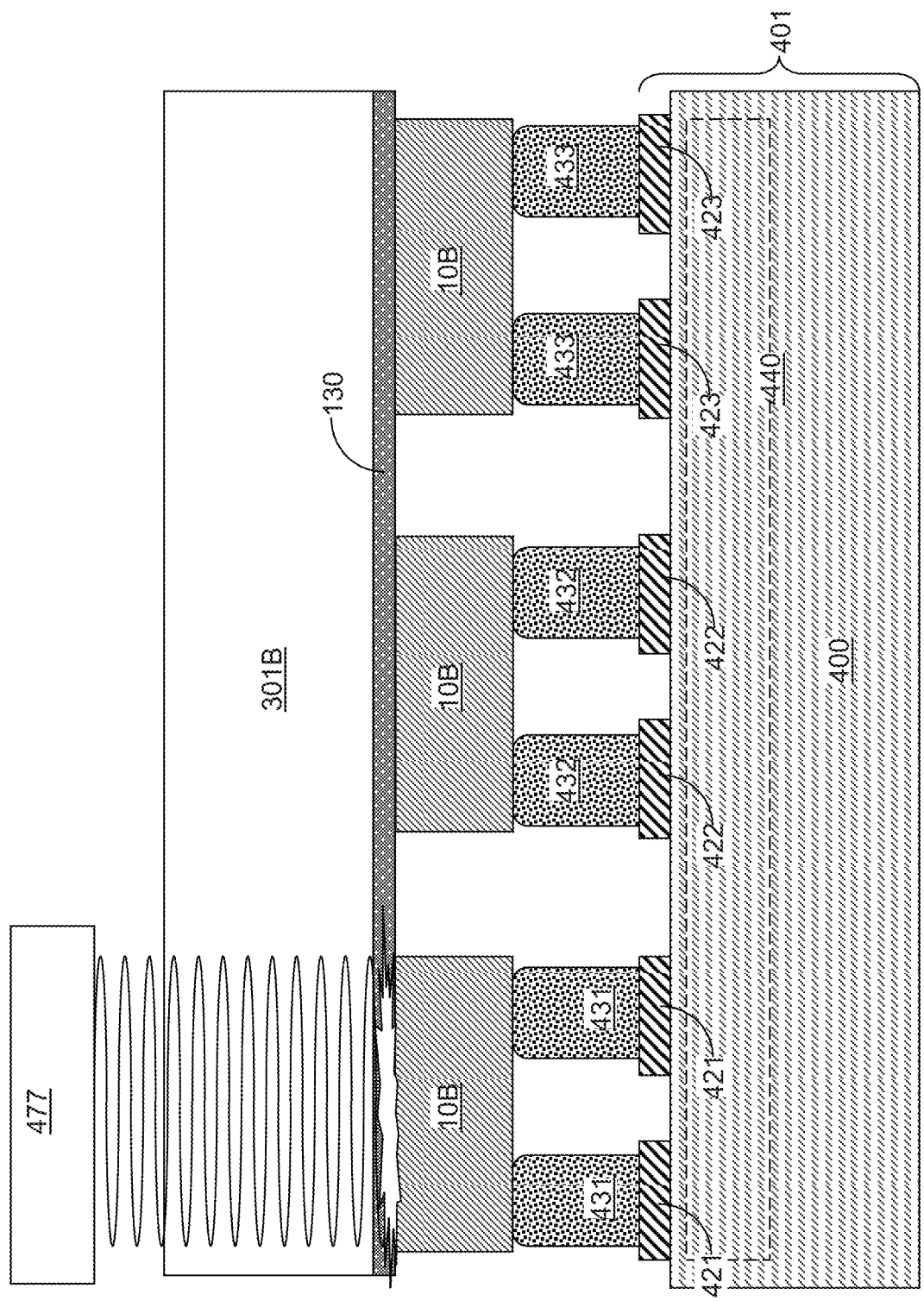

Referring to FIG. 35C, a laser irradiation process is performed to separate each bonded first light emitting device 10B from the first source substrate in the same manner as the processing steps of FIG. 32C. The wavelength of the laser 477 provides more heating to the material of the ablation material layer 130 than to the materials of the source substrate 301B and the transferred devices (e.g., the first light emitting diodes 10B). Each portion of the ablation material layer 130 overlying the first conductive bonding structures 431 can be sequentially irradiated by a laser beam from the layer 477 to dissociate each underlying first light emitting device 10B. In one embodiment, the temperature of the conductive bonding structures (431, 432, 433) can be maintained below the reflow temperature during dissociation process employing laser irradiation. Alternatively, the temperature of the conductive bonding structures (431, 432, 433) can be maintained near the reflow temperature during dissociation process employing laser irradiation Referring to FIG. 35D, the temperature of the conductive bonding structures (431, 432, 433) can be changed to a preset temperature, which is herein referred to as a "separation temperature" by non-selective heating, such as furnace heating. The separation temperature is a temperature at which each of the second and third conductive bonding structures (432, 433) can be split into two portions without causing additional fractures in the second and third bonding structures (432, 433). The separation temperature may be the same as the reflow temperature, may be lower than the reflow temperature (for example, by less than 10 degrees Celsius), or may be higher than the reflow temperature (for example, by less than 20 degrees Celsius). In one embodiment, the temperature of the conductive bonding structures (431, 432, 433) can be at the reflow temperature at the processing steps of FIG. 35B, be lowered to a process temperature that is lower than the reflow temperature at the processing steps of FIG. 35C, and be raised to the separation temperature at the processing steps of FIG. 35D.

The first conductive bonding structures 431 are not attached to the first source substrate 301B after the laser ablation process of FIG. 35C. As the assembly of the first source substrate 301B and attached first light emitting diodes 10B (i.e., the complement of the first subset of the first light emitting diodes 10B) is pulled away from the backplane 401 and the first subset of the first light emitting diodes 10B at the separation temperature, each of the second and third conductive bonding structures (432, 433) can be divided into two portions. For example, each second conductive bonding structure 432 can be divided into an upper second conductive bonding material portion 432U attached to a first light emitting device 10B and a lower second conductive bonding material portion 432L attached to the backplane 401, and each third conductive bonding structure 433 can be divided into an upper third conductive bonding material portion 433U attached to a first light emitting device 10B and a lower third conductive bonding material portion 433L attached to the backplane 401. The ratio of the amount of the conductive bonding material in an upper conductive bonding material portion (432U or 433U) to the amount of the conductive bonding material in an underlying lower conductive bonding material portion (432L or 433L) can be about 1 or less than 1 depending on the selection of the separation temperature.

Referring to FIG. 35E, a dummy substrate 700 is employed to push the first light emitting diodes 10B on the first conductive bonding structures 431 toward the backplane 401 while reflowing the first conductive bonding structures 431 in the same manner as the processing steps of FIG. 32E.

The processing steps of FIGS. 35A-35E can correspond to step 1 illustrated in FIG. 31B, in which the backplane 401 corresponds to the backplane BP1 in FIG. 31B. Equivalent processing steps (corresponding to step 2 illustrated in FIG. 31B) can be performed to transfer a first subset of second light emitting devices 10G from a second source substrate G (which can be a second transfer substrate 300G or a second-type growth substrate 100/500G) to first bonding pads 421 of the second backplane BP2 employing the transfer pattern shown in FIG. 31B (or any other pattern). Such processing steps can provide a second source substrate G from which a first subset of second light emitting devices 10G are removed in a pattern that is congruent to the pattern of the first light emitting diodes 10B on the backplane 401.

Figure 35D:
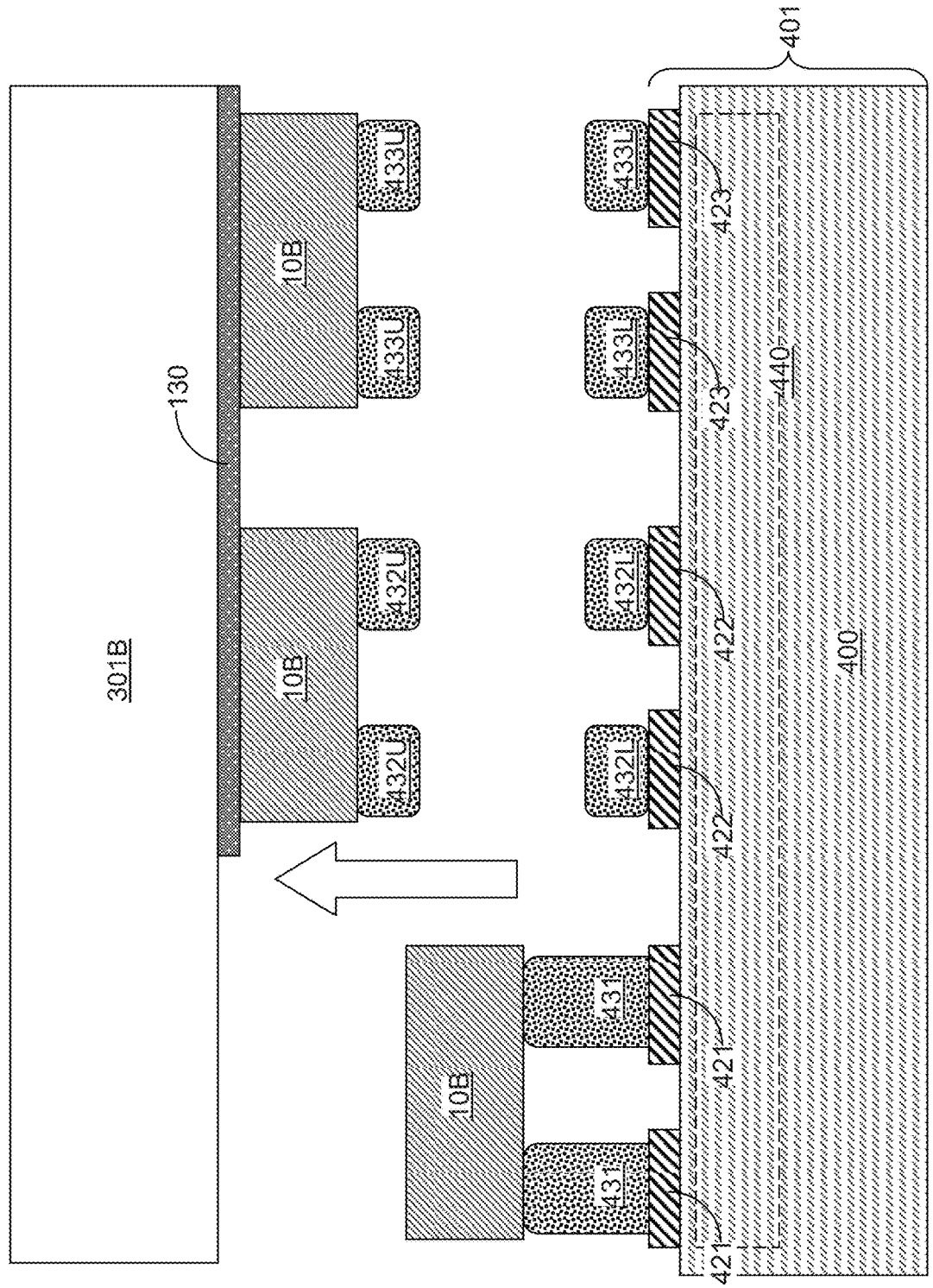
Figure 35F:
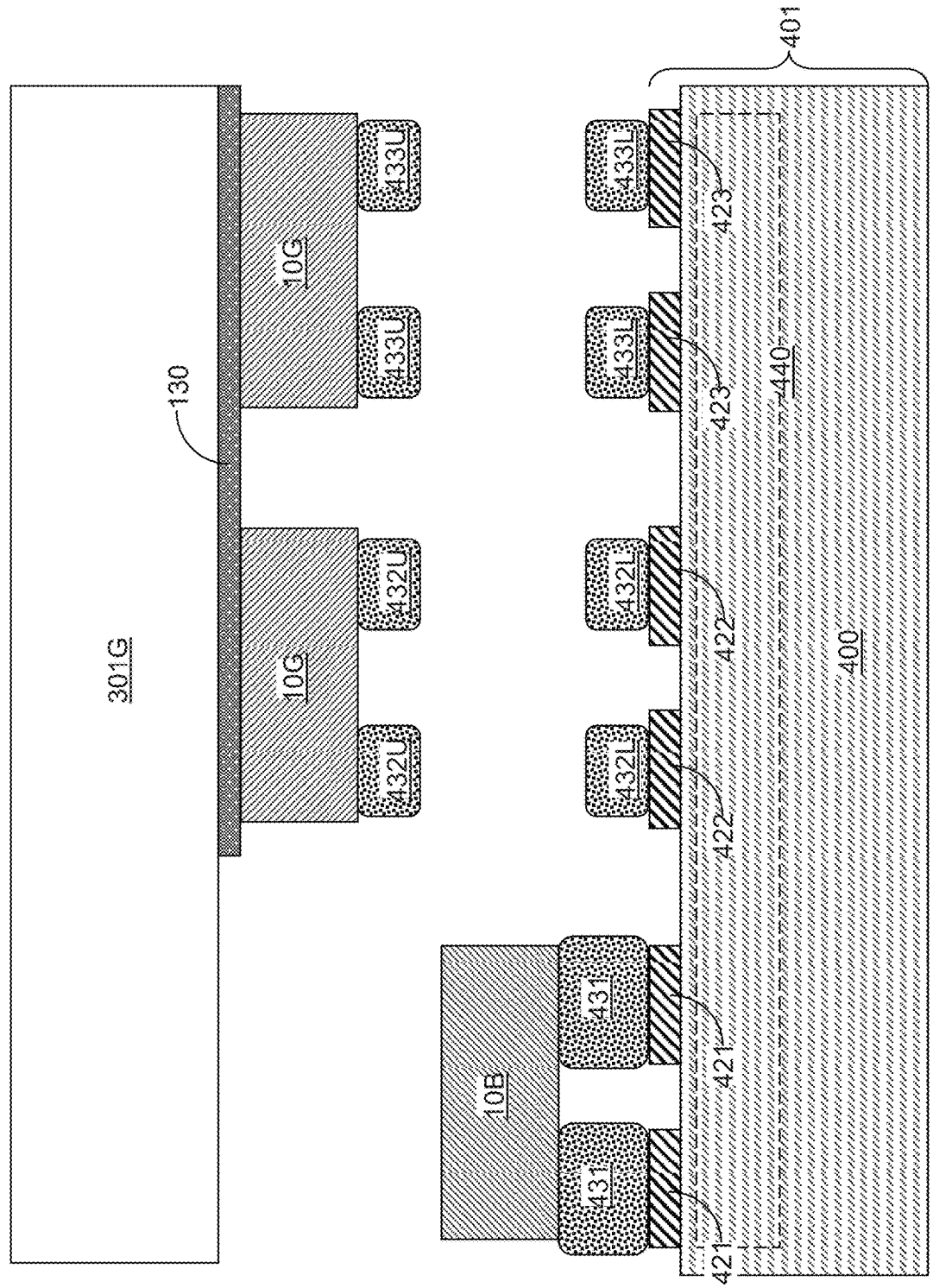

Referring to FIG. 35F, a second source substrate (such as a second transfer substrate 301G) from which a first subset of second light emitting devices 10G are removed is positioned over the in-process fifth exemplary light emitting device assembly, and is aligned such that a second subset of the second light emitting diodes 10G overlies the second bonding pads 422. Each upper conductive bonding material portion (432U or 433U) can be aligned to an underlying lower conductive bonding material portion (432L or 433L) after the alignment process.

Figure 35G:
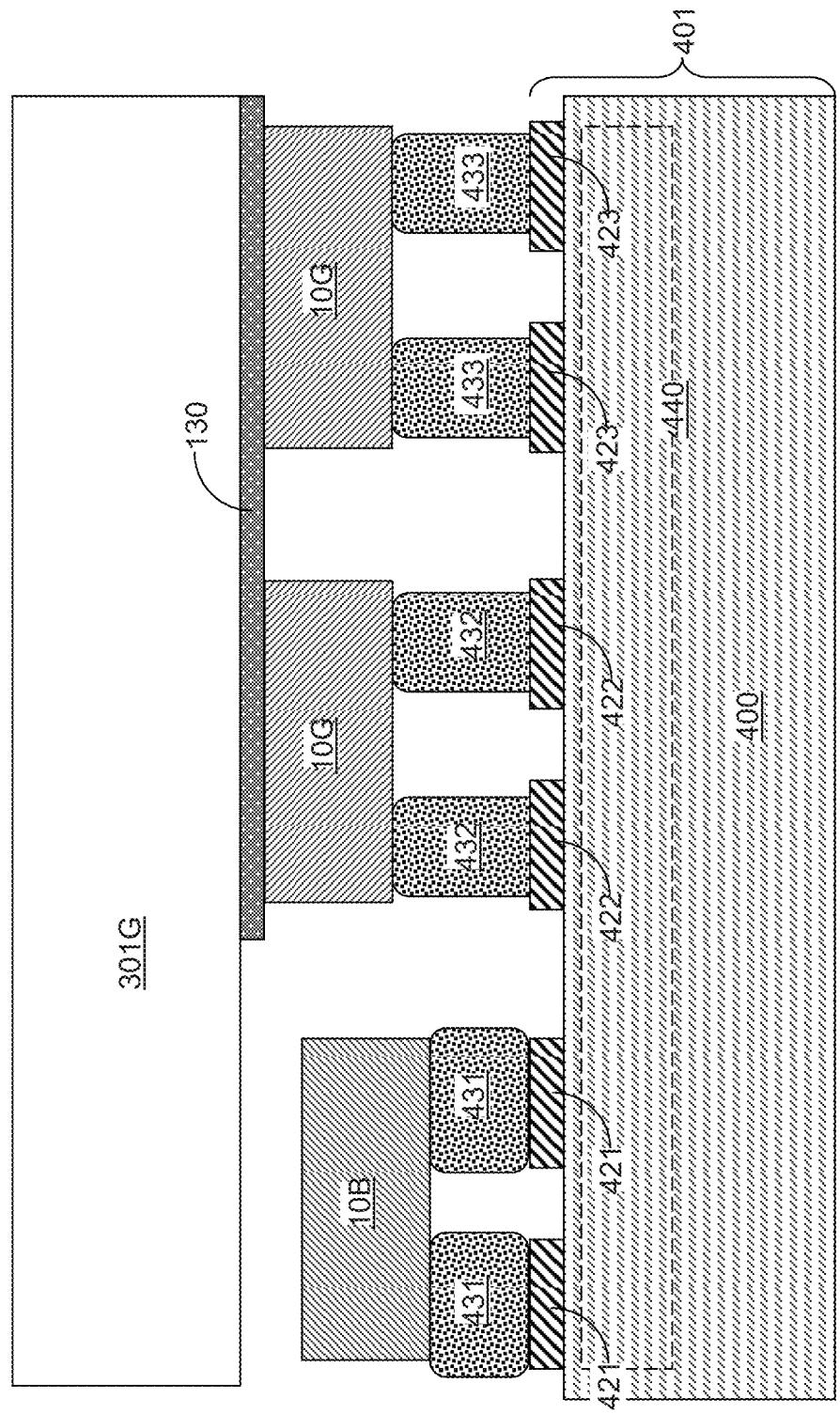

Referring to FIG. 35G, the backplane 401 and the assembly including the second light emitting diodes 10G are brought into contact with each other while the temperature is raised to the reflow temperature of the material of the upper conductive bonding material portions (432U, 433U) and the lower conductive bonding material portions (432L, 433L). The simultaneous ramping up of the temperature and reduction of the separation distance between the upper conductive bonding material portions (432U, 433U) and the lower conductive bonding material portions (432L, 433L) can avoid breakage of, and/or misalignment between, the upper conductive bonding material portions (432U, 433U) and the lower conductive bonding material portions (432L, 433L) due to irregularity in the shapes thereof.

Each vertically adjoined pair of an upper second conductive bonding material portion 432U and a lower second conductive bonding material portion 432L merges to form a second conductive bonding structure 432. Each vertically adjoined pair of an upper third conductive bonding material portion 433U and a lower third conductive bonding material portion 433L merges to form a second conductive bonding structure 433. Each second conductive bonding structure 432 is bonded to an overlying second light emitting device 10G and an underlying second bonding pad 422. Each third conductive bonding structure 433 is bonded to an overlying second light emitting device 10G and an underlying third bonding pad 423.

Figure 35H:
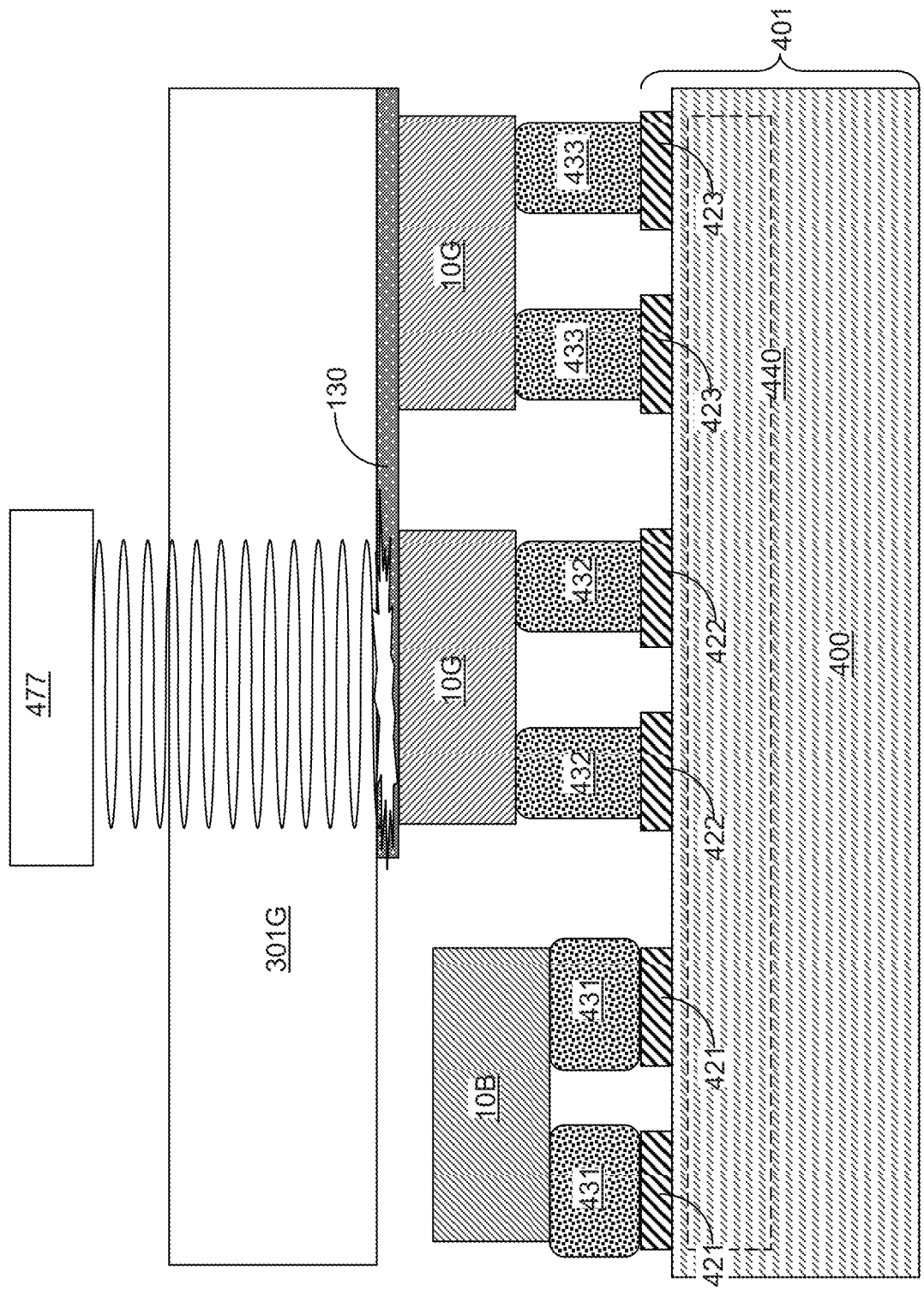

Referring to FIG. 35H, a laser irradiation process is performed to separate each bonded second light emitting device 10G from the second source substrate in the same manner as the processing steps of FIG. 32H. The wavelength of the laser 477 provides more heating to the material of the ablation material layer 130 than to the materials of the source substrate 301G and the transferred devices (e.g., the second light emitting diodes 10G). Each portion of the ablation material layer 130 overlying the second conductive bonding structures 432 can be sequentially irradiated by a laser beam from the layer 477 to dissociate each underlying second light emitting device 10G.

Figure 35I:
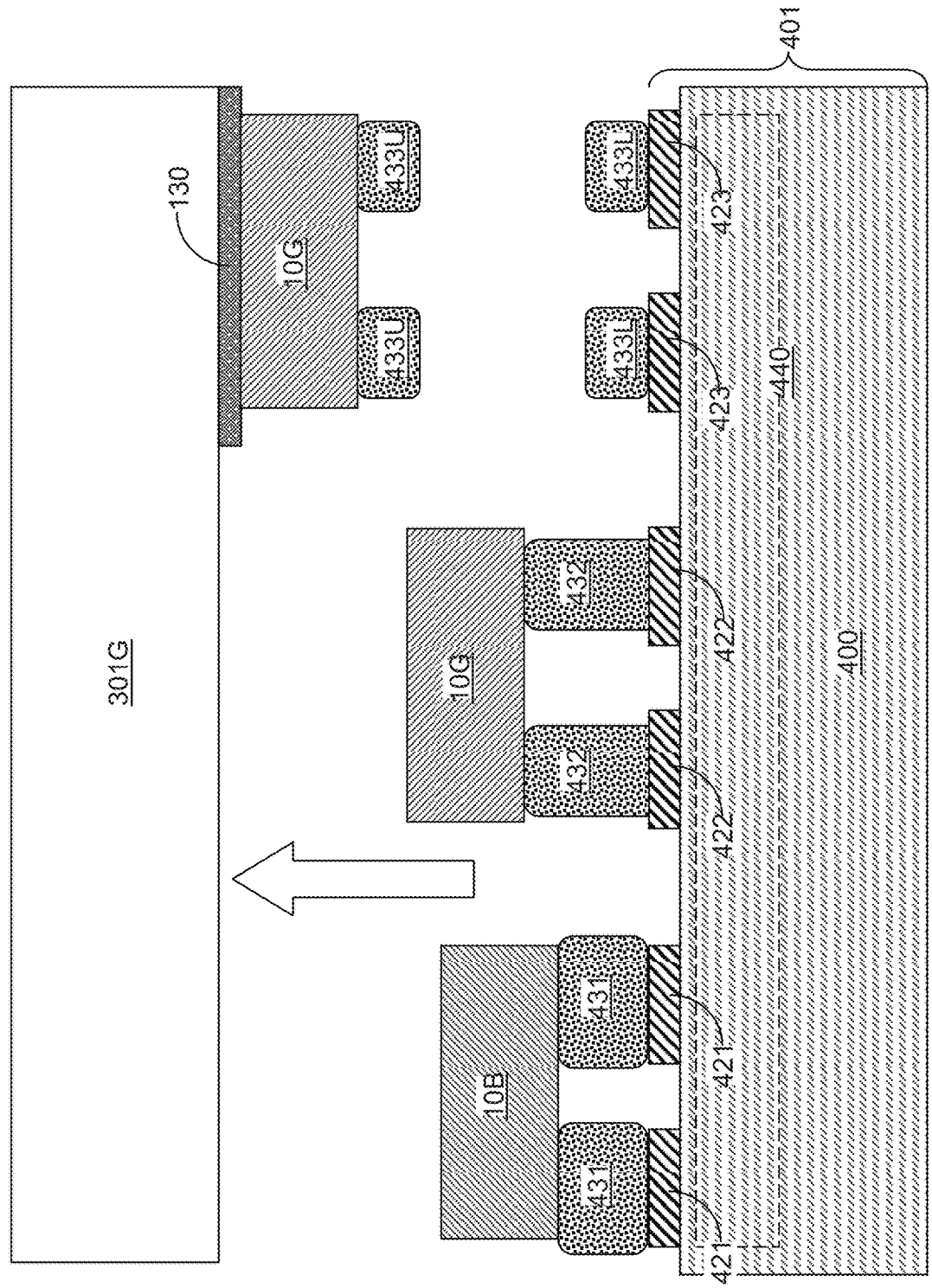

Referring to FIG. 35I, the second conductive bonding structures 432 are not attached to the second source substrate 301B after the laser ablation process of FIG. 35C. The temperature of the conductive bonding structures (431, 432, 433) can be changed to the separation temperature, and the assembly of the second source substrate 301G and attached second light emitting diodes 10G is pulled away from the backplane 401 and the first subset of the first light emitting diodes 10B at the separation temperature. Each of the third conductive bonding structures 433 can be divided into two portions. Specifically, each third conductive bonding structure 433 can be divided into an upper third conductive bonding material portion 433U attached to a first light emitting device 10B and a lower third conductive bonding material portion 433L attached to the backplane 401. The ratio of the amount of the conductive bonding material in an upper third conductive bonding material portion 433U to the amount of the conductive bonding material in an underlying lower third conductive bonding material portion 433L can be about 1 or less than 1 depending on the selection of the separation temperature.

Figure 35J:
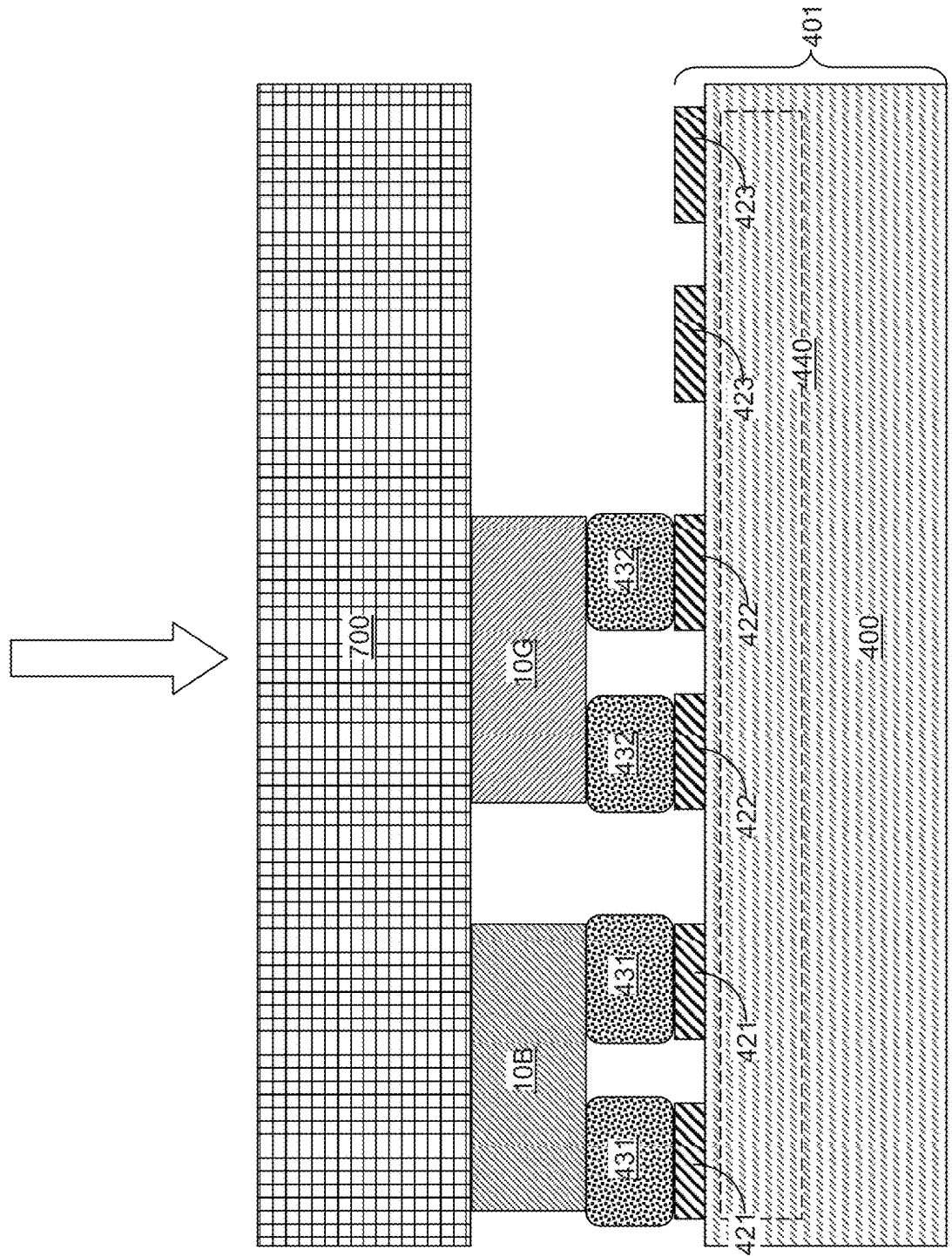

Referring to FIG. 35J, a dummy substrate 700 is employed to push the second light emitting diodes 10G on the second conductive bonding structures 432 toward the backplane 401 in the same manner as in the processing steps of FIG. 32J.

The processing steps of FIGS. 35F-35J can correspond to step 6 illustrated in FIG. 31C, in which the backplane 401 corresponds to the backplane BP1 in FIG. 31C. Processing steps corresponding to step 3 in FIG. 31B and step 7 in FIG. 31C can be performed to transfer a first subset and a second subset of third light emitting devices 10R from a third source substrate R (which can be a third transfer substrate 300R or a third-type growth substrate 100/500R) to bonding pads of additional backplanes (e.g., BP3 in FIG. 31B and BP4 in FIG. 31C) employing the transfer pattern shown in FIGS. 31B and 31C (or any other pattern). Such processing steps can provide a third source substrate R from which a first subset and a second subset of third light emitting devices 10R are removed in a pattern that is congruent to the combined pattern of the first light emitting diodes 10B and the second light emitting diodes 10G on the backplane 401.

Figure 35K:
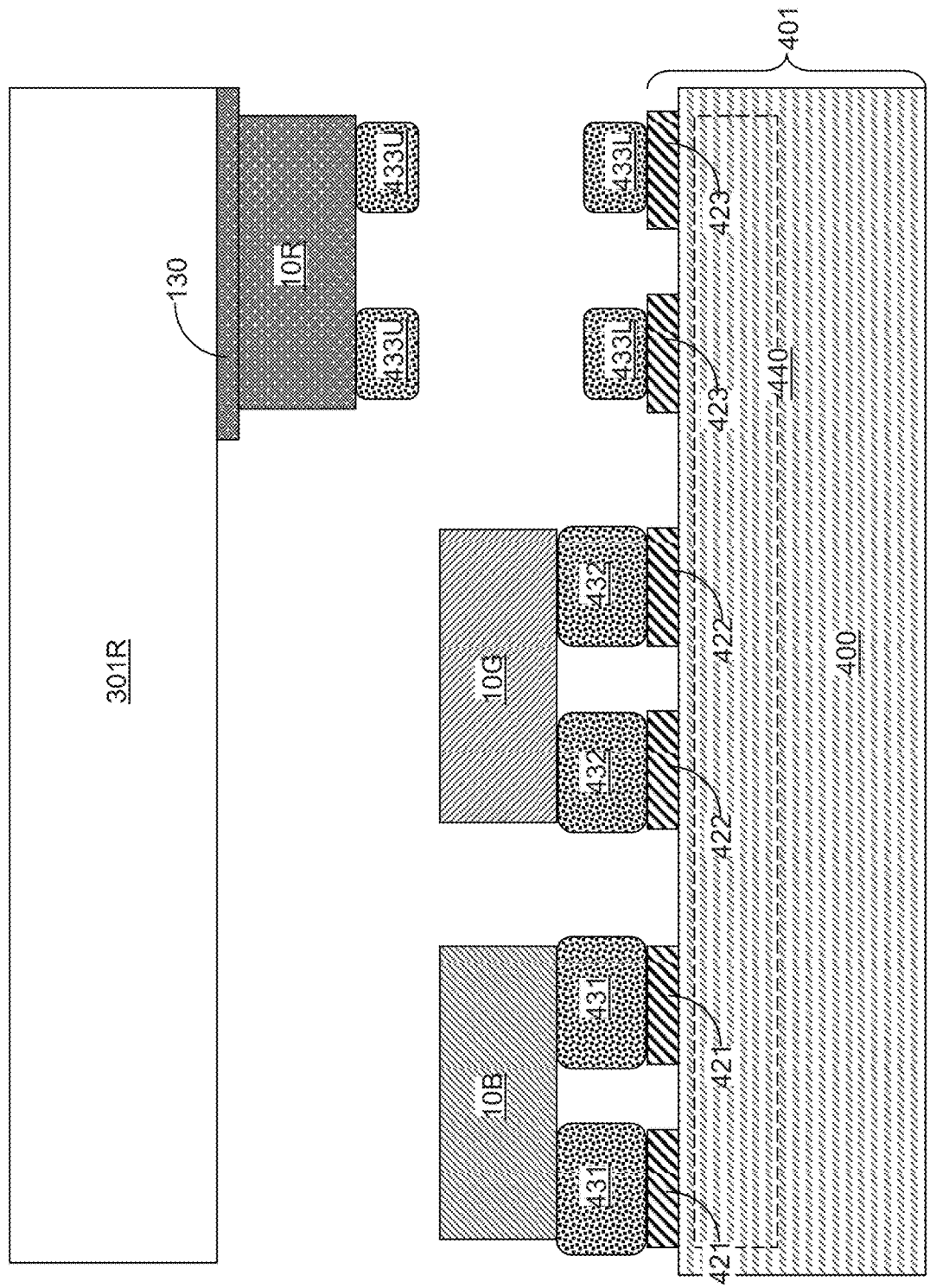

Referring to FIG. 35K, a third source substrate (such as a third transfer substrate 301R), from which a first subset and a second subset of third light emitting devices 10R have been removed in prior processing steps, is positioned over the in-process fifth exemplary light emitting device assembly, and is aligned such that a third subset of the third light emitting diodes 10R overlies the third bonding pads 423. Each upper third conductive bonding material portion 433U can be aligned to an underlying lower third conductive bonding material portion 433L after the alignment process.

Figure 35L:
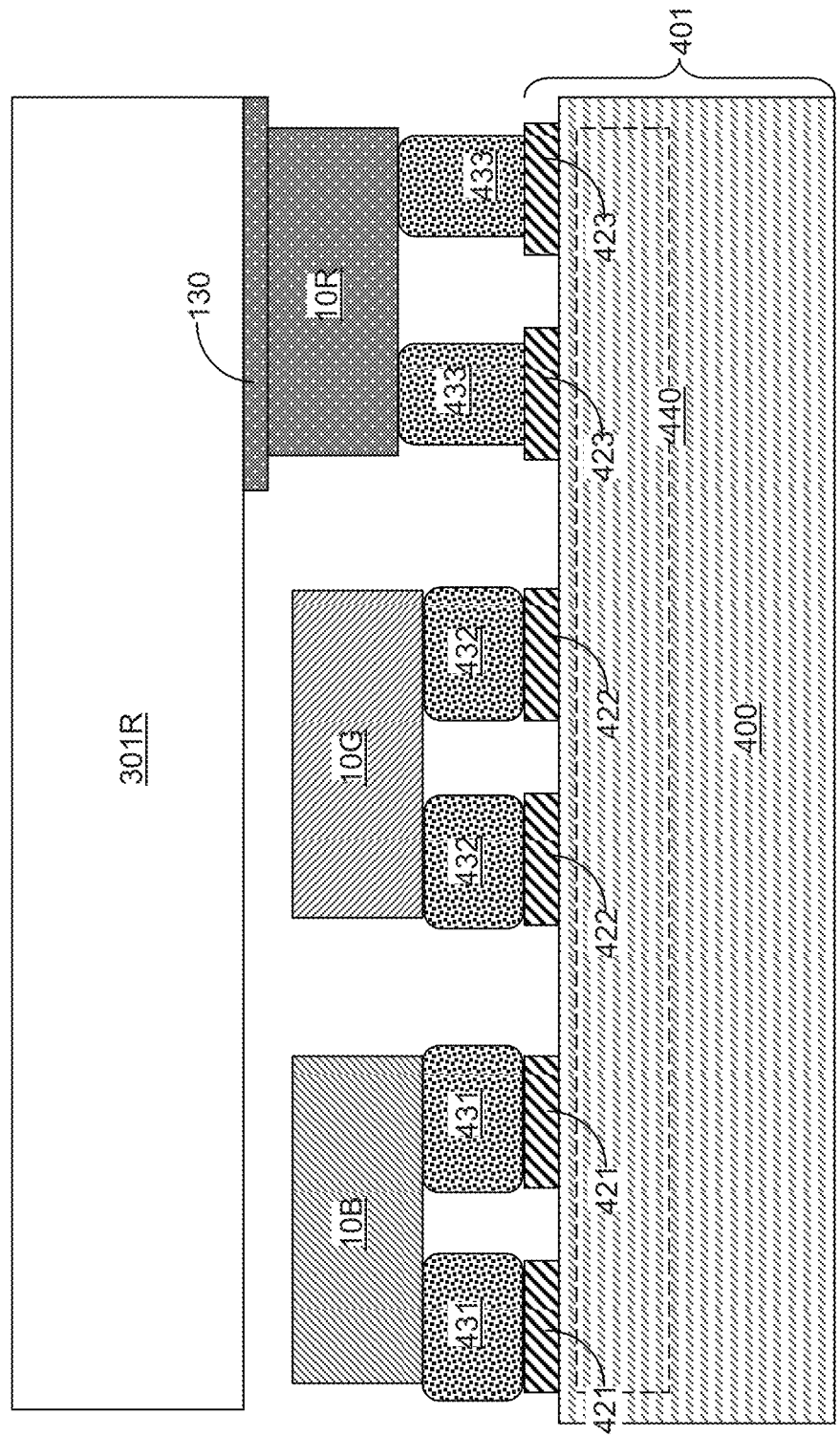

Referring to FIG. 35L, the backplane 401 and the assembly including the second light emitting diodes 10G are brought into contact with each other while the temperature is raised to the reflow temperature of the material of the upper third conductive bonding material portions 433U and the lower third conductive bonding material portions 433L. The simultaneous ramping up of the temperature and reduction of the separation distance between the upper third conductive bonding material portions 433U and the lower third conductive bonding material portions 433L can avoid breakage of, and/or misalignment between, the upper third conductive bonding material portions 433U and the lower third conductive bonding material portions 433L due to irregularity in the shapes thereof.

Each vertically adjoined pair of an upper third conductive bonding material portion 433U and a lower third conductive bonding material portion 433L merges to form a second conductive bonding structure 433. Each third conductive bonding structure 433 is bonded to an overlying second light emitting device 10G and an underlying third bonding pad 423.

Figure 35M:
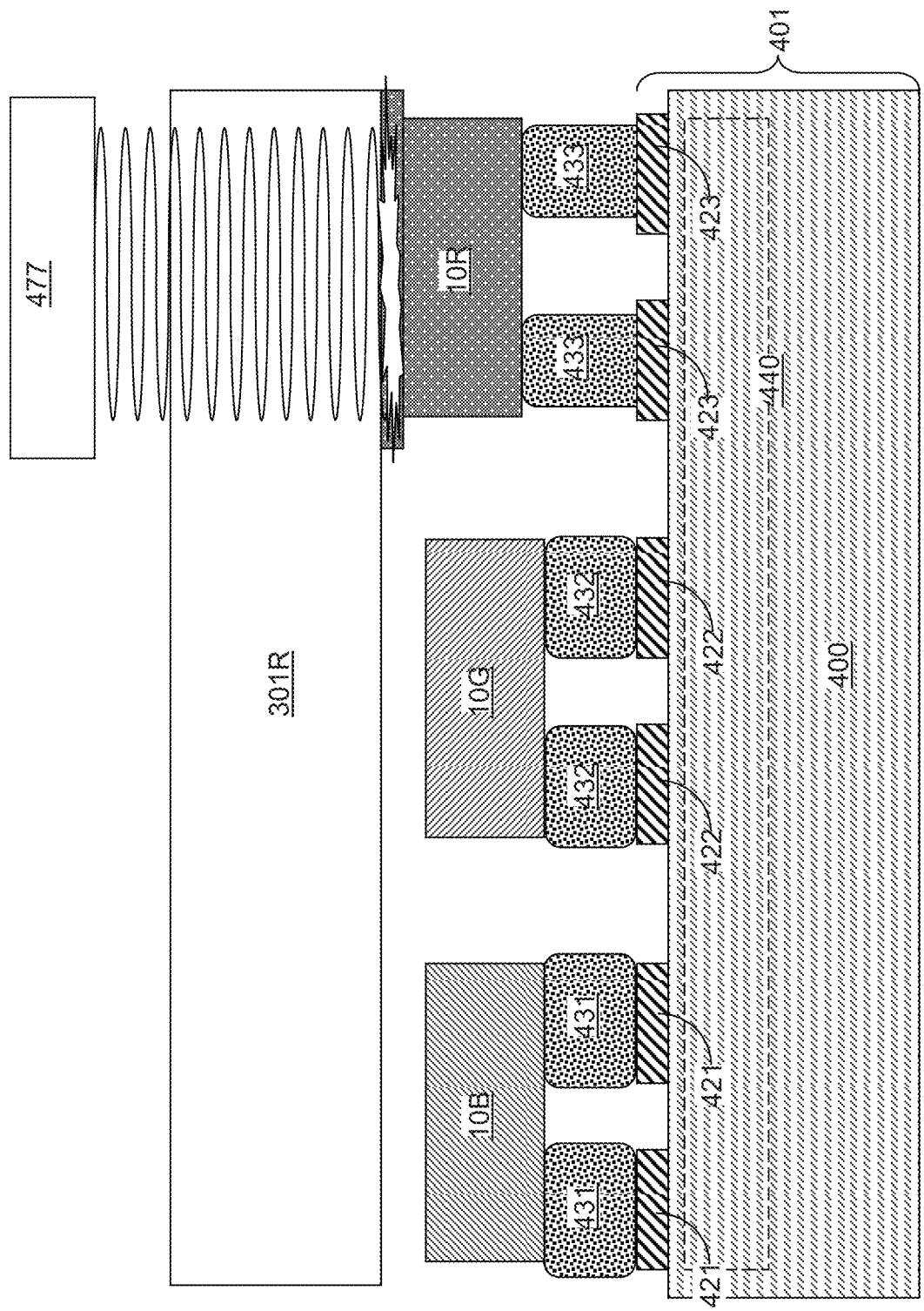

Referring to FIG. 35M, a laser irradiation process is performed to separate each bonded third light emitting device 10R from the third source substrate in the same manner as in the processing steps of FIG. 32M.

Figure 35N:
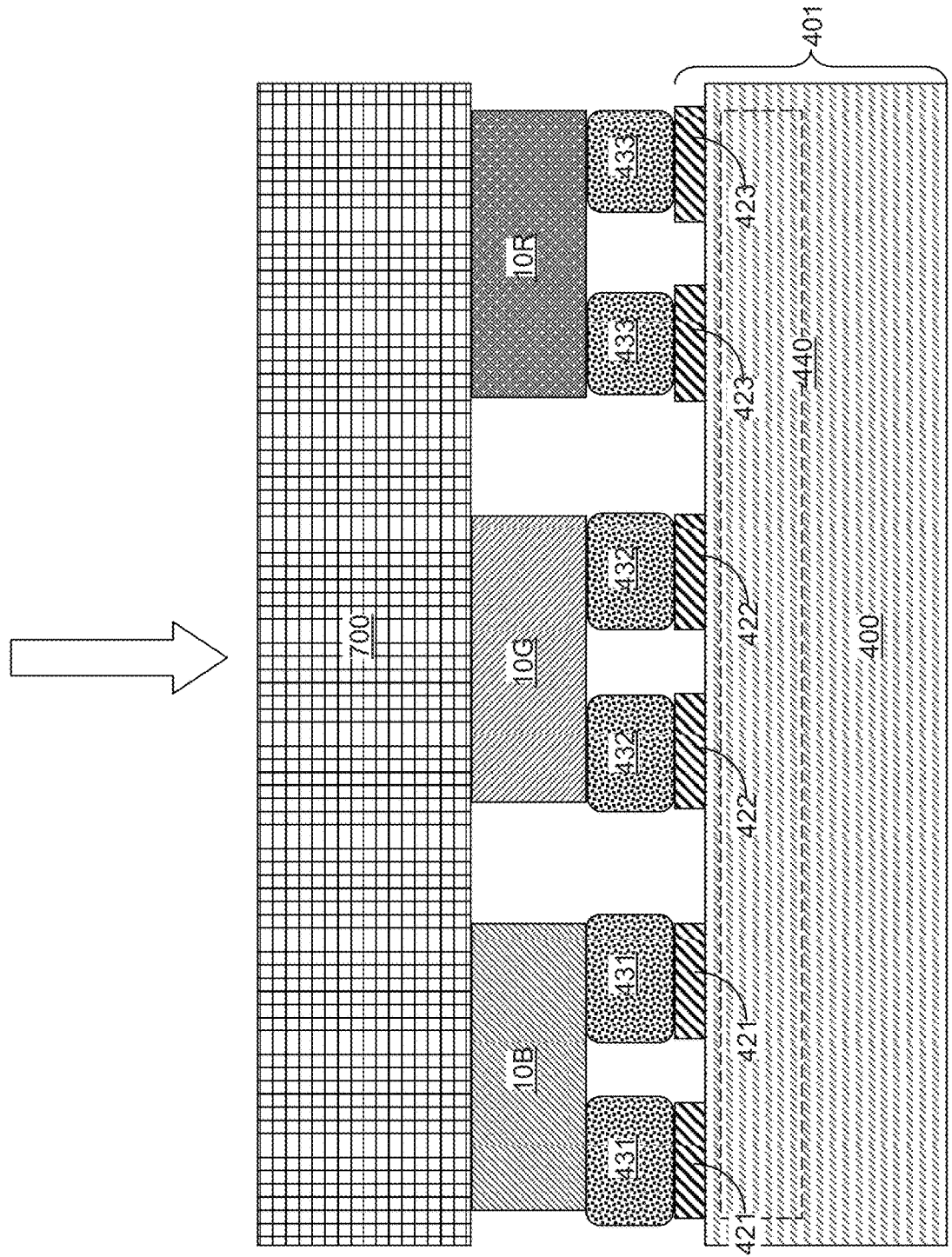

Referring to FIG. 35N, the assembly of the third source substrate 301R and any remaining third light emitting diodes 10R, if any, is separated from the backplane 401 and the third subset of the third light emitting diodes 10R that are now attached to the backplane 401 in the same manner as in the processing steps of FIG. 32N.

Optionally, a dummy substrate 700 may be employed to push the third light emitting diodes 10R on the third conductive bonding structures 433 toward the backplane 401 in the same manner as in the processing steps of FIG. 32N.

According to various embodiments of the present disclosure, a method of forming at least one integrated light emitting device assembly is provided. A first assembly comprising a first source substrate 301B and first light emitting devices 10B that emits light of a first wavelength is disposed over a backplane 401. First conductive bonding structures (430B or 431) are disposed between the backplane 401 and the first assembly. A first subset of the first light emitting devices 10B is bonded to the backplane 401 through the first conductive bonding structures (430B or 431). The first subset of the first light emitting devices 10B is detached from the first source substrate 301B by laser ablation of material portions 130 overlying the first subset of the first light emitting devices 10B. An assembly comprising the first source substrate 301B and a second subset of the first light emitting devices 10B is separated from the backplane 401 while the first subset of the first light emitting devices 10B remains bonded to the backplane 401 as illustrated in FIGS. 14, 32D, 33D, 34D, and 35D.

In one embodiment, a second assembly comprising a second source substrate 301G and second light emitting devices 10G is provided. The second light emitting devices 10G emit light of a second wavelength that is different from the first wavelength. The second light emitting devices 10G are not present in vacancy positions that form a first pattern (such as the pattern or vacancy in the second source substrate G in FIG. 31B). The second assembly comprising the second source substrate 301G and the second light emitting devices 10G is disposed over the backplane 401. Second conductive bonding structures 432 are disposed between the backplane 401 and the second assembly. The vacancy positions of the first pattern overlie all areas of the first light emitting devices 10B that are bonded to the backplane 402 when the second assembly is disposed over the backplane 401, as illustrated in FIGS. 15, 16, 32F, 32G, 33F, 33G, 34F, 34G, 35F, and 35G.

In one embodiment, a first subset of the second light emitting devices 10G is bonded to the backplane 401 through the second conductive bonding structures (430G or 432). The first subset of the second light emitting devices 10G is detached from the second source substrate 301G by laser ablation of material portions 130 overlying the first subset of the second light emitting devices; and 10G. An assembly comprising the second source substrate 301G and a second subset of the second light emitting devices 10G is separated from the backplane 401 while the first subset of the second light emitting devices 10G remains bonded to the backplane 401, as illustrated in FIGS. 17, 32I, 33I, 34I, and 35I.

In one embodiment, a third assembly comprising a third source substrate 301R and third light emitting devices 10R is provided. The third light emitting devices 10R emit light of a third wavelength that is different from the first wavelength and from the second wavelength. The third light emitting devices 10R are not present in vacancy positions that form a second pattern such as the pattern of vacancy positions over the third source substrate R in FIG. 31C. The third assembly comprising the third source substrate 301R and the third light emitting devices 10R is disposed over the backplane 401. Third conductive bonding structures (430R or 433) are disposed between the backplane 401 and the third assembly. The vacancy positions in the second pattern overlie all areas of the first and second light emitting devices (10B, 10G) that are bonded to the backplane 401 when the third assembly is disposed over the backplane 401, as illustrated in FIGS. 18, 32K, 32L, 33K, 33L, 34K, 34L, 35K, and 35L.

In one embodiment, a first subset of the third light emitting devices 10R is bonded to the backplane 401 through the third conductive bonding structures (430R or 433). The first subset of the third light emitting devices 10R is detached from the third source substrate 301R by laser ablation of material portions 130 overlying the first subset of the third light emitting devices 10R. An assembly comprising the third source substrate 301R and a second subset of the third light emitting devices 10R is separated from the backplane 401 while the first subset of the third light emitting devices 10R remains bonded to the backplane 401 as illustrated in FIG. 19 or in processing steps immediately following the processing steps of FIG. 32M, 33M, 34M, or 35M.

First bonding pads (420 or 421) and second bonding pads (420 or 421) are provided on the backplane 401. The first conductive bonding structures (430B or 431) overlie the first bonding pads (420 or 421) and the second conductive bonding structures (430G or 432) overlie the second bonding pads (420 or 422) when the first assembly is disposed over the backplane 401. The first conductive bonding structures (430B or 431) are bonded to the first subset of the first light emitting devices 10B and to the first bonding pads (420 or 421) when the first subset of the first light emitting devices 10B are bonded to the backplane 401 as illustrated in FIGS. 12, 32B, 33B, 34B, and 35B.

In some embodiments, one set of structures {(420 or 422) or 10B} selected from the second bonding pads (420 or 422) and the second subset of the first light emitting devices 10B does not physically contact the second conductive bonding structures (430G or 432) when the first subset of the first light emitting devices 10B are bonded to the backplane 401 as illustrated in FIGS. 13, 32B, and 33B. In some embodiments, the first conductive bonding structures (430B or 431) are bonded to the first bonding pads (420 or 421) and the second conductive bonding structures (430G or 432) are bonded to the second bonding pads (420 or 422) before, and while, the first subset of the first light emitting devices 10B are bonded to the backplane 401 as illustrated in FIGS. 11 and 12 and as explained above for the second through fifth exemplary integrated light emitting device assemblies. In some embodiments, each of the first and conductive bonding structures (430B or 431) is bonded to a respective first light emitting device 10B before, and while, the first subset of the first light emitting devices 10B are bonded to the backplane 401 as explained above for the first exemplary integrated light emitting device assembly and as illustrated in FIGS. 32A, 32B, 33A, 33B, 34A, 34B, 35A, and 35B.

In some embodiments, proximal surfaces of the first light emitting diodes 10B (i.e., surfaces that are closest to the backplane 401 such as the bottom surfaces of the first light emitting diodes 10B) are within a horizontal plane when the first assembly is disposed over the backplane as illustrated in FIGS. 12, 32A, 32B, 33A, 33B, 34A, 34B, 35A, and 35B. The first bonding pads (420 or 421) are more proximal to the horizontal plane than the second bonding pads (420 or 422) are to the horizontal plane when the first assembly is disposed over the backplane 401 as illustrated in FIGS. 12, 32A, and 32B. In some embodiments, the first bonding pads (421 have a greater thickness than the second bonding pads 422 as illustrated in FIGS. 32A-32N. In some embodiments, backside surfaces of the first bonding pads 420 are vertically spaced from the horizontal plane by a lesser separation distance than backside surfaces of the second bonding pads 420 are from the horizontal plane when the first assembly is disposed over the backplane 401 as illustrated in FIG. 12. In some embodiments, the backplane 401 has stepped surfaces having a different separation distance from a planar backside surface 409 of the backplane 401, and the first bonding pads 420 are located on a different stepped surface than the second bonding pads 420 as illustrated in FIGS. 9-12.

In some embodiments, the first bonding pads 421 and second bonding pads 422 have a same thickness, and the first conductive bonding structures 431 have a greater height than the second conductive bonding structures 432 upon formation thereof, as illustrated in FIG. 33A.

In some embodiments, the second bonding pads 422 and the second subset of the first light emitting devices 10B are in physically contact with the second conductive bonding structures 432 when the first subset of the first light emitting devices 10B are bonded to the backplane 401, as illustrated in FIGS. 34B and 35B.

In some embodiments, the first conductive bonding structures 431 are bonded to an underlying first bonding pad 421 and an overlying first light emitting device 10B by irradiation by a laser beam that selectively heats each first conductive bonding structure 10B as illustrated in FIG. 34B. In some embodiments, one set of structures (422 or 10B) selected from the second bonding pads 422 and the second subset of the first light emitting devices 10B is not bonded to the second conductive bonding structures 432 when the first subset of the first light emitting devices 10B are bonded to the backplane 401.

In some embodiments, the first conductive bonding structures (430B or 431) are bonded to an underlying first bonding pad (420 or 421) and an overlying first light emitting device 10B by uniformly heating the first conductive bonding structures (430B or 431) as illustrated in FIGS. 12, 32B, 33B, and 35B.

In some embodiments, the second conductive bonding structures 432 are bonded to the second bonding pads 422 and to the second subset of the first light emitting devices 10B when the first subset of the first light emitting devices 10B are bonded to the backplane 401 as illustrated in FIG. 35B. In this case, each of the second conductive bonding structures 432 can be separated into two portions (432U, 432L) while separating the assembly comprising the first source substrate 301B and a second subset of the first light emitting devices 10B from the backplane 401 as illustrated in FIG. 35D. The two portions (432U, 432L) can comprise an upper portion 432U bonded to a respective first light emitting device 10B within the second set, and a lower portion 432L bonded to a respective second bonding pad 421.

In some embodiments, the first subset of the first light emitting devices 10B are bonded to the first bonding pad 421 and the second subset of the first light emitting devices 10B are bonded to the second bonding pad 422 simultaneously at a reflow temperature at the processing step of FIG. 35B. The laser ablation can be performed at a temperature lower than the reflow temperature at the processing step of FIG. 35C. At the processing step of FIG. 35D, the assembly comprising the first source substrate 301B and the second subset of the first light emitting devices 10B is separated from the backplane 401 at a separation temperature, which can be selected to be not less than the reflow temperature in some cases.

In some embodiments, the first subset of the first light emitting devices 10B is pushed closer to the backplane while reflowing the first conductive bonding structures after the assembly comprising the first source substrate 301B and the second subset of the first light emitting devices 10B is separated from the backplane 401 as illustrated in FIGS. 27, 28, 32E, 33E, 34E, and 35E. In some embodiments, a vertical pushing distance during the pushing of the first subset of the first light emitting devices 10B can be greater than a maximum height among gaps between the second conductive bonding structures (430G or 432) and structures selected from overlying first light emitting diodes 10B and underlying second bonding pads (420 or 422). The gaps can be present between the second conductive bonding structures (430G or 432) and overlying first light emitting diodes 10B as illustrated in FIGS. 12 and 13, or can be present between the second conductive bonding structures (430G or 432) and underlying second bonding pads (420 or 422) as illustrated in FIGS. 32B and 33B.

In some embodiments, an additional assembly comprising another source substrate (401S or 101S) and sensor devices 10S can be provided. The sensor devices 10S are not present in vacancy positions that form another pattern, which can be, for example, the pattern of the vacancy positions in the fourth source substrate S in FIG. 31D. The additional assembly comprising the additional source substrate (401S or 101S) and the sensor devices 10S can be disposed over the backplane 401. Additional conductive bonding structures 420 can be disposed between the backplane 401 and the additional assembly, and the vacancy positions in the additional pattern overlie all areas of the first light emitting devices 10B (and second and third light emitting devices (10G, 10R), if present) that are bonded to the backplane 401 when the additional assembly is disposed over the backplane 401 as illustrated in FIG. 19. While transfer of the sensor devices 10S to the backplane 401 is not expressly described for the second through fifth integrated light emitting device assemblies, it is understood that the same device transfer methods can be iteratively employed to transfer any number of different types of discrete devices in an array configuration having the same pitches as the transferred discrete devices on the backplane 401.

In one embodiment, a first subset of the sensor devices 10S can be bonded to the backplane 401 through the additional conductive bonding structures 420. The first subset of the sensor devices 20S can be detached from the additional source substrate (401S or 101S) by laser ablation of material portions 20 overlying the first subset of the sensor devices 10S as illustrated in FIG. 20. An assembly comprising the additional source substrate (401S or 101S) and a second subset of the sensor devices 10S can be separated from the backplane 401 while the first subset of the sensor devices 10 remains bonded to the backplane 401 as illustrated in FIG. 21.

In some embodiments, the first subset of the first light emitting devices 10B is detached from the first source substrate (401B or 101B) one at a time by sequential irradiation of a laser beam to each first light emitting device 10B in the first subset as illustrated in FIGS. 13, 32C, 33C, 34C, and 35C.

The first bonding pads (420, 421) are provided on the backplane 401, and each of the first conductive bonding structures (430B or 431) is bonded to a respective first bonding pad (420, 421) and a respective first light emitting device 10B in the first subset when the first subset of the first light emitting devices 10B are bonded to the backplane 401. In some embodiment, second conductive bonding structures (430G or 432) are disposed between the second subset of the first light emitting devices 10B and second bonding pads (420, 422) located on the backplane 401 at a time of bonding the first subset of the first light emitting diodes to the backplane 401, and each second conductive bonding structure (430G or 432) is bonded to one of an overlying first light emitting device 10B within the second subset and an underlying second bonding pad (420, 422), and does not physically contact another of the overlying first light emitting device 10B within the second subset and the underlying second bonding pad (420, 422), as illustrated in FIGS. 13, 32B, and 33B.

In some embodiment, the backplane 401 is provided with stepped horizontal surfaces at a top side as illustrated in FIGS. 9-23 and 25-29. The stepped horizontal surfaces can comprise a first subset of the stepped horizontal surfaces located within a first horizontal surface plane HSP1, and a second subset of the stepped horizontal surfaces located within a second horizontal surface plane HSP2 that is more proximal to a planar backside surface 409 of the backplane 401 than the first subset of stepped horizontal surfaces is to the planar backside surface 409 of the backplane 401 as illustrated in FIG. 9. In this case, the first conductive bonding structures 420 can be formed at the first subset of the stepped horizontal surfaces, and the second conductive bonding structures 420 can be formed at the second subset of the stepped horizontal surfaces. The stepped horizontal surfaces can comprise a third subset of the stepped horizontal surfaces is located within a third horizontal surface plane HSP3 that is more proximal to the backside surface 409 of the backplane 401 than the second subset of stepped horizontal surfaces is to the backside surface 409 of the backplane 401, and the third conductive bonding structures 420 can be formed at the third subset of the stepped horizontal surfaces.

In one embodiment, the first assembly comprising the first source substrate (401B, 101B) and the first light emitting devices 10B can further comprise a release layer 20 contacting the first source substrate and comprising a material that absorbs light at a wavelength selected from ultraviolet range, visible range, and infrared range. A bonding material layer 30 can contact the release layer 20 and the first light emitting devices 10B.

First portions of the release layer 20 (which is an ablation material layer 130) that overlies the first subset of the first light emitting devices 10B can be removed selectively, while second portions of the release layer 20 that overlie the second subset of the first light emitting devices 10B are not removed. In some embodiments, the release layer 20 comprises silicon nitride, the laser wavelength is a ultraviolet wavelength, and irradiating the first portions of the release layer 20 with the laser beam ablates the first portions of the release layer 20.

In some embodiments, the first source substrate can be an upper portion 530 of a growth substrate 500B on which the first light emitting devices 10B are fabricated. The first source substrate 101B can be provided by separating the upper portion 530 of the growth substrate 500B from a lower portion of the growth substrate 500B. In one embodiment, the growth substrate 500B can comprise a III-V compound semiconductor material, and can be a III-V compound semiconductor substrate.

According to some embodiments of the present disclosure, an integrated light emitting device assembly is provided, which comprises a backplane 401 having stepped horizontal surfaces at a top side. The stepped horizontal surfaces comprises a first subset of the stepped horizontal surfaces located within a first horizontal surface plane HSP1, and a second subset of the stepped horizontal surfaces located within a second horizontal surface plane HSP2 that is more proximal to a backside surface 409 of the backplane 401 than the first subset of stepped horizontal surfaces is to the backside surface 409 of the backplane 401 as illustrated in FIG. 9. The integrated light emitting device assembly can comprise conductive bonding structures 430 overlying the stepped horizontal surfaces of the backplane 401. The conductive bonding structures 430 comprise first conductive bonding structures 430B overlying the first subset of the stepped horizontal surfaces and second conductive bonding structures 430G overlying the second subset of the stepped horizontal surfaces. The integrated light emitting device assembly can comprise light emitting devices (10B, 10G, 10R) bonded to the conductive bonding structures 430. The light emitting devices (10B, 10G, 10R) can comprise first light emitting devices 10B that emit light of a first wavelength and overlie the first subset of the stepped horizontal surfaces and second light emitting devices 10G that emit light of a second wavelength and overlie the second subset of stepped horizontal surfaces.

In some embodiments, a first horizontal interfacial plane including interfaces between the first light emitting devices 10B and the first conductive bonding structures 430B is more distal from the second horizontal surface plane than a second horizontal interface plane between the second light emitting devices 10G and the second conductive bonding structures 430G as illustrated in FIGS. 22, 23, 24, 25, and 29. In some embodiments, the stepped horizontal surfaces further comprise a third subset of the stepped horizontal surfaces located within a third horizontal surface plane HSP3 that is more proximal to the backside surface 409 of the backplane 401 than the second subset of stepped horizontal surfaces as illustrated in FIG. 9. The conductive bonding structures 430 can further comprise third conductive bonding structures 430R overlying the third subset of the stepped horizontal surfaces.

In some embodiments, the light emitting devices (10B, 10G, 10R) further comprise third light emitting devices 10R that emit light of a third wavelength and overlie the third subset of the stepped horizontal surfaces. A third horizontal interfacial plane including interfaces between the third light emitting devices 10R and the third conductive bonding structures 430R can be more proximal to the second horizontal surface plane HSP2 than the second horizontal interface plane is to the second horizontal surface plane HSP2 as illustrated in FIGS. 22, 23, 24, 25, and 29.

In some embodiments, the second conductive bonding structures 430G have a greater height than the first conductive bonding structures 430B as illustrated in FIGS. 22, 23, 24, 25, and 29. In some embodiments, the third conductive bonding structures 430R have a greater height than the second conductive bonding structures 430G as illustrated in FIGS. 22, 23, 24, 25, and 29. In some embodiments, the integrated light emitting device assembly can comprise sensor devices 10S bonded to the backplane 401 through fourth conductive bonding structures 430S.

In some embodiment, a first horizontal top plane including top surfaces of the first light emitting devices 10B can be more proximal to the second horizontal surface plane HSP2 than a second horizontal top plane including top surfaces of the second light emitting devices 10G is to the second horizontal surfaces plane HSP2 as illustrated in FIGS. 22, 23, 24, 25, and 29.

In some embodiments, the light emitting devices (10B, 10G, 10R) further comprise third light emitting devices 10R that emit light of a third wavelength and overlie the third subset of the stepped horizontal surfaces. A third horizontal top plane including top surfaces of the third light emitting devices 10R can be more distal from the second horizontal surface plane than the second horizontal top plane is from the second horizontal surfaces plane as illustrated in FIGS. 22, 23, 24, 25, and 29.

In some embodiments, the second light emitting devices 10G can have a greater height than the first light emitting devices 10G as illustrated in FIGS. 22, 23, 24, 25, and 29. In some embodiments, the third light emitting devices 10R can have a greater height than the second light emitting devices 10G.

In some embodiments, the light emitting devices (10B, 10G, 10R) can be arranged in a periodic array in which center-to-center distances of neighboring light emitting devices along a horizontal direction are integer multiples of a unit distance.

According to some embodiments of the present disclosure, an integrated light emitting device assembly comprising first light emitting devices 10B and second light emitting devices 10G bonded to a backplane 401 is provided. Each first light emitting device 10B emits light at a first wavelength, and each second light emitting device 10G emits light at a second wavelength that is different from the first wavelength. Each first light emitting device 10B is bonded to the backplane 401 through a first stack including a first bonding pad (420 or 421) and a first conductive bonding structure (430B or 431). Each second light emitting device 10G is bonded to the backplane 401 through a second stack including a second bonding pad (420 or 422) and a second conductive bonding structure (430G or 432). A first plane including first interfaces between the first bonding pads (420 or 421) and the first conductive bonding structures (430B or 431) is vertically offset from a second plane including second interfaces between the second bonding pads (420 or 422) and the second conductive bonding structures (430G or 432) as illustrated in FIGS. 22, 23, 24, 25, 29, and 32.

In some embodiments, distal surfaces (i.e., top surfaces) of the first light emitting devices 10B and the second light emitting devices 10G can be within a same plane that is spaced from, and is parallel to, the first and second planes as illustrated in FIG. 32N. In some embodiments, the first bonding pads 421 can have a first thickness, and the second bonding pads 422 can have a second thickness that is less than the first thickness as illustrated in FIG. 32N.

In some embodiments, the first bonding pads 420 and the second bonding pads 420 can have a same thickness, and are located on stepped surfaces. Bottom surfaces of the first bonding pads 420 are located on a first subset of the stepped surfaces, and bottom surfaces of the second bonding pads 420 are located on a second subset of the stepped surfaces that are vertically offset from the first subset of the stepped surfaces as illustrated in FIGS. 22, 23, 24, 25, and 29.

In some embodiment, the first conductive bonding structures 432 have a first height, and the second conductive bonding structures 432 have a second height that is less than the first height as illustrated in FIG. 32N. Each of the conductive bonding structures (431, 432, 433) can be formed with a same volume upon formation (for example, at the processing step of FIG. 32A), and each of the first conductive bonding structures 431 and the second conductive bonding structures 432 can have the same volume. The first conductive bonding structures 431 and the second conductive bonding structures 432 can have the same material composition. In some embodiments, the first bonding pads 421 can have a first thickness, the second bonding pads 422 can have a second thickness, and the sum of the first thickness and the first height of the first conductive bonding structures 431 can be the same as the sum of the second thickness and the second height of the second conductive bonding structures 432 as illustrated in FIG. 32N.

In some embodiments, third light emitting devices 10R can be bonded to the backplane 401. Each third light emitting device 10R emits light at a third wavelength that is different from the first wavelength and from the second wavelength. Each third light emitting device 10R can be bonded to the backplane 401 through a third stack including a third bonding pad 423 and a third conductive bonding structure 433. A third plane including third interfaces between the third bonding pads 423 and the third conductive bonding structures 433 can be vertically offset from the first plane and from the second plane.

According to some embodiments of the present disclosure, an integrated light emitting device assembly comprising first light emitting devices 10B and second light emitting devices 10G bonded to a backplane 401 is provided. Each first light emitting device 10B emits light at a first wavelength, and each second light emitting device 10G emits light at a second wavelength that is different from the first wavelength. Each first light emitting device 10B can be bonded to the backplane 401 through a first stack including a first bonding pad 421 and a first conductive bonding structure 431, and each second light emitting device 10G can be bonded to the backplane 401 through a second stack including a second bonding pad 422 and a second conductive bonding structure 432. The first conductive bonding structures 431 and the second conductive bonding structures 432 can have a same height. Each of the first conductive bonding structures 431 can have a first volume, and each of the second conductive bonding structures 432 can have a second volume that is less than the first volume as illustrated in FIG. 33N. The first conductive bonding structures 431, the second conductive bonding structures 432, and the third conductive bonding structures 433 can have different volumes as formed at the processing step of FIG. 33A. For example, the volume of the first conductive bonding structures 431 can be greater than the volume of the second conductive bonding structures 432, and the volume of the second conductive bonding structures 432 can be greater than the volume of the third conductive bonding structures 433. The conductive bonding structures (431, 432, 433) can have approximately the same lateral extent and different vertical extents as formed at the processing step of FIG. 33A.

In some embodiments, distal surfaces (i.e., top surfaces) of the first light emitting devices 10B and the second light emitting devices 10G can be within a same horizontal plane that is spaced from, and is parallel to, a top surface of the backplane 401, and a backside surface 409 of the backplane 401.

In some embodiments, the first bonding pads 421 and the second bonding pads 422 can have the same thickness as illustrated in FIG. 33N. In some embodiments, bottom surfaces of the first bonding pads 421 and the second bonding pads 422 can be located within a same plane including a top surface of the backplane 401. In some embodiments, the first conductive bonding structures 421 and the second conductive bonding structures 422 can have a same material composition.

In some embodiments, third light emitting devices 10R can be bonded to the backplane 401. Each third light emitting device 10R emits light at a third wavelength that is different from the first wavelength and from the second wavelength. Each third light emitting device 10R can be bonded to the backplane 401 through a third stack including a third bonding pad 423 and a third conductive bonding structure 433. The first conductive bonding structures 431, the second conductive bonding structures 432, and the third conductive bonding structures 433 can have the same height, and each of the third conductive bonding structures 433 can have a third volume that is less than the second volume.

According to an aspect of the present disclosure, ultra low temperature bonding for thermally sensitive processes can be designed around low melting point metals, eutectics and rapid diffusion reactions. Combining separate bond pad combinations leads to a process called selective die bonding. While the present disclosure is described employing a combination of three materials including indium (In), tin (Sn), and tellurium (Te), a combination of any plurality of materials selected from Table 1 below and having different melting temperatures can be employed as a set of solder materials in conjunction with corresponding bond pad metallurgy to enable sequential bonding of dies (devices) in multiple stages.

Further, various types of bond materials can be employed to implement the features of the present disclosure. Three embodiments include: fully reversible pure metal bonds; partially reversible eutectic reactions; and nearly irreversible low temperature diffusion reactions.

Fully reversible pure metal bonds with In (melting point 156° C.), Sn (melting point 232° C.) and Te (melting point 449° C.) are deposited on one or both sides of the devices to be bonded. The bond interface can be remelted and reworked several times. Each metal must be deposited on top of appropriate diffusion barriers and adhesion layers consistent with the underlying device or substrate. For example, Sn can be employed on Pt/Ti/Cr. The thickness of the layer may range from 10 nm to several microns. Lateral flow of the molten solder is controlled by bonding conditions, bond pad geometry, wetting layer design and thermal compression bonding parameters.

Partially reversible eutectic reactions are bonds in which the alloy system includes a series of cascading eutectic reactions in the phase diagram (e.g. the Cu—Sn) system or has an extended two phase liquid plus solid phase region adjoining the eutectic point. These bonds are partially reversible when the composition of the bond interface is engineered such that the mixing (diffusion) of the two alloying components increases in temperature of the alloy but still contains pure components and solid solutions with a low melting point. The reaction is partially reversible since the reacted alloy will form intermetallic compounds that do not remelt at low temperature. This type of die bonding method can also result in permanent bond when the thicknesses of the metal layers is engineered to result in full consumption of the lower melting point material into higher stability intermetallic compounds. These system will generally allow at least one remelt and rebond sequence and as many as four or more (Au—Sn). The first bond will be done slightly above the melting point of the lowest melting component. Rework temperature will be approximately 10° C.-15° C. higher than the first bond temperature. As more and more of the higher temperature component is consumed in the alloy formation the rebond/rework temperatures will rise. Each metal must be deposited on top of appropriate diffusion barriers and adhesion layers consistent with the underlying device or substrate. For example, Sn can be employed on Pt/Ti/Cr. The thickness of the layer may range from 10 nm to several microns. Lateral flow of the molten solder is controlled by bonding conditions, bond pad geometry, wetting layer design and thermal compression bonding parameters.

Nearly irreversible low temperature diffusion reactions are systems where it may be possible to rework the bond joint only once owing to the rapid diffusion process and formation of stable high temperature compounds. The reactions are rapid but can be used with rapid thermal processes to arrest the compound formation and allow for melting of remaining lower temperature solid solution. Each metal must be deposited on top of appropriate diffusion barriers and adhesion layers consistent with the underlying device or substrate. For example, Sn can be employed on Pt/Ti/Cr. The thickness of the layer may range from 10 nm to several microns. Lateral flow of the molten solder is controlled by bonding conditions, bond pad geometry, wetting layer design and thermal compression bonding parameters.

The exemplary systems include, but are not limited to, those with reaction temperatures below 450° C. that have been shown to be partially or fully reversible. The pure metal, fully reversible systems are In—In, Sn—Sn, and Te—Te. The fully and partially reversible bonds include one or more of In, Sn or Te. For tin based joints the most notable examples are In—Sn, Cu—Sn, Au—Sn, Ag—Sn, Al—Sn, Pd—Sn, Ge—Sn, Ni—Sn. For indium based joints the most significant systems are In—Sn, Ag—In, Au—In, Cu—In, In—Pt, In—Pd. The tellurium systems of interest are In—Te, Sn—Te, Ag, Te, Cu—Te, and Ge—Te.

Combing these basic low temperature reactions in selective areas of a bonded system allows selective transfer of mixed technologies or die types. The substrate can be provided with solder materials of different types. In one embodiment, the solder materials can be embodied as the conductive bonding structures (430, 431, 432, 433) described above. Alternatively, if a bonding scheme employs direct bondpad-to-bondpad bonding, the bondpads (420, 421, 422, 423) described above can include the solder materials.

For example if a support substrate is composed of bond pads of In, Sn and Te and the mating part(s) have bond pads of copper the following sequence could be used to selectively bond parts only at In, Sn, or Te locations.

First, starting with the first material (e.g., In) having a first eutectic point with Cu (which is the lowest eutectic point among the three eutectic points), the substrate can be heated to just over the first eutectic point (e.g., 156° C. for the case of the In—Cu system) and contacted by a first Cu-pad containing die, i.e., a first device 10B including copper bonding pads. This will form a eutectic alloy, and depending upon the length of time and temperature, the first Cu-pad containing die is held in contact the joint will form a stable intermetallic that will not remelt until above 310° C. during subsequent reheating processes. No other location with the Sn or Te will appreciably react with the Cu material at such a low temperature.

Second, a second Cu-pad containing die, i.e., a second device 10G including copper bonding pads, can be bonded to the substrate by placing the second Cu-pad containing die and raising the temperature of the contacted parts to just above the second eutectic point of the second material (e.g., Sn) with Cu. The second eutectic point is higher than the first eutectic point, and is lower than the third eutectic point of the third material with Cu. In case Sn is the second material, the second eutectic temperature is 186° C. The substrate can be heated to just over the second eutectic point and contacted by the second Cu-pad containing die, i.e., the copper bonding pad(s) of the second device 10G. This will form a eutectic alloy, and depending upon the length of time and temperature, the second Cu-pad containing die is held in contact the joint will form a stable intermetallic that will not remelt until above 340° C. during subsequent reheating processes. The intermetallics stabilize the joint.

Last, a third Cu-pad containing die, i.e., a third device 10R including copper bonding pads, can be bonded to the substrate by placing the third Cu-pad containing die and raising the temperature of the contacted parts to just above the third eutectic point of the third material (e.g., Te) with Cu. If the third material is Te, the third eutectic temperature is about 340° C.

Additional bonding schemes are provided, in which a substrate (such as a backplane 401) and a die (which can be any of the devices) have multiple combined metallurgies of staggered reaction temperatures. For example, the substrate can contain sites with In, Sn and Te bonding pads. A first die (such as a first light emitting device 10B) with at least one Au bonding pad can be joined to the In sites at 144° C., a second die (such as a second light emitting device 10G) with at least one Cu bonding pad can be joined to the Sn sites at 186° C.-227° C., and a third die (such as third light emitting device 10R) with at least one Ag bonding pad can be joined to the Te sites at 295° C.-353° C. Many combinations are possible and the thickness of the layers of the various types of bonding pads can be adjusted such that at each selective die attach stage there is enough remaining In, Sn, or Te to enable remelting and rework of the individual bonds.

The various methods of employing multiple types of solder materials having different eutectic temperatures with a common bonding pad material (such as Cu, Au, Ag, Sn, or In) can be employed in conjunction with any of the die (device) transfer methods described above.

Table 1 lists the metallurgical systems of interest and the lowest bond temperature for initial selective die attach.

TABLE 1

Exemplary eutectic systems and respective eutectic temperatures that can be employed to provide a set of eutectic systems having different eutectic temperatures for various bonding schemes of the present disclosure.

| Binary Alloy System | Lowest Bond Temp (° C.) |
|---|---|
| Au—Pd | 100 |
| In—Sn | 120 |
| Ag—In | 144 |
| Au—In | 153 |
| Cu—In | 153 |
| In—Pt | 154 |
| In—Pd | 156 |
| In—Te | 156 |

TABLE 1-continued

Exemplary eutectic systems and respective eutectic temperatures that can be employed to provide a set of eutectic systems having different eutectic temperatures for various bonding schemes of the present disclosure.

| Binary Alloy System | Lowest Bond Temp (° C.) |
|---|---|
| Cu—Sn | 186 |
| Sn—Zn | 199 |
| Au—Sn | 217 |
| Ag—Sn | 221 |
| Al—Sn | 228 |
| Sn—Te | 228 |
| Pd—Sn | 230 |
| Ge—Sn | 231 |
| Ni—Sn | 231 |
| Sn—Ti | 231 |
| Cr—Sn | 232 |
| Nb—Sn | 232 |
| Sn—Sn | 232 |
| Au—Cu | 240 |
| Cu—Ni | 250 |
| Ag—Te | 295 |
| Cu—Te | 340 |
| Al—Cr | 350 |
| Au—Ge | 360 |
| Au—Si | 363 |
| Ge—Te | 365 |
| Cu—Pd | 400 |
| Cu—Pt | 418 |

Figure 36:
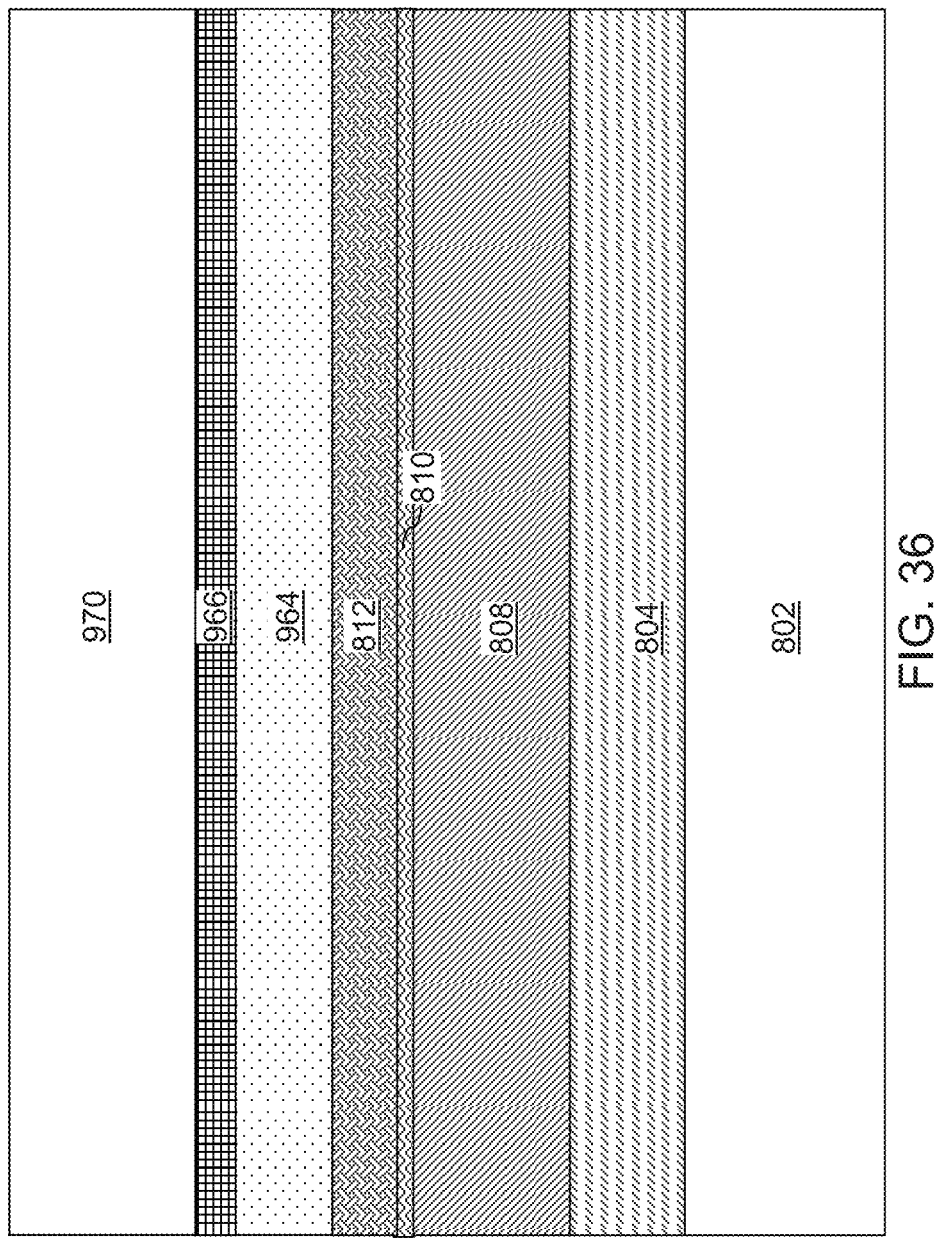
FIG. 36 is an exemplary structure for formation of red-light emitting diodes after formation of a dielectric material layer according to an embodiment of the present disclosure.

Referring to FIG. 36, an exemplary structure is illustrated, which includes a substrate 802 and a single crystalline n-doped gallium nitride layer 804. In one embodiment, the substrate 802 can be a single crystalline substrate on which a III-V compound semiconductor material can be epitaxially deposited. For example, the substrate 802 can be a sapphire (aluminum oxide) layer having a c-plane (0001 plane) as the crystallographic plane of the top surface.

The single crystalline n-doped gallium nitride layer 804 includes a single crystalline gallium nitride material in epitaxial alignment with the crystalline structure of the substrate 802. The single crystalline n-doped gallium nitride layer 804 can be formed, for example, by an epitaxial deposition process such as metal-organic chemical vapor deposition (MOCVD) process. The thickness of the single crystalline n-doped gallium nitride layer 804 can be selected such that dislocation defects caused by lattice mismatch between the lattice parameters of the substrate 802 and gallium nitride are healed, and the defect density decreases to a level suitable for device fabrication at the top surface of the single crystalline n-doped gallium nitride layer 804. For example, the thickness of the single crystalline n-doped gallium nitride layer 804 can be in a range from 1.2 microns 6 microns, although lesser and greater thicknesses can also be employed. The single crystalline n-doped gallium nitride layer 804 may be doped with electrical dopants of a first conductivity type. For example, the single crystalline n-doped gallium nitride layer 804 may be n-doped by introduction of silicon as n-type dopants during the epitaxial deposition process.

A single crystalline n-doped indium gallium nitride layer 808 is deposited on the single crystalline n-doped gallium nitride layer 804 by an epitaxial deposition method. In one embodiment, the single crystalline n-doped indium gallium nitride layer 808 can be formed with a graded composition such that the indium concentration gradually increases with distance from the top surface of the single crystalline n-doped gallium nitride layer 804. In one embodiment, the ratio of the atomic concentration of indium atoms to the sum of the atomic concentration of indium atoms and the atomic concentration of gallium atoms (i.e., an indium to Group III ratio) in the lower portion of the single crystalline n-doped indium gallium nitride layer 808 may be in a range from 0.001 to 0.4, such as from 0.01 to 0.2. The indium to Group III ratio in the upper portion of the single crystalline n-doped indium gallium nitride layer 808 may be in a range from 0.1 to 0.7, such as from 0.3 to 0.6, although lesser and greater ratios can also be employed. The thickness of the single crystalline n-doped indium gallium nitride layer 808 can be in a range from 1.5 microns to 10 microns, such as from 2 microns to 5 microns, although lesser and greater thicknesses can also be employed.

An active layer 810 is formed on the single crystalline n-doped indium gallium nitride layer 808. The active layer 810 includes at least one semiconductor material that emits light upon application of a suitable electrical bias. For example, the active layer 810 can include a multi-quantum well (MQW) structure that is conductive to emission of red light upon application of an electrical bias thereacross. For example, the active layer 810 can include a multi-quantum well including multiple repetitions of a combination of an indium gallium nitride layer having a first thickness (which may be in a range from 1 nm to 10 nm) and aluminum gallium nitride layer (which may be in a range from 0.5 nm to 5 nm). A series of epitaxy processes can be employed to grow the active layer 810. The thickness of the active layer 810 can be in a range from 20 nm to 1 micron, although lesser and greater thicknesses can also be employed. The active layer 810 can be configured to emit red light at a peak wavelength in a range from 620 nm to 750 nm upon application of an electrical bias thereacross. In one embodiment, the active layer 810 can include at least one instance of an indium gallium nitride layer and at least one instance of a compound semiconductor material layer having a greater band gap than the at least one indium gallium nitride layer.

In one embodiment, the active layer 810 can be a planar layer having a uniform thickness between a top surface and a bottom surface that are parallel to the top surface of the single crystalline n-doped gallium nitride layer 804. In one embodiment, the active layer 810 can include a multi quantum well structure including multiple instances of the indium gallium nitride layer and the compound semiconductor material layer. In one embodiment, the compound semiconductor material layer comprises aluminum gallium nitride. In one embodiment, the indium to Group III ratio (e.g., In/(In+Ga) ratio) of the indium gallium nitride layers in the active layer 810 may be in a range from 0.25 to 0.5, such as from 0.3 to 0.4. The aluminum to Group III ratio (e.g., Al/(Al+Ga) ratio) of the aluminum gallium nitride may be 0.5 to 0.98, such as 0.85 to 0.95, for example 0.9 to 0.94.

In one embodiment, the active layer may comprise the InGaN based quantum wells described by Hwang et al., Applied Physics Express 7, 071003 (2014), incorporated herein by reference in its entirety. Specifically, Hwang et al. describe a 4 period InGaN quantum well embedding an AlGaN interlayer with an Al content of 90% in each interlayer, located over a c-plane sapphire substrate. The indium content in the 3 nm thick InGaN quantum well is about 35% and less than 1% in the 1 nm thick AlGaN interlayer.

A p-doped compound semiconductor material layer 812 can be formed on the active layer 810. The p-doped compound semiconductor material layer 812 can include a single crystalline compound semiconductor material such as indium gallium nitride. In one embodiment, the indium to Group III ratio of the p-doped compound semiconductor material layer 812 can be the same as, or can be substantially the same as, the indium to Group III ratio of the single crystalline n-doped indium gallium nitride layer 808 in order to minimize strain caused by lattice mismatch. The thickness of the p-doped compound semiconductor material layer 812 can be in a range from 300 nm to 3 microns, although lesser and greater thicknesses can also be employed.

A transparent conductive electrode, such as a transparent conductive oxide layer 964 can be deposited over the p-doped compound semiconductor material layer 812. In case light emitted from the active layer 810 is directed downward toward the single crystalline n-doped gallium nitride layer 804 by a reflector layer to be subsequently formed above the transparent conductive electrode, then the transparent conductive oxide layer 964 is herein referred to a backside transparent conductive oxide layer 964. The transparent conductive oxide layer 964 includes a transparent conductive oxide material such as indium tin oxide or aluminum doped zinc oxide. The transparent conductive oxide layer 964 can be deposited as a continuous material layer that extends across the entire area of the p-doped compound semiconductor material layer 812. The thickness of the transparent conductive oxide layer 964 can be in a range from 100 nm to 2 microns, such as from 200 nm to 1 micron, although lesser and greater thicknesses can also be employed.

Optionally, a reflector material can be deposited to form a reflector layer 966 that continuously extends over the backside transparent conductive oxide layer 964 and the active layer 810. The reflector layer 966 is electrically shorted to the p-doped compound semiconductor material layer 812 through the backside transparent conductive oxide layer 964. In one embodiment, the reflector layer 966 includes at least one material selected from silver, aluminum, copper, and gold. In one embodiment, the reflector material can be deposited by a direction deposition method such as physical vapor deposition (sputtering) or vacuum evaporation. The reflector layer 966 can be employed to reflect light emitted from the active layer 810 downward.

An optional dielectric material is deposited over the reflector layer 966 and to form a dielectric material layer 970. The dielectric material layer 970 is formed over, and around, the reflector layer 966. The dielectric material of the dielectric material layer 970 can be a self-planarizing dielectric material such as spin-on glass (SOG) that can be formed by spin coating. Alternatively, the dielectric material of the dielectric material layer 970 can be a non-self-planarizing material. In this case, the dielectric material layer 970 may, or may not, be subsequently planarized. If the dielectric material layer 970 is planarized, a chemical mechanical planarization (CMP) process can be employed. In one embodiment, the dielectric material of the dielectric material layer 970 can include doped silicate glass or undoped silicate glass. The thickness of the dielectric material layer 970 can be in a range from 100 nm to 4 microns, such as from 200 nm to 2 microns, although lesser and greater thicknesses can also be employed.

Figure 37:
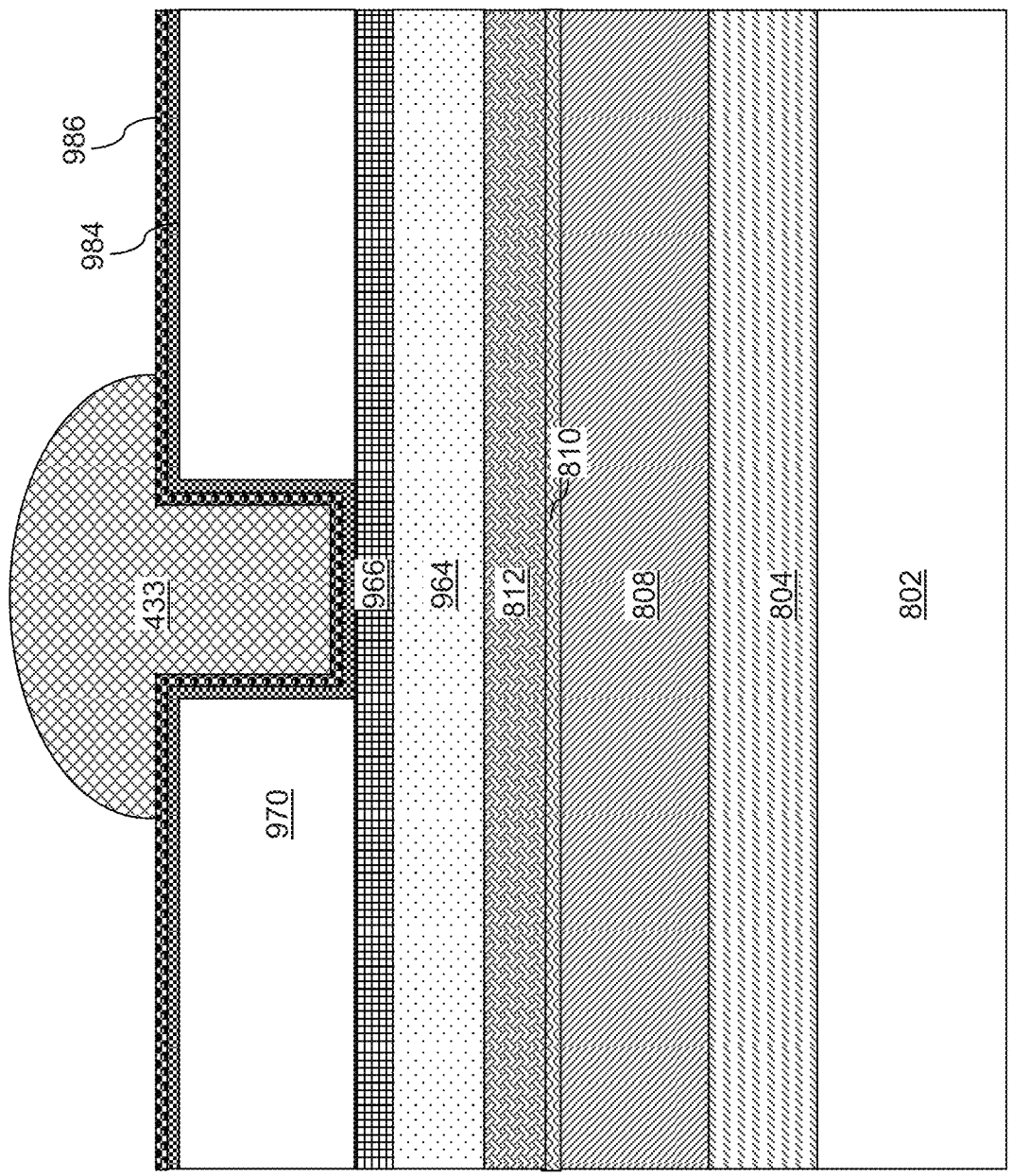
FIG. 37 is the exemplary structure for formation of red-light emitting diodes after formation of conductive bonding structures according to an embodiment of the present disclosure.

Referring to FIG. 37, openings can be formed through the dielectric material layer 970 to a top surface of the reflector layer 966. For example, a photoresist layer (not shown) can be applied over the dielectric material layer 970, and can be lithographically patterned to form openings therein. The pattern of the openings in the photoresist layer can be transferred through the dielectric material layer 970 by an anisotropic etch or an isotropic etch to form the openings in the dielectric material layer 970. For example, a wet etch employing hydrofluoric acid or a reactive ion etch employing a fluorocarbon etchant can be employed to form the opening through the dielectric material layer 970. In one embodiment, one opening through the dielectric material layer 970 can be formed per one die area, i.e., per each portion of the active layer 810 to be employed for a single red-light emitting subpixel.

At least one metallic barrier layer (984, 986) can be formed as at least one continuous material layer over the top surface of the dielectric material layer 970 and in the opening through the dielectric material layer 970. The at least one metallic barrier layer (984, 986) can be formed directly on the reflector layer 966. The at least one metallic barrier layer (984, 986) extends vertically through the openings through the dielectric material layer 970, and is electrically shorted to the reflector layer 966, the transparent conductive oxide layer 954, and the p-doped compound semiconductor material layer 812.

The at least one metallic barrier layer (984, 986) includes metallic material layers that can be employed for under-bump metallurgy (UBM), i.e., a set of metal layers provide between a solder bump and a die. In one embodiment, the at least one metallic barrier layer (984, 986) can include a diffusion barrier layer 984 and an adhesion promoter layer 986. Exemplary materials that can be employed for the diffusion barrier layer 984 include titanium and tantalum. Exemplary materials that can be employed for the adhesion promoter layer 986 include a stack, from bottom to top, of copper and nickel, tungsten, platinum, and a stack of tungsten and platinum. Any other under-bump metallurgy known in the art can also be employed. The at least one metallic barrier layer (984, 986) includes a horizontal portion that overlies the dielectric material layer 970 and a vertically protruding portion that adjoins an inner periphery of the horizontal portion and contacting sidewalls of the dielectric material layer 970 and the reflector layer 966.

A conductive bonding structure 433 (such as a solder bump) can be formed in each cavity within the openings in the dielectric material layer 970 and over a portion of the top surface of the at least one metallic barrier layer (984, 986) located around the opening in the dielectric material layer 970. If the conductive bonding structure 433 can be a solder bump that includes a solder material, which can include tin, and optionally includes silver, copper, bismuth, indium, zinc, and/or antimony. The upper portion of the conductive bonding structure 433 located above the horizontal plane including the top surface of the at least one metallic barrier layer (984, 986) can have a shape of a predominant portion of a sphere. It is understood that shape of the conductive bonding structure 433 as illustrated is only schematic, and may not represent a true shape of a conductive bonding structure 433. The lower portion of the conductive bonding structure 433 fills the opening in the dielectric material layer 970.

If the conductive bonding structure 433 has a shape of a predominant portion of a sphere, the diameter of the sphere can be in a range from 15 microns to 60 microns, although lesser and greater diameters can also be employed. The lower portion of the conductive bonding structure 433 can be formed directly on a sidewall of the at least one metallic barrier layer (984, 986) within the opening through the dielectric material layer 970 and directly on a top surface of a recessed portion of the at least one metallic barrier layer (984, 986). The conductive bonding structure 433 is electrically shorted to the reflector layer 966, the transparent conductive oxide layer 954, and the p-doped compound semiconductor material layer 812.

Figure 38:
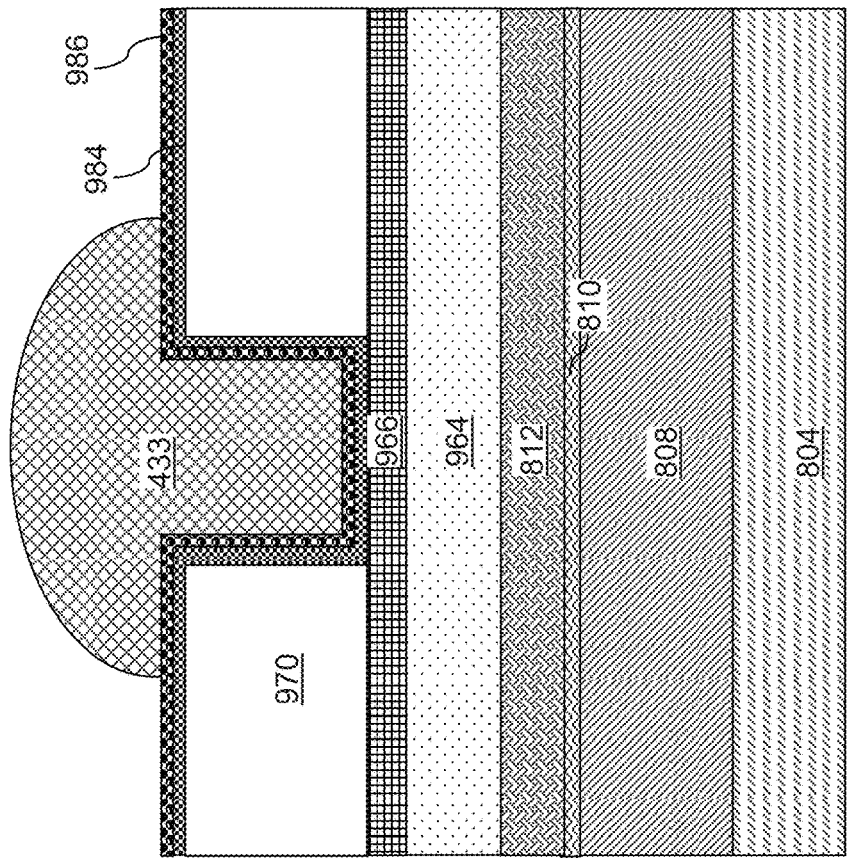
FIG. 38 is an isolated red-light emitting diode subpixel after singulation and removal of an underlying substrate according to an embodiment of the present disclosure.

Referring to FIG. 38, the substrate 802 can be optionally removed. For example, laser beam can pass through the substrate 802 (including a material such as sapphire) and ablate the bottom surface region of the single crystalline n-doped gallium nitride layer 804, thereby detaching the substrate 802 from remaining portions of the single crystalline n-doped gallium nitride layer 804 and the structures thereupon. The physically exposed surface of the single crystalline n-doped gallium nitride layer 804 is herein referred to as a distal surface, i.e., a surface that is distal from the active region 810. The exemplary structure can be subsequently singulated and/or transferred to form a display device including red-light emitting diodes. Each singulated die can be a red-light emitting diode, which can be employed as a third light emitting device 10R described above.

In one embodiment, an electrode for each light emitting diode can be formed on a respective conductive bonding structure 433, and another electrode for each light emitting diode can be formed on a respective portion of the distal surface of the single crystalline n-doped gallium nitride layer 804.

Figure 39:
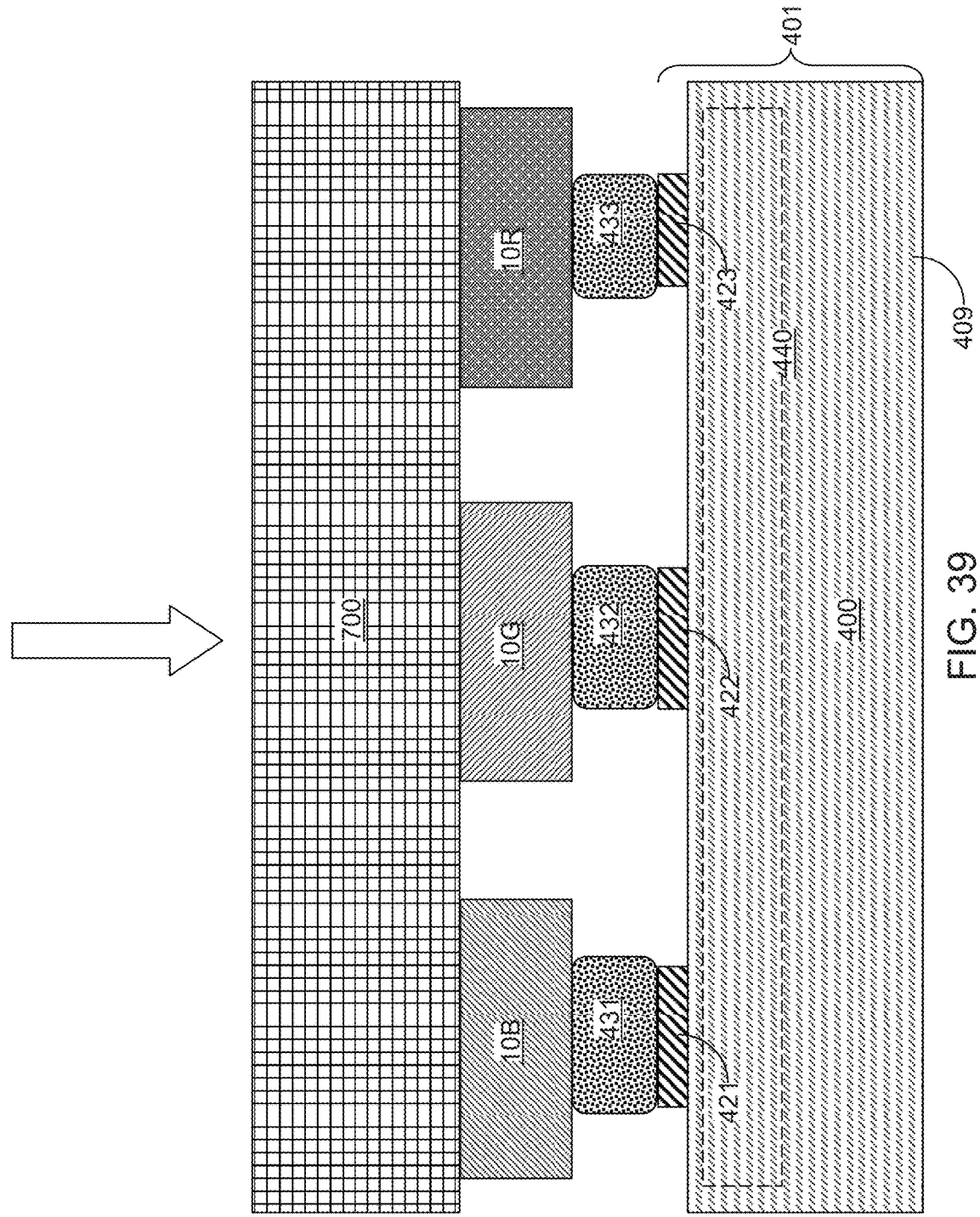
FIG. 39 is an assembly of a backplane and an array of pixels including light emitting diodes in case each of the light emitting diodes are provided with a single conductive bonding structure.

FIG. 39 illustrates the assembly process in which a red-light emitting device 10R is bonded to a backplane 401, which may be any one of the backplanes described above. In case two conductive bonding structures (431, 432, or 433) are formed per device (10B, 10G, 10R), each of the two conductive bonding structures (431, 432, or 433) can be connected to a respective node of a light emitting device. In case only one conductive bonding structure (431, 432, or 433) is formed per device (10B, 10G, 10R), the conductive bonding structure (431, 432, or 433) is connected to one node of the respective device (10B, 10G, 10R), and a material portion in each device (10B, 10G, 10R) located on the opposite side of the conductive bonding structure (431, 432, or 433) is connected to the other node of the respective device (10G, 10G, 10R).

In the case of red-light emitting diode 10R illustrated in FIG. 38 is employed in the structure of FIG. 39, the p-doped compound semiconductor material layer 812 is electrically connected to the conductive bonding structure 433 thereupon, and the single crystalline n-doped gallium nitride layer 804 can be the topmost surface of the red-light emitting diode 10R shown in FIG. 39.

Figure 40A:
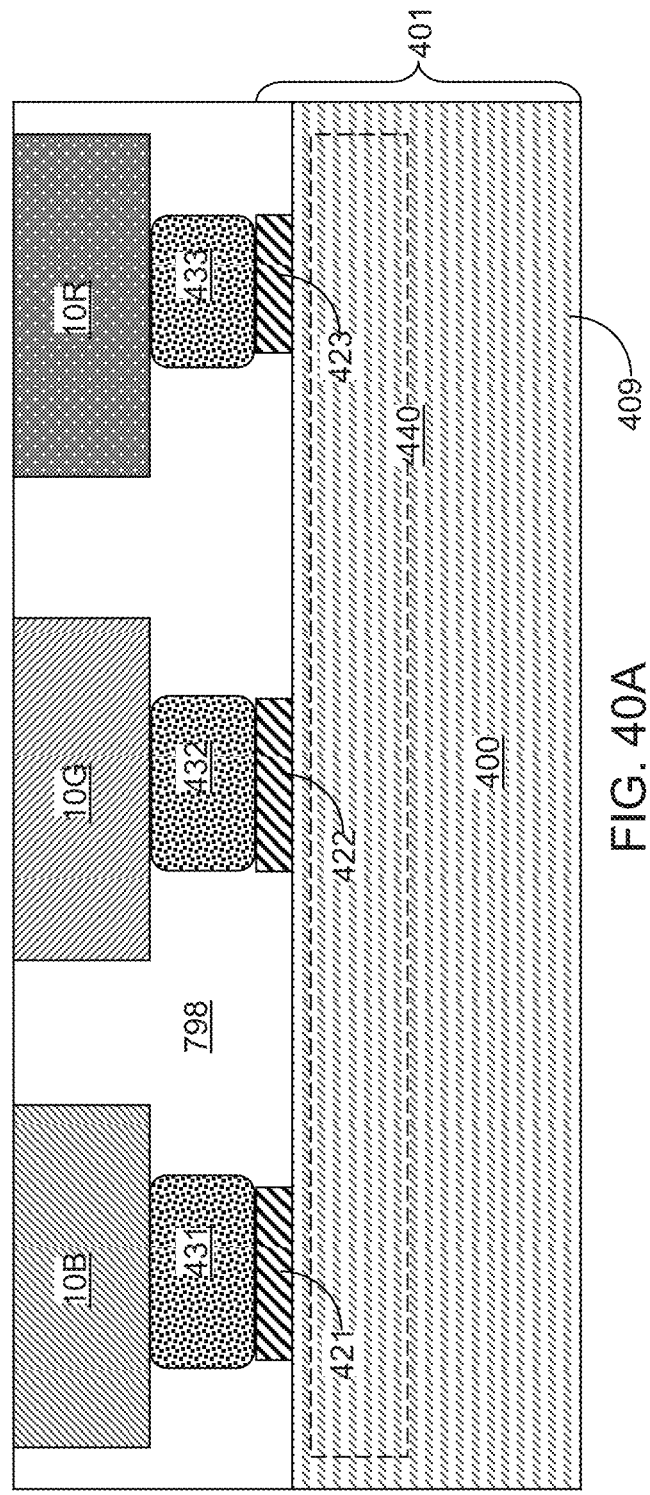
FIG. 40A is the assembly of the backplane and the array of pixels after application of an insulating inter-die fill material layer according to an embodiment of the present disclosure.

Referring to FIG. 40A, a dielectric fill material layer 798 can be applied in the spaces between the devices (10B, 10G, 10R) that are bonded to the backplane 401. While FIG. 40A illustrates only three devices (10B, 10G, 10R), it is understood that an array of pixels is formed on the backplane 401, and each pixel includes a set of light emitting device such as a blue-light emitting diode as a first light emitting device 10B, a green-light emitting diode as a second light emitting device 10G, and a red-light emitting diode as a third light emitting device 10R. The dielectric fill material layer 798 can laterally surround each of the red-light emitting diodes, the green-light emitting diodes, and the blue light emitting diodes within the array of pixels. The dielectric fill material layer 798 can include a self-planarizing dielectric material such as spin-on glass (SOG), or can be planarized by a recess etch or chemical mechanical planarization. The top surface of the dielectric fill material layer 798 as planarized can be within the horizontal plane including the top surfaces of the devices (10B. 10G, 10R), or can be vertically recessed below the horizontal plane including the top surfaces of the devices (10B. 10G, 10R).

Figure 40B:
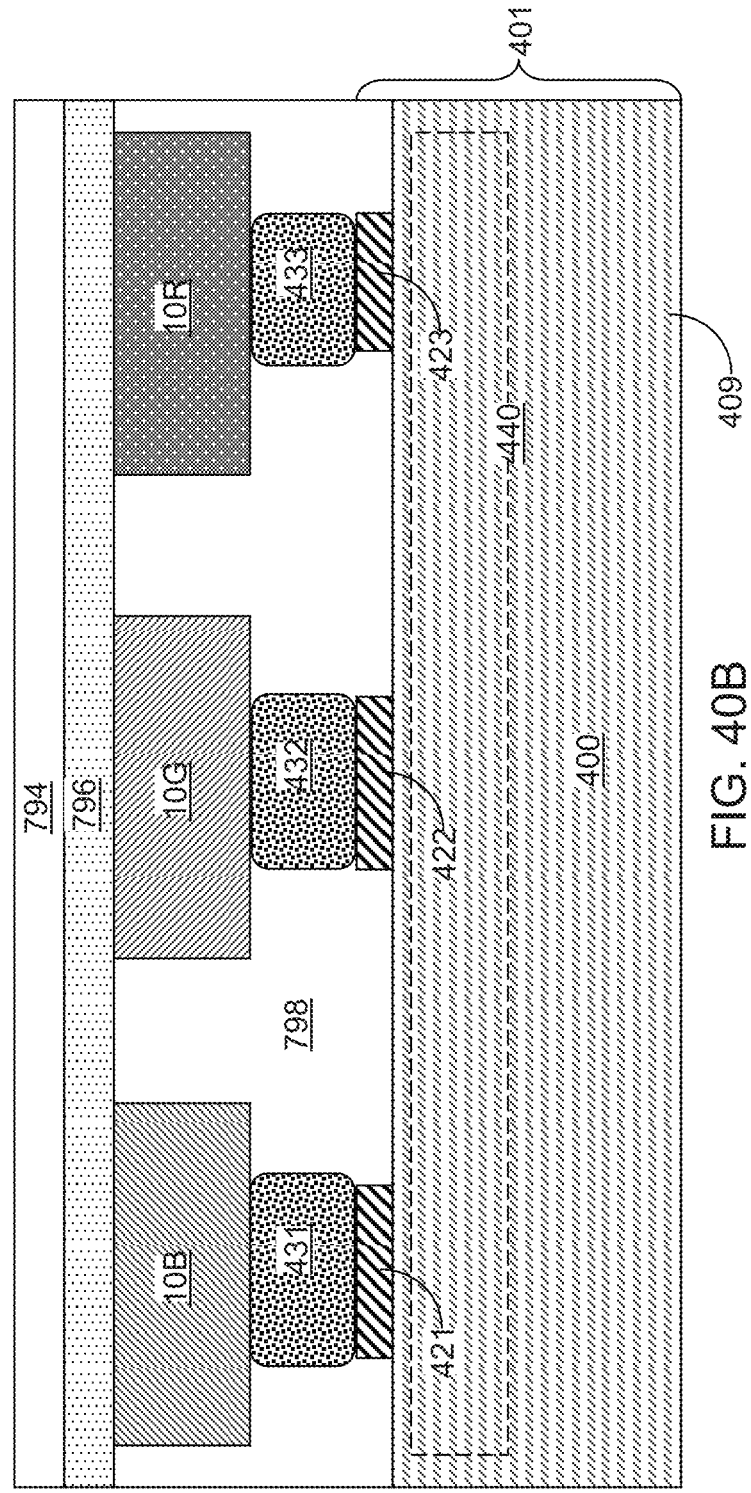
FIG. 40B is the assembly of the backplane and the array of pixels after formation of a front side transparent conductive oxide layer and a transparent dielectric protection layer according to an embodiment of the present disclosure.

Referring to FIG. 40B, a front side transparent conductive oxide layer 796 can be formed over the dielectric fill material layer 798 and directly on the electrical nodes that are located on top of each device (10B, 10G, 10R). For example, each red-light emitting diode can include a single crystalline n-doped gallium nitride layer 804 as the physically exposed node. In case the green-light emitting diodes and/or the blue-light emitting diodes include a single crystalline n-doped gallium nitride layer as physically exposed nodes at top, the front side transparent conductive oxide layer 796 can be deposited directly on such a single crystalline n-doped gallium nitride layer. In this case, the front side transparent conductive oxide layer 796 can be a common ground electrode for each of the red-light emitting diodes, the green-light emitting diodes, and the blue-light emitting diodes.

A transparent passivation dielectric layer 794 can be formed over the front side transparent conductive oxide layer 796. The transparent passivation dielectric layer 794 can include silicon nitride or silicon oxide.

The red-light emitting diodes of the type illustrated in FIG. 38 can be employed without, or in combination with, the blue-light emitting diodes and/or the green-light emitting diodes of the type described above in the direct view display device of FIG. 40B. Such a direct view display device comprises an array of pixels located on a backplane 401. Each of the pixels comprises a red-light emitting diode configured to emit light at a peak wavelength in a range from 620 nm to 750 nm, a green-light emitting diode configured to emit light at a peak wavelength in a range from 495 nm to 570 nm, and a blue-light emitting diode configured to emit light at a peak wavelength in a range from 450 to 495 nm. The red-light emitting diode in each pixel comprises: a first single crystalline n-doped gallium nitride layer 804; a single crystalline n-doped indium gallium nitride layer 808 in epitaxial alignment with the single crystalline n-doped gallium nitride layer 804; an active layer 810 including at least one instance of an indium gallium nitride layer and at least one instance of a compound semiconductor material layer having a greater band gap than the at least one indium gallium nitride layer; and a first p-doped compound semiconductor material layer 812, wherein the active layer is configured to emit light at a peak wavelength in a range from 620 nm to 750 nm upon application of electrical bias between the single crystalline n-doped indium gallium nitride layer 808 and the p-doped compound semiconductor material layer 812.

In one embodiment, the active layer 810 is a planar layer having a uniform thickness between a top surface and a bottom surface that are parallel to a top surface of the single crystalline n-doped gallium nitride layer 804. In one embodiment, the active layer 810 includes a multi quantum well structure including multiple instances of the indium gallium nitride layer and the compound semiconductor material layer. In one embodiment, the compound semiconductor material layer comprises aluminum gallium nitride.

Each of the red-light emitting diodes 10R, the green-light emitting diodes 10G, and the blue light emitting diodes 10B can be a planar LED or a nanowire LED.

In one embodiment, the red-light emitting diode in each pixel comprises a first conductive bonding structure 433 (such as a solder bump) that is electrically shorted to the first p-doped compound semiconductor material layer 812 and is bonded to a respective bonding pad 423 on the backplane 401; and the at least one of the green-light emitting diode 10G, and the blue-light emitting diode 10B in each pixel comprises a second conductive bonding structure (431 or 432) (such as a solder bump) that is electrically shorted to the second p-doped compound semiconductor material layer and is bonded to another respective bonding pad (421 or 422) on the backplane 401.

In one embodiment, the red-light emitting diode 10R in each pixel comprises a first reflector layer 966 that is located between the first p-doped compound semiconductor material layer 812 and the first conductive bonding structure 433 and configured to reflect light toward the first single crystalline n-doped gallium nitride layer 804.

In one embodiment, the red-light emitting diode 10R in each pixel comprises a first transparent conductive oxide layer 964 that is located between, and electrically shorted to, the first p-doped compound semiconductor material layer 812 and the first conductive bonding structure 433.

In one embodiment, the direct view display device can further include: a dielectric fill material layer 798 laterally surrounding each of the red-light emitting diodes 10R, the green-light emitting diodes 10G, and the blue light emitting diodes 10B within the array of pixels; and a front side transparent conductive oxide layer 796 located on the dielectric fill material layer 798 and electrically shorted to each instance of the first and second single crystalline n-doped gallium nitride layers 804 within the array of pixels.

Figure 41:
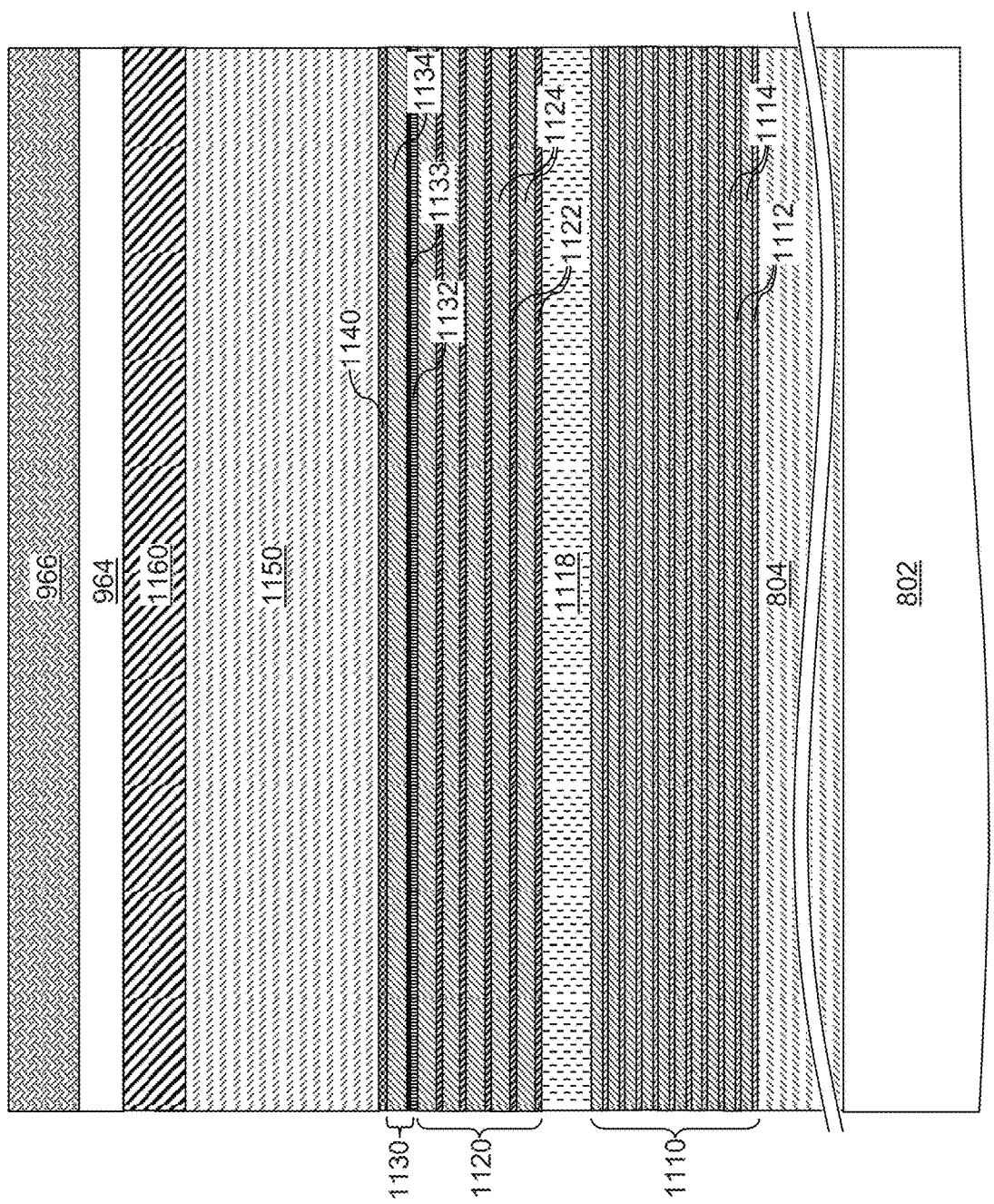
FIG. 41 is a vertical cross-sectional view of a first exemplary planar material layer stack that can be formed over a substrate to provide light emitting diodes that emit light at a peak wavelength in a range from 600 nm to 750 nm according to an embodiment of the present disclosure.

Referring to FIG. 41, a first exemplary planar material layer stack according to an embodiment of the present disclosure is shown. The first exemplary planar material layer stack can be formed by providing a substrate 802, which can be a single crystalline substrate on which a III-V compound semiconductor material can be epitaxially deposited. For example, the substrate 802 can be a sapphire (aluminum oxide) substrate having a c-plane (0001 plane) as the crystallographic plane of the top surface. The substrate 802 can have a planar top surface. As used herein, a "planar" surface refers to a surface that is substantially coincident with a Euclidean two-dimensional plane within the variations caused by surface roughness.

A single crystalline gallium nitride (GaN) layer 804 can be grown by an epitaxial deposition process. The gallium nitride layer 804 may be unintentionally or intentionally n-doped. The single crystalline n-doped gallium nitride layer 804 includes a single crystalline gallium nitride material grown on the substrate 802 (such as a single crystalline sapphire substrate). At the time of deposition, the single crystalline n-doped gallium nitride layer 804 is a planar single crystalline n-doped GaN layer having a planar top surface and a planar bottom surface that are parallel to the planar top surface of the substrate 802. The single crystalline n-doped gallium nitride layer 804 can be formed, for example, by an epitaxial deposition process such as metal-organic chemical vapor deposition (MOCVD) process. The thickness of the single crystalline n-doped gallium nitride layer 804 can be selected such that dislocation defects caused by lattice mismatch between the lattice parameters of the substrate 802 and gallium nitride are healed, and the defect density decreases to a level suitable for device fabrication at the top surface of the single crystalline n-doped gallium nitride layer 804. In a non-limiting illustrative example, the thickness of the single crystalline n-doped gallium nitride layer 804 can be in a range from 1.2 microns to 6 microns, although lesser and greater thicknesses can also be employed. The single crystalline n-doped gallium nitride layer 804 may be doped with electrical dopants of a first conductivity type. For example, the single crystalline n-doped gallium nitride layer 804 may be n-doped by introduction of silicon as n-type dopants during the epitaxial deposition process. Upon singulation of the first exemplary planar material layer stack in a subsequent process, each discrete portion of the single crystalline n-doped gallium nitride layer 804 becomes a single crystalline n-doped GaN portion within a respective light emitting device, which can be a first light emitting device 10R.

In one embodiment, a planar layer stack (1110, 1118, 1120, 1130, 1140, 1150, 1160) is formed on the single crystalline n-doped gallium nitride layer 804. The planar layer stack (1110, 1118, 1120, 1130, 1140, 1150, 1160) can include an epitaxial material layer stack (i.e., a stack of epitaxial material layers that are epitaxially aligned among one another) that includes, in order, one or more of planar superlattice structures (1110, 1120) comprising respective strain-modulating layer stacks (1112, 1114) and/or (1112, 1124), a planar light-emitting quantum well that includes a planar light-emitting indium gallium nitride layer 1132 and a planar GaN barrier layer 1134, and a planar p-doped III-nitride layer 1140, which is preferably a p-doped aluminum gallium nitride layer. However, the p-doped III-nitride layer 1140 may alternatively comprise gallium nitride or indium aluminum gallium nitride with a low indium content. The plurality of planar superlattice structures (1110, 1120) can modulate, and reduce, the strain of the planar light-emitting InGaN layer 1132, thereby enabling high indium incorporation with low defect formation and thus enabling high emission efficiency across the red wavelength range. The planar light-emitting indium gallium nitride layer 1132 is configured to emit light at a first peak wavelength in a range from 600 nm to 750 nm under electrical bias thereacross. In one embodiment, the first peak wavelength can be in a range from 610 nm to 680 nm.

In an illustrative example, the plurality of strain-modulating layer stacks can include first strain-modulating layer stacks (1112, 1114) and second strain-modulating layer stacks (1122, 1124). Each first strain-modulating layer stack (1112, 1114) can include a first intervening indium gallium nitride layer 1112 and a first intervening GaN layer 1114. Each second strain-modulating layer stack (1122, 1124) can include a second intervening indium gallium nitride layer 1122 and a second intervening GaN layer 1124. In an alternative embodiment, at least one layer among the first intervening GaN layers 1114 and the second intervening GaN layers 1124 may be replaced with a respective intervening aluminum gallium nitride layer or indium gallium nitride layer having a different indium concentration than the first intervening indium gallium nitride layers 1112 or the second intervening indium gallium nitride layers 1122 within the respective strain-modulating layer stack.

In one embodiment, the first intervening indium gallium nitride layers 1112 can have a lower indium concentration than the second intervening indium gallium nitride layers 1122. For example, the first intervening indium gallium nitride layers 1112 can have a composition of $In_pGa_{(1-p)}N$ in which p is in a range from 0.04 to 0.08, although lesser and greater values for p can also be employed. The second intervening indium gallium nitride layers 1122 can have a composition of $In_qGa_{(1-q)}N$ in which q is in a range from 0.08 to 0.12, although lesser and greater values for q can also be employed.

The first strain-modulating layer stacks (1112, 1114) containing the lower indium concentration first intervening indium gallium nitride layers 1112 can be considered as "UV" stacks (e.g., which would emit UV radiation having a peak wavelength less than 400 nm). The second strain-modulating layer stacks (1122, 1124) containing the higher indium concentration second intervening indium gallium nitride layers 1122 can be considered as "blue" stack (e.g., which would emit blue visible light having a peak wavelength between 400 nm and 495 nm).

The thickness of each first intervening indium gallium nitride layer 1112 can be in a range from 0.7 nm to 1.5 nm, although lesser and greater thicknesses can also be employed. The thickness of each first intervening GaN layer 1114 can be in a range from 3 nm to 6 nm, although lesser and greater thicknesses can also be employed. The thickness of each second intervening indium gallium nitride layer 1122 can be in a range from 2 nm to 3 nm, although lesser and greater thicknesses can also be employed. The thickness of each second intervening GaN layer 1124 can be in a range from 15 nm to 20 nm, although lesser and greater thicknesses can also be employed.

The layers of the first and the second superlattice structures (1110, 1120) may be not intentionally doped with p-type or n-type dopants. Such III-nitride layers that are not intentionally doped typically have n-type conductivity.

Without wishing to be bound by any particular theory, it is believed that it is possible that due to the higher indium content of the second intervening indium gallium nitride layers 1122 in the second strain-modulating layer stacks (1122, 1124) of the second superlattice structure 1120 than of the first intervening indium gallium nitride layers 1112 in the second strain-modulating layer stacks (1122, 1124) of the first superlattice structure 1110, the effective lattice constant of the second superlattice structure 1120 is greater than the effective lattice constant of the first superlattice structure 1110.

The first superlattice structure 1110 can include 3 to 30, such as 10 to 15 first strain-modulating layer stacks (1112, 1114), although lesser and greater number of repetitions can also be employed. The total thickness of the first multi quantum well structure 1110 can be in a range from 20 nm to 150 nm, although lesser and greater thicknesses can also be employed.

The second superlattice structure 1120 can include 2 to 15, such as 5 to 10 second strain-modulating layer stacks (1122, 1124), although lesser and greater number of repetitions can also be employed. The total thickness of the second superlattice structure 1120 can be in a range from 20 nm to 150 nm, although lesser and greater thicknesses can also be employed. The second superlattice structure 1120 can include a lower number of strain-modulating layer stacks (i.e., a lower number of layers) than the first superlattice structure 1110.

Each strain-modulating layer stack (1112, 1114) or (1122, 1124) can function as buffer layers that provide strain accommodation between two layers that are located on opposite sides of the strain-modulating layer stack in the respective superlattice structure (1110, 1120). For example, the difference in the lattice parameters of the single crystalline n-doped gallium nitride layer 804 and the planar light-emitting indium gallium nitride layer 1132 can be accommodated by the strain-modulating layer stacks which provide gradual transition of lattice parameters between the single crystalline n-doped gallium nitride layer 804 and the planar light-emitting indium gallium nitride layer 1132 so that the planar light-emitting indium gallium nitride layer 1132 can be formed as a high quality epitaxial film. The superlattice structures (1110, 1120) stop lattice defects, such as dislocations and other defects from propagating from the substrate or underlying layer 804 into the light emitting region 1130 (i.e., active region) containing the planar light-emitting indium gallium nitride layer 1132.

It is noted that the indium gallium nitride and gallium nitride layers in the plurality of strain-modulating layer stacks (1112, 1114) or (1122, 1124) have respective Wurtzite structures. As used herein, an "effective lattice constant" of a layer stack having a Wurtzite structure is the weighted average of hexagonal-plane lattice constants "a" of the Wurtzite structures of all component layers within the layer stack in which each lattice constant "a" is weighted by the fraction defined by the number of all atoms within the respective component layer divided by the number of all atoms within the layer stack.

In one embodiment, the effective lattice parameter and the atomic concentration of indium in the intervening indium gallium nitride layers (1112, 1122) of the plurality of strain-modulating layer stacks (1112, 1114) or (1122, 1124) can monotonically increase with the physical distance of each strain-modulating layer stack (1112, 1114) or (1122, 1124) from the single crystalline n-doped GaN portion, i.e., from the single crystalline n-doped gallium nitride layer 804. Thus, the bottom first intervening indium gallium nitride layer 1112 in the first superlattice 1110 may have a lower indium content and a lower lattice parameter than the top first intervening indium gallium nitride layer 1112 in the first superlattice 1110. Alternatively, all first intervening indium gallium nitride layers 1112 in the first superlattice 1110 may have about the same indium content and the same latter parameter.

Likewise, in one embodiment, the bottom second intervening indium gallium nitride layer 1122 in the second superlattice 1120 may have a lower indium content and a lower lattice parameter than the top second intervening indium gallium nitride layer 1122 in the second superlattice 1120. Alternatively, all second intervening indium gallium nitride layers 1122 in the second superlattice 1120 may have about the same indium content and the same latter parameter.

Optionally, a planar GaN spacer layer 1118 can be provided between the groups of the first strain-modulating layer stacks (1112, 1114) of the first superlattice structure 1110 and the groups of the second strain-modulating layer stacks (1122, 1124) of the second superlattice structure 1120 to reduce overall strain during the epitaxial growth of the layers. For example, the planar GaN spacer layer 1118 can have a thickness in the range from 30 nm to 50 nm, although lesser and greater thicknesses can also be employed. The planar GaN spacer layer 1118 may be not intentionally doped with p-type or n-type dopants. Such GaN layer that is not intentionally doped typically has n-type conductivity.

The light emitting region 1130 may comprise a planar light-emitting quantum well 1130. The planar light-emitting quantum well 1130 can be formed on the most distal strain-modulating layer stack, which can be the most distal second strain-modulating layer stack (1122, 1124) within the second superlattice structure 1120. The planar light-emitting quantum well 1130 includes a planar light-emitting indium gallium nitride layer 1132, a planar aluminum gallium nitride layer 1133, and a planar GaN barrier layer 1134, in that order. In one embodiment, these layers are not intentionally doped.

The planar light-emitting indium gallium nitride layer 1132 includes an epitaxial indium gallium nitride material having a composition that emits light at a peak wavelength in a range from 600 nm to 750 nm, and preferably in a range from 610 nm to 680 nm. In one embodiment, the planar light-emitting indium gallium nitride layer 1132 has a composition of $In_xGa_{(1-x)}N$, in which x is in a range from 0.26 to 0.55 (i.e., higher indium content than underlying indium gallium nitride layers 1112 and 1122). In one embodiment, the planar light-emitting indium gallium nitride layer 1132 can have a thickness in a range from 2 nm to 5 nm.

The planar aluminum gallium nitride layer 1133 can have a composition of $Al_yGa_{(1-y)}N$, in which y is in a range from 0.3 to 1.0 (such as from 0.5 to 0.8). In one embodiment, the planar aluminum gallium nitride layer can have a thickness in a range from 0.5 nm to 5.0 nm, such as from 0.5 nm to 1.0 nm. Without wishing to be bound by any particular theory, it is believed that the planar aluminum gallium nitride layer 1133 reduces or prevents evaporation of indium from the underlying planar light-emitting indium gallium nitride layer 1132 during deposition to provide a sufficiently high indium content in layer 1132 to permit layer 1132 to emit visible light with a peak wavelength in the red color range (e.g., to emit red light). Additionally or alternatively, modification of band structure and piezoelectric effects of the second superlattice structure 1120 may enable shift of the peak wavelength from the aluminum gallium nitride layer 1133 toward a longer wavelength, i.e., toward the red wavelength range from 610 nm to 680 nm. Furthermore, the planar aluminum gallium nitride layer 1133 may provide strain compensation with the p-side layers 1140 and 1150 to provide better quality (i.e., lower defect) p-side layers and/or may moderate the quantum well band structure in the planar aluminum gallium nitride layer 1132 due to an undesirable piezoelectric effect which separates electrons and holes. The strain compensation can occur between the quantum well (that emits the red light) and the rest of the epitaxial stack, principally to reduce misfit defect formation in the active layer itself (as well as in the p-layers).

The planar GaN barrier layer 1134 can have a thickness in a range from 15 nm to 20 nm, although lesser and greater thicknesses can also be employed. The planar GaN barrier layer 1134 provides an energy barrier between the planar light-emitting indium gallium nitride layer 1132 and p-type compound semiconductor material layers to be subsequently formed (e.g., to form a quantum well for light emission).

The various material layers within the first superlattice structure 1110, the planar GaN spacer layer 1118, the second superlattice structure 1120, and the planar light-emitting quantum well 1130 can be "undoped," i.e., be intrinsic (i.e., free of electrical dopants), or have a low level of dopant concentration that is typically caused by incorporation of residual dopants in a reactor chamber. As used herein, an "undoped" semiconductor material refers to a semiconductor material that has not been subjected to an intentional doping process during fabrication. It is well known in the art that an undoped semiconductor material typically has a free charge carrier concentration this is insufficient to render the semiconductor material conductive. Typically, an undoped semiconductor material has a free charge carrier concentration not greater than $1.0 \times 10^{16}/cm^3$.

A planar p-doped III-nitride layer, such as p-doped aluminum gallium nitride layer 1140 can be formed on the planar light-emitting quantum well 1130. For example, the planar p-doped aluminum gallium nitride layer 1140 can be formed directly on the planar GaN barrier layer 1134. In one embodiment, the planar p-doped aluminum gallium nitride layer 1140 can have a thickness in a range from 10 nm to 20 nm, although lesser and greater thicknesses can also be employed. In one embodiment, the planar p-doped aluminum gallium nitride layer 1140 can be p-doped at a dopant concentration that provides a free charge carrier concentration (i.e., the concentration of holes) in a range from $1.0 \times 10^{17}/cm^3$ to $3.0 \times 10^{20}/cm^3$, such as from $3.0 \times 10^{17}/cm^3$ to $1.0 \times 10^{20}/cm^3$, although lesser and greater free charge carrier concentrations can also be employed. The planar p-doped aluminum gallium nitride layer 1140 can have a lower aluminum contact than the aluminum gallium nitride layer 1133. For example, the planar p-doped aluminum gallium nitride layer 1140 can have a composition $Al_zGa_{(1-z)}N$, in which z is less than 0.5, such as in a range from 0.2 to 0.3.

An optional first p-doped compound semiconductor material layer 1150 can be formed on the planar p-doped aluminum gallium nitride layer 1140. The first p-doped compound semiconductor material layer 1150 can include a p-doped single crystalline compound semiconductor material such as p-doped gallium nitride. In one embodiment, the first p-doped compound semiconductor material layer 1150 can be p-doped at a dopant concentration that provides a free charge carrier concentration (i.e., the concentration of holes) in a range from $1.0 \times 10^{17}/cm^3$ to $3.0 \times 10^{20}/cm^3$, such as from $3.0 \times 10^{17}/cm^3$ to $1.0 \times 10^{20}/cm^3$, although lesser and greater free charge carrier concentrations can also be employed.

A second p-doped compound semiconductor material layer 1160 can be formed on the first p-doped compound semiconductor material layer 1150. The second p-doped compound semiconductor material layer 1160 can include a heavily p-doped single crystalline compound semiconductor material such as p-doped gallium nitride. The dopant concentration in the second p-doped compound semiconductor material layer 1160 can be greater than the dopant concentration in the first p-doped compound semiconductor material layer 1150. In one embodiment, the second p-doped compound semiconductor material layer 1160 can be heavily p-doped at a dopant concentration that provides a free charge carrier concentration (i.e., the concentration of holes) in a range from $5.0 \times 10^{19}/cm^3$ to $3.0 \times 10^{21}/cm^3$, such as from $1.0 \times 10^{20}/cm^3$ to $2.0 \times 10^{21}/cm^3$, although lesser and greater free charge carrier concentrations can also be employed. The total thickness of the first and second p-doped compound semiconductor material layers (1150, 1160) can be in a range from 90 nm to 200 nm, although lesser and greater thicknesses can also be employed.

A transparent conductive electrode, such as a transparent conductive oxide layer 964 can be deposited over the first and second p-doped compound semiconductor material layers (1150, 1160). In case light emitted from the light-emitting indium gallium nitride layer 1132 is directed downward toward the single crystalline n-doped gallium nitride layer 804 by a reflector layer to be subsequently formed above the transparent conductive electrode, then the transparent conductive oxide layer 964 is herein referred to a backside transparent conductive oxide layer 964. The transparent conductive oxide layer 964 includes a transparent conductive oxide material such as indium tin oxide or aluminum doped zinc oxide. The transparent conductive oxide layer 964 can be deposited as a continuous material layer that extends across the entire area of the p-doped compound semiconductor material layer 812. The thickness of the transparent conductive oxide layer 964 can be in a range from 100 nm to 2 microns, such as from 200 nm to 1 micron, although lesser and greater thicknesses can also be employed.

Optionally, a reflector material can be deposited to form a reflector layer 966 that continuously extends over the backside transparent conductive oxide layer 964. The reflector layer 966 is electrically shorted to the p-doped compound semiconductor material layer 1160 through the backside transparent conductive oxide layer 964. In one embodiment, the reflector layer 966 includes at least one material selected from silver, aluminum, copper, and gold. In one embodiment, the reflector material can be deposited by physical vapor deposition (sputtering) or vacuum evaporation. The reflector layer 966 can be employed to reflect light emitted from the active region 1130 through the transparent substrate 802.

Subsequently, additional processing steps of FIG. 36 can be performed to form a dielectric material layer, and the processing steps of FIGS. 37 and 38 can be performed to provide a plurality of first light emitting diodes 10R. Upon singulation into multiple first light emitting diodes 10R, each planar material layer of the structure of FIG. 41 becomes a layer that is parallel to a respective portion of the single crystalline n-doped GaN layer within a first light emitting diode 10R, which is a single crystalline n-doped GaN portion having a planar top surface.

Each first light emitting diode 10R includes a section of the first exemplary planar material layer stack illustrated in FIG. 41. Each first light emitting diode 10R includes a single crystalline n-doped GaN portion that is a single crystalline n-doped GaN layer having a planar top surface. Each layer within the plurality of strain-modulating layer stacks, the light-emitting indium gallium nitride layer, the GaN barrier layer, and the p-doped aluminum gallium nitride layer are planar layers having a respective top surface and a respective bottom surface that are parallel to the planar top surface of the single crystalline n-doped GaN layer.

Figure 42:
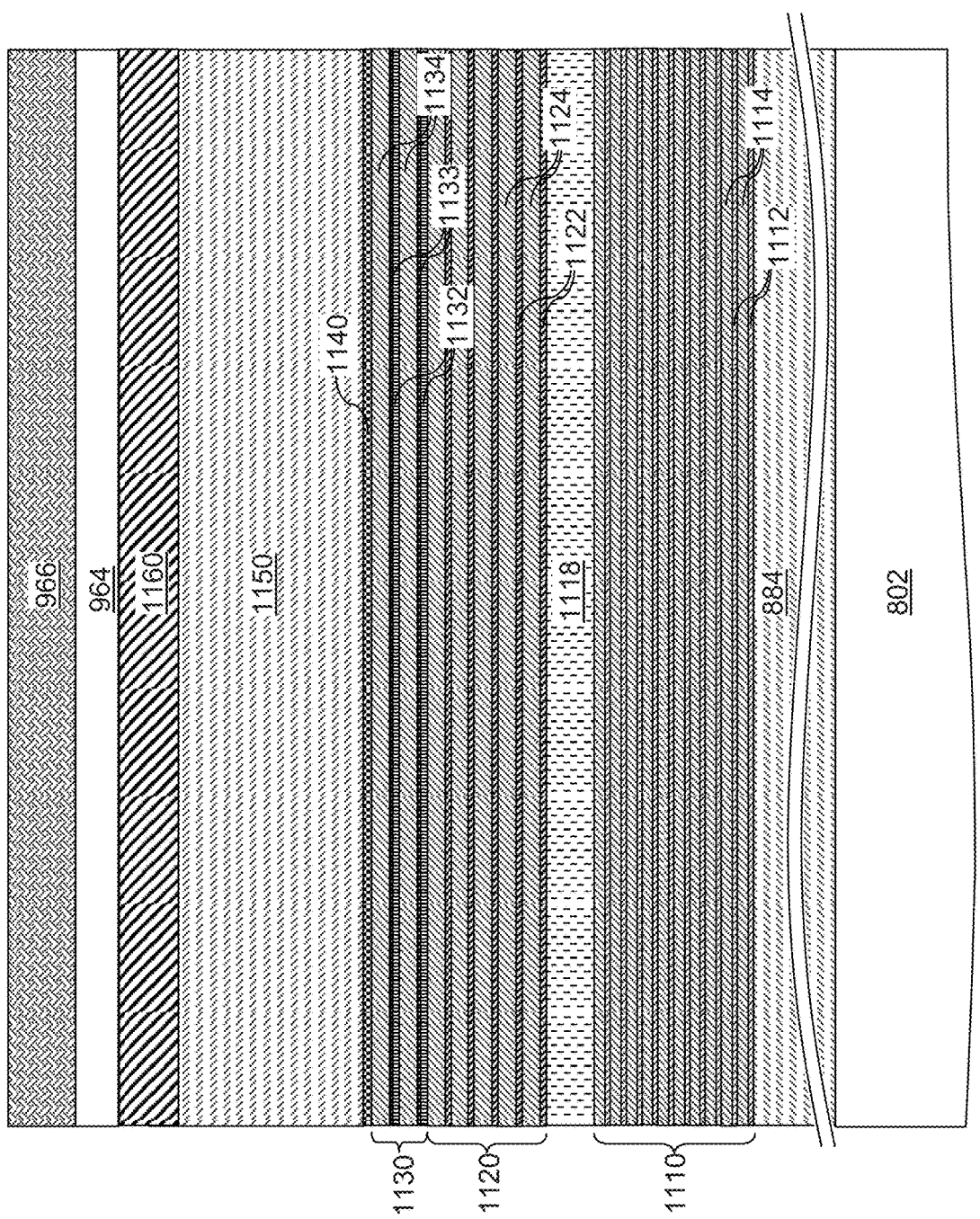
FIG. 42 is a vertical cross-sectional view of a second exemplary planar material layer stack that can be formed over a substrate to provide light emitting diodes that emit light at a peak wavelength in a range from 600 nm to 750 nm according to an embodiment of the present disclosure.

Referring to FIG. 42, a second exemplary planar material layer stack is illustrated, which can be derived from the first exemplary planar material layer stack by modifying the light emitting region 1130 to include two planar light-emitting quantum wells (i.e., to include two repetitions of a light-emitting indium gallium nitride layer 1132, a planar aluminum gallium nitride layer 1133, and a GaN barrier layer 1134). Thus, the light emitting region 1130 of the second exemplary planar material layer stack includes a stack, from a proximal side to the planar single crystalline n-doped GaN layer 804 to a distal side from the planar single crystalline n-doped GaN layer 804, a light-emitting indium gallium nitride layer 1132, a planar aluminum gallium nitride layer 1133, a GaN barrier layer 1134, an additional light-emitting indium gallium nitride layer 1132 located on the GaN barrier layer 1134, an addition planar aluminum gallium nitride layer 1133, and an additional GaN barrier layer 1134 located on the additional light-emitting indium gallium nitride layer 1133. The p-doped aluminum gallium nitride layer 1140 can be formed directly on the additional GaN barrier layer 1134.

Additional processing steps can be performed on the second exemplary planar material layer stack as on the first exemplary planar material layer sack of FIG. 41 to provide first light emitting diodes 10R.

If the first or second exemplary planar material layer stack of FIGS. 41 and 42 is employed, the first light emitting diodes 10R can be provided by forming a planar layer stack on a substrate 802 such that the planar layer stack has the same layer sequence as the epitaxial material layer stack to be provided within each first light emitting diode 10R, by forming conductive bonding structures (such as the conductive bonding structures 433 illustrated in FIG. 37) over the planar layer stack, and by dicing the substrate 802 and the planar layer stack to provide the first light emitting diodes 10R.

Figure 43:
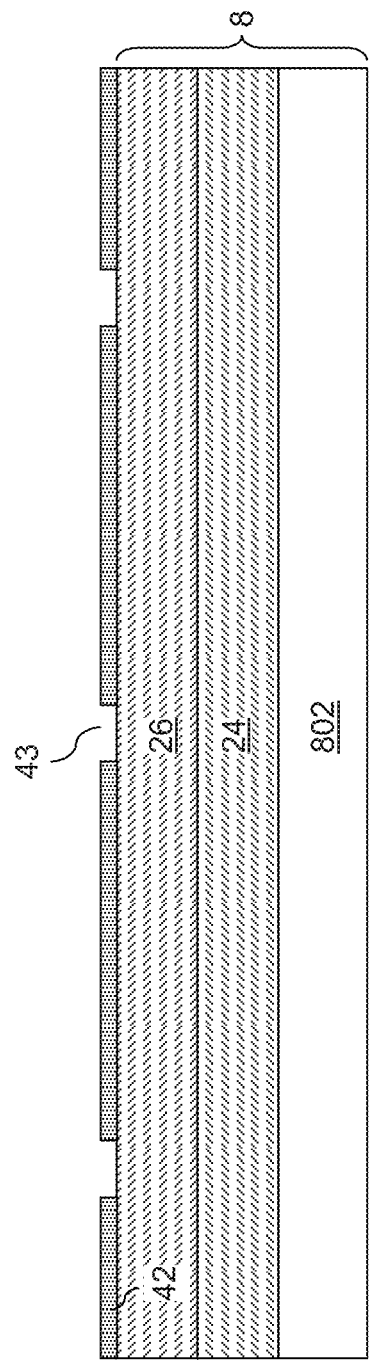
FIG. 43 is a vertical cross-sectional view of an exemplary device structure for forming nanowire-containing light emitting diodes after forming a patterned growth mask according to an embodiment of the present disclosure.

Referring to FIG. 43, an exemplary device structure for forming nanowire-containing light emitting diodes is illustrated. According to an embodiment of the present disclosure, a nanowires growth method is employed to provide the nanowire-containing light emitting diodes which emit red visible light.

As used herein, a "p-plane" means a "pyramid plane," which is a diagonal plane at the tip of the nanowire (e.g., $\{1\bar{1}01\}$ planes), a "c-plane" represents a (0001) base plane, and an "m-plane" represents any of the $\{10\bar{1}0\}$ vertical sidewall planes. Growth rate means layer growth rate along the direction perpendicular to a growth surface when not otherwise specified.

The exemplary device structure illustrated in FIG. 43 is an in-process structure for nanowires-containing light emitting diodes on the substrate 802. As used herein, an "in-process" structure refers to a structure that is subsequently modified to make a final structure. The substrate 802 can include a growth substrate 22 (such as a sapphire substrate), an optional buffer semiconductor layer 24, and a planar single crystalline n-doped GaN layer 26. The planar single crystalline n-doped GaN layer 26 functions as one node of each light emitting diode to be subsequently formed. The optional buffer semiconductor layer 24 and the planar single crystalline n-doped GaN layer 26 can be formed by an epitaxial deposition process so that each of the buffer semiconductor layer 24 and the planar single crystalline n-doped GaN layer 26 includes a single crystalline semiconductor material that is epitaxially aligned to the single crystalline structure of the growth substrate 802 (which can include a single crystalline sapphire ($Al_2O_3$) substrate).

A growth mask 42 is subsequently formed on the top surface of the planar single crystalline n-doped GaN layer 26. The growth mask 42 includes a dielectric material such as silicon nitride or silicon oxide, and can be formed, for example, by chemical vapor deposition. The thickness of the growth mask 42 can be in a range from 10 nm to 500 nm, although lesser and greater thicknesses can also be employed.

Openings 43 are formed through the growth mask 42, for example, by application and patterning of a photoresist layer (not shown) and a subsequent etch process that etches physically exposed portions of the growth mask 42 employing the patterned photoresist layer as an etch mask. The photoresist layer can be subsequently removed, for example, by ashing. The openings may be circular, elliptical, or polygonal. In an illustrative example, the maximum lateral dimension of each opening 43 (such as a diameter or a major axis) may be in a range from 50 nm to 500 nm, although lesser and greater maximum lateral dimensions can be employed for each. The openings 43 can form a two-dimensional array, which may be, for example, a hexagonal array (which includes an equilateral triangular array), a rectangular array, or a parallelogramatic array. The center-to-center distance between a neighboring pair of openings 43 can be in a range from 150 nm to 5 microns, although lesser and greater spacings can also be employed.

Figure 44:
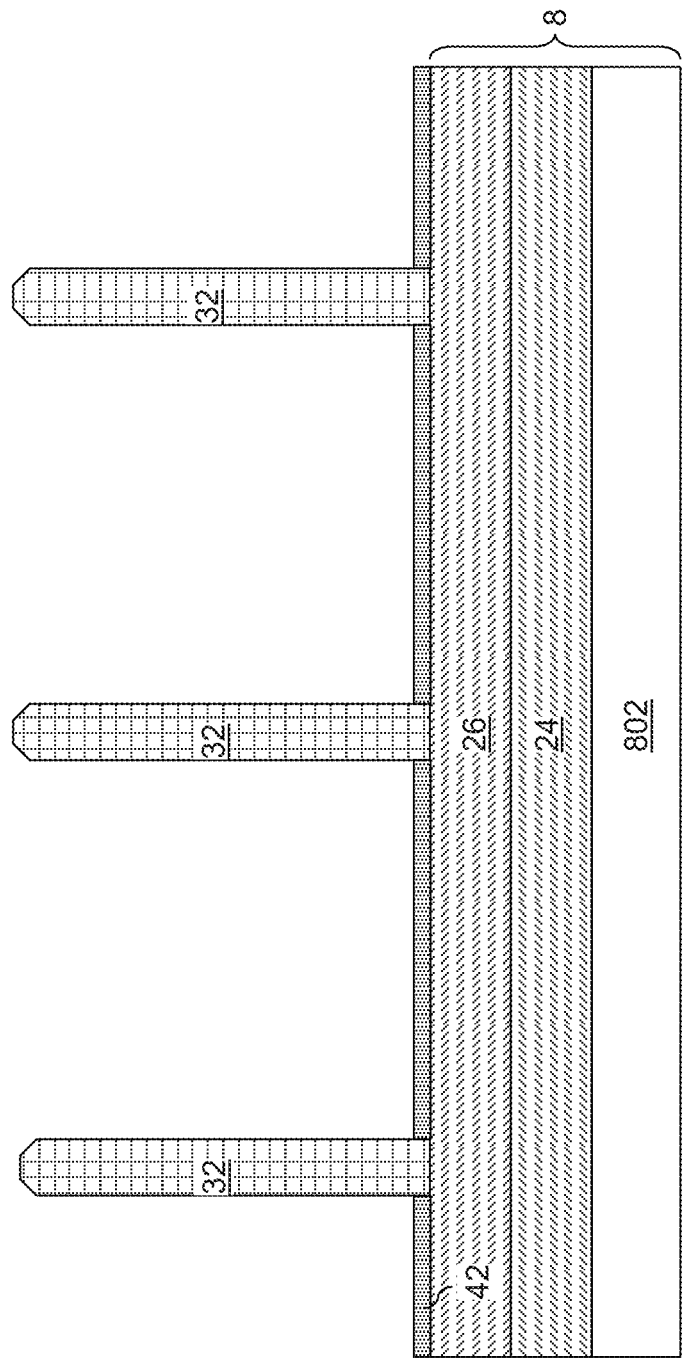
FIG. 44 is a vertical cross-sectional view of the exemplary device structure after forming nanowire cores according to an embodiment of the present disclosure.

Referring to FIG. 44, nanowire cores 32 can be grown through the openings 43 in the patterned growth mask 42 by a selective epitaxy process performed in a Group V limited regime. Alternatively, a silicon enriched growth CVD method, a pulsed growth CVD method or an MBE method can be employed to form the nanowire cores 32. Each nanowire cores 32 extends through a respective opening 43 in the patterned growth mask 42 along a direction substantially perpendicular to the top surface of the substrate 802. The nanowire cores 32 can be grown from the physically exposed surfaces of the planar single crystalline n-doped GaN layer 26 by a selective epitaxy process under process conditions that provide epitaxial growth of a single crystalline doped semiconductor material having a doping of the first conductivity type (such as n-doped GaN) along the direction perpendicular to the c-plane. The c-plane can be parallel to the top surface of the planar single crystalline n-doped GaN layer 26. Growth of the nanowire cores 32 can be performed by a selective semiconductor deposition process that grows a single crystalline semiconductor material from physically exposed semiconductor surfaces primarily along the c-direction, i.e., the direction perpendicular to the c-plane, while not growing any semiconductor material from dielectric surfaces. The entirety of each nanowire core 32 can be single crystalline and in epitaxial alignment with the planar single crystalline n-doped GaN layer 26.

As used herein, the aspect ratio of each nanowire core 32 is defined as the final height of the nanowire core to the maximum lateral dimension at the base of the nanowire core, which is the maximum lateral dimension of the respective opening through the growth mask 42. The aspect ratio of the nanowire cores 32 can be in a range from 2 to 40, although lesser and greater aspect ratios can also be employed.

Figure 45:
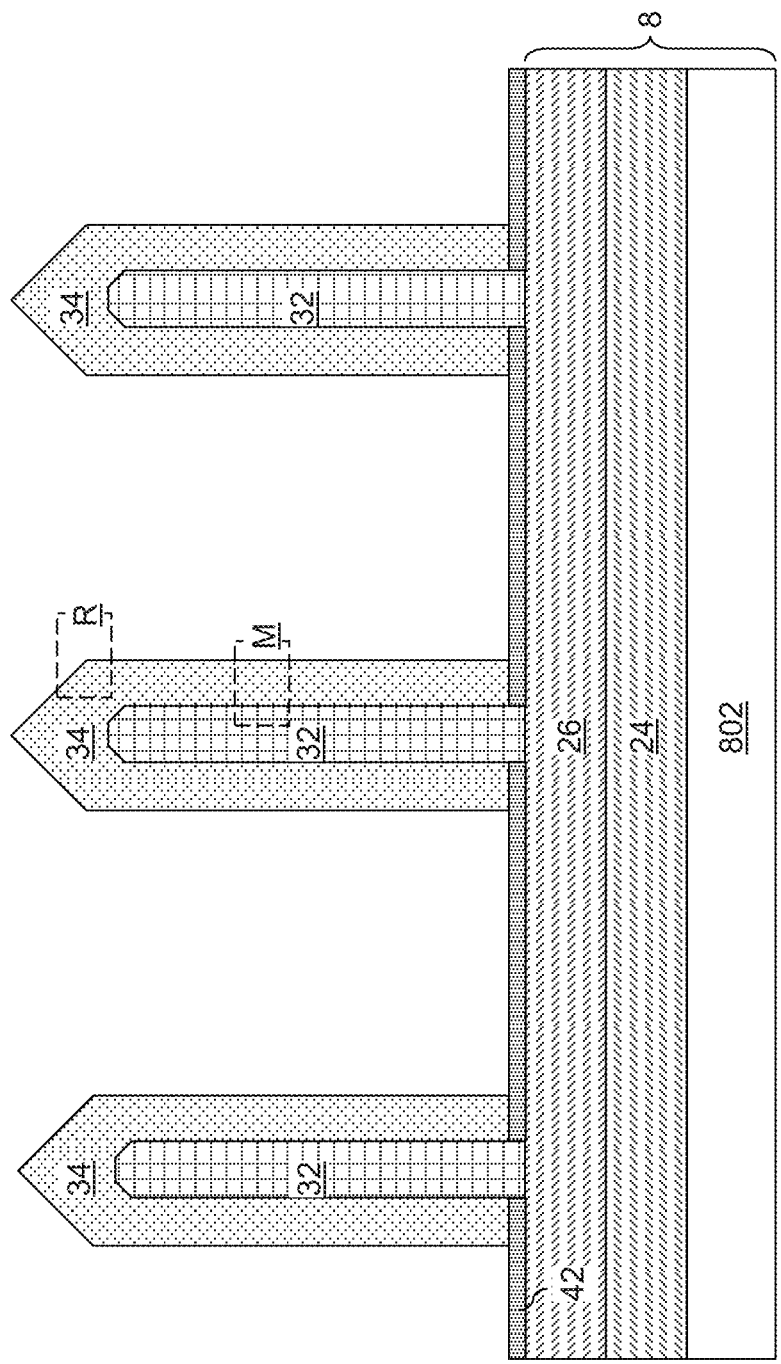
FIG. 45 is a vertical cross-sectional view of the exemplary device structure after forming shell structures according to an embodiment of the present disclosure.

Referring to FIGS. 45, 46A and 46B, a shell layer stack 34 is formed on each nanowire cores 32, which is a single crystalline n-doped GaN portion. FIG. 46A is a magnified view of a region M of the exemplary device structure of FIG. 45 and FIG. 46B is magnified TEM micrograph of a region R of the exemplary device structure of FIG. 45. The growth mode can change to a Group III limited growth mode, which is also referred to as a high V/III growth mode employed in conventional growth of III-V materials, for formation of the shell layers within the shell layer stack 34. Thus, the shell layers can be formed on all physically exposed semiconductor surfaces during the respective selective epitaxy processes.

The shell layer stack 34 can include an epitaxial shell layer stack (i.e., a stack of epitaxial shell layers that are epitaxially aligned among one another) that includes, in order, an optional plurality of shell strain-modulating layer stacks (1210, 1220, 1225), a shell light-emitting quantum well that includes a shell light-emitting indium gallium nitride layer 1232, a shell aluminum gallium nitride layer 1133, a shell GaN barrier layer 1234, and a shell p-doped aluminum gallium nitride layer 1240. The shell light-emitting indium gallium nitride layer 1232 is configured to emit light at a first peak wavelength in a range from 600 nm to 750 nm under electrical bias thereacross. In one embodiment, the first peak wavelength can be in a range from 610 nm to 680 nm. As used herein, a "shell layer" refers to a continuous material layer that laterally encloses and overlies all facets of a nanowire core 32. The thickness of a shell layer may vary across facets of the nanowire core 32. For example, vertical portions of a shell layer may be thicker than angled portions of the shell layer.

Each strain-modulating layer stack (1210, 1220, 1225) includes at least a pair of layers that includes a respective intervening indium gallium nitride layer (1212, 1222, 1226) and a respective intervening GaN layer (1214, 1224, 1228). The inner most strain-modulating layer stack may comprise a superlattice shell 1210 which contains a plurality of stacks of pairs of layers 1212 and 1214. Each strain-modulating layer stack (1210, 1220, 1225) can function as buffer layers that provide strain relaxation between two layers that are located on opposite sides of the strain-modulating layer stack (1210, 1220, 1225). For example, the difference in the lattice parameters of the single crystalline n-doped gallium nitride portion of the nanowire cores 32 and the shell light-emitting indium gallium nitride layer 1232 can be accommodated by the strain-modulating layer stack (1210, 1220, 1225), which provide gradual transition of lattice parameters and trap lattice defects between the nanowire core 32 and the shell light-emitting indium gallium nitride layer 1232 so that the shell light-emitting indium gallium nitride layer 1232 can be formed as a high quality epitaxial film.

The various layers in the plurality of shell strain-modulating layer stacks (1210, 1220, 1225) have respective Wurtzite structures. In an illustrative example, the plurality of strain-modulating layer stacks (1210, 1220, 1225) can include a superlattice shell 1210 of a plurality (e.g., five to ten) of first strain-modulating layer stacks (1212, 1214), a second strain-modulating layer stack 1220, and a third strain-modulating layer stack 1225. Each first strain-modulating layer stack (1212, 1214) can include a first intervening indium gallium nitride layer 1212 and a first intervening GaN layer 1214. The second strain-modulating layer stack 1220 can include a second intervening indium gallium nitride layer 1222 and a second intervening GaN layer 1224. The third strain-modulating layer stack 1225 can include a third intervening indium gallium nitride layer 1226 and a third intervening GaN layer 1228.

Each of the first strain-modulating layer stacks (1212, 1214) can have a first effective lattice constant, the second strain-modulating layer stack 1220 can have a second effective hexagonal-plane lattice constant that is greater than the first effective hexagonal-plane lattice constant, and the third strain-modulating layer stack 1225 can have a third effective hexagonal-plane lattice constant that is greater than the second effective hexagonal-plane lattice constant.

In one embodiment, the atomic concentration of indium in the intervening indium gallium nitride layers (1212, 1222, 1226) of the plurality of strain-modulating layer stacks (1210, 1220, 1225) can monotonically increase with the physical distance of each strain-modulating layer stack (1210, 1220, 1225) from the single crystalline n-doped GaN portion, i.e., from the nanowire core 32.

In one embodiment, the first intervening indium gallium nitride layers 1212 can have a lower indium concentration than the second intervening indium gallium nitride layer 1222. For example, the first intervening indium gallium nitride layers 1212 can have a composition of $In_pGa_{(1-p)}N$ in which p is in a range from 0.04 to 0.08, although lesser and greater values for p can also be employed. The second intervening indium gallium nitride layer 1222 can have a composition of $In_gGa_{(1-q)}N$ in which p is in a range from 0.10 to 0.12, although lesser and greater values for q can also be employed. The third intervening indium gallium nitride layer 1226 can have a composition of $In_rGa_{(1-r)}N$ in which r is in a range from 0.15 to 0.30, although lesser and greater values for r can also be employed. The thickness of each first intervening indium gallium nitride layer 1212 can be in a range from 0.7 nm to 1.5 nm, although lesser and greater thicknesses can also be employed. The thickness of each first intervening GaN layer 1214 can be in a range from 3 nm to 5 nm, although lesser and greater thicknesses can also be employed. The thickness of the second intervening indium gallium nitride layer 1222 can be in a range from 4 nm to 6 nm, although lesser and greater thicknesses can also be employed. The thickness of the second intervening GaN layer 1224 can be in a range from 2 nm to 4 nm, although lesser and greater thicknesses can also be employed. The thickness of the third intervening indium gallium nitride layer 1226 can be in a range from 2.5 nm to 8 nm, although lesser and greater thicknesses can also be employed. The thickness of the third intervening GaN layer 1224 can be in a range from 6 nm to 10 nm, although lesser and greater thicknesses can also be employed.

Optionally, a shell GaN spacer layer 1218 can be provided between the groups of the first strain-modulating layer stacks (1212, 1214) (i.e., the superlattice shell 1210) and the second strain-modulating layer stack 1220 to reduce overall stress during the epitaxial growth of the shell layers. For example, the shell GaN spacer layer 1218 can have a thickness in the range from 30 nm to 50 nm, although lesser and greater thicknesses can also be employed.

In one embodiment, the effective hexagonal-plane lattice constant of the second strain-modulating layer stack 1220 can be greater than the effective hexagonal-plane lattice constant of the first superlattice shell 1210, and the effective hexagonal-plane lattice constant of the third strain-modulating layer stack 1225 can be greater than the effective hexagonal-plane lattice constant of the second strain-modulating layer stack 1220. Further, the atomic concentration of indium in the second intervening indium gallium nitride layer 1222 can be greater than the atomic concentration of indium in the first intervening indium gallium nitride layers 1212, and the atomic concentration of indium in the third intervening indium gallium nitride layer 1226 can be greater than the atomic concentration of indium in the second intervening indium gallium nitride layer 1222. The atomic percentage of indium in the second strain-modulating layer stack 1220 can be greater than the atomic percentage of indium in the superlattice shell 1210, and the atomic percentage of indium in the third strain-modulating layer stack 1225 can be greater than the atomic percentage of indium in the second strain-modulating layer stack 1220.

The superlattice shell 1210 can emit UV radiation, the second strain-modulating layer stack 1220 can emit blue visible light and the third strain-modulating layer stack 1225 can emit green visible light. In one embodiment, the second strain-modulating layer stack 1220 can have a non-uniform surface profile having at least 3 peaks, where each of the at least 3 peaks is separated from an adjacent one of the at least 3 peaks by a valley; and each of the at least 3 peaks extends at least 2 nm in a radial direction away from an adjacent valley, as described in U.S. Pat. No. 9,281,442, which is incorporated by reference herein in its entirety. This second strain-modulating layer stack 1220 with the non-uniform surface profile can be used for surface profile modification/ preparation of the light emitting region shell 1230 with indium rich regions in addition to strain management.

The light emitting region shell 1230 can be a light-emitting quantum well which is formed on the most distal strain-modulating layer stack, which can be the third strain-modulating layer stack 1225. The shell light-emitting quantum well 1230 includes a shell light-emitting indium gallium nitride layer 1232, a shell aluminum gallium nitride layer 1233, and a shell GaN barrier layer 1234.

The shell light-emitting indium gallium nitride layer 1232 includes an epitaxial indium gallium nitride material having a composition that emits light at a peak wavelength in a range from 600 nm to 750 nm, and preferably in a range from 610 nm to 680 nm. In one embodiment, the shell light-emitting indium gallium nitride layer 1232 can have a thickness in a range from 3 nm to 7 nm.

In one embodiment, the shell light-emitting indium gallium nitride layer 1232 contains indium rich regions having at least 5 atomic percent higher indium content than indium poor regions in the active region quantum well shell, which is believed to be at least in part due to the non-uniform surface profile of the underlying second strain-modulating layer stack 1220, as described in U.S. Pat. No. 9,281,442.

In one embodiment, the shell light-emitting indium gallium nitride layer 1232 also contains indium rich "nano-ring" or "eave" region 1232A shown in FIG. 46B. The nano-ring region 1232A comprises a structural discontinuity from the p-plane in the upper tip portion of the shell to the m-plane in the lower portion of the shell, as described in PCT International Publication Number WO 2106/025325 A1 and its priority U.S. provisional application Ser. No. 62/036,363 filed Aug. 12, 2014, both of which are incorporated herein by reference in their entirety. Region 1232A has at least 5 atomic percent higher indium content than upper tip portion of the layer 1232 having the sloped p-plane sidewalls and the lower portion of the layer 1232 having the substantially vertical m-plane side. The nano-ring region 1232A is a ring shaped region which surrounds an entire periphery of a middle portion of the nanowire core 32 between the upper tip portion and the lower portion of the nanowire core 32. The nano-ring region 1232A may contain at least a 3:7 atomic ratio of indium to gallium, such as a 3.5:6.5 greater atomic ratio of indium to gallium. However, other ratios, such as less than 3:7 may also be used. In one embodiment, at least a portion (such as at least the nano-ring region 1232A) of the shell light-emitting indium gallium nitride layer 1232 has a composition of $In_xGa_{(1-x)}N$, in which x is in a range from 0.26 to 0.55, such as 0.35 to 0.50.

The shell aluminum gallium nitride layer 1233 includes a thin aluminum gallium nitride material that can prevent evaporation of indium from the underlying shell light-emitting indium gallium nitride layer 1232 during fabrication. The shell aluminum gallium nitride layer 1233 can have a composition of $Al_yGa_{(1-y)}N$, in which y is in a range from 0.3 to 1.0 (such as from 0.5 to 0.8). In one embodiment, the shell aluminum gallium nitride layer can have a thickness in a range from 0.2 nm to 3.0 nm (such as 0.5 nm to 1.5 nm), such as from 0.5 nm to 1.0 nm.

The shell GaN barrier layer 1234 can have a thickness in a range from 5 nm to 20 nm. The shell GaN barrier layer 1234 provides an energy barrier between the shell light-emitting indium gallium nitride layer 1232 and p-type compound semiconductor material layers to be subsequently formed. Optionally, one or more of the various strain-modifying layers (1210, 1218, 1220, 1225) described above may be omitted and the shell light-emitting quantum well 1230 may be formed directly on the nanowire core 32, on a GaN or AlGaN barrier layer, and/or on one of the other shell layers located on the nanowire core 32, due to the nano-compliancy of the nanowire core 32.

The various material layers within the superlattice shell 1210, the shell GaN spacer layer 1218, the second strain-modulating layer stack 1220, the third strain-modulating layer stack 1225, and the shell light-emitting quantum well 1230 can be undoped (e.g., not intentionally doped), and may have a free charge carrier concentration not greater than $1.0 \times 10^{19}/cm^3$.

A shell p-doped aluminum gallium nitride layer 1240 can be formed on the shell layer stack 34, i.e., on the shell light-emitting quantum well 1230. For example, the shell p-doped aluminum gallium nitride layer 1240 can be formed directly on the shell GaN barrier layer 1234. In one embodiment, the shell p-doped aluminum gallium nitride layer 1240 can have a thickness in a range from 10 nm to 30 nm, although lesser and greater thicknesses can also be employed. In one embodiment, the shell p-doped aluminum gallium nitride layer 1240 can be p-doped at a dopant concentration that provides a free charge carrier concentration (i.e., the concentration of holes) in a range from $1.0 \times 10^{17}/cm^3$ to $3.0 \times 10^{20}/cm^3$, such as from $3.0 \times 10^{17}/cm^3$ to $1.0 \times 10^{20}/cm^3$, although lesser and greater free charge carrier concentrations can also be employed. The shell p-doped aluminum gallium nitride layer 1240 can have a lower aluminum content than the shell aluminum gallium nitride layer 1233 and can have a composition of Al$_z$Ga$_{(1-z)}$N, in which z is less than 0.5, such as in a range from 0.2 to 0.3.

Figure 47:
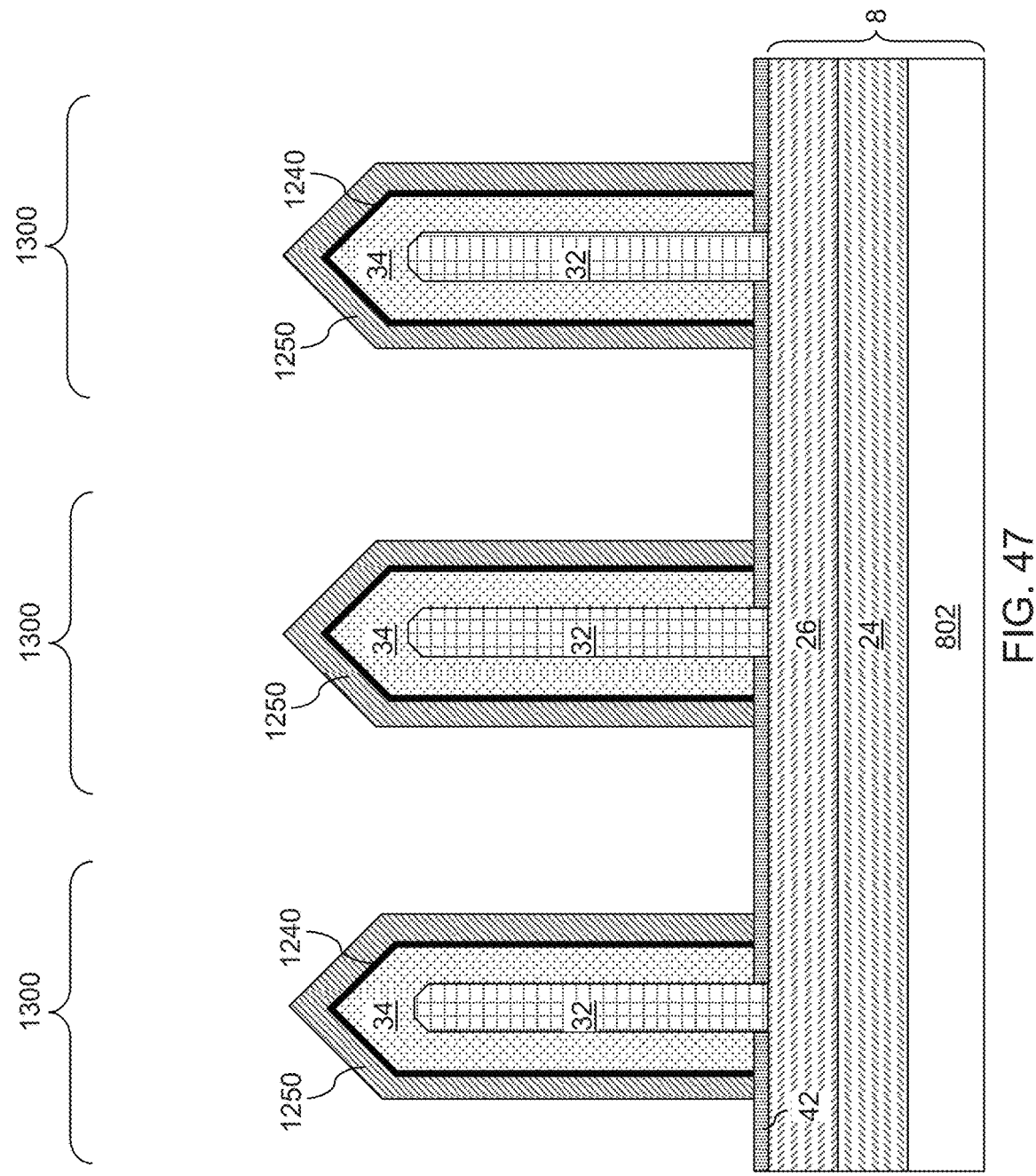
FIG. 47 is a vertical cross-sectional view of the exemplary device structure after formation of a p-type outer shell layer according to an embodiment of the present disclosure.

Referring to FIG. 47, a first p-doped compound semiconductor material layer 1250 can be formed on the shell stack 34 (e.g., on the shell p-doped aluminum gallium nitride layer 1240 which forms the outer surface of the shell stack 34). The first p-doped compound semiconductor material layer 1250 can include a p-doped single crystalline compound semiconductor material such as p-doped gallium nitride. In one embodiment, the first p-doped compound semiconductor material layer 1250 can be p-doped at a dopant concentration that provides a free charge carrier concentration (i.e., the concentration of holes) in a range from $1.0\times10^{17}$/cm$^3$ to $3.0\times10^{20}$/cm$^3$, such as from $3.0\times10^{17}$/cm$^3$ to $1.0\times10^{20}$/cm$^3$, although lesser and greater free charge carrier concentrations can also be employed. The deposited p-doped compound semiconductor material coalesces between the nanowires, with or without vertical seams or voids laterally surrounding each nanowire, to form the first p-doped compound semiconductor material layer 1250 as a continuous material layer.

Each combination of a nanowires core 32, a shell layer stack 34, a shell p-doped aluminum gallium nitride layer 1240, and a first p-doped compound semiconductor material layer 1250 constitutes a semiconductor nanowire 1300.

Figure 48:
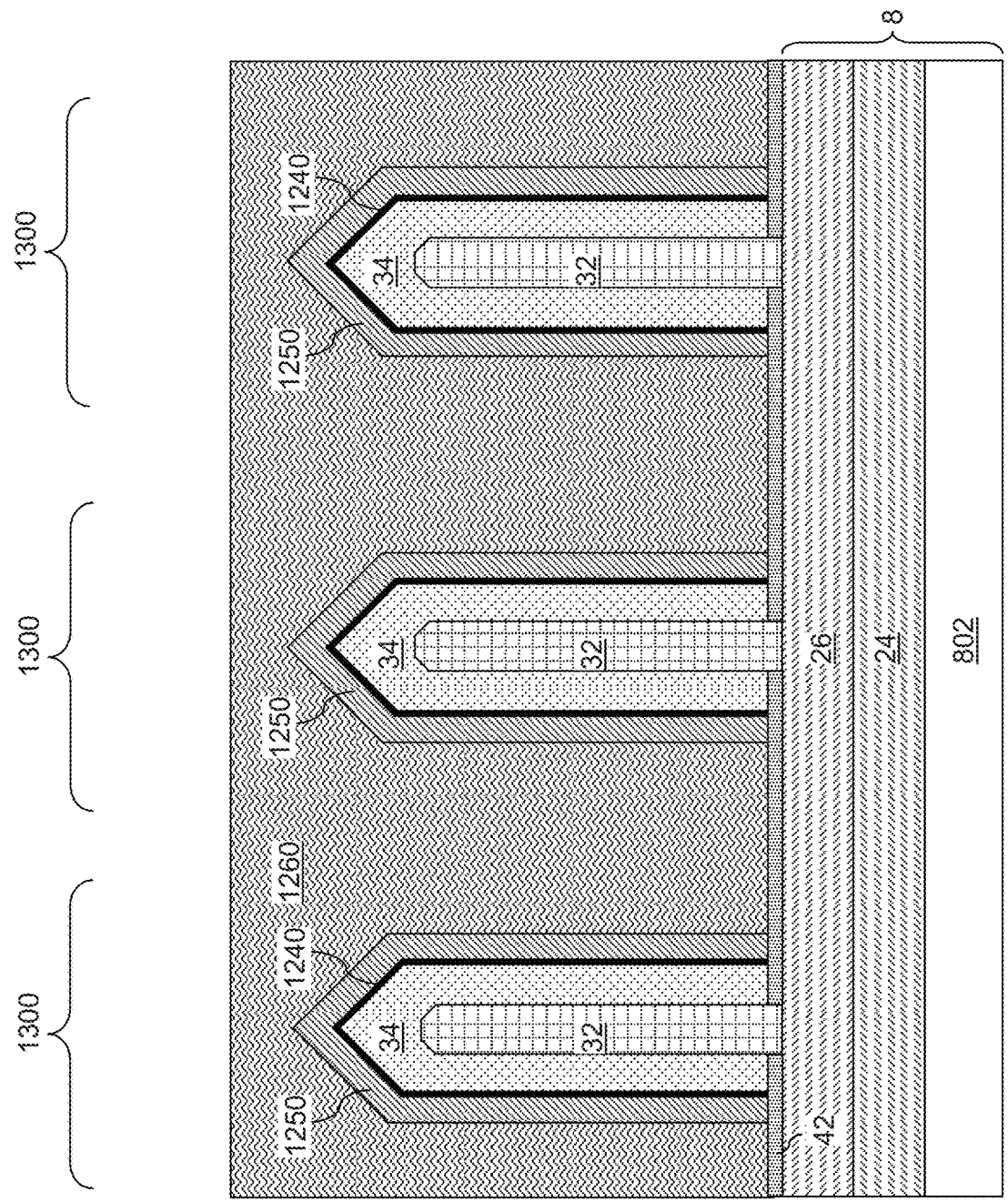
FIG. 48 is a vertical cross-sectional view of the exemplary device structure after formation of a continuous p-type semiconductor material layer according to an embodiment of the present disclosure.

Referring to FIG. 48, a second p-doped compound semiconductor material layer 1260 can be formed on the first p-doped compound semiconductor material layer 1250. The second p-doped compound semiconductor material layer 1260 can include a p-doped single crystalline compound semiconductor material such as p-doped gallium nitride. The dopant concentration in the second p-doped compound semiconductor material layer 1260 can be greater than the dopant concentration in the first p-doped compound semiconductor material layer 1250. In one embodiment, the second p-doped compound semiconductor material layer 1260 can be p-doped at a dopant concentration that provides a free charge carrier concentration (i.e., the concentration of holes) in a range from $5.0\times10^{19}$/cm$^3$ to $3.0\times10^{21}$/cm$^3$, such as from $1.0\times10^{20}$/cm$^3$ to $2.0\times10^{21}$/cm$^3$, although lesser and greater free charge carrier concentrations can also be employed. The thickness of the second p-doped compound semiconductor material layer 1260 is selected such that the second p-doped compound semiconductor material layer 1260 is either formed as a continuous material layer filling the gaps between the semiconductor nanowires 1300 and providing a continuous top surface or forms an air-bridge structure enclosing air gaps between the semiconductor nanowires, as described in U.S. Pat. No. 8,350,249, incorporated herein by reference in its entirety.

Figure 49:
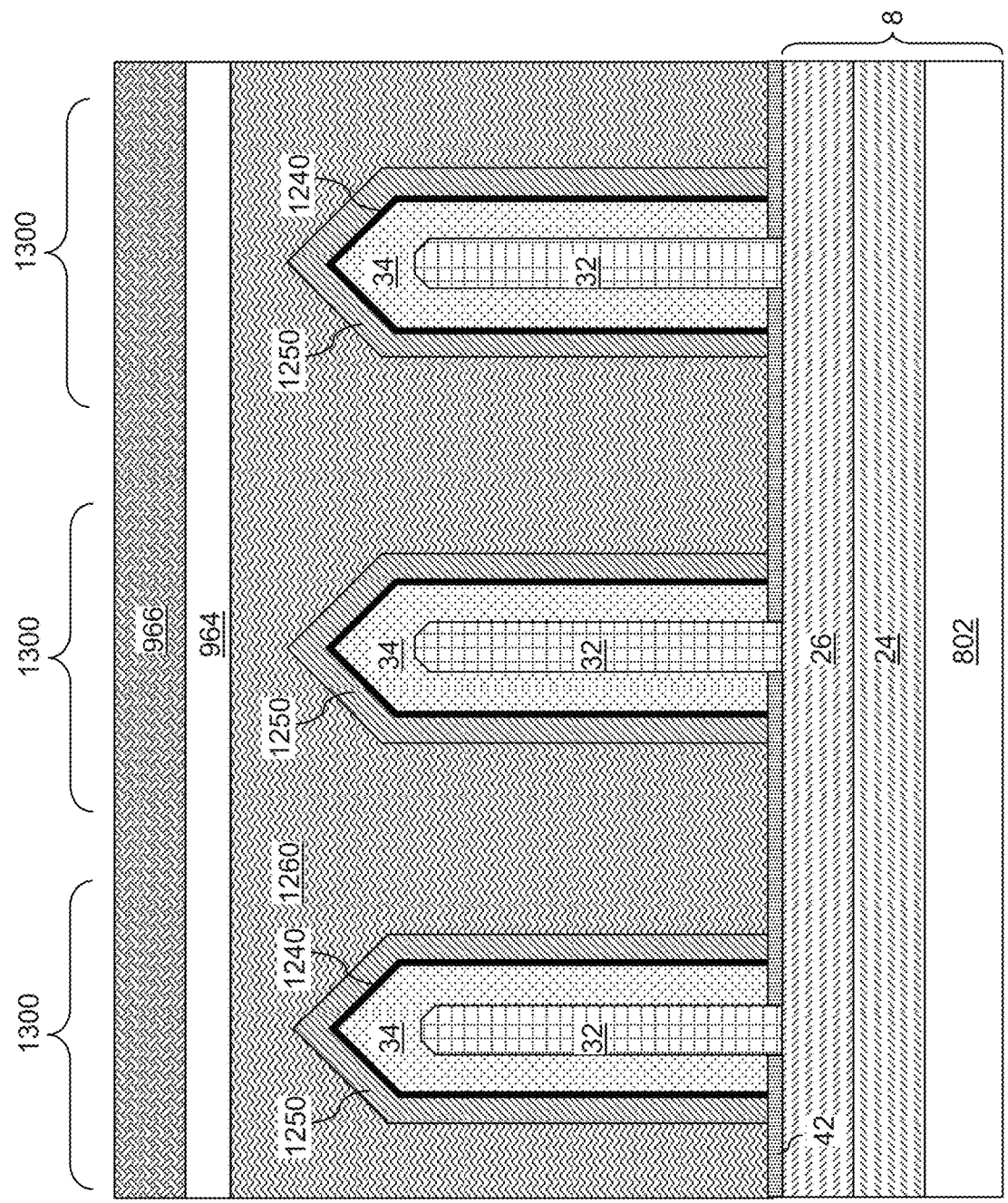
FIG. 49 is a vertical cross-sectional view of the exemplary device structure after formation of a transparent conductive oxide layer and a reflector layer according to an embodiment of the present disclosure.

Referring to FIG. 49, a transparent conductive electrode, such as a transparent conductive oxide layer 964 can be deposited over the first and second p-doped compound semiconductor material layers (1250, 1260). In case light emitted from the light-emitting indium gallium nitride layer 1232 is directed downward toward the single crystalline n-doped gallium nitride layer 26 by a reflector layer 966 to be subsequently formed above the transparent conductive electrode, then the transparent conductive oxide layer 964 is herein referred to a backside transparent conductive oxide layer 964. The transparent conductive oxide layer 964 includes a transparent conductive oxide material such as indium tin oxide or aluminum doped zinc oxide. The transparent conductive oxide layer 964 can be deposited as a continuous material layer that extends across the entire area of the first and second p-doped compound semiconductor material layers (1250, 1260). The transparent conductive oxide layer 964 can be discontinuous (for example, by patterning) across neighboring groups of light emitting diodes to enable independent operation of each group of light emitting diodes. The thickness of the transparent conductive oxide layer 964 can be in a range from 100 nm to 2 microns, such as from 200 nm to 1 micron, although lesser and greater thicknesses can also be employed.

Optionally, a reflector material can be deposited to form a reflector layer 966 that continuously extends over the backside transparent conductive oxide layer 964. The reflector layer 966 is electrically shorted to the first and second p-doped compound semiconductor material layers (1250, 1260) through the backside transparent conductive oxide layer 964. In one embodiment, the reflector layer 966 includes at least one material selected from silver, aluminum, copper, and gold. In one embodiment, the reflector material can be deposited by a direction deposition method such as physical vapor deposition (sputtering) or vacuum evaporation. The reflector layer 966 can be employed to reflect light emitted from the light emitting region 1230 downward.

Subsequently, additional processing steps of FIG. 36 can be performed to form a dielectric material layer, and the processing steps of FIGS. 37 and 38 can be performed to provide a plurality of first light emitting diodes 10R. Upon singulation into multiple first light emitting diodes 10R, each first light emitting diode can include a plurality of semiconductor nanowires 1300.

Each first light emitting diode 10R includes a nanowire core 32 as a single crystalline n-doped GaN portion, which protrudes vertically from a horizontal surface of a single crystalline n-doped GaN layer 26 having a planar top surface. An optional shell layer stack 34 comprising each layer within the plurality of strain-modulating layer stacks (1210, 1220, 1225), the light-emitting indium gallium nitride layer 1232, the GaN barrier layer 1234, and the p-doped aluminum gallium nitride layer 1240 laterally surrounds the nanowires core 32 and includes vertical portions that extend along a vertical direction and perpendicular to the planar top surface of the single crystalline n-doped GaN layer 26.

In the embodiment illustrated in FIGS. 43-49, a planar single crystalline n-doped GaN layer 26 having a planar top surface is formed on a substrate 802. Nanowire cores 32 comprising n-doped GaN can be formed on the planar single crystalline n-doped GaN layer 26. A shell layer stack 34 is formed on the nanowire cores 32. The shell layer stack includes one or more of shell strain-modulating layer stacks (1210, 1220, 1225), a shell light-emitting indium gallium nitride layer 1332, a shell GaN barrier layer 1332, and a shell p-doped aluminum gallium nitride layer 1240. The thicknesses of the layers within shell strain-modulating layer stacks (1210, 1220, 1225) can be thin to accommodate the strain on the shell light-emitting indium gallium nitride layer 1332. Alternatively, one or more of the stacks (1210, 1220 and/or 1225) can be omitted due to the nano-compliance of the nanowire core 32 which accommodates the strain on the shell light-emitting indium gallium nitride layer 133. Conductive bonding structures 433 described in the prior embodiment are electrically shorted to first and second p-doped compound semiconductor material layers (1250, 1260) can formed. The substrate 802 and material structures thereupon can be diced to provide the first light emitting diodes 10R. Portions of the substrate 802 can be removed to enable formation of electrical contact to a single crystalline n-doped GaN layer (which is a remaining portion of the planar single crystalline n-doped GaN layer 26) within each first light emitting diode.

The first light emitting diodes 10R can be bonded to a backplane employing any of the methods described above to form an array of pixels for a direct view display device. Second light emitting diodes 10G configured to emit light at a second peak wavelength in a range from 400 nm to 600 nm can be bonded to the backplane. Optionally, additional light emitting diodes such as third light emitting diodes 10B can be transferred to the backplane. For example, the second light emitting diodes may be green-light emitting diodes and the second peak wavelength can be in a range from 495 nm to 570 nm, and third light emitting diodes 10B may be blue-light emitting diodes configured to emit light at a third peak wavelength in a range from 400 to 495 nm.

In a non-limiting example, each of the first light emitting diodes 10R can comprise a first conductive bonding structure 433 that is electrically connected to a respective p-doped aluminum gallium nitride layer (1140, 1240) and is bonded to a respective bonding pad 423 on the backplane 401, and each of the second light emitting diodes 10G can comprise a second conductive bonding structure 422 that is electrically shorted to a respective p-doped compound semiconductor material layer within the second light emitting diode 10G and is bonded to another respective bonding pad 422 on the backplane 401 as illustrated in FIG. 40B.

In one embodiment, each of the first light emitting diodes 10R can comprise a first reflector layer 966 that is located between the respective p-doped aluminum gallium nitride layer (1140, 1240) and the first conductive bonding structure 433 and configured to reflect light toward the p-doped aluminum gallium nitride layer (1140, 1240). In one embodiment, each of the first light emitting diodes 10R can comprise a first transparent conductive oxide layer 964 that is located between, and electrically shorted to, the p-doped aluminum gallium nitride layer (1140, 1240) and the first conductive bonding structure 433.

In one embodiment, the methods of FIGS. 40A and 40B can be performed after bonding the light emitting diodes (10R, 10G, 10B) to form an array of pixels. Specifically, a dielectric fill material layer 798 laterally surrounding each of the first light emitting diodes 10R and the second light emitting diodes 10G within the array of pixels can be formed after bonding the first light emitting diodes 10R and the second light emitting diodes 10G to the backplane 401 as illustrated in FIG. 40A. Subsequently, a front side transparent conductive oxide layer 796 can be formed over the dielectric fill material layer 798 such that the front side transparent conductive oxide layer 796 is electrically shorted to each single crystalline n-doped GaN portion (804, 32) in the first light emitting diodes 10R within the array of pixels. The front side transparent conductive oxide layer 796 can be a common ground electrode for each of the first light emitting diodes 10R and the second light emitting diodes 10G.

While the red light emitting diodes 10R of the embodiments of FIGS. 41 to 49 are described above as being used in a multi-color direct view display, it should be understood that these red light emitting diodes can be used in any suitable light emitting device where red light emission is desired, such as a backlight for a LCD display, in a lighting fixture (e.g., lamp), a vehicle headlamp, a vehicle tail light, a traffic light, an in-eye projection device, etc.

Figure 50:
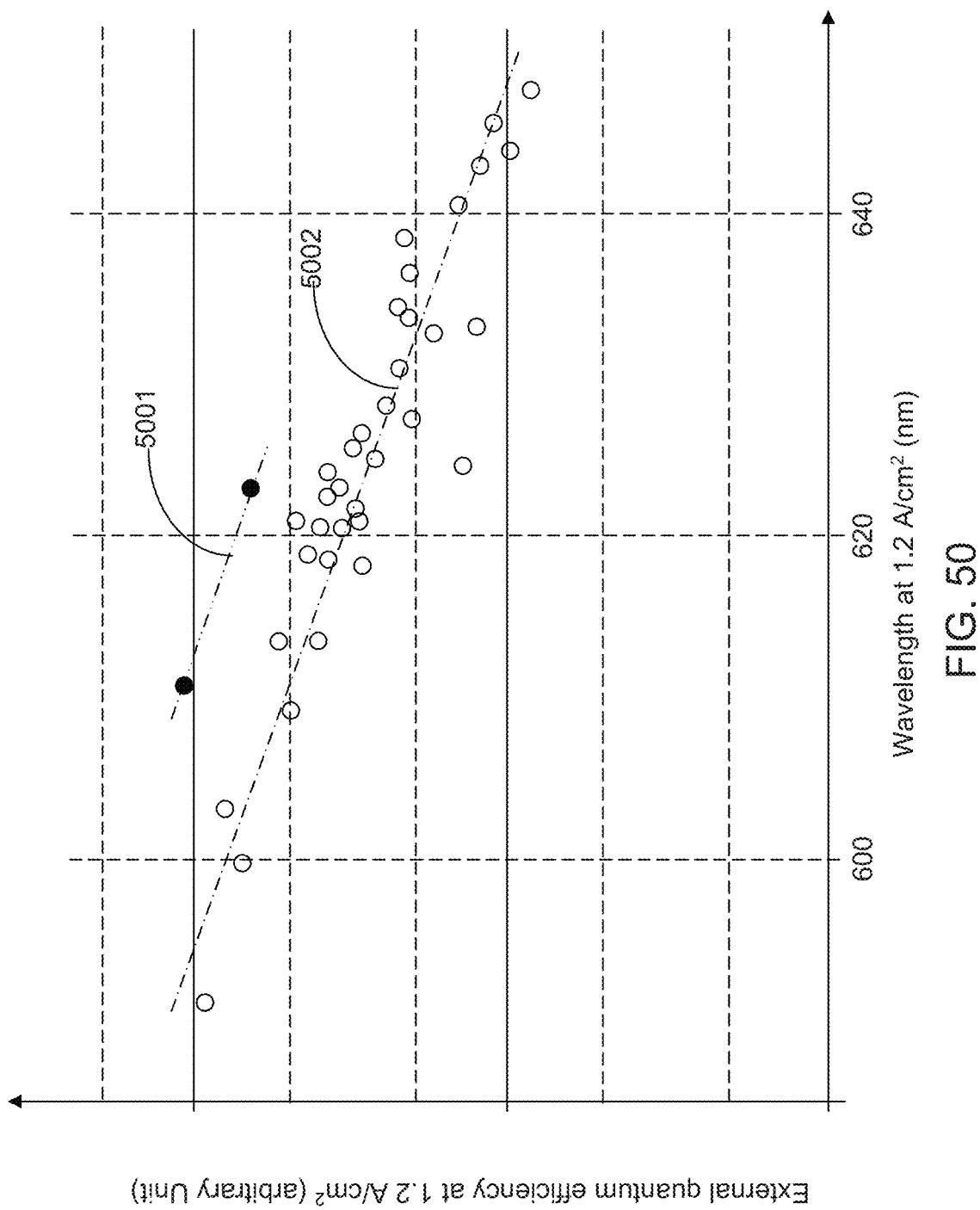
FIG. 50 is graph showing external quantum efficiency of sample light emitting devices employing the first exemplary planar material layer stack of FIG. 41 or the second exemplary planar material layer stack of FIG. 42 according to an embodiment of the present disclosure.

FIG. 50 is graph showing external quantum efficiency of sample light emitting devices employing the first exemplary planar material layer stack of FIG. 41 and the second exemplary planar material layer stack of FIG. 42. The relationship between the peak wavelength and the external quantum efficiency at 1.2 A/cm$^2$ current density is plotted in the graph. Closed circles correspond to data points for samples having the configuration of the first exemplary planar material layer stack of FIG. 41, and are fitted with a first fitting curve 5001. Open circles correspond to data points for samples having the configuration of the second exemplary planar material layer stack of FIG. 42, and are fitted with a second fitting curve 5002. External quantum efficiency greater than 2%, such as 2 to 10% for peak emission wavelengths between 600 and 640 nm are provided. External quantum efficiency greater than 2% at a peak wavelength greater than 620 and providing crisp red color has been demonstrated by samples implementing the structures of the present disclosure. It is well known that external quantum efficiency in light emitting diodes rapidly decreases within increase in wavelength above 600 nm. External quantum efficiency greater than 2% at a peak wavelength greater than 620 nm (such as 3.9% at 628 nm) as provided by samples implementing the structures of the present disclosure is believed to be superior in performance to any known prior art InGaN based red light emitting devices.

The layer stacks tested were not diced or encapsulated and did not have a reflector. Furthermore, instead of actual electrodes, nickel dots were deposited on the stacks and subjected to a high voltage spike to diffuse the nickel dots into the stack. The voltage was then measured between p-side and n-side dots. A fully encapsulated chip in a silver reflector header and with epoxy (a lamp) is expected to deliver a four times improvement in EQE relative to nickel dot devices. It should be noted that the stack with one quantum well in the light emitting region exhibits a higher external quantum efficiency for a given peak emission wavelength than a stack with two quantum wells in the light emitting region. Without wishing to be bound by a particular theory, it is believed that this effect may be due to lower strain in the single quantum well device. Thus, in an embodiment of the present disclosure, the light emitting region contains one or two quantum wells, or three or more quantum wells.

Figure 51:
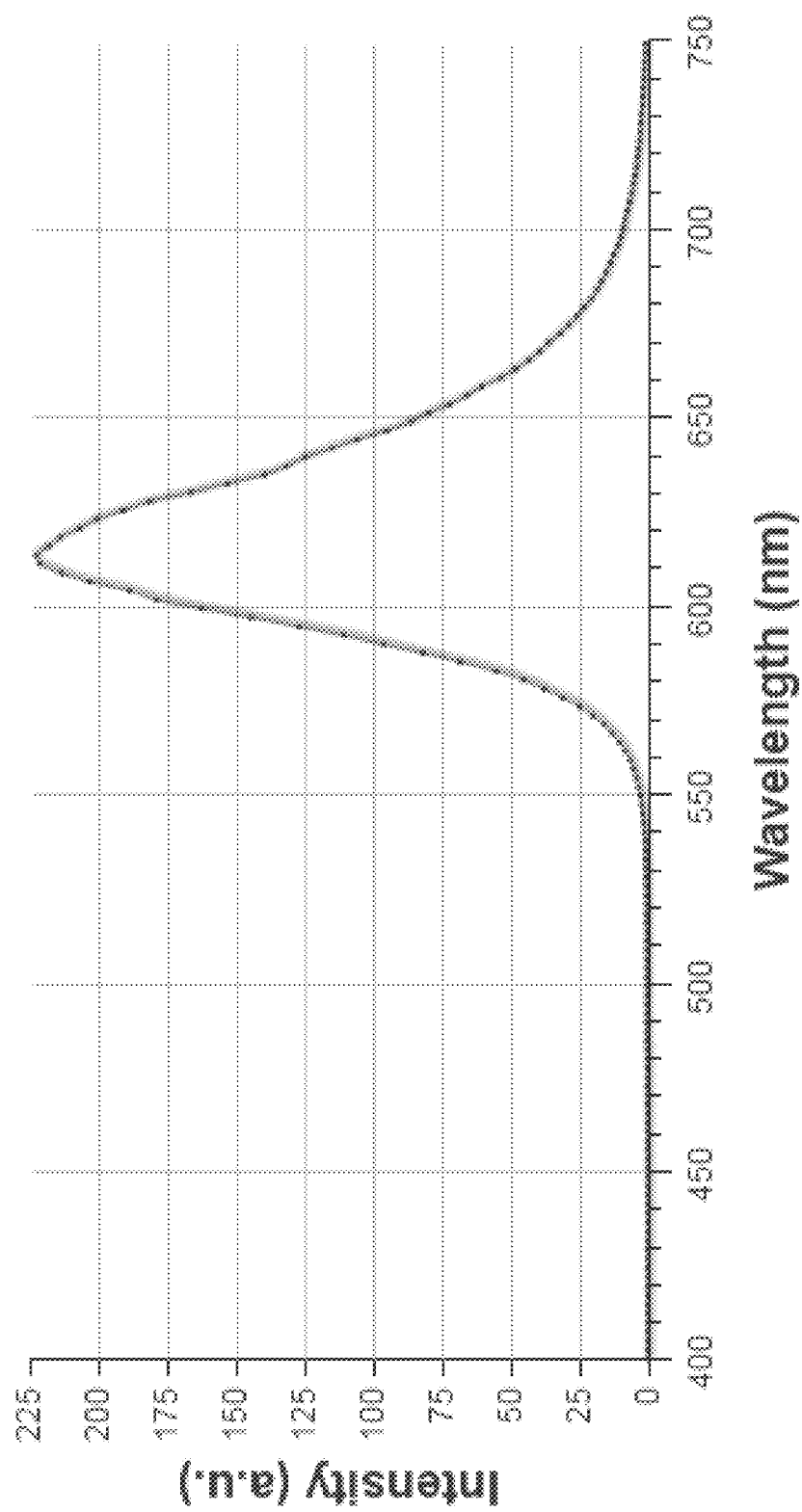
FIG. 51 is a graph of emission intensity versus wavelength for the second exemplary planar material stack of FIG. 42 according to an embodiment of the present disclosure.

FIG. 51 is a plot of emission intensity versus wavelength for the second exemplary planar material stack of FIG. 42. The stack exhibited a full width half maximum (FWHM) of less than 50 nm (e.g., about 45 nm) at a current density of 1.2 A/cm$^2$.

Figure 52:
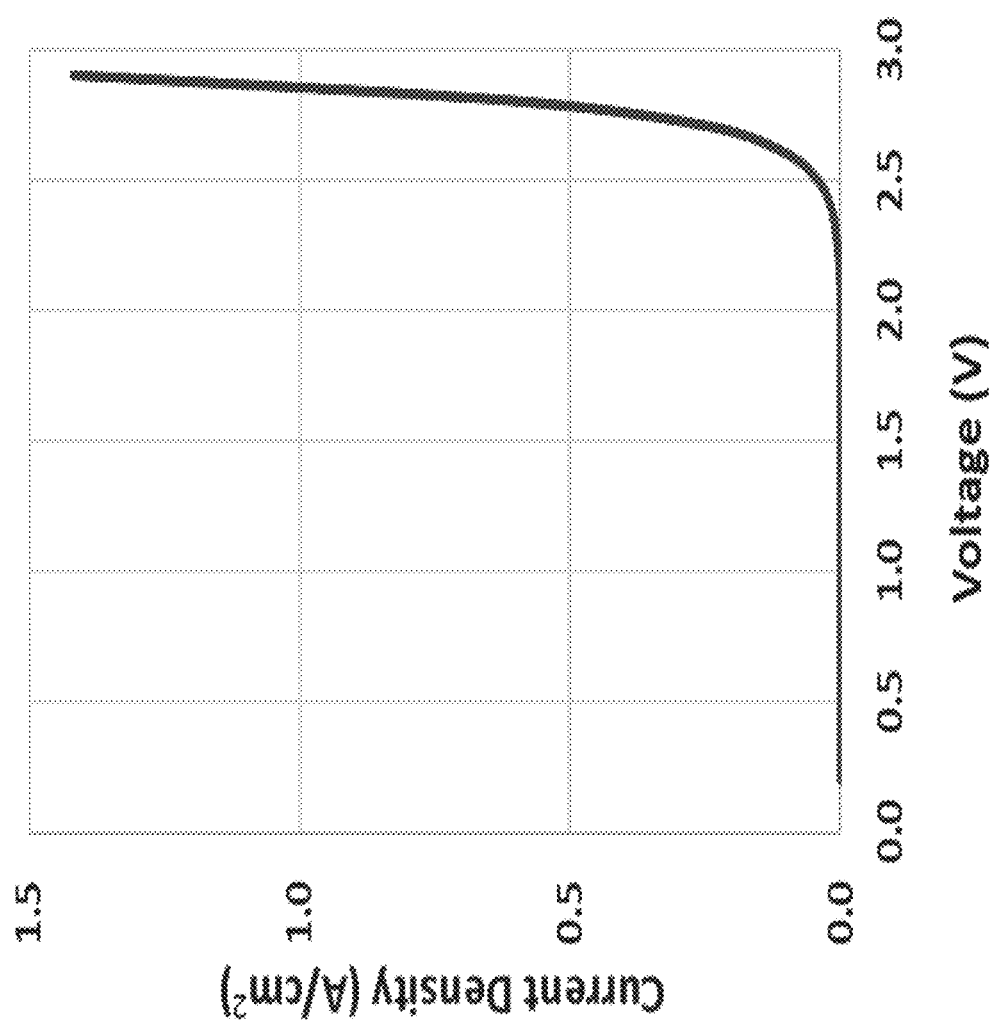
FIG. 52 shows a current-voltage plot of the device of an unencapsulated sample 20 micron micro-LED employing the second exemplary planar material stack of FIG. 42 at various operating current density conditions according to an embodiment of the present disclosure.

FIG. 52 shows a current-voltage plot of an unencapsulated, undiced 20 micron micro-LED employing the second exemplary planar material stack of FIG. 42 at 610 nm peak emission wavelength for various operating current density conditions according to an embodiment of the present disclosure.

Figure 53:
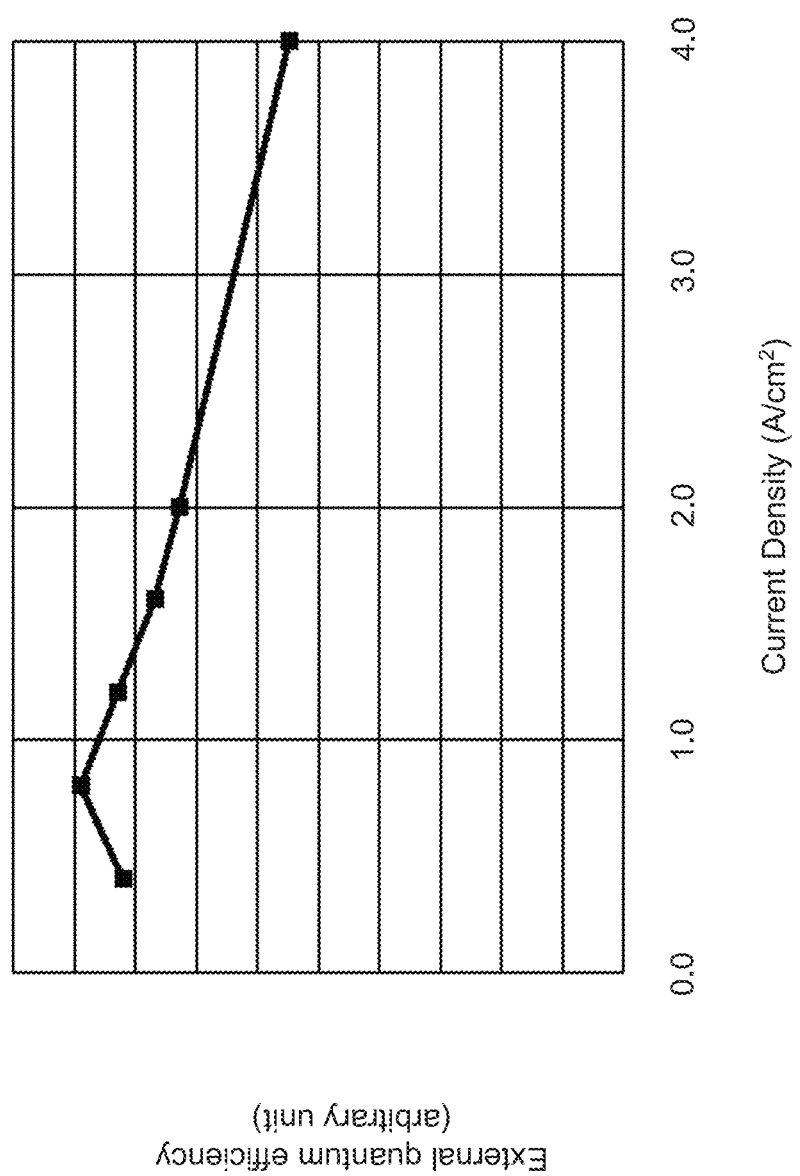
FIG. 53 is a graph showing external quantum efficiency of sample light emitting devices employing the exemplary device structure of FIG. 49 according to an embodiment of the present disclosure.

Referring to FIG. 53, spectral distribution of sample light emitting devices employing the exemplary device structure of FIG. 49 is illustrated. The peak external quantum efficiency occurs at low current densities below 1 A/cm$^2$, which makes the nanowire based LED suitable for direct view displays which operate at below low current densities below 1 A/cm$^2$.

As described above, the planar and nanowire LEDs of the embodiments of FIGS. 41-53 exhibit red light emission (e.g., 610 to 650 nm, such as 615 to 630 nm) with high external quantum efficiency (e.g., 2 to 10%) for relatively low current densities (e.g., to 2 A/cm$^2$) and FWHF of 100 nm or less, such as 50 nm or less, for example 45 to 50 nm. The Group III composition of the aluminum gallium nitride layer (e.g., cap layer) (1133, 1233) in the light emitting region (1130, 1230) may contain less than 99% aluminum (e.g., 50 to 80% Al). The devices may contain less than five quantum wells (e.g., one or two quantum wells) in the light emitting region. The devices may also include a superlattice (1110 and 1210) UV emitting InGaN/GaN stack and least one blue or green emitting InGaN/GaN stack between the light emitting region and the n-type side of the device for strain relief and improvement of light emitting region quality.

The red light emitting diode of the present disclosure can be a micro red LED having a lateral dimension (as measured left to right for the red light emitting diode 10R in FIG. 40B) in a range from 1 micron to 100 microns. Multiple red light emitting diodes or a single red light emitting diode may constitute a single sub-pixel of a display device. For example, an in in-eye projection device can include a single red light emitting nanowire 1300 as a single red sub-pixel. The red light display diode of the present disclosure may be employed in a monocolor display device formed on a backplane, or in an RGB monolithic display device.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A red-light emitting diode, comprising:
    an n-doped portion comprising a single crystalline n-doped GaN layer;
    a p-doped portion;
    a light emitting region located between the n-doped portion and a p-doped portion, the light emitting region comprising:
        a light-emitting indium gallium nitride layer emitting light at a peak wavelength between 600 and 750 nm under electrical bias thereacross;
        a III-nitride layer located on the light-emitting indium gallium nitride layer; and
        a GaN barrier layer located on the III-nitride layer; and
    at least one strain-modulating layer located between the single crystalline n-doped GaN layer and the light emitting region, wherein the at least one strain-modulating layer comprises a plurality of strain-modulating layer stacks that are located on the single crystalline n-doped GaN layer and comprise a respective intervening indium gallium nitride layer and a respective intervening GaN layer;
    wherein:
        an effective lattice constant of each strain-modulating layer stack of the plurality of strain-modulating layer stacks monotonically increases with a distance from the single crystalline n-doped GaN layer; and
        an atomic concentration of indium in the intervening indium gallium nitride layers of the plurality of strain-modulating layer stacks monotonically increases with a physical distance of each strain-modulating layer stack from the single crystalline n-doped GaN layer; and
    wherein the light emitting diode comprises at least one feature selected from:
        (a) the light emitting diode comprises a nanowire device; or
        (b) the light emitting region consists of one or two quantum wells; or
        (c) the III-nitride layer comprises an aluminum gallium nitride layer which has a composition $Al_yGa_{(1-y)}N$, where y is in a range from 0.3 to 1.0; or
        (d) a UV emitting InGaN/GaN superlattice is located between the n-doped portion and the light emitting region.

2. The light emitting diode of claim 1, wherein the p-doped portion comprises a p-doped III-nitride layer which comprises a p-doped aluminum gallium nitride layer.

3. The light emitting diode of claim 1, wherein:
    the light-emitting indium gallium nitride layer has a composition of $In_xGa_{(1-x)}N$, wherein x is in a range from 0.26 to 0.55; and
    the light-emitting indium gallium nitride layer has a thickness in a range from 3 nm to 7 nm.

4. The light emitting diode of claim 3, wherein the p-doped III-nitride layer comprises a p-doped aluminum gallium nitride layer which has a thickness in a range from 0.5 nm to 5.0 nm and the GaN barrier layer has a thickness in a range from 5 nm to 20 nm.

5. The light emitting diode of claim 4, further comprising a p-doped GaN layer located on the p-doped aluminum gallium nitride layer.

6. The light emitting diode of claim 1, wherein:
    the single crystalline n-doped GaN layer has a planar top surface; and
    each layer within the plurality of strain-modulating layer stacks, the light-emitting indium gallium nitride layer, the III-nitride layer, and the GaN barrier layer are planar layers having a respective top surface and a respective bottom surface that are parallel to the planar top surface of the single crystalline n-doped GaN layer.

7. The light emitting diode of claim 1 wherein the light emitting diode comprises feature (a).

8. The light emitting diode of claim 1 wherein the light emitting diode comprises feature (b).

9. The light emitting diode of claim 1 wherein the light emitting diode comprises feature (c).

10. The light emitting diode of claim 1 wherein the light emitting diode comprises feature (d).

11. The light emitting diode of claim 1 wherein the light emitting diode comprises two or more of features (a) to (d).

12. The light emitting diode of claim 1, wherein the red-light emitting diode comprises a first light emitting diode which has a width between 1 and 100 microns located in a direct view display on a backplane, which further comprises a second green-light emitting light emitting diode a third blue-light emitting diode located on the backplane.

13. The light emitting diode of claim 1, wherein the light-emitting indium gallium nitride layer emits light at a peak wavelength between 610 and 650 nm under electrical bias thereacross.

14. A red-light emitting diode, comprising:
    an n-doped portion;
    a p-doped portion;
    a light emitting region located between the n-doped portion and a p-doped portion, the light emitting region comprising:
        a light-emitting indium gallium nitride layer emitting light at a peak wavelength between 600 and 750 nm under electrical bias thereacross;

a III-nitride layer located on the light-emitting indium gallium nitride layer; and
a GaN barrier layer located on the III-nitride layer; and
at least one strain-modulating layer located between the n-doped portion and the light emitting region, wherein the at least one strain-modulating layer comprises a plurality of strain-modulating layer stacks that are located on the n-doped portion and comprise a respective intervening indium gallium nitride layer and a respective intervening GaN layer;
wherein the light emitting diode comprises at least one feature selected from:
(a) the light emitting diode comprises a nanowire device; or
(b) the light emitting region consists of one or two quantum wells; or
(c) the III-nitride layer comprises an aluminum gallium nitride layer which has a composition $Al_yGa_{(1-y)}N$, where y is in a range from 0.3 to 1.0; or
(d) a UV emitting InGaN/GaN superlattice is located between the n-doped portion and the light emitting region;
wherein:
the n-doped portion comprises a single crystalline n-doped GaN portion which is a nanowire core that protrudes vertically from a horizontal surface of a single crystalline n-doped GaN layer having a planar top surface;
each layer within the plurality of strain-modulating layer stacks, the light-emitting indium gallium nitride layer, the III-nitride layer, and the GaN barrier layer laterally surrounds the nanowire core and includes vertical portions that extend along a vertical direction and perpendicular to the planar top surface of the single crystalline n-doped GaN layer; and
light-emitting indium gallium nitride layer contains an indium rich nano-ring region which a structural discontinuity between p-plane and m-plane portions of the light-emitting indium gallium nitride layer and includes at least 5 atomic percent higher indium content than the p-plane and the m-plane portions of the light-emitting indium gallium nitride layer such that the nano-ring region has a composition of $In_xGa_{(1-x)}N$, in which x is in a range from 0.26 to 0.55.

15. A red-light emitting diode, comprising:
an n-doped portion;
a p-doped portion; and
a light emitting region located between the n-doped portion and a p-doped portion, the light emitting region comprising a light-emitting indium gallium nitride layer emitting light at a peak wavelength between 610 and 650 nm under electrical bias thereacross;
wherein:
the light emitting diode comprises a micro-light emitting diode having a lateral dimension in a range from 1 micron to 100 microns;
the light emitting diode is located in a display device; and
the light emitting diode emits the light at the peak wavelength between 610 and 650 nm under electrical bias thereacross having a full width half maximum of 100 nm or less and an external quantum efficiency of 2 to 10% for current densities of 1 to 2 $A/cm^2$.

16. The light emitting diode of claim 15, wherein the light emitting region further comprises
a III-nitride layer located on the light-emitting indium gallium nitride layer; and
a GaN barrier layer located on the III-nitride layer.

17. The light emitting diode of claim 15, wherein:
the light emitting diode emits the light at the peak wavelength between 615 and 630 nm under electrical bias thereacross having a full width half maximum of 45 to 50 nm and an external quantum efficiency of 2 to 3.9% for the current densities of 1 to 2 $A/cm^2$; and
the display device comprises an in-eye projection device comprising the light emitting diode as a single red sub-pixel, a monocolor display device formed on a backplane, or an RGB monolithic display device.

18. A red-light emitting diode, comprising:
an n-doped portion;
a p-doped portion; and
a light emitting region located between the n-doped portion and a p-doped portion, the light emitting region comprising a light-emitting indium gallium nitride layer emitting light at a peak wavelength between 610 and 650 nm under electrical bias thereacross;
wherein:
the light emitting diode comprises a micro-light emitting diode having a lateral dimension of 100 microns or less;
the light emitting diode is located in a display device; and
the light emitting diode emits the light at the peak wavelength between 610 and 650 nm under electrical bias thereacross having a full width half maximum of 100 nm or less and an external quantum efficiency of 2 to 10% for current densities of 2 $A/cm^2$ or less.

19. The light emitting diode of claim 18, wherein the light emitting region further comprises
a III-nitride layer located on the light-emitting indium gallium nitride layer; and
a GaN barrier layer located on the III-nitride layer.

20. The light emitting diode of claim 18, wherein:
the light emitting diode emits the light at the peak wavelength between 610 and 650 nm under electrical bias thereacross having the full width half maximum of 100 nm or less and the external quantum efficiency of 2 to 10% for current densities below 1 $A/cm^2$; and
the display device comprises an in-eye projection device comprising the light emitting diode as a single red sub-pixel, a monocolor display device formed on a backplane, or an RGB monolithic display device.

* * * * *